(12) United States Patent
Fujimori et al.

(10) Patent No.: US 10,032,977 B2
(45) Date of Patent: Jul. 24, 2018

(54) DEVICE USING A PIEZOELECTRIC ELEMENT AND METHOD FOR MANUFACTURING THE SAME

(71) Applicant: ROHM CO., LTD., Kyoto (JP)

(72) Inventors: Yoshikazu Fujimori, Kyoto (JP); Tomohiro Date, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 394 days.

(21) Appl. No.: 14/817,957

(22) Filed: Aug. 4, 2015

(65) Prior Publication Data

US 2016/0043299 A1    Feb. 11, 2016

(30) Foreign Application Priority Data

Aug. 5, 2014  (JP) ................ 2014-159807
Sep. 4, 2014  (JP) ................ 2014-180571
Sep. 4, 2014  (JP) ................ 2014-180572
Sep. 4, 2014  (JP) ................ 2014-180573
Jul. 30, 2015  (JP) ................ 2015-151164

(51) Int. Cl.
| | |
|---|---|
| *H01L 41/047* | (2006.01) |
| *H01L 41/053* | (2006.01) |
| *H01L 41/08* | (2006.01) |
| *H01L 41/29* | (2013.01) |
| *B41J 2/16* | (2006.01) |

(Continued)

(52) U.S. Cl.
CPC ...... *H01L 41/0533* (2013.01); *B41J 2/14233* (2013.01); *B41J 2/161* (2013.01); *B41J 2/1628* (2013.01); *B41J 2/1629* (2013.01); *B41J 2/1631* (2013.01); *B41J 2/1642* (2013.01); *B41J 2/1646* (2013.01); *H01L 37/02* (2013.01); *H01L 41/0475* (2013.01); *H01L 41/0477* (2013.01); *H01L 41/0478* (2013.01); *H01L 41/0805* (2013.01); *H01L 41/0973* (2013.01); *H01L 41/29* (2013.01); *H01L 41/332* (2013.01);

(Continued)

(58) Field of Classification Search
CPC ...... B41J 2/14233; B41J 2/161; B41J 2/1628; B41J 2/1629; B41J 2/1631; B41J 2/1642; B41J 2/1646
USPC ................................. 310/328, 363–365
See application file for complete search history.

(56) References Cited

U.S. PATENT DOCUMENTS

2013/0265370 A1    10/2013  Nagahata
2015/0270472 A1*   9/2015  Nagahata ............ B41J 2/161
                                            310/365

(Continued)

FOREIGN PATENT DOCUMENTS

| JP | 2009272319 A | * | 11/2009 | ...... H01L 21/8246 |
|---|---|---|---|---|
| JP | 2013-119182 A | | 6/2013 | |
| JP | 2013-215930 A | | 10/2013 | |

*Primary Examiner* — Thomas Dougherty
(74) *Attorney, Agent, or Firm* — Rabin & Berdo, P.C.

(57) ABSTRACT

An inkjet printing head 1 includes a piezoelectric element 6 having a lower electrode 7, a piezoelectric film 8 formed above the lower electrode 7, and an upper electrode 9 formed above the piezoelectric film 8, a hydrogen barrier film 13 covering an entirety of a side surface of the upper electrode 9 and the piezoelectric film 8, and an interlayer insulating film 14 that has an opening 17 at an upper surface center of the upper electrode 9, is laminated on the hydrogen barrier film 13, and faces the entirety of the side surface of the upper electrode 9 and the piezoelectric film 8 across the hydrogen barrier film 13.

15 Claims, 87 Drawing Sheets

(51) Int. Cl.
*B41J 2/14* (2006.01)
*H01L 37/02* (2006.01)
*H01L 41/09* (2006.01)
*H01L 41/332* (2013.01)

(52) U.S. Cl.
CPC ............... *B41J 2002/14241* (2013.01); *B41J 2002/14491* (2013.01)

(56) References Cited

U.S. PATENT DOCUMENTS

2016/0027988 A1* 1/2016 Nagahata ............ H01L 41/0472 347/70
2016/0072039 A1* 3/2016 Iida ..................... H01L 41/047 310/364

* cited by examiner

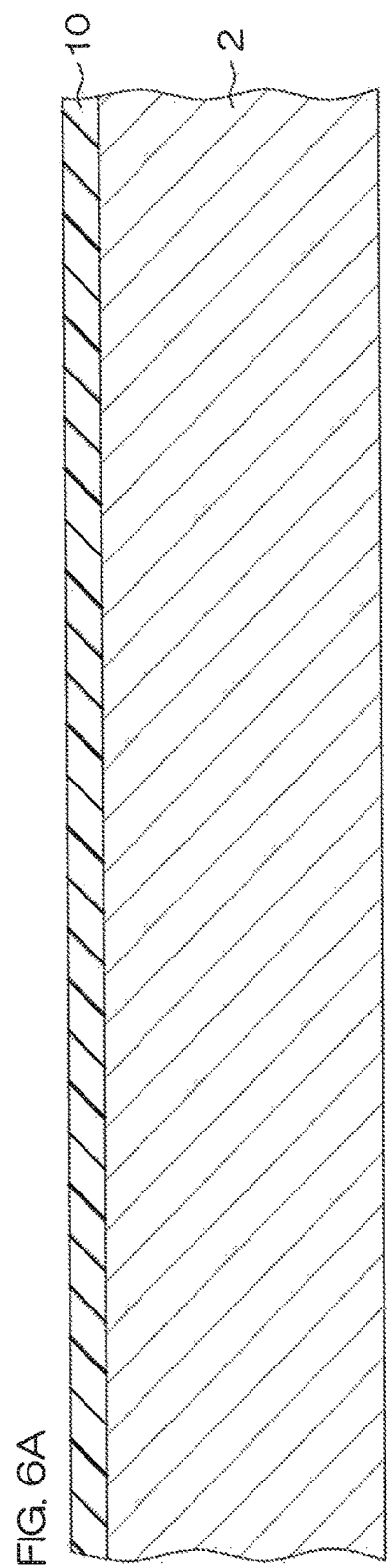

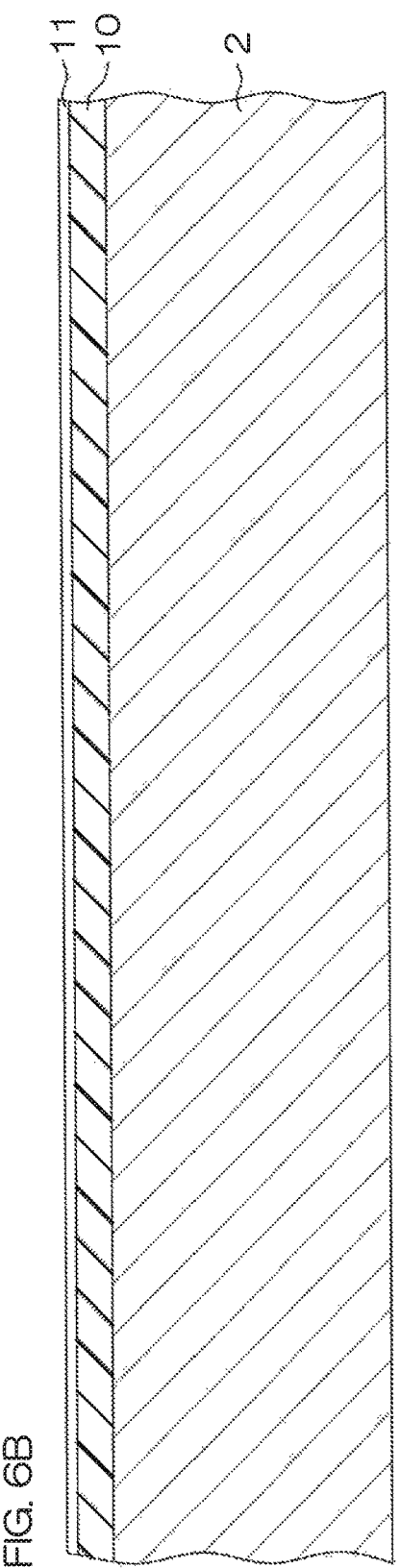

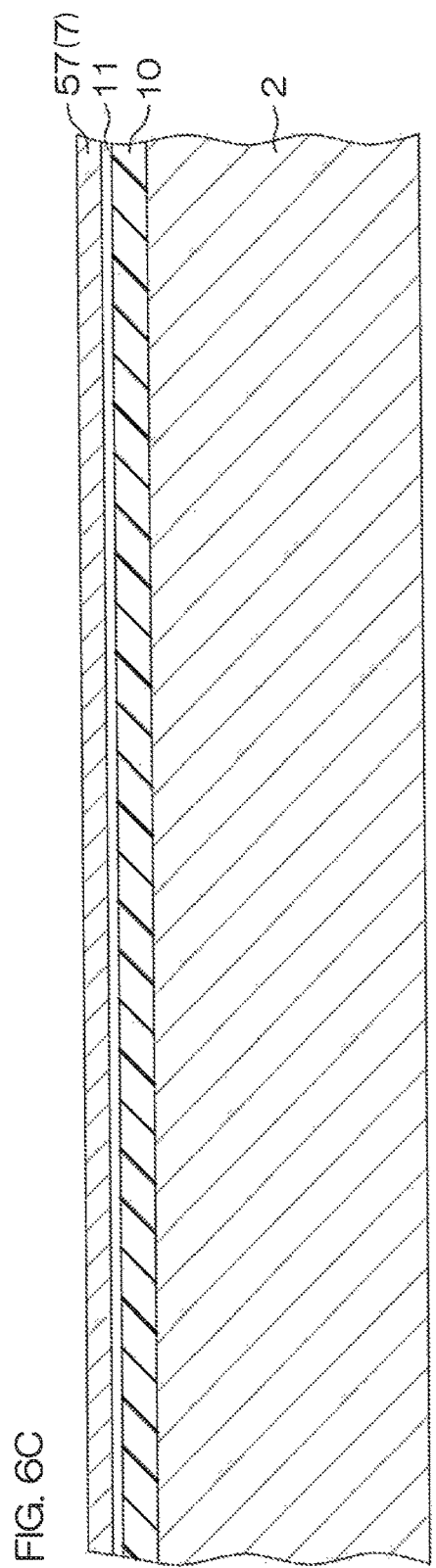

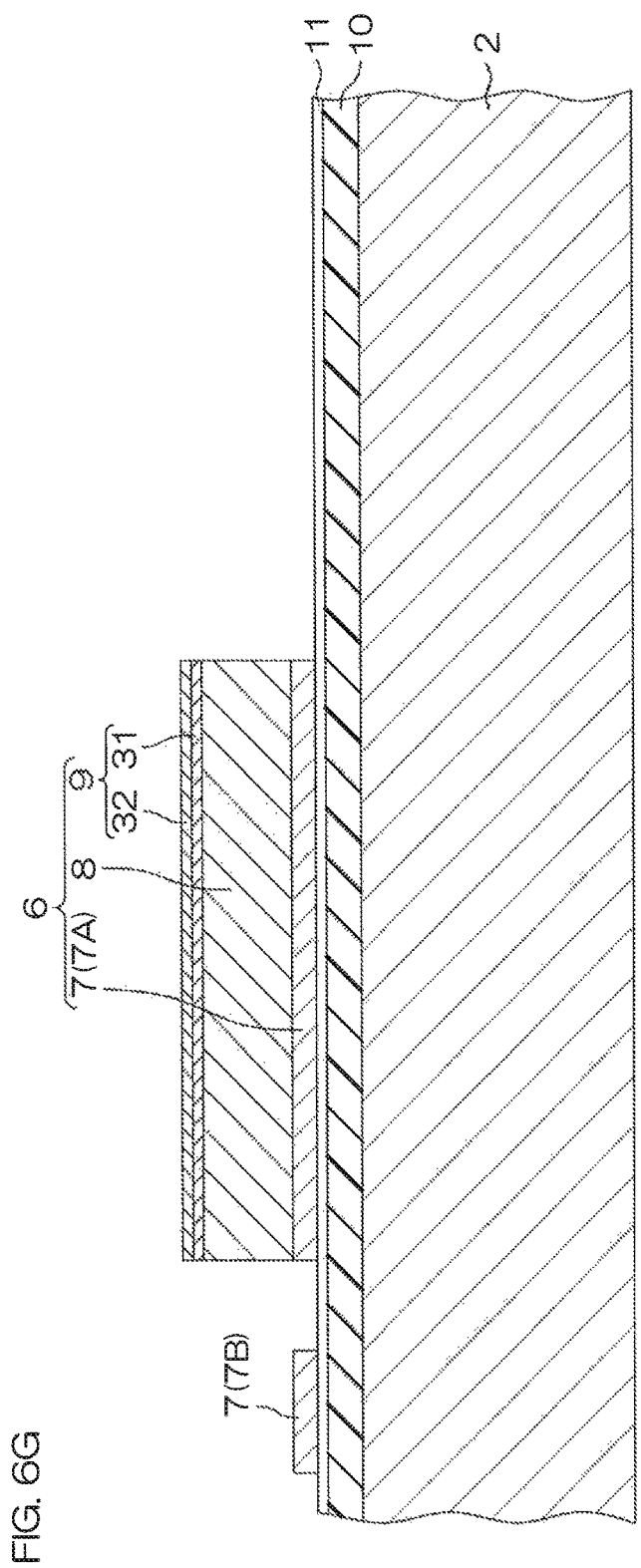

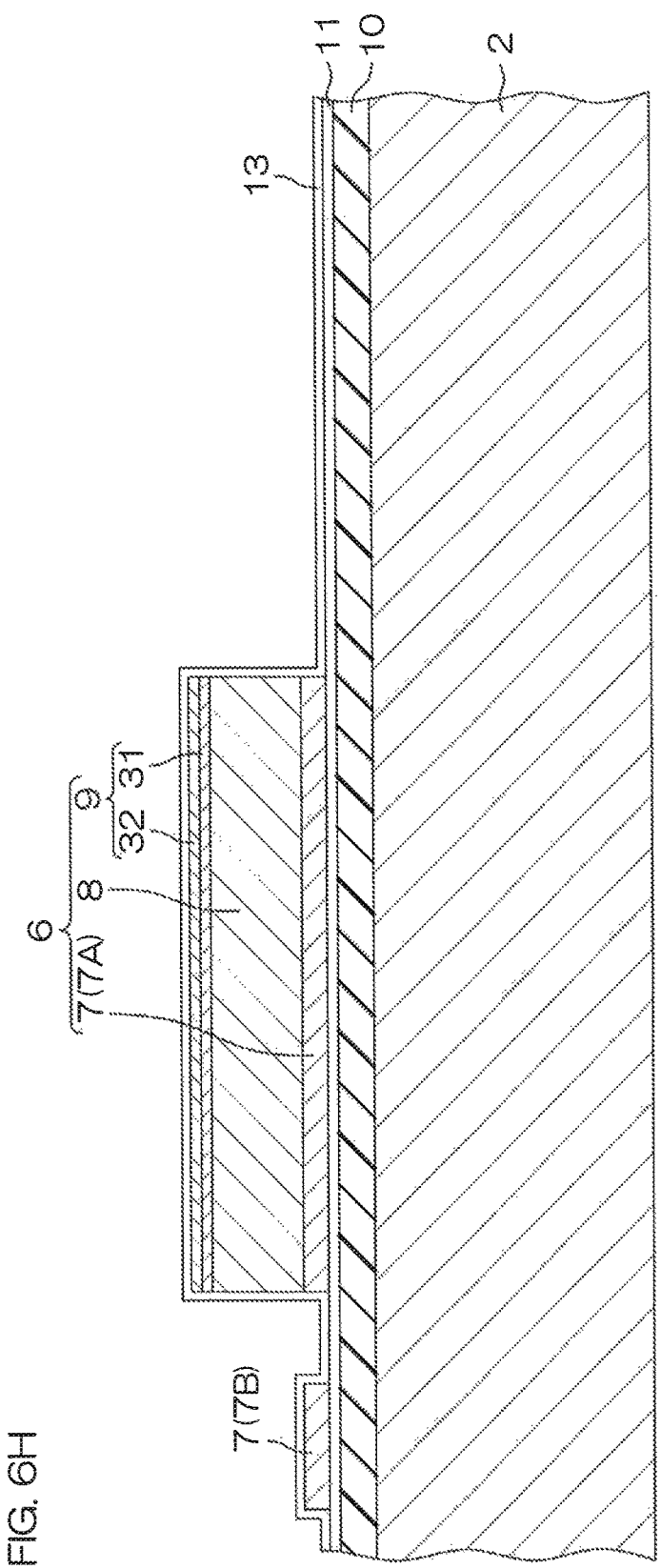

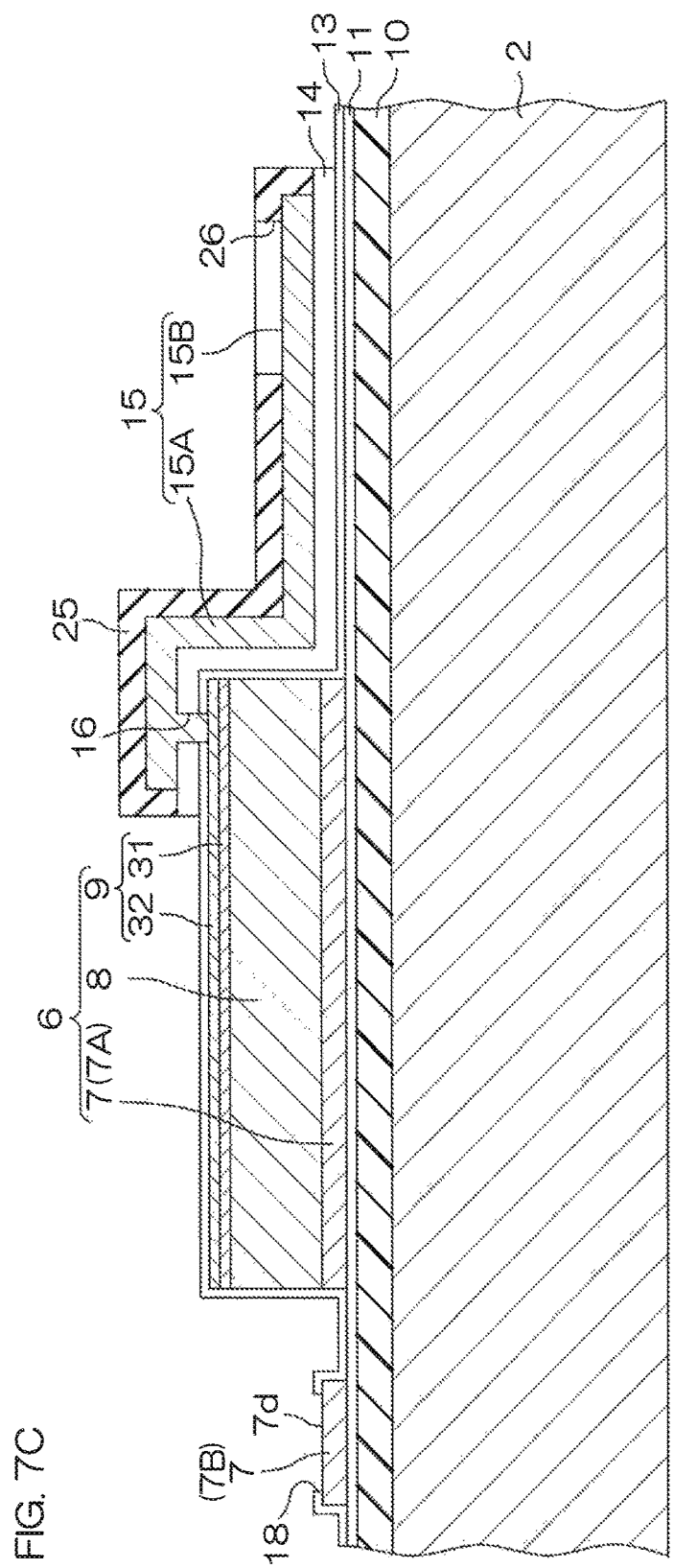

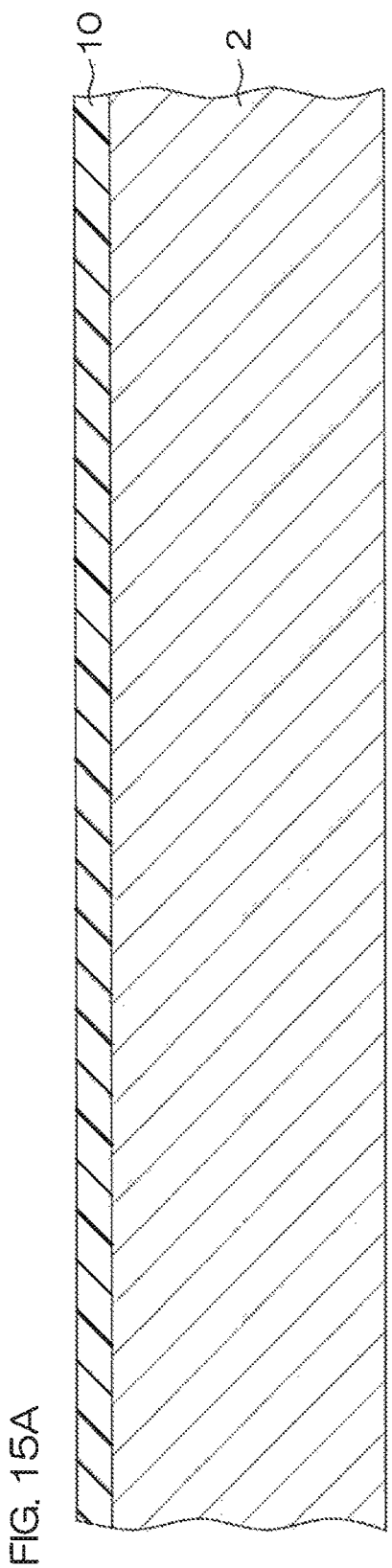

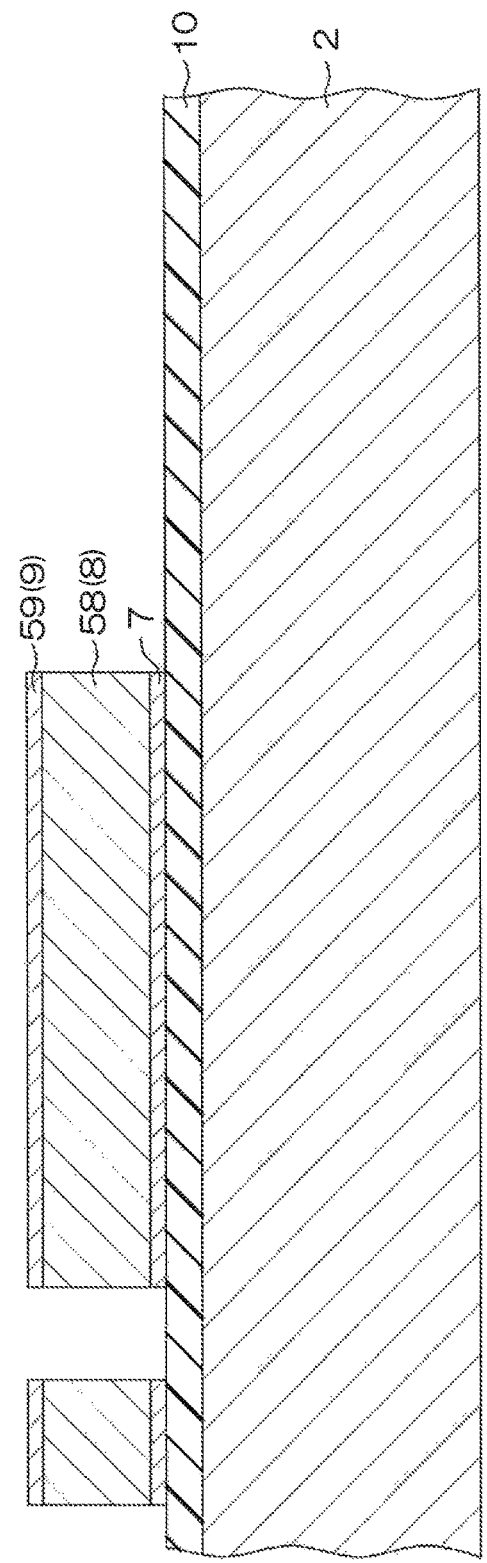

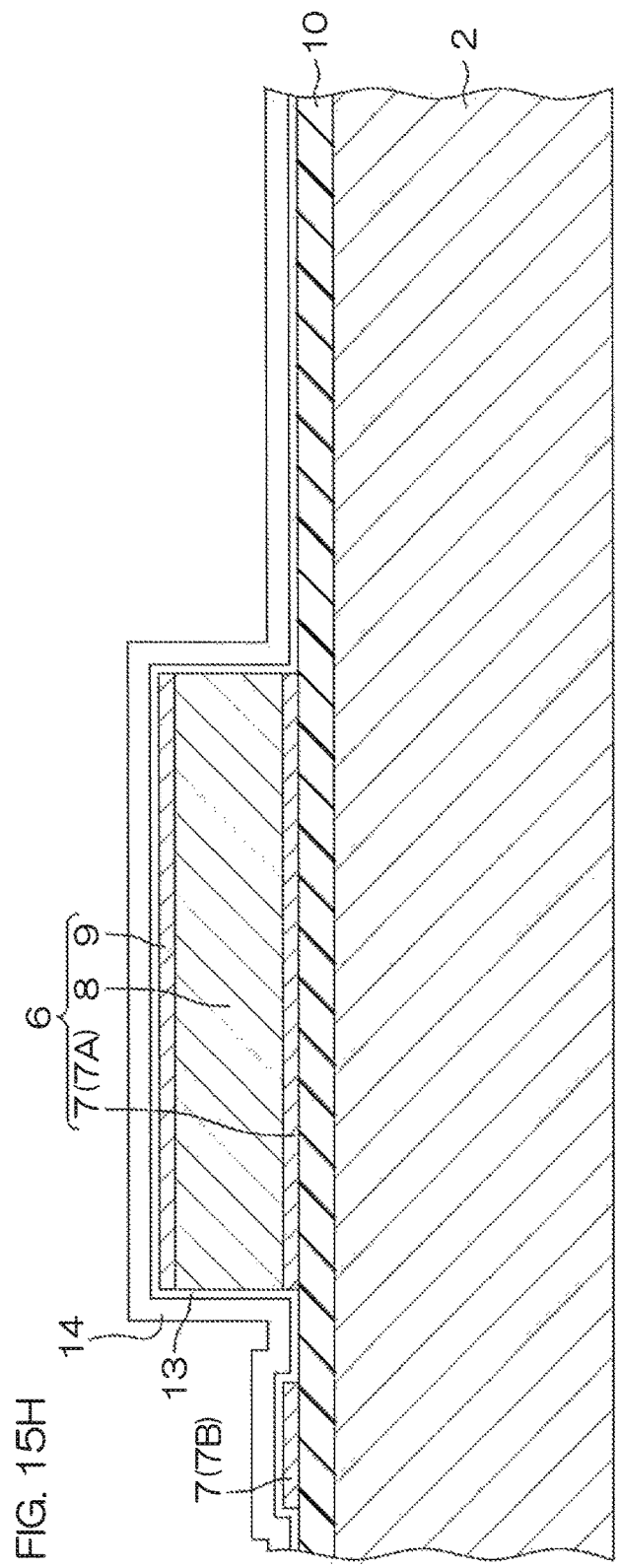

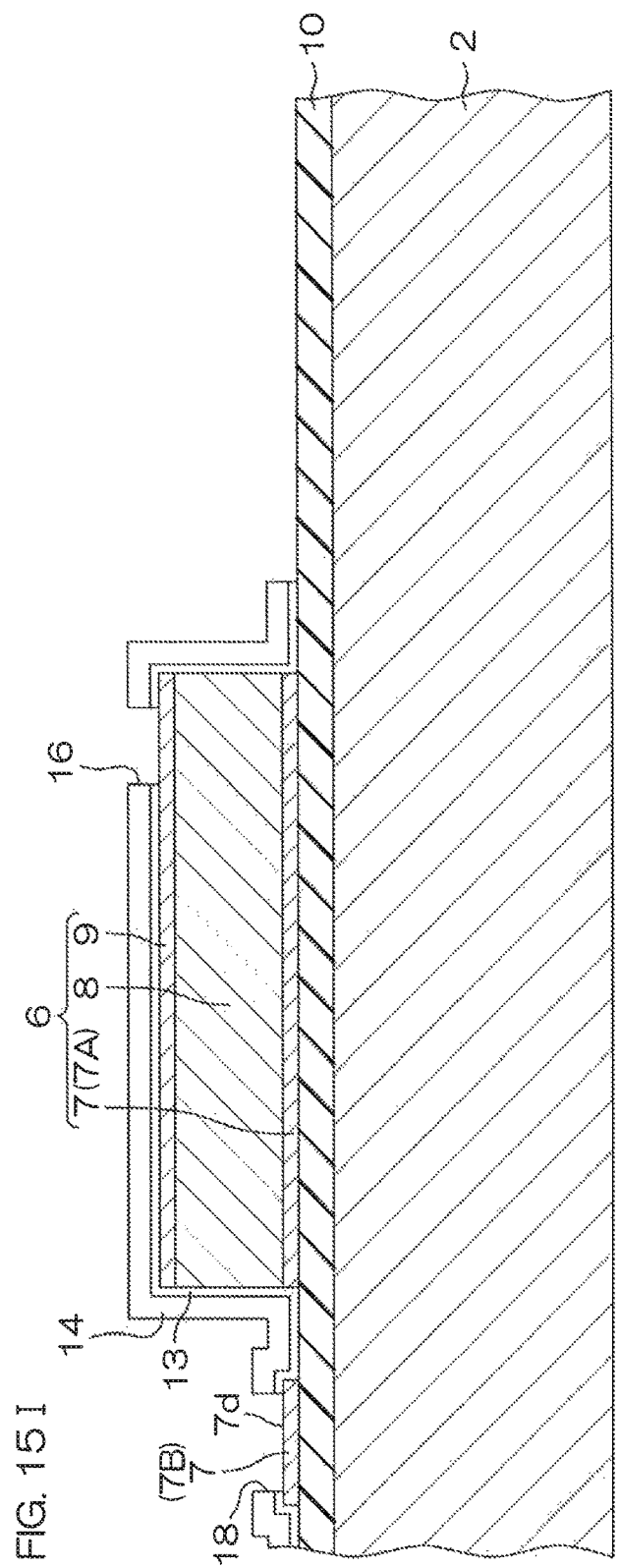

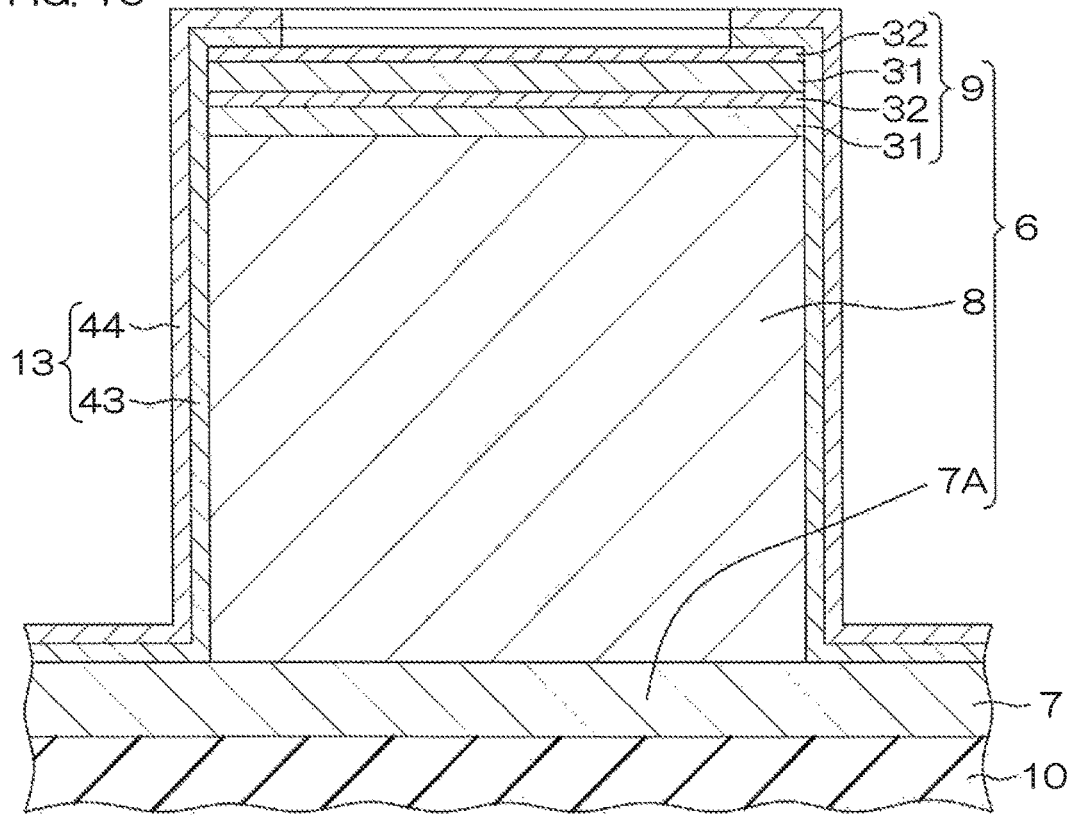

DEVICE USING A PIEZOELECTRIC ELEMENT AND METHOD FOR MANUFACTURING THE SAME

BACKGROUND OF THE INVENTION

1. Field of the Invention

The present invention relates to a device using a piezoelectric element that uses a piezoelectric element and a method for manufacturing the same.

2. Description of the Related Art

An inkjet printing head is known as a device using a piezoelectric element that uses a piezoelectric element. An example of such an inkjet printing head is disclosed in Japanese Patent Application Publication No. 2013-119182. The inkjet printing head of Japanese Patent Application Publication No. 2013-119182 includes a silicon substrate having a pressure chamber, a movable film (vibrating film) supported by the silicon substrate so as to face the pressure chamber, and a piezoelectric element bonded to the movable film. The piezoelectric element is arranged by laminating a lower electrode, a piezoelectric film, and an upper electrode in that order from the movable film side. An upper surface and a side surface of the piezoelectric element are covered by a hydrogen barrier film constituted of $Al_2O_3$ (alumina). An interlayer insulating film constituted of $SiO_2$ is formed above the hydrogen barrier film and a surface protection film (passivation film) constituted of SiN is formed above the interlayer insulating film.

SUMMARY OF THE INVENTION

The inventor of preferred embodiments of the present invention described and claimed in the present application conducted an extensive study and research regarding a device using a piezoelectric element and a method for manufacturing the same, such as the one described above, and in doing so, discovered and first recognized new unique challenges and previously unrecognized possibilities for improvements as described in greater detail below.

The displacement of the movable film can be made large by making the piezoelectric film easily deformable. To make the piezoelectric film easily deformable, it is preferable to provide just the minimum necessary film at a periphery of the piezoelectric element and not provide a film elsewhere. The aluminum film serving as the hydrogen barrier film is essential for protection of the piezoelectric film. The present inventor thus trial-manufactured an arrangement where, in a periphery of a piezoelectric film, an interlayer insulating film and a passivation film are formed just in a region in which wiring connected to an upper electrode is provided and just a hydrogen barrier film is formed in a region other than the above region.

That is, the hydrogen barrier film is formed by a sputtering method so as to cover front surfaces of the movable film and the piezoelectric element. Next, the interlayer insulating film is formed across an entire surface above the hydrogen barrier film. Next, a wiring film is formed above the interlayer insulating film and is patterned to form a wiring connected to the upper electrode. Next, the passivation film is formed to cover a front surface of the interlayer insulating film and a front surface of the wiring. Next, the passivation film is patterned (etched) by photolithography to remove the passivation film at portions other than the portion covering the wiring. Thereafter, the interlayer insulating film is patterned (etched) by photolithography to remove portions besides that in a region in which the wiring is present. Substantially the entirety of a side surface and an upper surface of the piezoelectric element is thereby put in a state of being covered just by the hydrogen barrier film.

It was found that with the arrangement trial-manufactured by the inventor, there is a possibility of peeling off of the upper electrode. The reason why the upper electrode peels off is considered to be as follows. The hydrogen barrier film formed by the sputtering method is thin in film thickness at the side surface of the piezoelectric element and therefore is not necessarily sufficient in coverage. Also, the hydrogen barrier film is damaged during the patterning of the interlayer insulating film below the wiring connected to the upper electrode. Therefore in the interlayer insulating film patterning process, an alkaline processing liquid, used for organic matter removal after resist peel-off (asking), permeates to the upper electrode and causes a chemical reaction (cell reaction) to cause peeling off of the upper electrode film.

An object of the present invention is to provide a device using a piezoelectric element and a method for manufacturing the same with which a piezoelectric film can be made readily deformable and yet with which peeling-off of an upper electrode does not occur.

In order to overcome the previously unrecognized and unsolved challenges described above, a device using a piezoelectric element according to the present invention includes a piezoelectric element having a lower electrode, a piezoelectric film formed above the lower electrode, and an upper electrode formed above the piezoelectric film, a hydrogen barrier film covering an entirety of a side surface of the upper electrode and the piezoelectric film, and an interlayer insulating film that has an opening at an upper surface center of the upper electrode, is laminated on the hydrogen barrier film, and faces the entirety of the side surface of the upper electrode and the piezoelectric film across the hydrogen barrier film.

With the present arrangement, the entirety of the side surface of the upper electrode and the piezoelectric film are covered by the hydrogen barrier film and the interlayer insulating film laminated on the hydrogen barrier film. Therefore with the present arrangement, there is no patterning process of removing the interlayer insulating film covering the entirety of the side surface of the upper electrode and the piezoelectric film in the process of manufacturing the device using the piezoelectric element. That is, with the present arrangement, peeling-off of the upper electrode does not occur because there is no step that causes peeling-off of the upper electrode in the process of manufacturing the device using the piezoelectric element.

Also with the present arrangement, the interlayer insulating film has the opening at the upper surface center of the upper electrode and therefore the piezoelectric film deforms readily during driving of the piezoelectric element.

The preferred embodiment of the present invention further includes a substrate having a cavity and a movable film held on the substrate so as to face the cavity, and the piezoelectric element is disposed above the movable film.

In the preferred embodiment of the present invention, a metal barrier film is interposed between the movable film and the piezoelectric element. With this arrangement, metal elements can be prevented from escaping from the piezoelectric film. Piezoelectric characteristics of the piezoelectric film can thereby be kept satisfactory and metals can be prevented from diffusing into the movable film during film formation of the piezoelectric film.

In the preferred embodiment of the present invention, the metal barrier film is an $Al_2O_3$ film.

In the preferred embodiment of the present invention, above the piezoelectric element, a contact hole, exposing a portion of the upper electrode, is formed in the interlayer insulating film, and above the interlayer insulating film, there is formed a wiring having one end portion connected to the upper electrode via the contact hole and another end portion lead out to an outer side of the piezoelectric element.

The preferred embodiment of the present invention further includes a passivation film formed just in a region in which the wiring above the interlayer insulating film is present and covering the wiring. With this arrangement, the movable film can be made greater in displacement in comparison to a case where the passivation film is formed across an entire region above interlayer insulating film.

In the preferred embodiment of the present invention, the cavity is formed to a rectangular shape in a plan view as viewed from a direction normal to a major surface of the movable film, the movable film is formed to a rectangular shape matching a cavity edge in the plan view, and the piezoelectric film, in the plan view, is a rectangle having a width shorter than a width in a short direction of the movable film and a length shorter than a length in a long direction of the movable film, with both end edges and both side edges thereof being receded further toward an interior of the movable film than both end edges and both side edges, respectively, of the movable film, and the upper electrode, in the plan view, is a rectangle having a width shorter than the width in a short direction of the movable film and a length shorter than the length in a long direction of the movable film, with both end edges and both side edges thereof being receded further toward the interior of the movable film than both end edges and both side edges, respectively, of the movable film.

With this arrangement, the piezoelectric film and the upper electrode are not disposed above a peripheral edge portion of the movable film and therefore the movable film can be made large in displacement.

In the preferred embodiment of the present invention, the hydrogen barrier film is an $Al_2O_3$ film.

In the preferred embodiment of the present invention, the interlayer insulating film is an SiO film.

In the preferred embodiment of the present invention, the passivation film is an SiN film.

In the preferred embodiment of the present invention, the upper electrode is constituted of a laminated film of an $IrO_2$ film formed above the piezoelectric film and an Ir film formed above the $IrO_2$ film.

A method for manufacturing a device using a piezoelectric element according to the present invention includes a first step of forming, above a movable film, a piezoelectric element including a lower electrode, a piezoelectric film formed above the lower electrode, and an upper electrode formed above the piezoelectric film, a second step of forming a hydrogen barrier film covering front surfaces of the movable film and the piezoelectric element, a third step of forming an interlayer insulating film above the hydrogen barrier film, a fourth step of forming, above the piezoelectric element, a contact hole, exposing a portion of the upper electrode, in the hydrogen barrier film and the interlayer insulating film, a fifth step of forming, above the interlayer insulating film, a wiring having one end portion contacting the upper electrode via the contact hole and another end portion lead out to an outer side of the piezoelectric element, a sixth step of forming a passivation film, covering the wiring, in a region above the interlayer insulating film in which the wiring is present, and a seventh step of forming an opening at an upper surface central portion of the piezoelectric element in the hydrogen barrier film and the interlayer insulating film.

With the present manufacturing method, a device using a piezoelectric element having the arrangement of the device using the piezoelectric element according to the present invention is obtained. The device using the piezoelectric element with which the piezoelectric film deforms readily and yet with which peeling-off of an upper electrode does not occur can thus be manufactured.

In the preferred embodiment of the present invention, the fifth step includes a step of forming a wiring film above the interlayer insulating film, including an interior of the contact hole, and a step of patterning the wiring film to form the wiring having the one end portion contacting the upper electrode via the contact hole and the other end portion lead out to the outer side of the piezoelectric element.

In the preferred embodiment of the present invention, the sixth step includes a step of forming, above the interlayer insulating film, the passivation film covering a front surface of the interlayer insulating film and a front surface of the wiring, and a step of patterning the passivation film to a pattern constituted of just a portion covering the wiring.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 6A is a sectional view of an example of a manufacturing process of the inkjet printing head.

FIG. 6B is a sectional view of a step subsequent to that of FIG. 6A.

FIG. 6C is a sectional view of a step subsequent to that of FIG. 6B.

FIG. 6G is a sectional view of a step subsequent to that of FIG. 6F.

FIG. 6H is a sectional view of a step subsequent to that of FIG. 6G.

FIG. 6I is a sectional view of a step subsequent to that of FIG. 6H.

FIG. 6O is a sectional view of a step subsequent to that of FIG. 11N.

FIG. 7C is a sectional view of a step subsequent to that of FIG. 7B.

FIG. 15A is a sectional view of an example of a manufacturing process of the inkjet printing head.

FIG. 15E is a sectional view of a step subsequent to that of FIG. 15D.

FIG. 15H is a sectional view of a step subsequent to that of FIG. 15G.

FIG. 15I is a sectional view of a step subsequent to that of FIG. 15H.

FIG. 16 is an enlarged sectional view of a modification example of the hydrogen barrier film.

DETAILED DESCRIPTION OF THE PREFERRED EMBODIMENTS

Preferred embodiments of a first invention to a fourth invention shall now be described in detail with reference to the attached drawings.

[1] First Invention

Figure 1A:
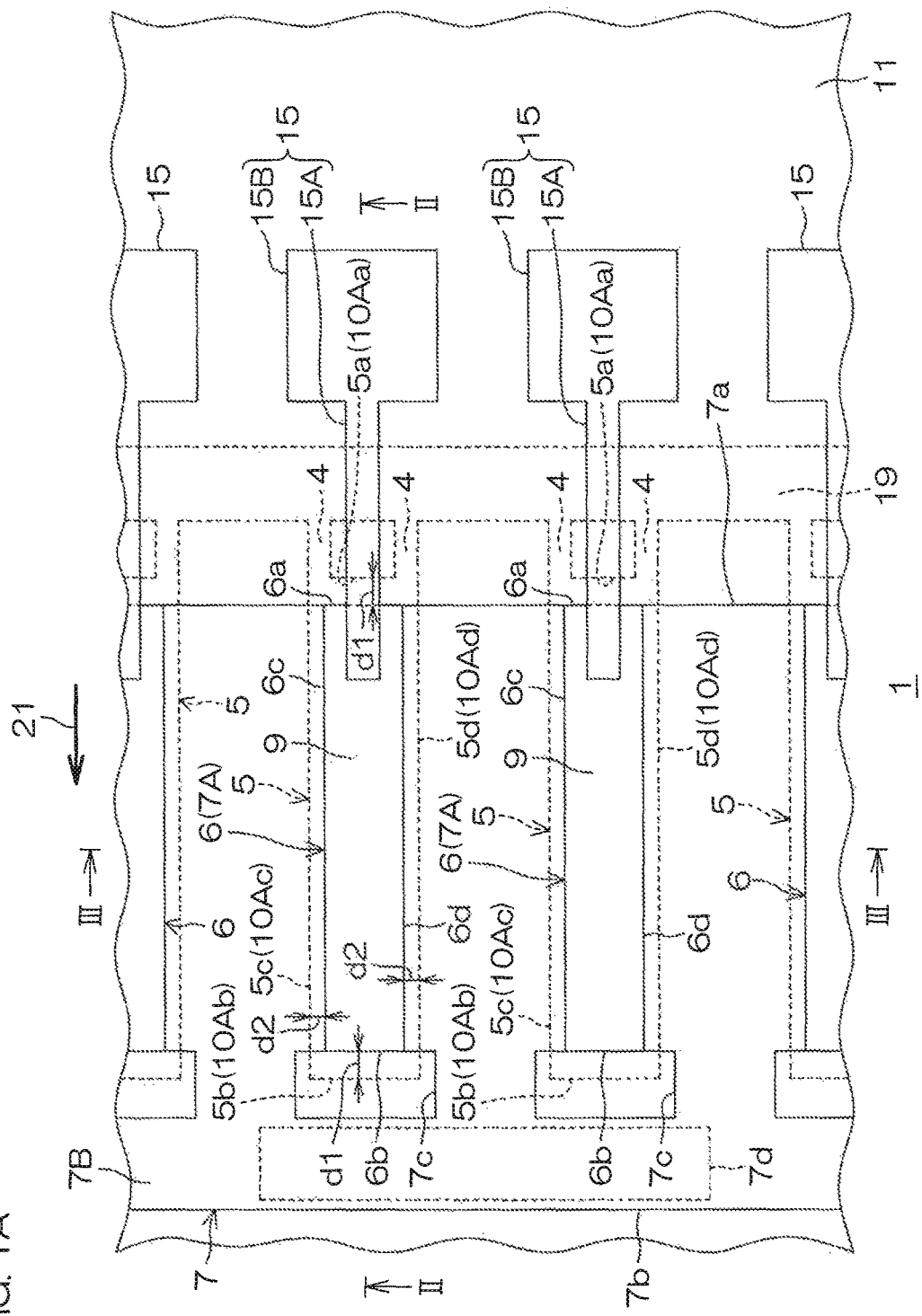
FIG. 1A is a schematic plan view of an inkjet printing head to which a first invention is applied and is a plan view with which a hydrogen barrier film, an interlayer insulating film, and a passivation film are omitted.
Figure 1B:
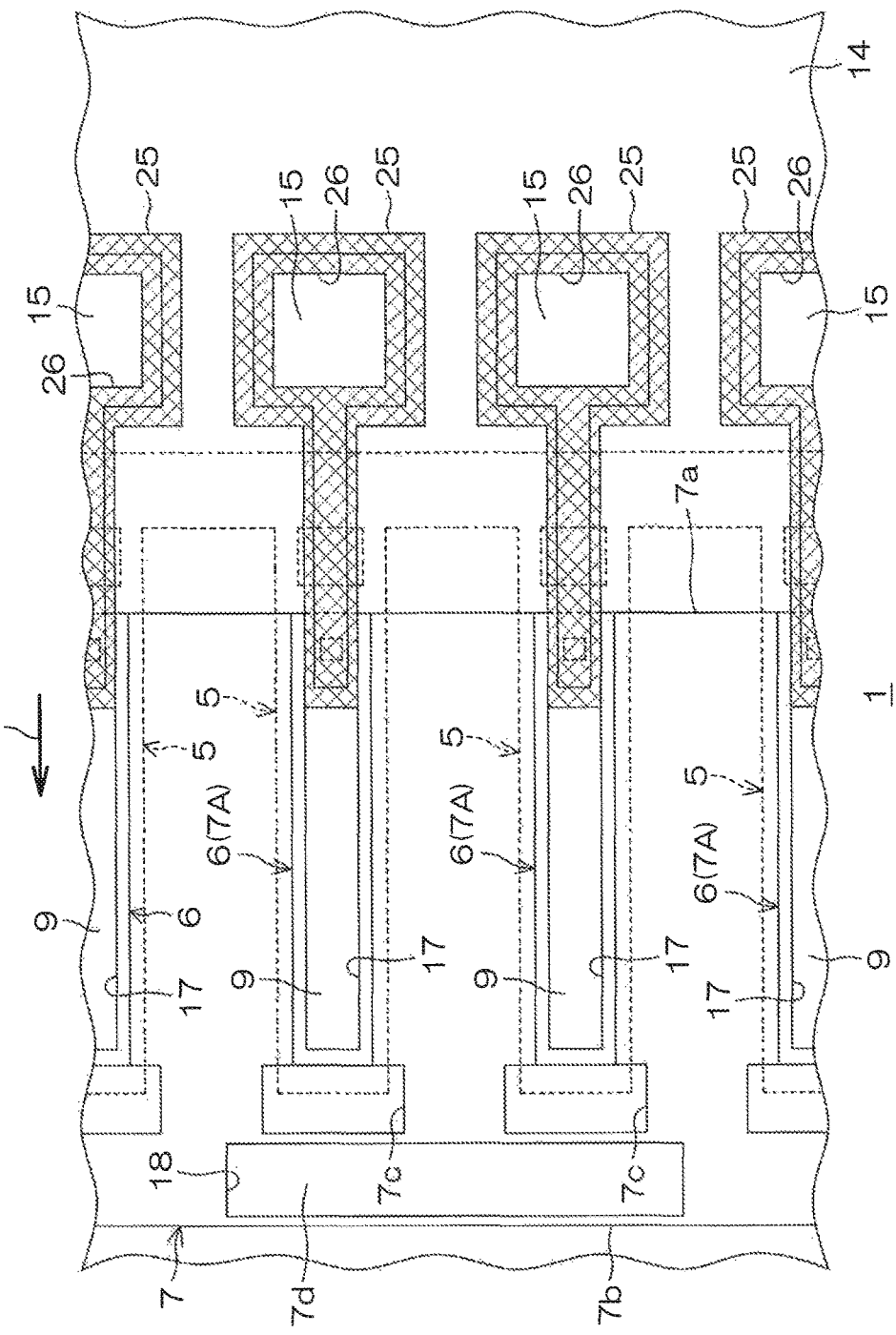
FIG. 1B is a schematic plan view for illustrating a region in which the passivation film is formed.
Figure 1C:
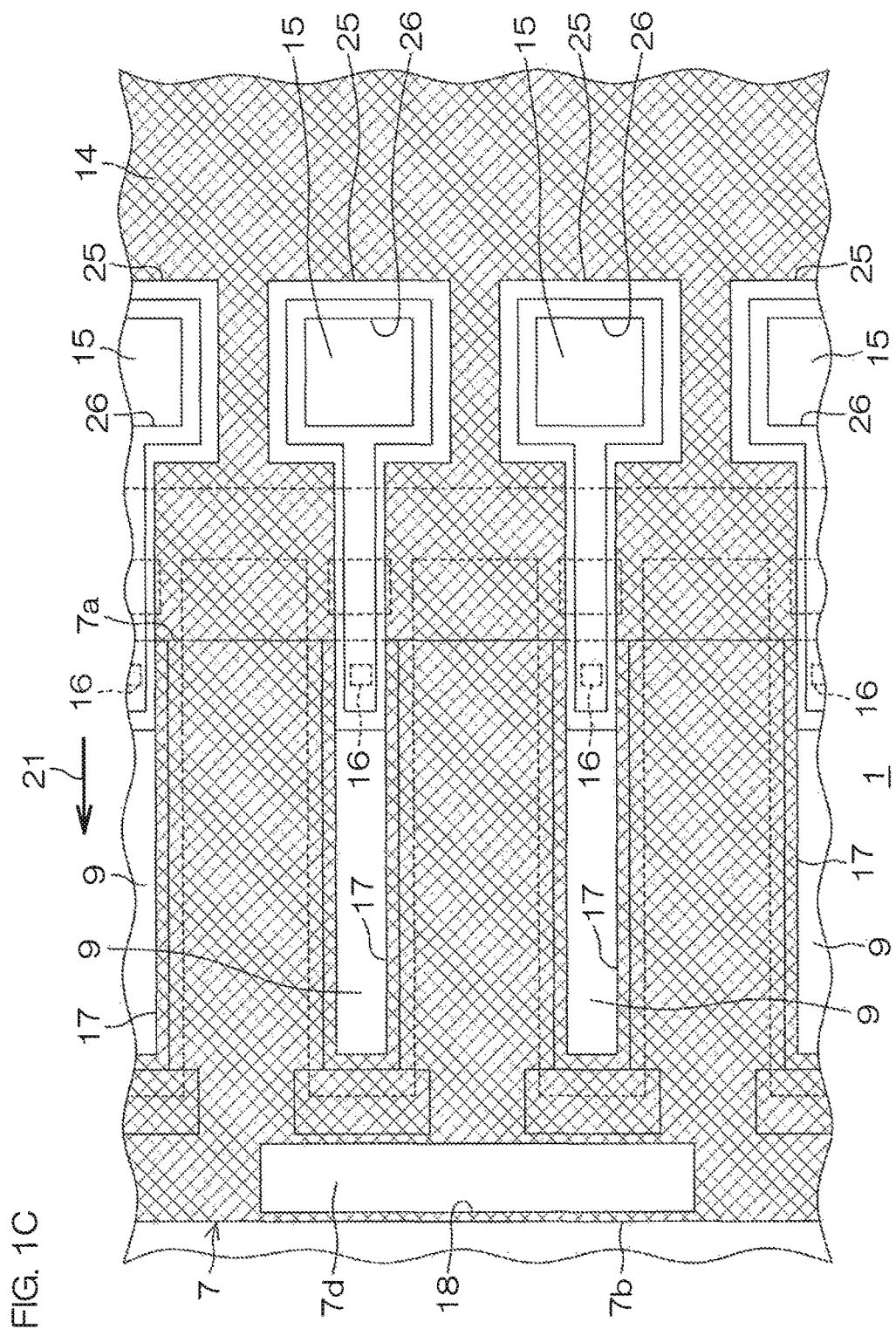
FIG. 1C is a schematic plan view for illustrating a region of the interlayer insulating film in which the passivation film is not formed on a front surface.
Figure 2:
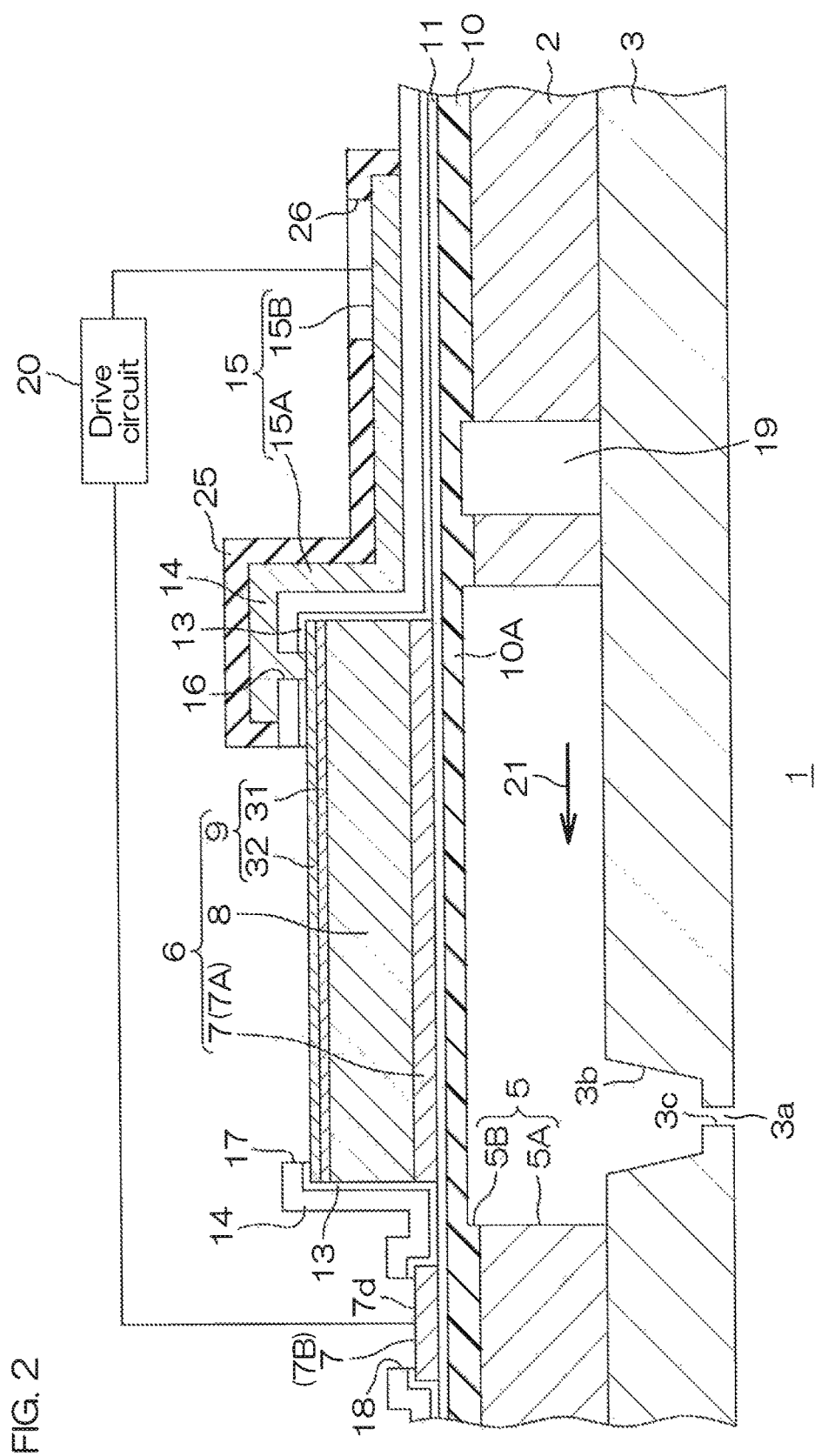
FIG. 2 is a schematic enlarged sectional view taken along line II-II in FIG. 1.
Figure 3:
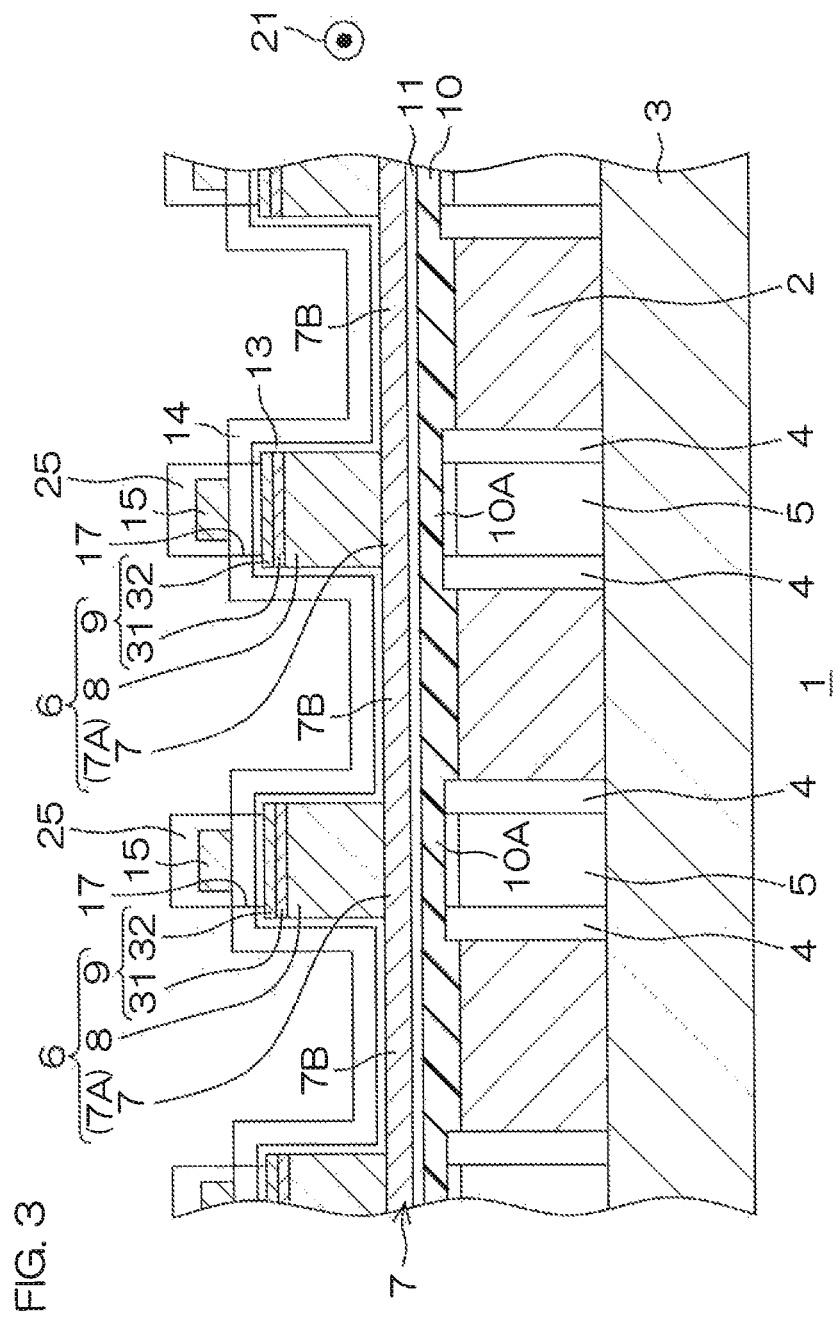
FIG. 3 is a schematic enlarged sectional view taken along line III-III in FIG. 1.
Figure 4:
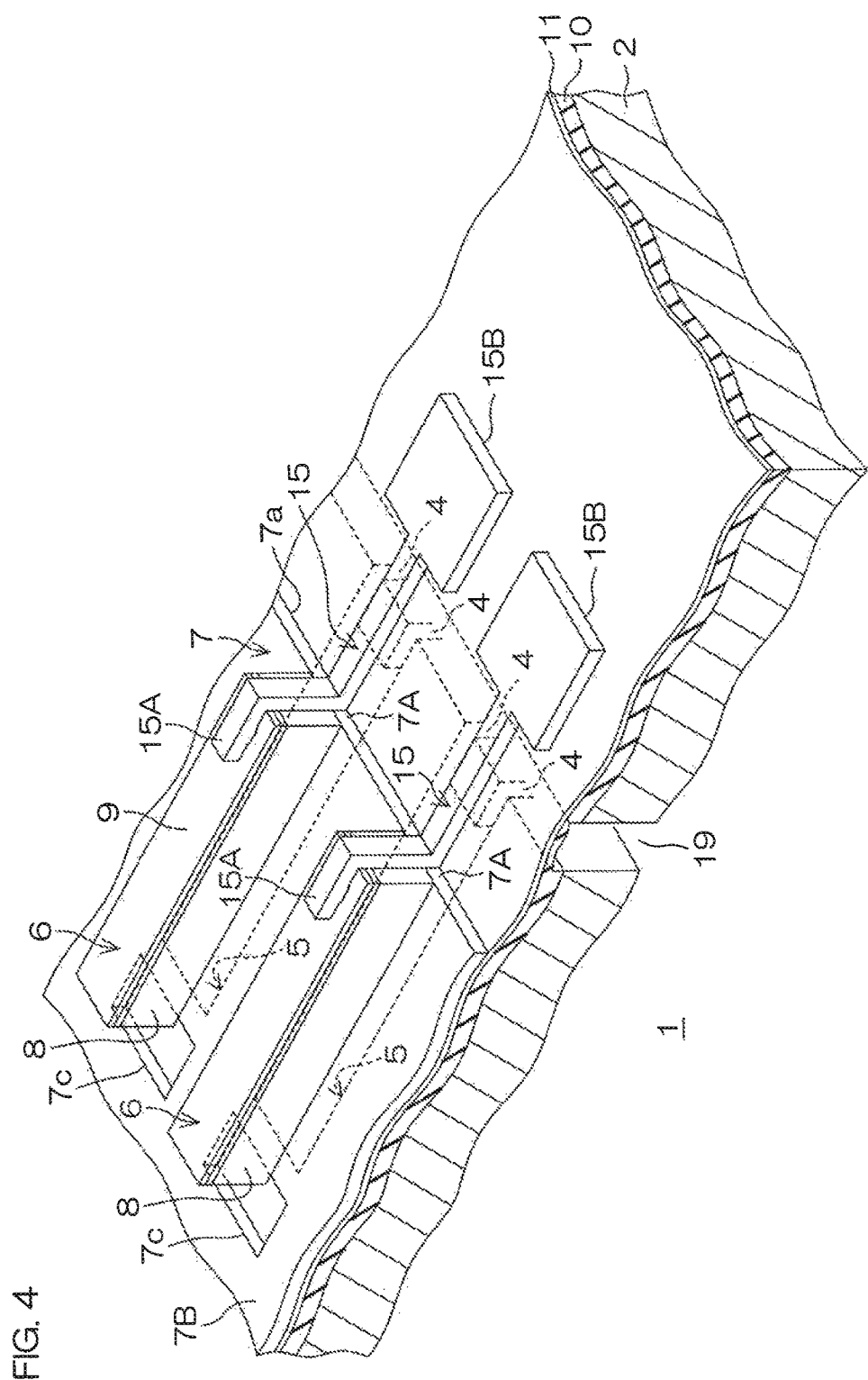
FIG. 4 is a schematic perspective view of the inkjet printing head.
Figure 5:
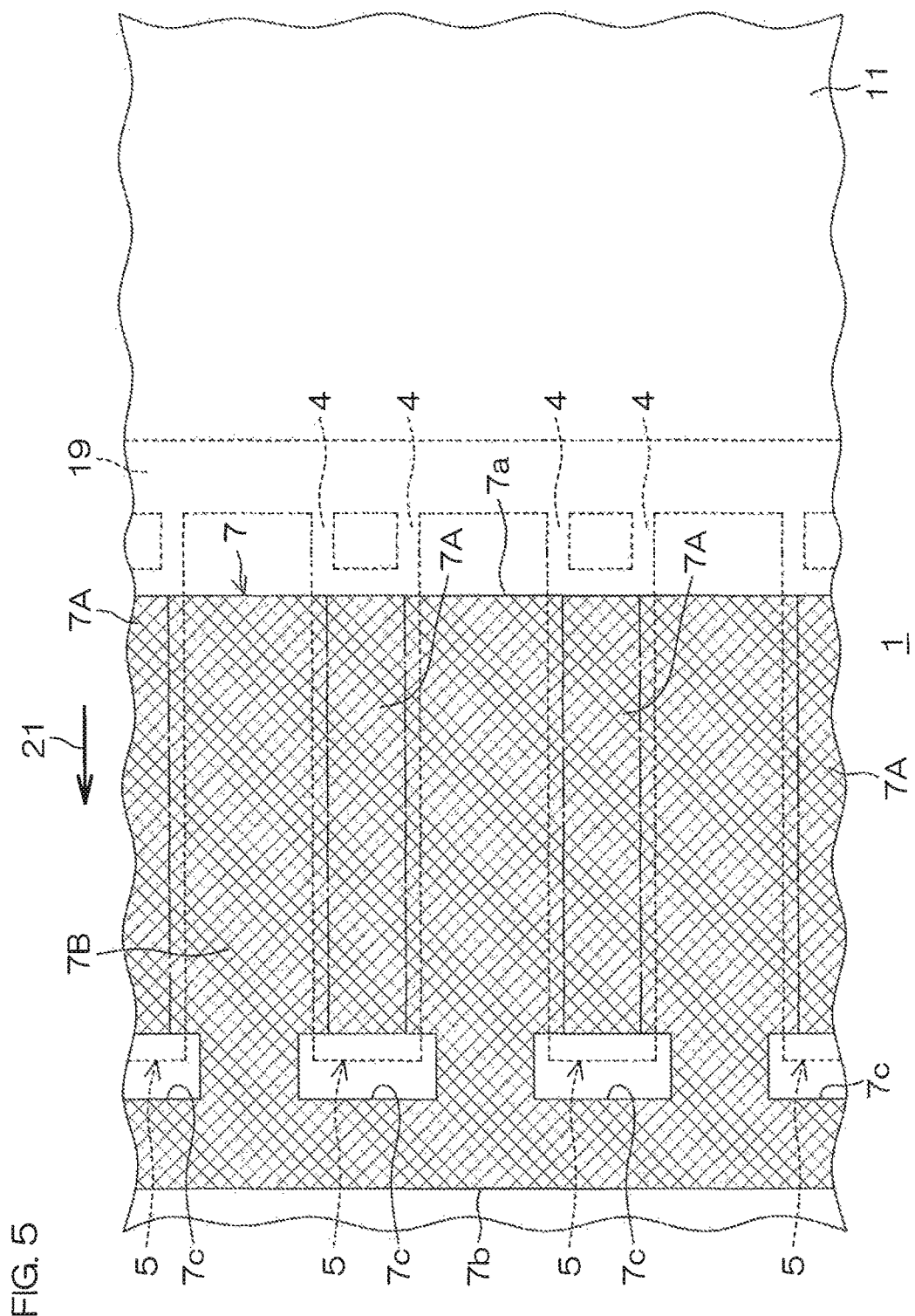
FIG. 5 is a plan view of a planar shape of a lower electrode formed above a movable film formation layer and is a plan view with which the arrangement besides the lower electrode formed above the movable film formation layer is removed.

FIG. 1A is a schematic plan view of an inkjet printing head to which a first invention is applied. FIG. 1B is a schematic plan view for illustrating a region in which a passivation film is formed. FIG. 1B is a schematic plan view for illustrating a region of the interlayer insulating film in which the passivation film is not formed on a front surface. FIG. 2 is a schematic enlarged sectional view taken along line II-II in FIG. 1. FIG. 3 is a schematic enlarged sectional view taken along line III-III in FIG. 1. FIG. 4 is a schematic perspective view of the inkjet printing head. In FIG. 1A and FIG. 4, a hydrogen barrier film indicated by symbol 13 and an insulating film indicated by symbol 14 in FIG. 2 and FIG. 3 are omitted. FIG. 5 is a plan view of a planar shape of a lower electrode formed above a movable film formation layer and is a plan view with which the arrangement besides the lower electrode formed above the movable film formation layer is removed.

Referring to FIG. 2, the inkjet printing head 1 includes a silicon substrate 2 and a nozzle substrate 3 having discharge ports 3a that discharge ink. A movable film formation layer 10 is laminated on the silicon substrate 2. In the laminate of the silicon substrate 2 and the movable film formation layer 10, pressure chambers (cavities) 5 are formed as ink flow passages (ink reservoirs). Each pressure chamber 5 is constituted of a space portion 5A, formed in the silicon substrate 2 and penetrating through the silicon substrate 2 in a thickness direction, and a recess 5B, formed in a rear surface (surface at the silicon substrate 2 side) of the movable film formation layer 10 and continuous to the space portion 5A.

The nozzle substrate 3 is constituted, for example, of a silicon plate, is adhered to a rear surface of the silicon substrate 2, and, together with the silicon substrate 2 and the movable film formation layer 10, defines the pressure chambers 5. The nozzle substrate 3 has recesses 3b facing the pressure chambers 5 and an ink discharge passage 3c is formed in a bottom surface of each recess 3b. Each ink discharge passage 3c penetrates through the nozzle substrate 3 and has a discharge port 3a at an opposite side from a pressure chamber 5. Therefore, when a volume change occurs in the pressure chamber 5, the ink retained in the pressure chamber 5 passes through the ink discharge passage 3c and is discharged from the discharge port 3a.

Each pressure chamber 5 is formed by digging into the silicon substrate 2 and the movable film formation layer 10 from the rear surface side of the silicon substrate 2. Ink supply passages 4 (see FIG. 1A and FIG. 3 together), in communication with the pressure chambers 5, are further formed in the silicon substrate 2 and the movable film formation layer 10. The ink supply passages 4 are in communication with the pressure chambers 5 and are formed to guide ink from an ink tank (for example, an ink cartridge) that is an ink supply source to the pressure chambers 5. Each pressure chamber 5 is formed to be elongate along an ink flow direction 21, which is a right/left direction in FIG. 2.

Each portion of the movable film formation layer 10 that is atop roof portion of a pressure chamber 5 constitutes a movable film (membrane) 10A. The movable film 10A (movable film formation layer 10) is constituted, for example, of a silicon oxide ($SiO_2$) film formed above the silicon substrate 2. The movable film 10A (movable film formation layer 10) may be constituted of a laminate, for example, of a silicon (Si) layer formed above the silicon substrate 2, a silicon oxide ($SiO_2$) layer formed above the silicon layer, and a silicon nitride (SiN) layer formed above the silicon oxide layer. In the present specification, the movable film 10A refers to each portion of the movable film formation layer 10 that is a top roof portion defining a pressure chamber 5. Therefore, portions of the movable film formation layer 10 besides the top roof portions of the pressure chambers 5 do not constitute the movable films 10A.

Each movable film 10A has a thickness of, for example, 0.4 μm to 2 μm. If the movable film 10A is constituted of a silicon oxide film, the thickness of the silicon oxide film may be approximately 1.2 μm. If the movable film 10A is constituted of a laminate of a silicon layer, a silicon oxide layer, and a silicon nitride layer, the thickness of each of the silicon layer, the silicon oxide layer, and the silicon nitride layer may be approximately 0.4 μm.

Each pressure chamber 5 is defined by the movable film 10A, the silicon substrate 2, and the nozzle substrate 3 and is formed to a substantially rectangular parallelepiped shape in the present preferred embodiment. The pressure chamber 5 may, for example, have a length of approximately 800 μm and a width of approximately 55 μm. Each ink supply passage 4 is formed to be in communication with one end portion (an end portion positioned at an opposite side from the discharge port 3a in the present preferred embodiment) in a long direction of a pressure chamber 5. In the present preferred embodiment, the discharge port 3a of the nozzle substrate 3 is disposed near another end portion related to the long direction of the pressure chamber 5.

A metal barrier film 11 is formed on a front surface of the movable film formation layer 10. The metal barrier film 11 is constituted, for example, of an $Al_2O_3$ (alumina) film. The metal barrier film 11 may be an MgO film or may be $ZrO_2$. On a front surface of the metal barrier film 11, piezoelectric elements 6 are disposed at positions above the movable film 10A. Each piezoelectric element 6 includes a lower electrode 7 formed above the metal barrier film 11, a piezoelectric film 8 formed above the lower electrode 7, and an upper electrode 9 formed above the piezoelectric film 8. In other words, the piezoelectric element 6 is arranged by sandwiching the piezoelectric film 8 from above and below by the upper electrode 9 and the lower electrode 7.

The lower electrode 7 has, for example, a two-layer structure with a Ti (titanium) layer and a Pt (platinum) layer being laminated in that order from the movable film 10A side. Besides this, the lower electrode 7 may be formed of a single film that is an Au (gold) film, a Cr (chromium) layer, or an Ni (nickel) layer, etc. The lower electrode 7 has main electrode portions 7A in contact with lower surfaces of the piezoelectric films 8 and an extension portion 7B (see also FIG. 1A, FIG. 4, and FIG. 5) extending to a region outside the piezoelectric film 8.

As the piezoelectric film 8, for example, a PZT (PbZ$r_x$Ti$_{1-x}$O$_3$: lead zirconate titanate) film formed by a sol-gel method or a sputtering method may be applied. Such a piezoelectric film 8 is constituted of a sintered body of metal oxide crystals. The piezoelectric film 8 preferably has a thickness of 1 µm to 5 µm. The overall thickness of the movable film 10A is preferably approximately the same as the thickness of the piezoelectric film 8 or approximately ⅔ the thickness of the piezoelectric film. The metal barrier film 11 prevents metal atoms (Pb, Zr, and Ti in the case where the piezoelectric film 8 is PZT) from escaping from the piezoelectric film 8 to keep the piezoelectric characteristics of the piezoelectric film 8 satisfactory and prevents metals from diffusing into the movable film 10A during film formation of the piezoelectric film 8.

Each upper electrode 9 is formed to have substantially the same shape in plan view as the piezoelectric film 8. In the present preferred embodiment, the upper electrode 9 has a two-layer structure in which an $IrO_2$ (iridium oxide) film 31 and an Ir (iridium) film 32 are laminated in that order from the piezoelectric film 8 side.

The front surface of the metal barrier film 11, front surfaces of the piezoelectric elements 6, and a front surface of the extension portion of the lower electrode 7 are covered with a hydrogen barrier film 13. The hydrogen barrier film 13 is constituted, for example, of $Al_2O_3$ (alumina). Degradation of characteristics of the piezoelectric films 8 due to hydrogen reduction can thereby be prevented. An interlayer insulating film 14 is laminated above the entire surface of the hydrogen barrier film 13. The interlayer insulating film 14 is constituted, for example, of $SiO_2$. Wirings 15 are formed above the interlayer insulating film 14. Each wiring 15 is constituted of a metal material that includes Al (aluminum).

One end portion of each wiring 15 is disposed above one end portion of an upper electrode 9. A penetrating hole (contact hole) 16, penetrating continuously through the hydrogen barrier film 13 and the interlayer insulating film 14, is formed between the wiring 15 and the upper electrode 9. The one end portion of the wiring 15 enters into the penetrating hole 16 and is connected to the upper electrode 9 inside the penetrating hole 16. Also, in the hydrogen barrier film 13 and the interlayer insulating film 14, an opening 17 of rectangular shape in plan view is formed at an upper surface central portion of each upper electrode 9 (portion surrounded by a peripheral edge portion of an upper surface of each upper electrode 9).

Also, an opening 18, penetrating continuously through the hydrogen barrier film 13 and the interlayer insulating film 14, is formed at a position corresponding to a predetermined region above the extension portion 7B of the lower electrode 7 and a front surface of the lower electrode 7 is exposed via the opening 18. The exposed portion constitutes a pad portion 7d arranged to connect the lower electrode 7 to the exterior. Above the interlayer insulating film 14 are formed passivation films 25 that cover the wirings 15.

Each piezoelectric element 6 is formed at a position facing a pressure chamber 5 across a movable film 10A and the metal barrier film 11. That is, the piezoelectric element 6 is formed to contact a surface of the metal barrier film 11 at the opposite side from the pressure chamber 5. The pressure chamber 5 is filled with ink supplied from an unillustrated ink tank through the ink supply passages 4. The movable film 10A defines a top surface portion of the pressure chamber 5 and faces the pressure chamber 5. The movable film 10A is supported by portions of the laminate of the movable film formation layer 10 and the silicon substrate 2 at a periphery of the pressure chamber 5 and has flexibility enabling deformation in a direction facing the pressure chamber 5 (in other words, in the thickness direction of the movable film 10A).

The wirings 15 and the pad portion 7d of the lower electrode 7 are connected to a drive circuit 20. The drive circuit 20 may be formed in a region of the silicon substrate 2 separate from the pressure chambers 5 or may be formed outside the silicon substrate 2. When a drive voltage is applied from the drive circuit 20 to a piezoelectric element 6, the piezoelectric film 8 deforms due to an inverse piezoelectric effect. The movable film 10A is thereby made to deform together with the piezoelectric element 6 to bring about a volume change of the pressure chamber 5 and the ink inside the pressure chamber 5 is pressurized. The pressurized ink passes through the ink discharge passage 3c and is discharged as microdroplets from the discharge port 3a.

Referring to FIG. 1A to FIG. 5, a plurality of the pressure chambers 5 are formed as stripes extending parallel to each other in the laminate of the silicon substrate 2 and the movable film formation layer 10. The plurality of pressure chambers 5 are formed at equal intervals that are minute intervals (for example, of approximately 30 µm to 350 µm) in a width direction thereof. In plan view, each pressure chamber 5 has an oblong shape that is elongate along the ink flow direction 21 from ink supply passages 4 to a discharge passage 3c. That is, the top surface portion of the pressure chamber 5 has two side edges 5c and 5d along the ink flow direction 21 and two end edges 5a and 5b along a direction orthogonal to the ink flow direction 21. At the one end portion of each pressure chamber 5, the ink supply passages 4 are divided and formed as two passages and are in communication with a common ink passage 19. The common ink passage 19 is in communication with the ink supply passages 4 corresponding to the plurality of pressure chambers 5 and is formed to supply the ink from the ink tank to the ink supply passages 4.

Each piezoelectric element 6 has a rectangular shape in plan view with which a length in the ink flow direction 21 (same direction as a long direction of each movable film 10A) is defined to be shorter than a length of the movable film 10A in the long direction. As shown in FIG. 1A, respective end edges 6a and 6b along a short direction of the piezoelectric element 6 are disposed at inner sides at predetermined intervals d1 (for example, of 5 μm) from respective corresponding end edges 10Aa and 10Ab of the movable film 10A. Also, a width of the piezoelectric element 6 in the short direction (direction parallel to a major surface of the silicon substrate 2) orthogonal to the long direction of the movable film 10A is defined to be narrower than a width of the movable film 10A (top surface portion of a pressure chamber 5) in the short direction. Respective side edges 6c and 6d along a long direction of the piezoelectric element 6 are disposed at inner sides at predetermined intervals d2 (for example, of 5 μm) from respective corresponding side edges 10Ac and 10Ad of the movable film 10A.

As shown in FIG. 1A and FIG. 5, the lower electrode 7 has, in plan view, a flat plate shape with a predetermined width in a direction along the ink flow direction 21 and extending across the plurality of pressure chambers 5 in the direction orthogonal to the ink flow direction 21, and is a common electrode used in common for the plurality of piezoelectric elements 6. A first side 7a of the lower electrode 7 along the direction orthogonal to the ink flow direction 21 is matched in plan view with a line joining the end edges 6a at one end of the plurality of piezoelectric elements 6. A second side 7b of the lower electrode 7 opposite the first side 7a is disposed further outside (downstream in the ink flow direction 21) than the end edges 10Ab of the movable films 10A corresponding to the other end edges 6b of the plurality of piezoelectric elements 6.

The lower electrode 7 includes the main electrode portions 7A of rectangular shapes in plan view that constitute the piezoelectric elements 6 and the extension portion 7B lead out from the main electrode portions 7A in a direction along the front surface of the movable film formation layer 10 to cross over peripheral edges of the top surface portions (movable films 10A) of the pressure chambers 5 and extend outside the peripheral edges of the top surface portions of the pressure chambers 5. Each main electrode portion 7A is formed to be shorter than a movable film 10A along the long direction of the movable film 10A and respective end edges thereof are disposed at inner sides at the predetermined intervals d1 from the respective corresponding end edges 10Aa and 10Ab of the movable film 10A. Also with the main electrode portion 7A, a width along the short direction of the movable film 10A is defined to be narrower than the width of the movable film 10A in the short direction and respective end edges thereof are disposed at inner sides at the intervals d2 from the respective corresponding side edges 10Ac and 10Ad of the movable film 10A.

In plan view, the extension portion 7B extends from the respective side edges of each main electrode portion 7A to the outside of the corresponding side edges 5c and 5d of the top surface portion of a pressure chamber 5 upon crossing over the side edges 5c and 5d of the top surface portion of the pressure chamber 5. Of all regions of the lower electrode 7, the extension portion 7B is the region excluding the main electrode portions 7A. In the extension portion 7B, cutout portions 7c of rectangular shapes in plan view that penetrate through the lower electrode 7 are formed at downstream sides in the ink flow direction 21 of the respective piezoelectric elements 6. In plan view, each cutout portion 7c has two side edges (short sides) along the ink flow direction 21 and two end edges (long sides) along the direction orthogonal to the ink flow direction 21. One end edge of the cutout portion 7c is disposed at a position matching the end edge 6b of a piezoelectric element 6 (end edge at the downstream side of a main electrode portion 7A) in relation to the ink flow direction 21 and the other end edge is disposed further outside (downstream in the ink flow direction 21) than the end edge 10Ab of a movable film 10A. One side edge of the cutout portion 7c is disposed further outside than the one side edge 10Ac of the movable film 10A and the other side edge of the cutout portion 7c is disposed further outside than the other side edge 10Ad of the movable film 10A. Therefore in plan view, an end portion of the movable film 10A at the end edge 10Ab side is disposed at an inner side of the cutout portion 7c. The pad portion 7d of rectangular shape that is elongate in the direction orthogonal to the ink flow direction 21 is formed in a region between the second side 7b of the lower electrode 7 and the plurality of cutout portions 7c.

Referring to FIG. 1A to FIG. 4, each upper electrode 9 is formed to a rectangular shape of the same pattern as a main electrode portion 7A of the lower electrode 7 in plan view. That is, the upper electrode 9 is formed to be shorter than a movable film 10A along the long direction of the movable film 10A and respective end edges thereof are disposed at inner sides at the predetermined intervals d1 from the respective corresponding end edges 10Aa and 10Ab of the movable film 10A. Also with the upper electrode 9, a width along the short direction of the movable film 10A is defined to be narrower than the width of the movable film 10A in the short direction and respective end edges thereof are disposed at inner sides at the intervals d2 from the respective corresponding side edges 10Ac and 10Ad of the movable film 10A.

In plan view, each piezoelectric film 8 is formed to a rectangular shape of the same pattern as an upper electrode 9. That is, the piezoelectric film 8 is formed to be shorter than a movable film 10A along the long direction of the movable film 10A and respective end edges thereof are disposed at inner sides at the predetermined intervals d1 from the respective corresponding end edges 10Aa and 10Ab of the movable film 10A. Also with the piezoelectric film 8, a width along the short direction of the movable film 10A is defined to be narrower than the width of the movable film 10A in the short direction and respective end edges thereof are disposed at inner sides at the intervals d2 from the respective corresponding side edges 10Ac and 10Ad of the movable film 10A. A lower surface of the piezoelectric film 8 contacts an upper surface of the portion of the lower electrode 7 that constitutes the piezoelectric element 6 and an upper surface of the piezoelectric film 8 contacts a lower surface of the upper electrode 9.

Each wiring 15 is constituted of a lead-out portion 15A, having one end portion connected to one end portion (an end portion at the one end edge 6a side of a piezoelectric element 6) of an upper electrode 9 and extending in a direction opposite to the ink flow direction 21 in plan view, and a pad portion 15B of rectangular shape in plan view that is made integral to the lead-out portion 15A and connected to a tip of the lead-out portion 15A. The pad portion 15B is disposed further upstream in the ink flow direction 21 than the one end edge 6a of the piezoelectric element 6. The lead-out portion 15A extends from an upper surface of one end portion (an end portion at the one end edge 6a side of the piezoelectric element 6) of the piezoelectric element 6 and along an end surface of the piezoelectric element 6 continuous to the upper surface, and further extends to the pad portion 15B along the front surface of the movable film formation layer 10. Each passivation film 25 is formed just in a region in which a wiring 15 is present and covers an upper surface and a side surface of the wiring 15. The passivation film 25 has formed therein an opening 26 exposing a central portion of a front surface of the pad portion 15B.

Figure 6D:
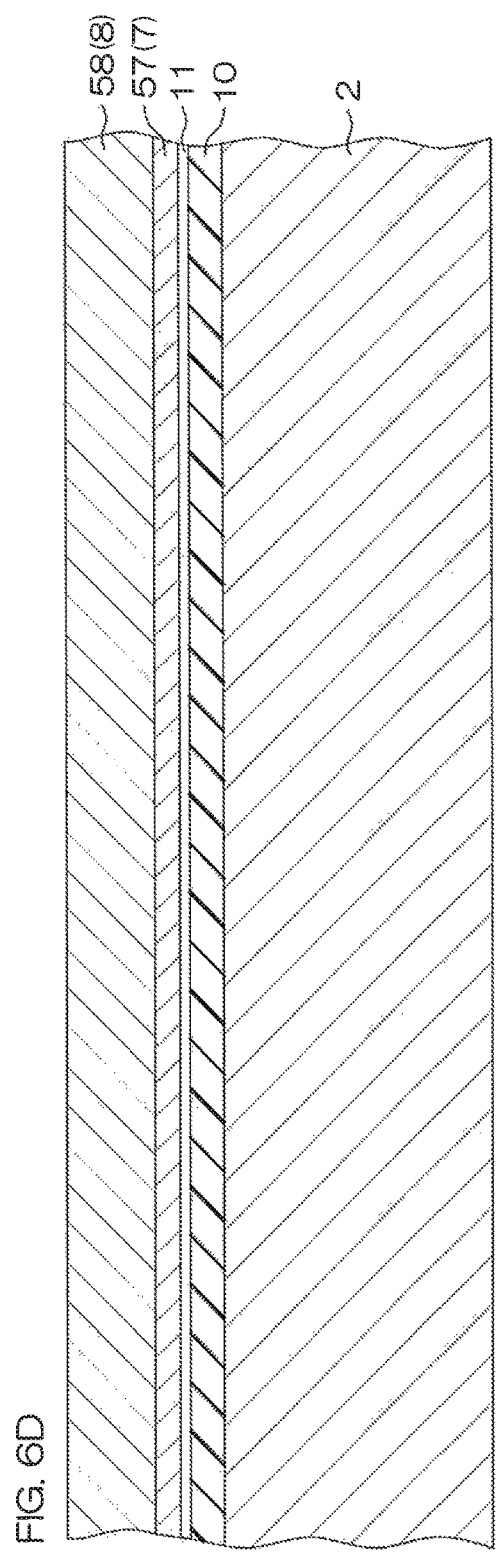
FIG. 6D is a sectional view of a step subsequent to that of FIG. 6C.
Figure 6E:
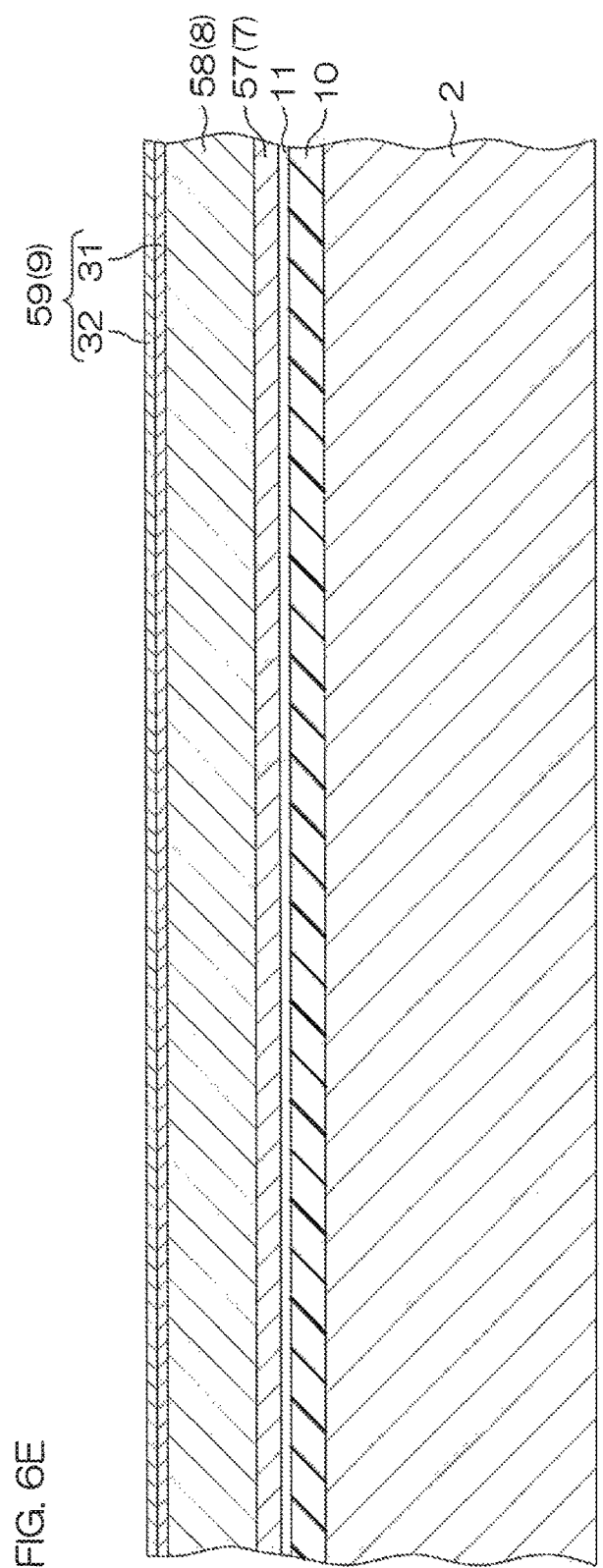
FIG. 6E is a sectional view of a step subsequent to that of FIG. 6D.
Figure 6F:
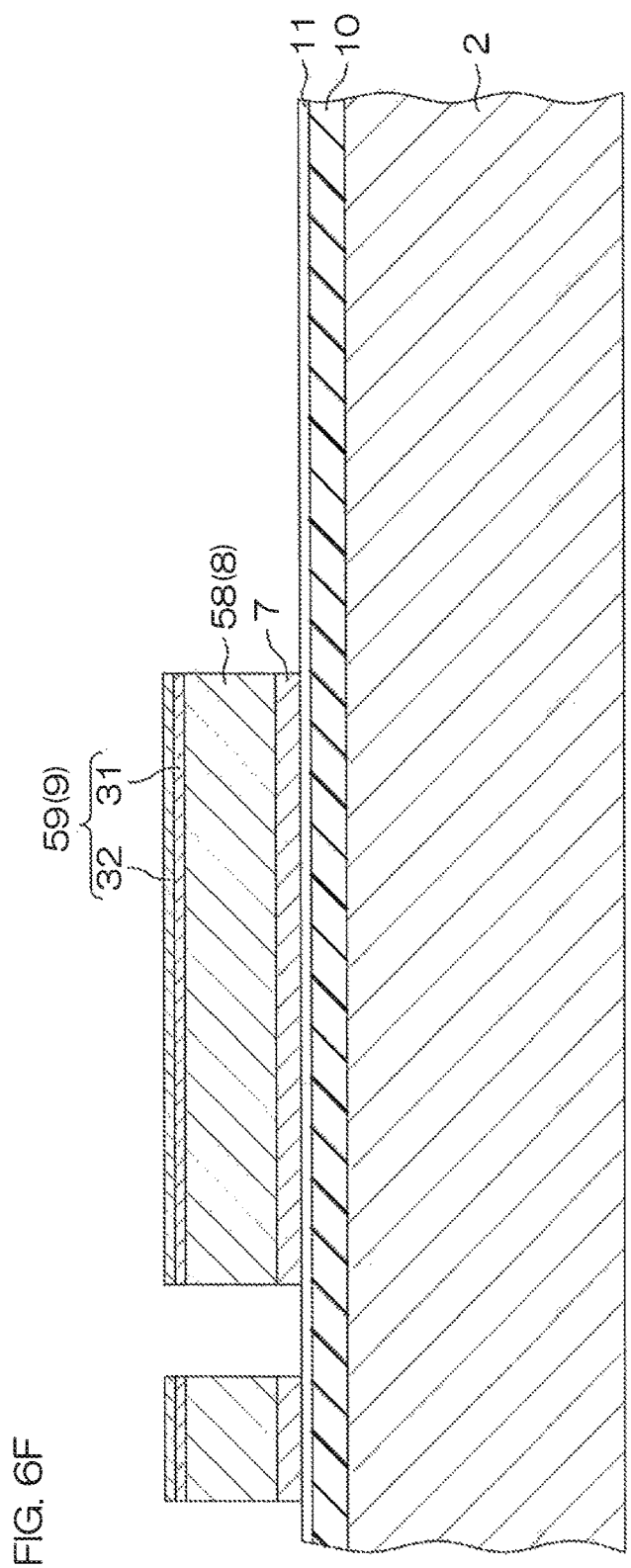
FIG. 6F is a sectional view of a step subsequent to that of FIG. 6E.
Figure 61:
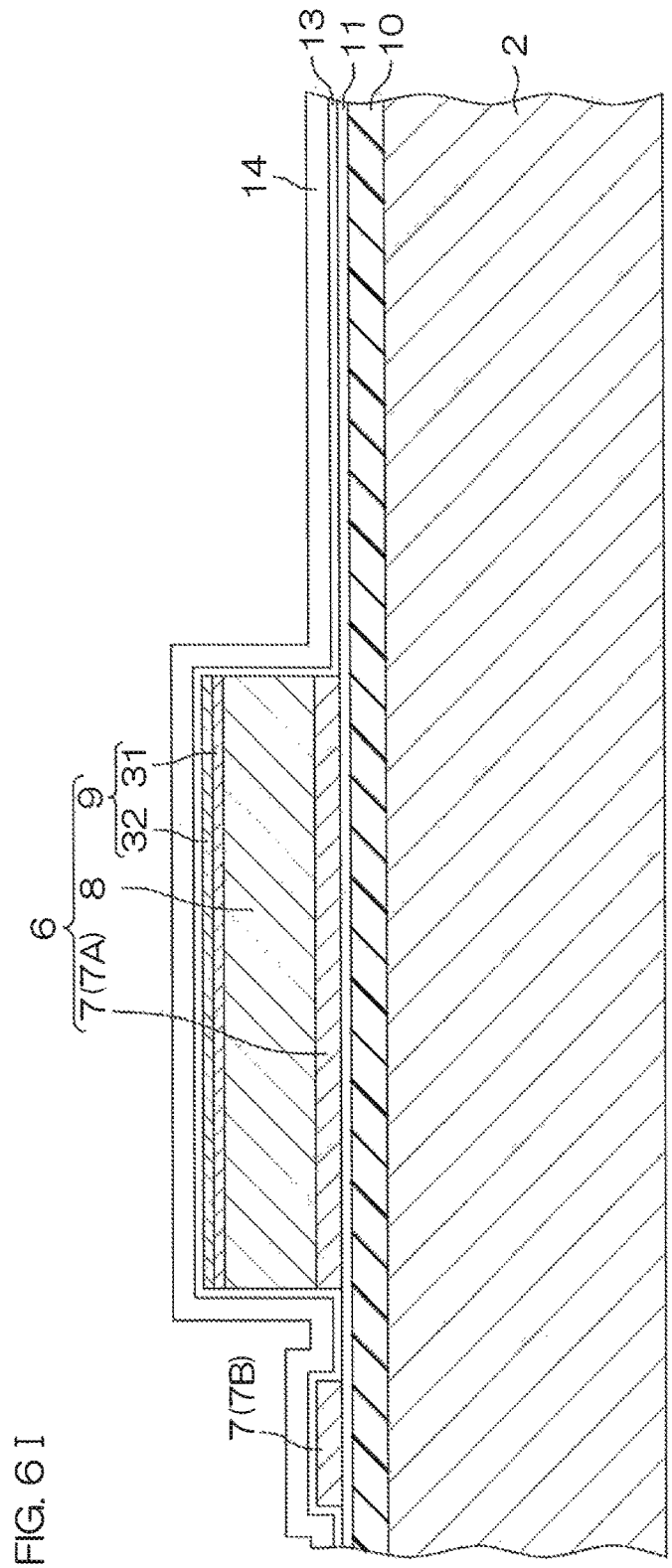
Figure 6J:
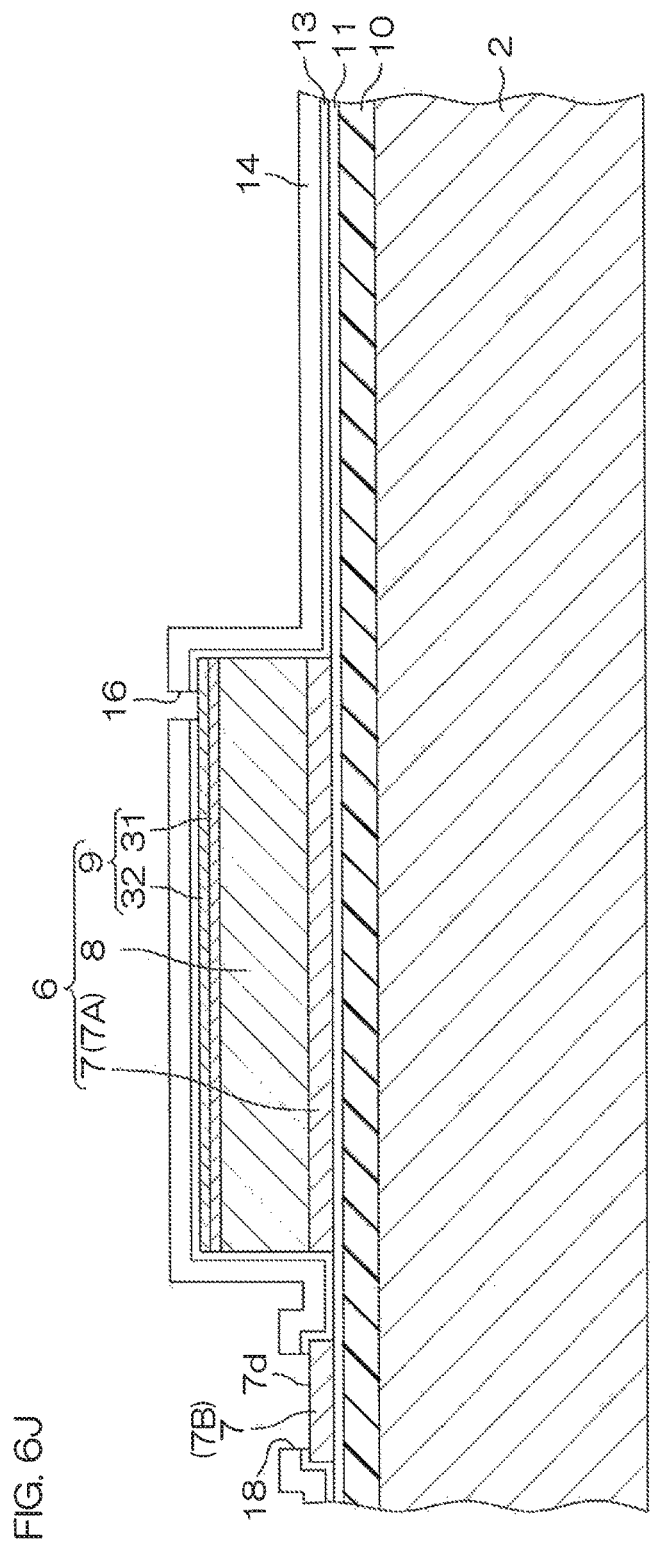
FIG. 6J is a sectional view of a step subsequent to that of FIG. 6I.
Figure 6K:
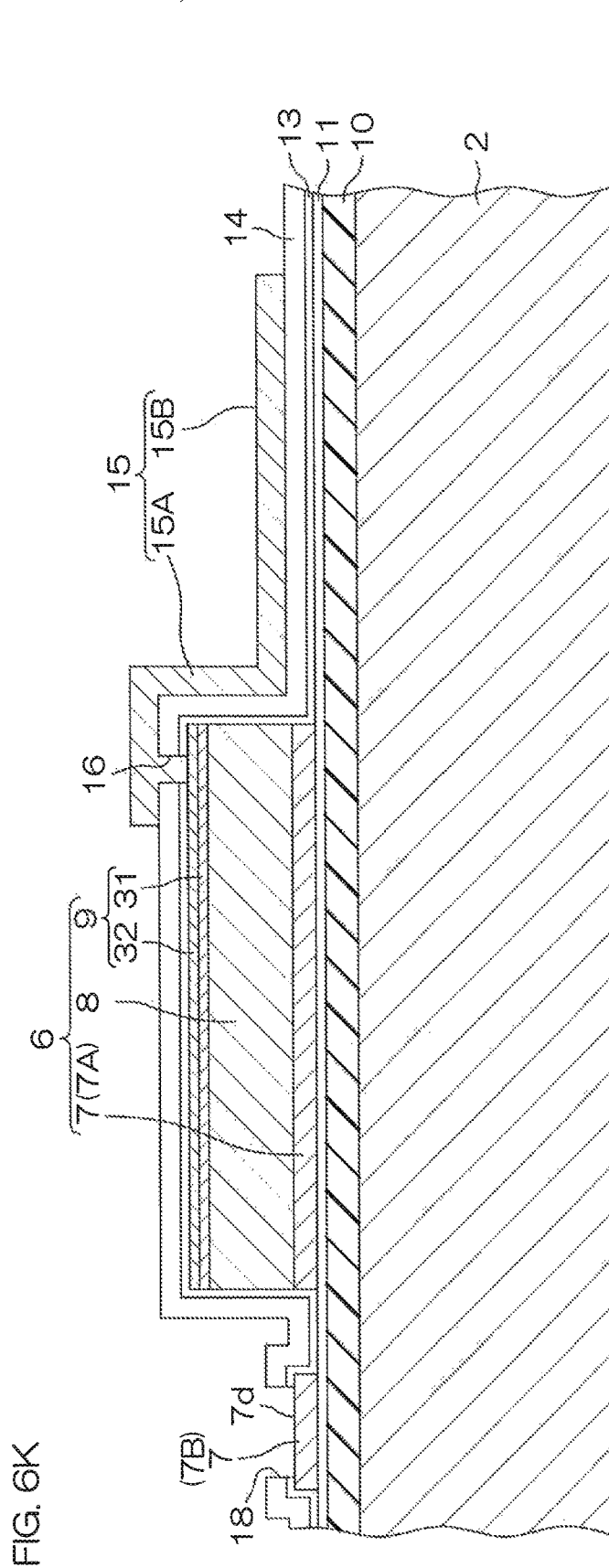
FIG. 6K is a sectional view of a step subsequent to that of FIG. 6J.
Figure 6L:
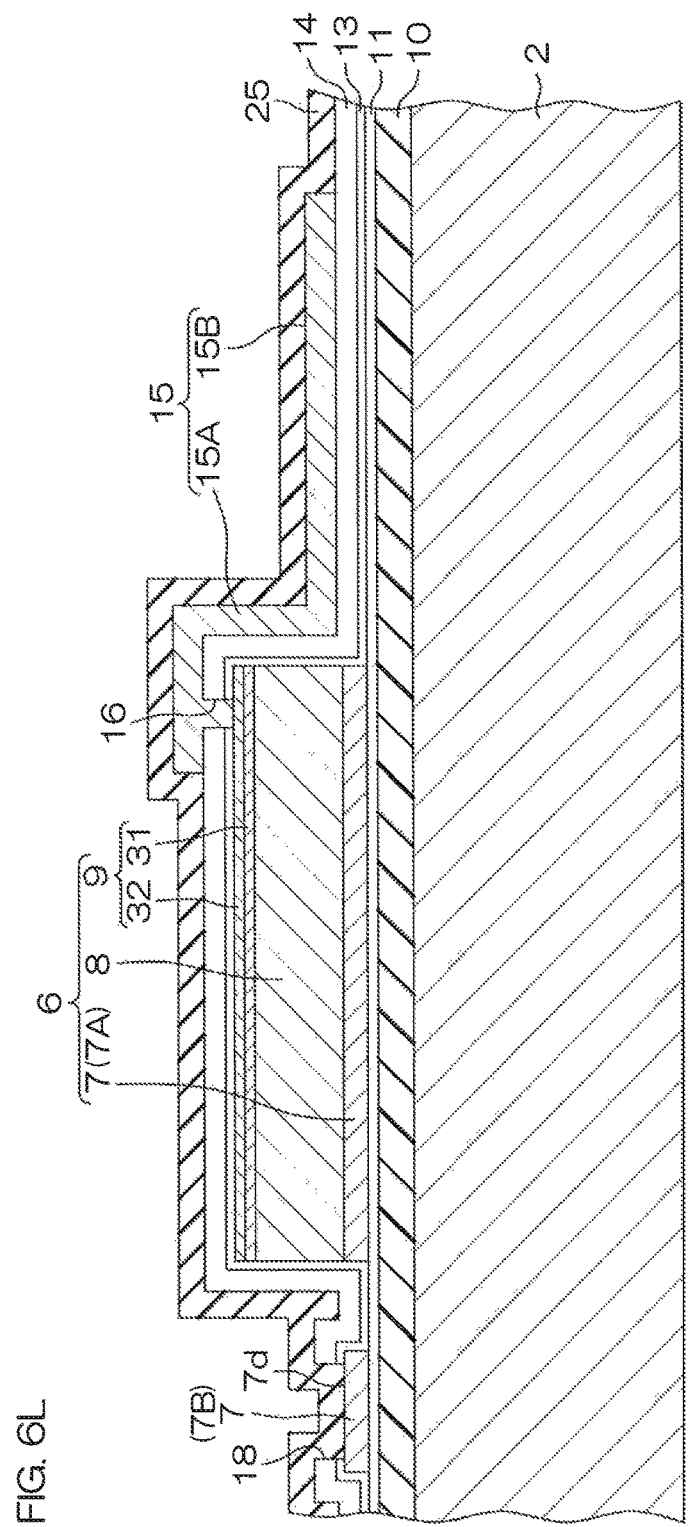
FIG. 6L is a sectional view of a step subsequent to that of FIG. 6K.
Figure 6M:
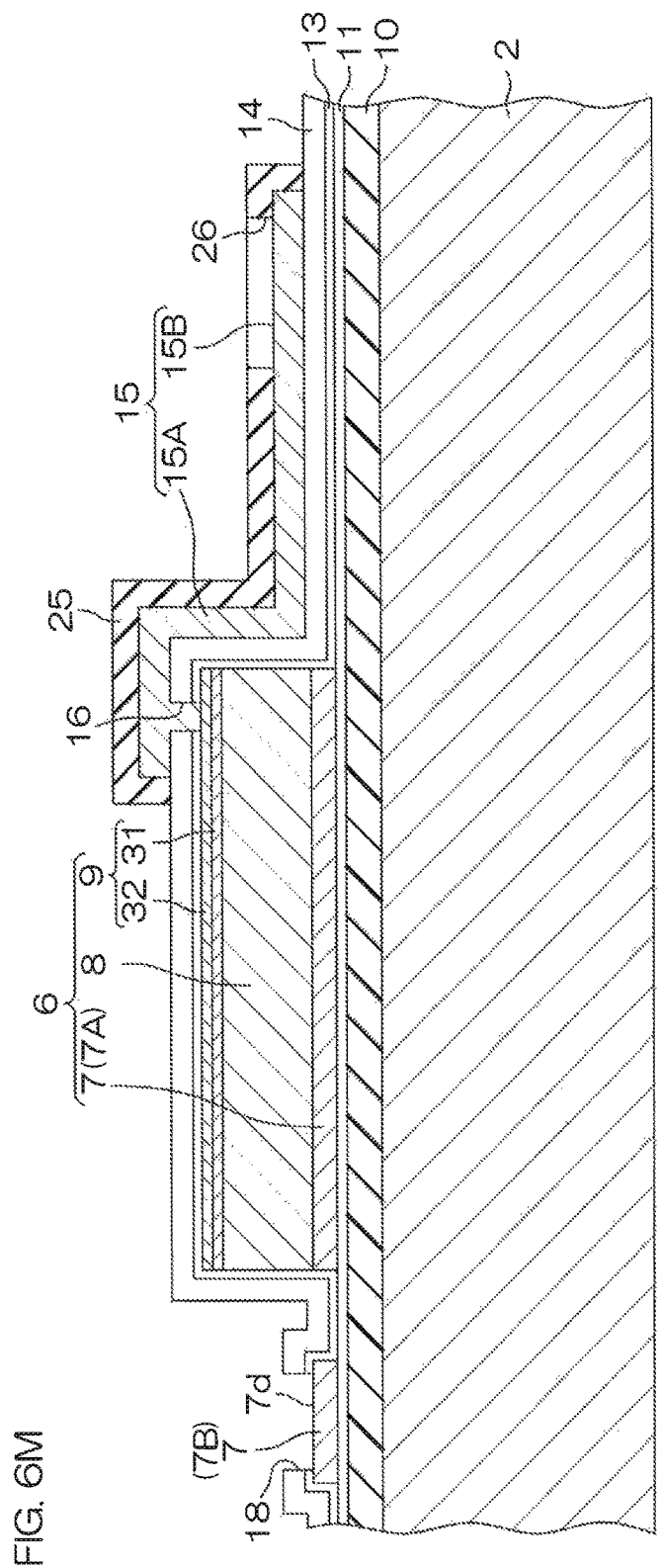
FIG. 6M is a sectional view of a step subsequent to that of FIG. 11L.
Figure 6N:
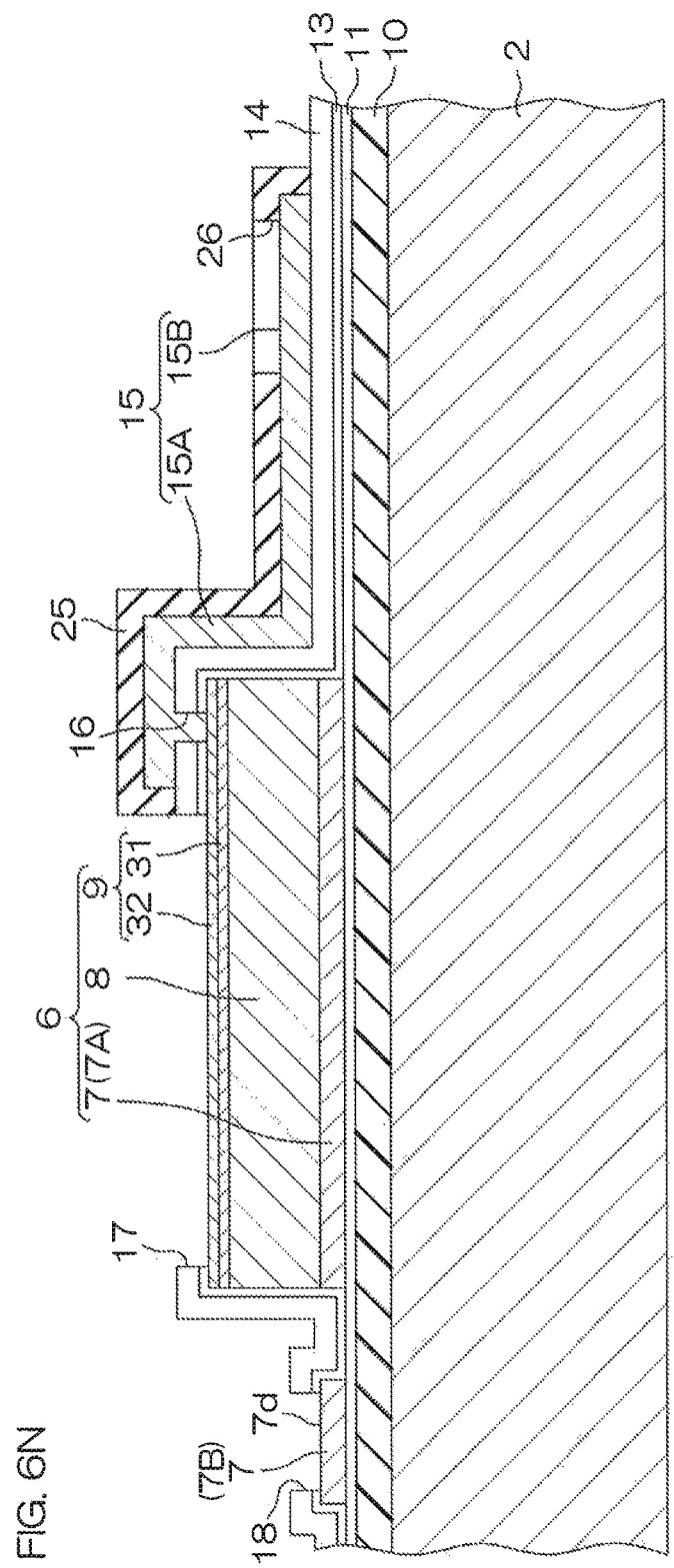
FIG. 6N is a sectional view of a step subsequent to that of FIG. 11M.
Figure 60:
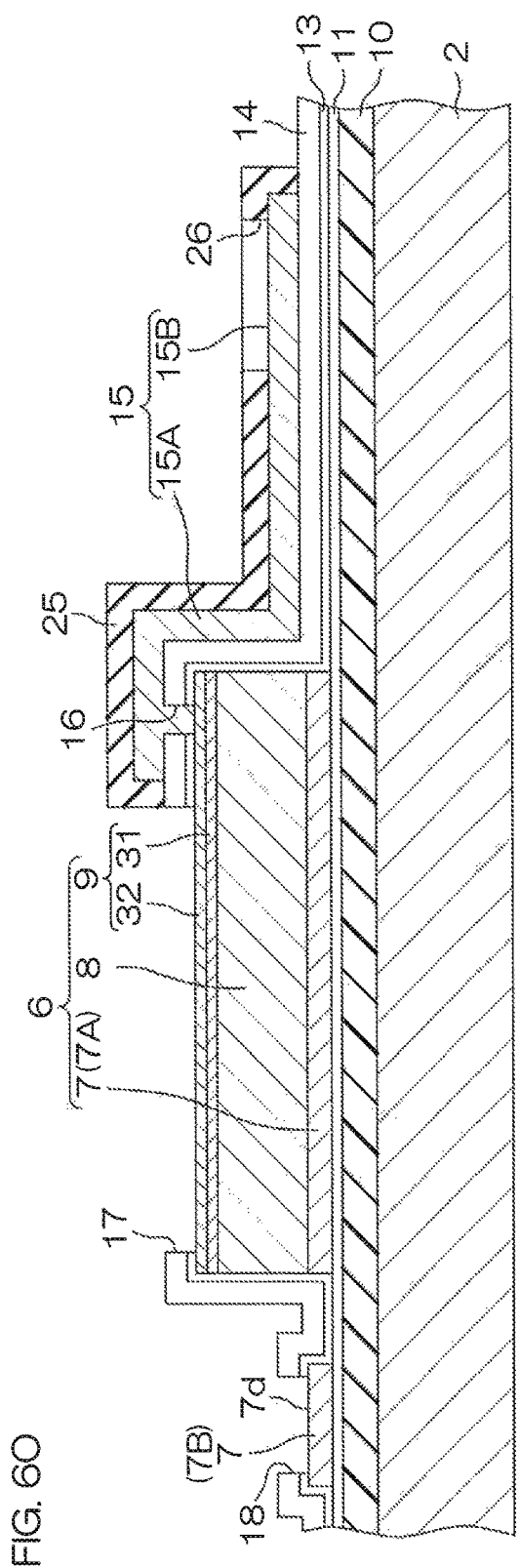
Figure 6P:
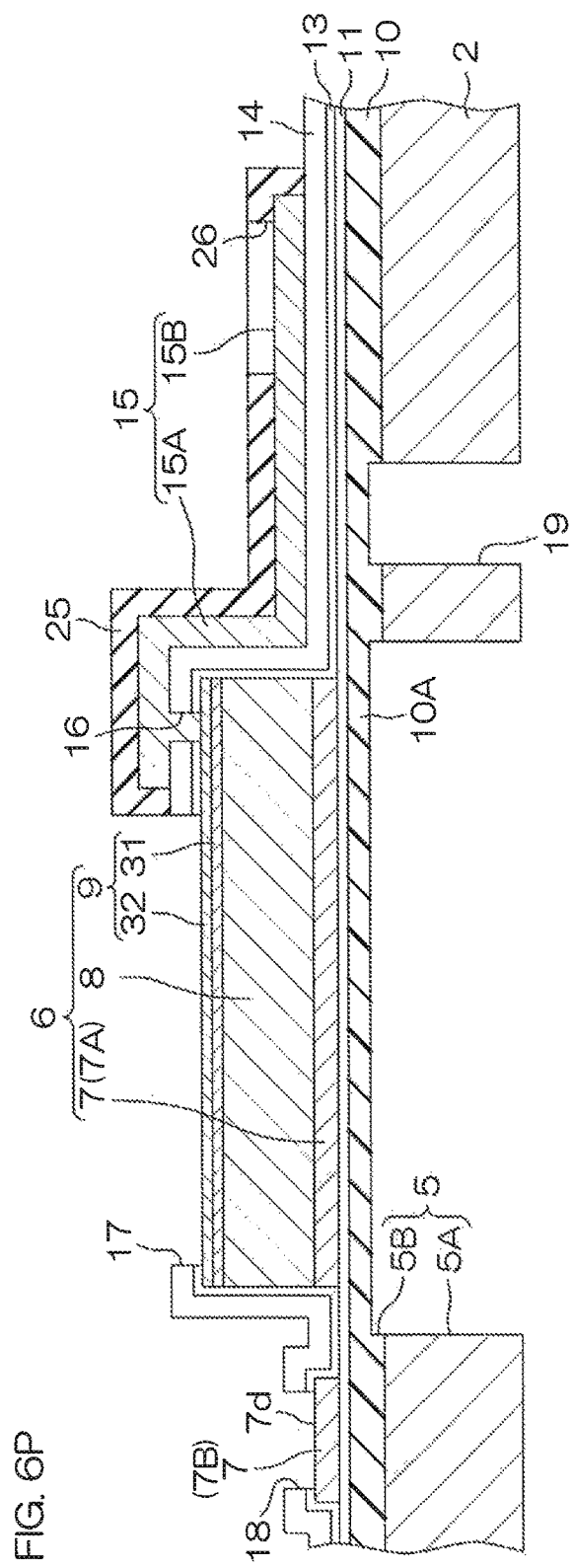
FIG. 6P is a sectional view of a step subsequent to that of FIG. 11O.

FIG. 6A to 6P are sectional views of an example of a process for manufacturing the inkjet printing head 1 and show a section corresponding to FIG. 2.

First, as shown in FIG. 6A, the movable film formation layer 10 is formed on a front surface of the silicon substrate 2. However, as the silicon substrate 2, that which is thicker than the thickness of the silicon substrate 2 at the final stage is used. Specifically, a silicon oxide layer (for example, of 1.2 µm thickness) is formed on the front surface of the silicon substrate 2. If the movable film formation layer 10 is constituted of a laminate of a silicon layer, a silicon oxide layer, and a silicon nitride layer, the silicon layer (for example, of 0.4 µm thickness) is formed on the front surface of the silicon substrate 2, the silicon oxide layer (for example, of 0.4 µm thickness) is formed above the silicon layer, and the silicon nitride layer (for example, of 0.4 µm thickness) is formed above the silicon oxide layer.

Next, as shown in FIG. 6B, the metal barrier film 11, constituted, for example, of $Al_2O_3$, is formed on the front surface of the movable film formation layer 10. The metal barrier film 11 prevents metal atoms (for example, Pb, Zr, and Ti) from escaping from the piezoelectric films 8 that are to be formed later. When metal atoms escape, the piezoelectric films 8 may degrade in piezoelectric characteristics. Also, when metal atoms that have escaped become mixed in the silicon layer constituting the movable film 10A, the movable film 10A may degrade in durability.

Next, a lower electrode film 57, which is a material layer of the lower electrode 7, is formed above the metal barrier film 11 as shown in FIG. 6C. The lower electrode film 57 is constituted, for example, of a Pt/Ti laminated film having a Ti film (for example, of 10 nm to 40 nm thickness) as a lower layer and a Pt film (for example, of 10 nm to 400 nm thickness) as an upper layer. Such a lower electrode film 57 may be formed by the sputtering method.

Next, as shown in FIG. 6D, a material film (piezoelectric material film) 58 of the piezoelectric films 8 is formed on an entire surface above the lower electrode film 57. Specifically, for example, a PZT film of 1 µm to 5 µm thickness is formed by a sol-gel method. Such a PZT film is constituted of a sintered body of metal oxide crystal grains.

Next, as shown in FIG. 6E, an upper electrode film 59, which is a material of the upper electrode 9, is formed on the entire surface of the piezoelectric material film 58. The upper electrode film 59 is constituted of an $IrO_2$/Ir laminated film having the $IrO_2$ film 31 (for example, of 40 nm to 160 nm thickness) as a lower layer and the Ir film 32 (for example, of 40 nm to 160 nm thickness) as an upper layer. Such an upper electrode film 59 may be formed by the sputtering method.

Next, as shown in FIG. 6F and FIG. 6G, patterning of the upper electrode film 59, the piezoelectric material film 58, and the lower electrode film 57 is performed. First, as shown in FIG. 6F, a resist mask with a pattern of the lower electrode 7 is formed by photolithography and using the resist mask as a mask, the upper electrode film 59, the piezoelectric material film 58, and the lower electrode film 57 are etched in the same pattern to thereby form the lower electrode film 57 of a predetermined pattern. More specifically, the upper electrode film 59 is patterned by dry etching, the piezoelectric material film 58 is patterned by wet etching, and the lower electrode film 57 is patterned by dry etching. The lower electrode 7 is thereby formed. An etchant used in the wet etching of the piezoelectric material film 58 may be an acid having hydrochloric acid as a main component.

Then, after peeling off the resist mask, a resist mask with a pattern of the piezoelectric films 8 is formed by photolithography and using the resist pattern, the upper electrode film 59 and the piezoelectric material film 58 are etched in the same pattern. More specifically, the upper electrode film 59 is patterned by dry etching and the piezoelectric material film 58 is patterned by wet etching. The piezoelectric films 8 and the upper electrodes 9 are thereby formed as shown in FIG. 6G. The piezoelectric elements 6, each constituted of the main electrode portion 7A of the lower electrode, the piezoelectric film 8, and the upper electrode 9, are thereby formed as shown in FIG. 6G.

Then, after peeling off the resist mask, the hydrogen barrier film 13 covering the entire surface is formed as shown in FIG. 6H. The hydrogen barrier film 13 may be an $Al_2O_3$ film formed by the sputtering method and may have a film thickness of 40 nm to 160 nm.

Next, as shown in FIG. 6I, the interlayer insulating film 14 is formed on the entire surface above the hydrogen barrier film 13. The interlayer insulating film 14 may be an $SiO_2$ film and may have a film thickness of 250 nm to 1000 nm.

Next, as shown in FIG. 6J, the penetrating holes 16 and the opening 18 are formed in both the interlayer insulating film 14 and the hydrogen barrier film 13.

Next, a wiring film that constitutes the wirings 15 is formed above the interlayer insulating film 14, including the interiors of the penetrating holes 16. Thereafter, the wiring film is patterned by photolithography and etching to form the wirings 15 connected to the upper electrodes 9 as shown in FIG. 6K.

Next, as shown in FIG. 6L, the passivation film 25 is formed on the front surface of the interlayer insulating film 14 and the front surfaces of the wiring films 15.

Next, a resist mask, covering the upper surfaces of the wirings 15 and regions in vicinities thereof and having openings corresponding to the openings 26, is formed by photolithography, and using the resist mask as a mask, the passivation film 25 is etched. Of the passivation film 25, regions besides the regions covering the wirings 15 and regions corresponding to the openings 26 are thereby removed. Passivation films 25, each covering the upper surface and the side surface of a wiring 15 and having an opening 26, are thereby left just in regions in which the wirings 15 are present as shown in FIG. 6M. Then, after peeling off the resist mask, organic matter is removed using an alkaline processing liquid.

Next, as shown in FIG. 6N, the openings 17 are formed in the interlayer insulating film 14 and the hydrogen barrier film 13 at upper surface centers of the upper electrodes 9. Specifically, first, a resist mask having openings corresponding to the openings 17 is formed by photolithography, and using the resist mask as a mask, the interlayer insulating film 14 is etched. The openings 17 are thereby formed in the interlayer insulating film 14. Thereafter, using the resist mask as a mask, the hydrogen barrier film 13 is etched. The openings 17 are thereby formed in the hydrogen barrier film 13. Then, after peeling off the resist mask, organic matter is removed using the alkaline processing liquid.

Next, as shown in FIG. 6O, rear surface grinding for thinning the silicon substrate 2 is performed. The silicon substrate 2 is made thin by the silicon substrate 2 being ground from the rear surface. For example, the silicon substrate 2 with a thickness of approximately 670 µm in the initial state may be thinned to a thickness of approximately 300 µm.

Next, as shown in FIG. 6P, etching (dry etching or wet etching) from the rear surface of the silicon substrate 2 is performed on the laminate of the silicon substrate 2 and the movable film formation layer 10 to form the pressure chambers 5, the ink supply passages 4, and the common ink passage 19 and form the movable films 10A at the same time. In the etching process, the metal barrier film 11 formed on the front surfaces of the hydrogen barrier film 13 and the movable film formation layer 10 prevents the escaping of metal elements (Pb, Zr, and Ti in the case of PZT) from the piezoelectric films 8 and keeps the piezoelectric characteristics of the piezoelectric films 8 in a satisfactory state. Also as mentioned above, the metal barrier film 11 formed on the front surface of the movable film formation layer 10 contributes to maintaining the durability of silicon layer that forms the movable films 10A.

Thereafter, although not shown in FIG. 6, the nozzle substrate 3 is adhered onto the rear surface of the silicon substrate 2 and the inkjet printing head 1 shown in FIG. 1A to FIG. 4 is thereby obtained.

FIG. 7A to FIG. 7E are sectional views of a manufacturing process of a comparative example with which portions of the interlayer insulating film 14 besides the regions in which the wirings are present are removed in the inkjet printing head 1.

Figure 7A:
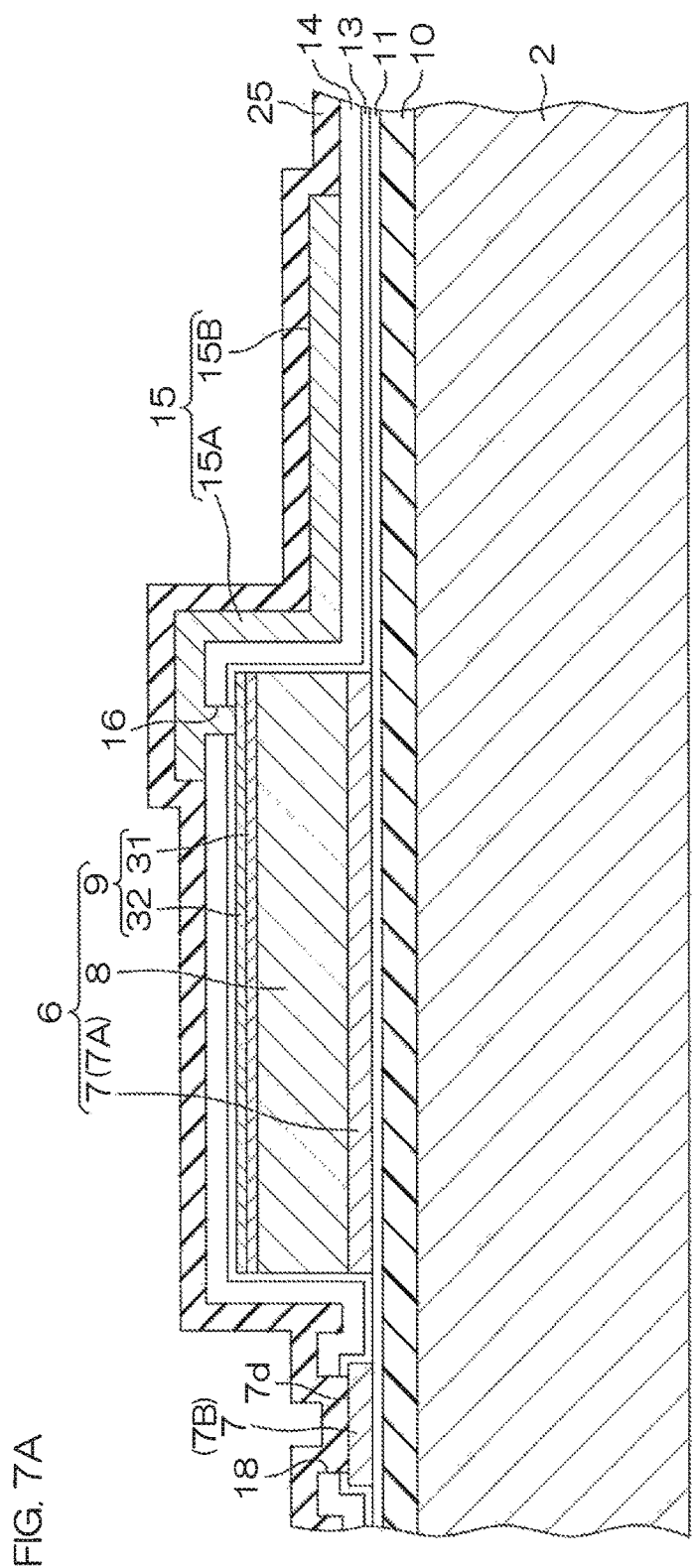
FIG. 7A is a sectional view of an example of a manufacturing process of a comparative example.

The processes of FIG. 6A to FIG. 6M described above are the same in the comparative example as well. FIG. 7A corresponds to FIG. 6L and FIG. 7B corresponds to FIG. 6M.

In FIG. 7A, the passivation film 25 is formed on the entire surface above the interlayer insulating film 14 as described above.

Figure 7B:
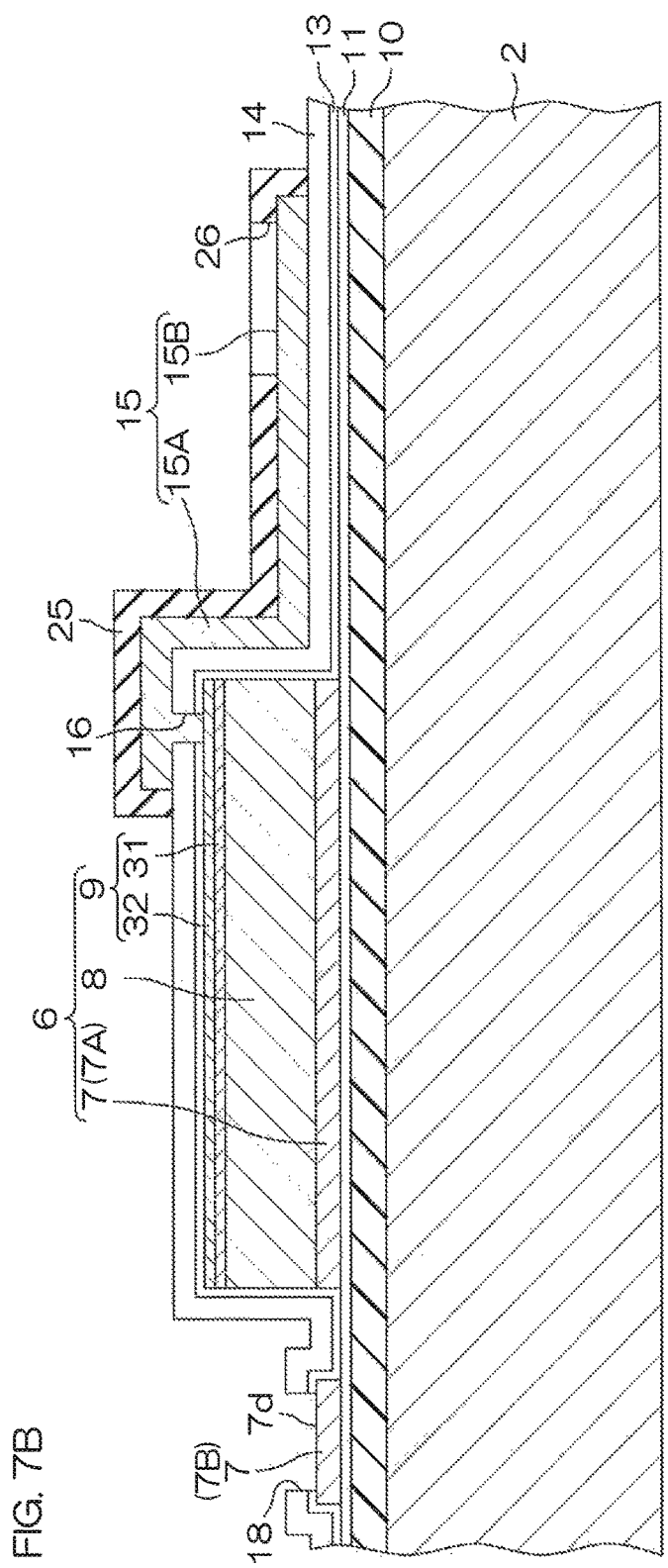
FIG. 7B is a sectional view of a step subsequent to that of FIG. 7A.

Next, a resist mask, covering the upper surfaces of the wirings 15 and regions in vicinities thereof and having openings corresponding to the openings 26, is formed by photolithography, and using the resist mask as a mask, the passivation film 25 is etched. Of the passivation film 25, regions besides the regions covering the wirings 15 and regions corresponding to the openings 26 are thereby removed. Passivation films 25, each covering the upper surface and the side surface of a wiring 15 and having an opening 26, are thereby left just in regions in which the wirings 15 are present as shown in FIG. 7B. Then, after peeling off the resist mask, organic matter is removed using the alkaline processing liquid.

Next, as shown in FIG. 7C, a resist mask covering the passivation films 25 and the openings 26 is formed and using the resist mask as a mask, the interlayer insulating film 14 is etched. Portions of the interlayer insulating film 14 besides the regions in which the wirings are present are thereby removed. Then, after peeling off the resist mask, organic matter is removed using the alkaline processing liquid.

Figure 7D:
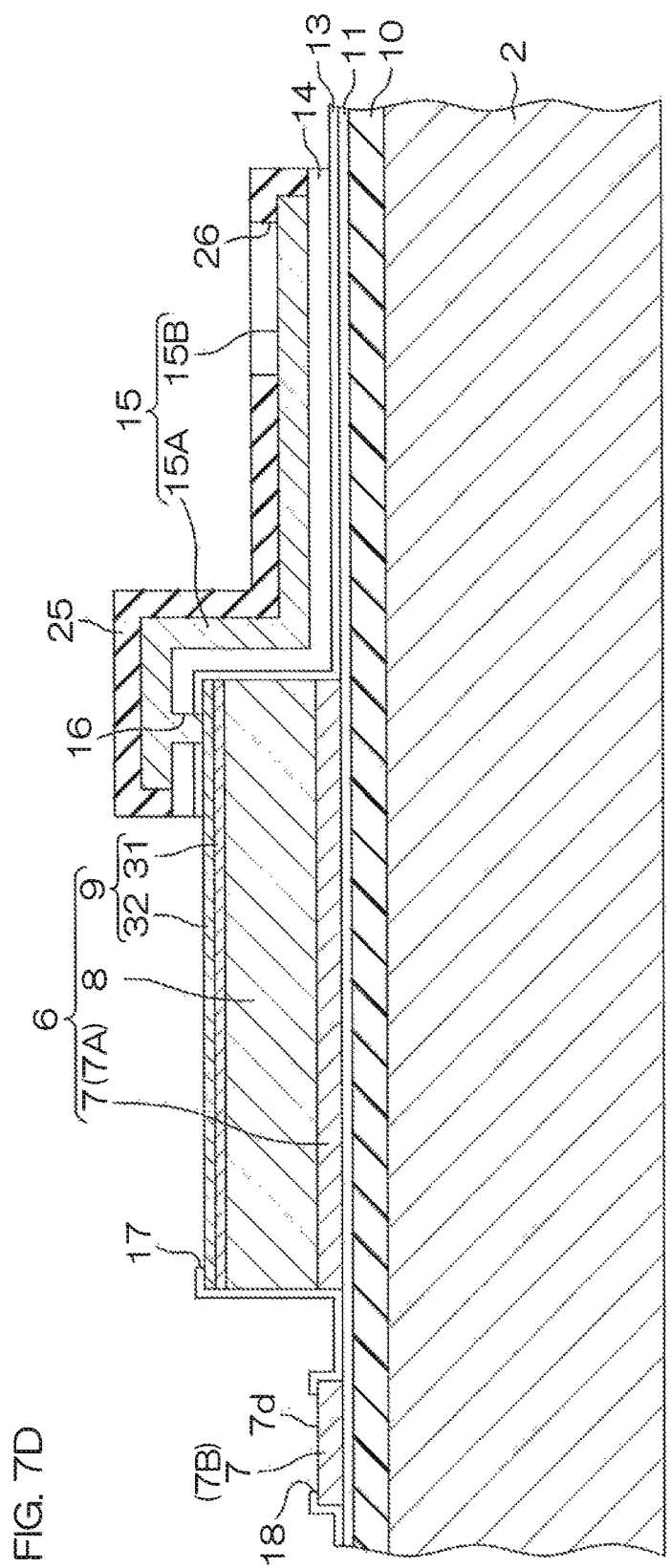
FIG. 7D is a sectional view of a step subsequent to that of FIG. 7C.
Figure 7E:
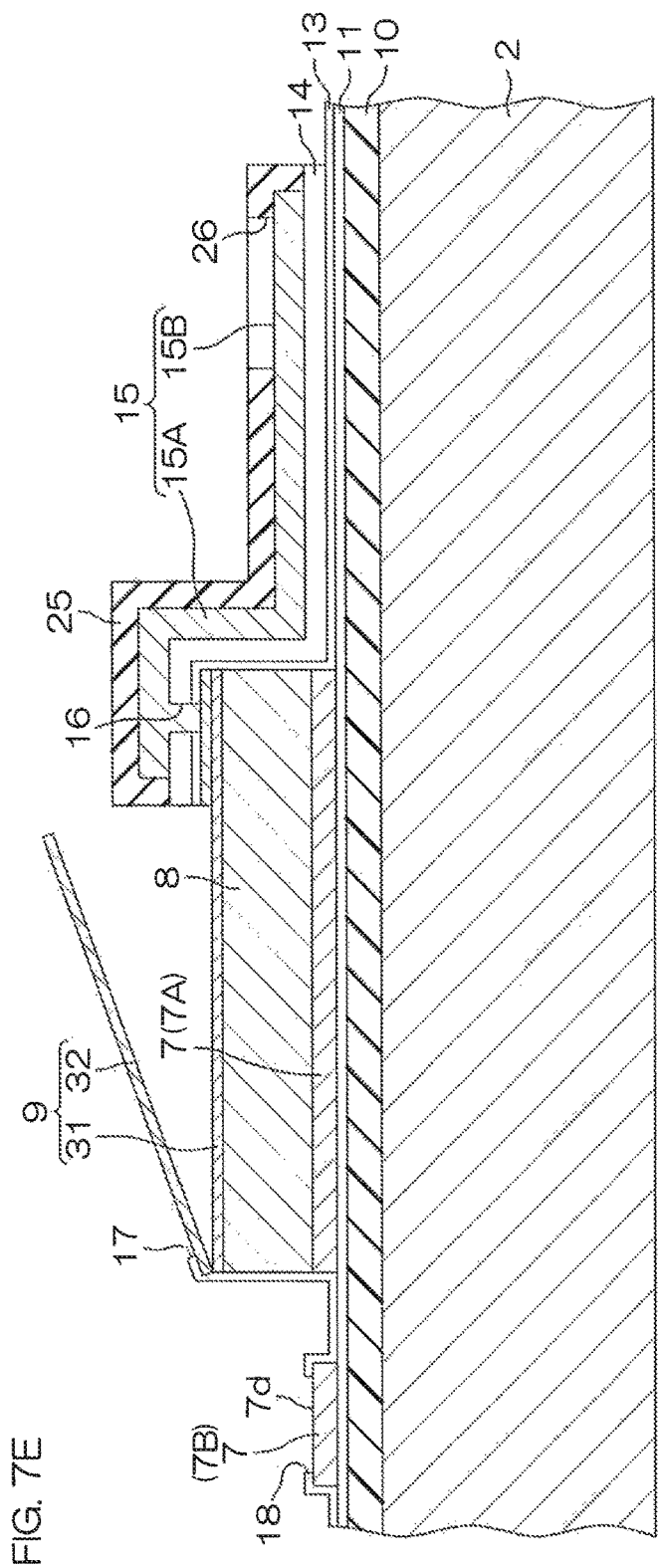
FIG. 7E is a sectional view showing a manner in which an Ir film of an upper electrode becomes peeled off from an $IrO_2$ film after the step of FIG. 7D.

Next, as shown in FIG. 7D, the openings 17 are formed in the hydrogen barrier film 13 at upper surface central regions of the upper electrodes 9. Specifically, a resist mask having openings corresponding to the openings 17 is formed by photolithography, and using the resist mask as a mask, the hydrogen barrier film 13 is etched. The openings 17 are thereby formed in the hydrogen barrier film 13.

With such a comparative example, the Ir film 32 of an upper electrode 9 peeled off from the IrO$_2$ film 31. There was also a case where an entire upper electrode 9 peeled off from the piezoelectric film 8.

The reason why the upper electrode 9 peels off in the comparative example is considered to be as follows. The hydrogen barrier film 13 formed by the sputtering method is thin in film thickness at the side surfaces of the piezoelectric elements 6 (piezoelectric films 8) and therefore is not necessarily sufficient in coverage. Also, the hydrogen barrier film 13 is damaged in the patterning process for removing portions of the interlayer insulating film 14 besides the regions in which the wirings 15 are present (process of FIG. 7C). Due to the patterning of the interlayer insulating film 14, substantially the entirety of the side surface of each piezoelectric element 6 is covered by just the hydrogen barrier film 13 that is thin and has been damaged. In this state, the organic matter removal using the alkaline processing liquid is performed after the peeling off of the resist and therefore the alkaline processing liquid permeates from the side surface of each upper electrode 9 to an interface of the Ir film 32 and the IrO$_2$ film 31 and an interface of the IrO$_2$ film 31 and a piezoelectric film 8 and causes a chemical reaction (cell reaction) to cause peeling off of the upper electrode 9.

With the preferred embodiment described above, there is no patterning process of removing the portions of the interlayer insulating film 14 besides the regions in which the wirings 15 are present as in the comparative example. The organic matter removal using the alkaline processing liquid is thus not performed in a state where substantially the entirety of the side surface of each piezoelectric element 6 is covered by just the hydrogen barrier film 13. Peeling off of an upper electrode 9 thus does not occur as in the comparative example.

Also with the preferred embodiment described above, the passivation films 25 are formed just at portions at which the wirings 15 are present and large portions of the side surface and the upper surface of each piezoelectric element 6 are not covered by a passivation film 25. Displacement of the movable film 10A can thus be increased in comparison to the conventional example described in Japanese Patent Application Publication No. 2013-119182 in which entireties of the side surface and the upper surface of each piezoelectric element 6 is covered by a passivation film 25. Further, with the preferred embodiment described above, the openings 17 are formed in the hydrogen barrier film 13 and the interlayer insulating film 14 at the upper surface central portions of the piezoelectric elements 6 and therefore the displacement of the movable film 10A can be increased in comparison to the conventional example described in Japanese Patent Application Publication No. 2013-119182 in which entire upper surfaces of the piezoelectric elements 6 are covered by the hydrogen barrier film 13 and the interlayer insulating film 14.

Figure 8:
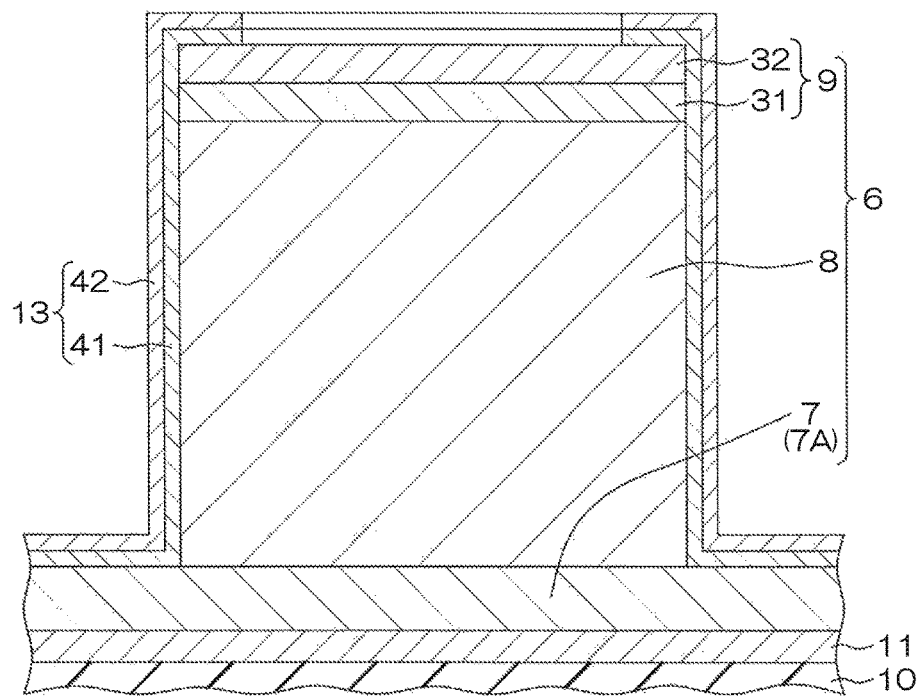
FIG. 8 is an enlarged sectional view of a modification example of the hydrogen barrier film.

Although a preferred embodiment of the first invention has been described above, the first invention may be implemented in yet other preferred embodiments. With the preferred embodiment described above, the hydrogen barrier film 13 is constituted of a sputtered film made of Al$_2$O$_3$. However, as shown in FIG. 8, the hydrogen barrier film 13 may have a structure where an Al$_2$O$_3$ film (sputtered film) 41, formed by the sputtering method, and an Al$_2$O$_3$ film (ALD film) 42, formed by atomic layer deposition (ALD), are laminated. FIG. 8 is an enlarged section corresponding to the section of FIG. 3. In FIG. 8, portions corresponding to respective portions in FIG. 3 described above are provided with the same symbols as in FIG. 3.

The sputtered film 41 is high in barrier property against hydrogen but is low in covering property. On the other hand, the ALD film 42 is high in covering property but is low in barrier property against hydrogen. Therefore, as shown in FIG. 8, by the hydrogen barrier film 13 being constituted of the laminated film of the sputtered film 41 and the ALD film 42, the hydrogen barrier film 13 that is high in barrier property against hydrogen and high in covering property can be obtained. Degradation of characteristics due to hydrogen reduction of the piezoelectric films 8 can thereby be prevented effectively.

Also, although with the preferred embodiment described above, PZT was cited as an example of the material of the piezoelectric film, a piezoelectric material besides this that is constituted of a metal oxide as represented by lead titanate ($PbPO_3$), potassium niobate ($KNbO_3$), lithium niobate ($LiNbO_3$), lithium tantalate ($LiTaO_3$), etc., may be applied instead.

Also, although with the preferred embodiment described above, recesses 5B, each defining a portion of a pressure chamber 5, are formed in the rear surface of the movable film formation layer 10, the recesses 5B do not have to be formed. In this case, each pressure chamber 5 is constituted of just a space portion 5A formed in the silicon substrate 2.

Besides the above, various design changes may be applied within the scope of the matters described in the claims.

[2] Second to Fourth Inventions

[2-1] An object of a second invention is to provide a piezoelectric actuator upper electrode with which a high hydrogen barrier effect is obtained and a piezoelectric actuator including the same.

The second invention has the following features.

A1. A piezoelectric actuator upper electrode having a structure where a metal film and a conductive oxide film are alternately laminated repeatedly at least two or more times.

A conductive oxide film becomes reduced when hydrogen enters it and therefore has a function of trapping or blocking hydrogen. Although a metal film is somewhat high in density and has barrier performance against oxygen and hydrogen, it is polycrystalline and therefore hydrogen may enter from a grain boundary. Therefore, by alternately laminating a conductive oxide film and a metal film repeatedly at least two or more times, an upper electrode of high hydrogen barrier property is obtained. That is, with the second invention, a high hydrogen barrier effect is obtained with a thinner overall film thickness than when the upper electrode is formed thickly with a metal single film.

A2. The piezoelectric actuator upper electrode according to "A1.," where the metal film is an Ir film and the conductive oxide film is an $IrO_2$ film.

A3. The piezoelectric actuator upper electrode according to "A2.," where the metal film and the conductive oxide film are alternately laminated repeatedly two times.

A4. A piezoelectric actuator including a substrate having a cavity, a movable film held on the substrate so as to face the cavity, and a piezoelectric element formed on a surface of the movable film at an opposite side from the cavity, and where the piezoelectric element includes a lower electrode, formed on the surface of the movable film at the opposite side from the cavity, the upper electrode according to any one of "A1." to "A3." that is disposed at an opposite side from the movable film with respect to the lower electrode, and a piezoelectric film provided between the lower electrode and the upper electrode.

With this arrangement, a piezoelectric actuator that includes an upper electrode with a high hydrogen barrier property is obtained. Degradation of characteristics of the piezoelectric film due to hydrogen reduction can thereby be prevented.

A5. The piezoelectric actuator according to "A4.," where the movable film is formed to a rectangular shape in a plan view as viewed from a direction normal to a major surface of the movable film and the piezoelectric film, in the plan view, is a rectangle having a width shorter than a width in a short direction of the movable film and a length shorter than a length in a long direction of the movable film, with both end edges and both side edges thereof being receded further toward an interior of the movable film than both end edges and both side edges, respectively, of the movable film, and the upper electrode, in the plan view, is a rectangle having a width shorter than the width in a short direction of the movable film and a length shorter than the length in a long direction of the movable film, with both end edges and both side edges thereof being receded further toward the interior of the movable film than both end edges and both side edges, respectively, of the movable film.

With this arrangement, the piezoelectric film and the upper electrode are not disposed above a peripheral edge portion of the movable film and therefore the movable film can be made large in displacement.

A6. The piezoelectric actuator according to "A4." or "A5.," including a hydrogen barrier film covering an entirety of a side surface of the piezoelectric film. With this arrangement, degradation of characteristics of the piezoelectric film due to hydrogen reduction can be suppressed further.

A7. The piezoelectric actuator according to "A6.," where the hydrogen barrier film has a structure in which at least two types of sputtered films, formed under different conditions, are laminated. With this arrangement, the hydrogen barrier film is arranged from a laminated film of at least two types of sputtered films that differ in characteristics and the hydrogen barrier property of the hydrogen barrier film can thus be improved. Degradation of characteristics of the piezoelectric film due to hydrogen reduction can thereby be suppressed further.

A8. The piezoelectric actuator according to "A7.," where the conditions are the pressures when the at least two types of sputtered films are formed.

A9. The piezoelectric actuator according to "A8.," where the at least two types of sputtered films are arranged from a first sputtered film constituted of $Al_2O_3$ and a second sputtered film constituted of $Al_2O_3$ and formed under a condition differing from that of the first sputtered film.

A10. The piezoelectric actuator according to "A9.," where the pressure when the first sputtered film is formed is not less than 0.01 Pa and less than 0.1 Pa and the pressure when the second sputtered film is formed is not less than 0.1 Pa and not more than 3.0 Pa.

A11. The piezoelectric actuator according to "A9." or "A10.," where the first sputtered film has a film thickness of not less than 10 nm and not more than 100 nm, the second sputtered film has a film thickness of not less than 10 nm and not more than 100 nm, and the total of the film thicknesses of the first sputtered film and the second sputtered film is not more than 100 nm.

A12. The piezoelectric actuator according to "A6.," where the hydrogen barrier film has a structure in which a sputtered film and a plasma CVD film are laminated successively from the piezoelectric film side.

Although a sputtered film has a good hydrogen barrier property, it does not have a very good covering property with respect to the side surface of the piezoelectric film. Also with a sputtered film, pinholes form readily when there is unevenness on the surface of the piezoelectric film. On the other hand, although being poor in hydrogen barrier property in comparison to a sputtered film, a plasma CVD film can readily wrap around the side surface of the piezoelectric film and is also high in the ability to fill pinholes. Therefore, with an arrangement where a sputtered film and a plasma CVD film are laminated, the hydrogen barrier effect can be improved in comparison to an arrangement where the hydrogen barrier film is formed with just a sputtered film if the hydrogen barrier film thickness is the same in both arrangements. Degradation of characteristics of the piezoelectric film due to hydrogen reduction can thereby be suppressed further.

A13. The piezoelectric actuator according to "A12.," where the sputtered film is constituted of an $Al_2O_3$ film and the plasma CVD film is constituted of an SiN film.

A14. The piezoelectric actuator according to "A13.," where the sputtered film has a film thickness of not less than 10 nm and not more than 100 nm, the plasma CVD film has a film thickness of not less than 10 nm and not more than 100 nm, and the total of the film thicknesses of the sputtered film and the plasma CVD film is not more than 100 nm.

[2-2] An object of a third invention is to provide a device using a piezoelectric film with which a displacement of a movable film can be made large.

The third invention has the following features.

B1. A device using a piezoelectric element including a substrate having a cavity, a movable film held on the substrate so as to face the cavity, and a piezoelectric element formed above the movable film, and where the piezoelectric element includes a lower electrode, formed on a surface of the movable film at an opposite side from the cavity, an upper electrode disposed at an opposite side from the movable film with respect to the lower electrode, and a piezoelectric film provided between the lower electrode and the upper electrode and the upper electrode has a thin film portion along the cavity edge.

With this arrangement, the upper electrode is readily bendable because the upper electrode has the thin film portion formed along the cavity edge. The movable film is thereby made to undergo warping deformation readily during driving of the piezoelectric element and the movable film can thus be made large in displacement.

B2. The device using the piezoelectric element according to "B1.," where the upper electrode includes a first electrode film, formed above the piezoelectric film, and a second electrode film, formed above the first electrode film and made of a material differing from the first electrode film, a groove along the cavity edge is formed on a front surface of the second electrode film, and a portion of the upper electrode at which the groove is formed constitutes the thin film portion.

B3. The device using the piezoelectric element according to "B2.," where the groove penetrates through the second electrode film.

B4. The device using the piezoelectric element according to "B3.," where a recess matching the groove is formed on a front surface of the first electrode film.

B5. The device using the piezoelectric element according to "B2.," where the groove does not penetrate through the second electrode film.

B6. The device using the piezoelectric element according to any one of "B2." to "B6.," where a Young's modulus of the first electrode film is greater than a Young's modulus of the second electrode film.

B7. The device using the piezoelectric element according to any one of "B2." to "B6.," where the first electrode film is constituted of $IrO_2$ and the second electrode film is constituted of Ir.

B8. The device using the piezoelectric element according to "B1.," where the upper electrode is arranged from a metal single film, a groove along the cavity edge is formed on a front surface of the upper electrode, and the portion of the upper electrode at which the groove is formed constitutes the thin film portion.

B9. The device using the piezoelectric element according to "B8.," where the metal single film is an Ir film.

B10. The device using the piezoelectric element according to any one of "B2." to "B9.," where the groove is formed as a stripe.

B11. The device using the piezoelectric element according to any one of "B2." to "B9.," where the groove is formed as a mesh.

B12. The device using the piezoelectric element according to any one of "B2." to "B11.," where a transverse sectional shape of the groove is a rectangle.

B13. The device using the piezoelectric element according to any one of "B2." to "B11.," where a transverse sectional shape of the groove is a trapezoid.

B14. The device using the piezoelectric element according to any one of "B2." to "B11.," where a transverse sectional shape of the groove is a V-shape.

B15. The device using the piezoelectric element according to any one of "B2." to "B14.," where the cavity is formed to a rectangular shape in a plan view as viewed from a direction normal to a major surface of the movable film, the movable film is formed to a rectangular shape matching the cavity edge in the plan view, and the piezoelectric film, in the plan view, is a rectangle having a width shorter than a width in a short direction of the movable film and a length shorter than a length in a long direction of the movable film, with both end edges and both side edges thereof being receded further toward an interior of the movable film than both end edges and both side edges, respectively, of the movable film, the upper electrode, in the plan view, is a rectangle having a width shorter than the width in a short direction of the movable film and a length shorter than the length in a long direction of the movable film, with both end edges and both side edges thereof being receded further toward the interior of the movable film than both end edges and both side edges, respectively, of the movable film, and the groove is formed along a side edge of the movable film.

With this arrangement, the movable film is made to undergo warping deformation readily in its short direction during driving of the piezoelectric element and the movable film is thus made large in displacement.

[2-3] An object of a fourth invention is to provide a device using a piezoelectric film with which a displacement of a movable film can be made large.

C1. A device using a piezoelectric/pyroelectric element including a substrate having a cavity, a membrane held on the substrate so as to face the cavity, a piezoelectric/pyroelectric element formed above the membrane and functioning as a piezoelectric element or a pyroelectric element, and a metal line formed on the membrane at least in a region between the piezoelectric/pyroelectric element and a cavity edge.

The membrane is generally made of a hard, brittle material and therefore cracks readily. The present arrangement includes the metal line that is formed on the membrane at least in the region between the piezoelectric/pyroelectric element and the cavity edge. The metal line is formed at a high temperature and shrinks thereafter upon being cooled to ordinary temperature and the metal line is thus made to have tensile stress. That is, the metal line applies a force in a shrinking direction to the membrane and the membrane is thus made unlikely to crack.

C2. The device using the piezoelectric/pyroelectric element according to "C1.," where the piezoelectric/pyroelectric element includes a lower electrode, formed on a surface of the membrane at an opposite side from the cavity, an upper electrode disposed at an opposite side from the membrane with respect to the lower electrode, and a piezoelectric/pyroelectric film provided between the lower electrode and the upper electrode, and the metal line is formed at the same layer as the lower electrode and constitutes a portion of the lower electrode. With this arrangement, the metal line may be formed in a process of forming the lower electrode.

C3. The device using the piezoelectric/pyroelectric element according to "C1.," where the metal line is formed at a layer different from that of the lower electrode.

C4. The device using the piezoelectric/pyroelectric element according to "C3.," where the metal line is embedded inside the membrane.

C5. The device using the piezoelectric/pyroelectric element according to any one of "C1." to "C4.," where the metal line is formed as a stripe.

C6. The device using the piezoelectric/pyroelectric element according to any one of "C1." to "C4.," where the metal line is formed as a mesh.

C7. The device using the piezoelectric/pyroelectric element according to any one of "C1." to "C5.," where the membrane is a movable film, the piezoelectric/pyroelectric element is a piezoelectric element, the piezoelectric/pyroelectric film is a piezoelectric film, and the device using the piezoelectric/pyroelectric element is an inkjet printing head. With this arrangement, an inkjet printing head including a movable film that is unlikely to crack is obtained.

C8. The device using the piezoelectric/pyroelectric element according to "C7.," where the cavity is formed to a rectangular shape in a plan view as viewed from a direction normal to a major surface of the movable film, the movable film is formed to a rectangular shape matching a cavity edge in the plan view, and the piezoelectric film, in the plan view, is a rectangle having a width shorter than a width in a short direction of the movable film and a length shorter than a length in a long direction of the movable film, with both end edges and both side edges thereof being receded further toward an interior of the movable film than both end edges and both side edges, respectively, of the movable film, and the upper electrode, in the plan view, is a rectangle having a width shorter than the width in a short direction of the movable film and a length shorter than the length in a long direction of the movable film, with both end edges and both side edges thereof being receded further toward the interior of the movable film than both end edges and both side edges, respectively, of the movable film.

With this arrangement, the piezoelectric film and the upper electrode are not disposed above a peripheral edge portion of the movable film and therefore the movable film can be made large in displacement.

C9. The device using the piezoelectric/pyroelectric element according to "C1." or "C4.," where the membrane is a heat insulating film, the piezoelectric/pyroelectric element is a pyroelectric element, the piezoelectric/pyroelectric film is a pyroelectric film, and the device using the piezoelectric/pyroelectric element is an infrared image sensor. With this arrangement, an infrared image sensor including a heat insulating film that is unlikely to crack is obtained.

C10. The device using the piezoelectric/pyroelectric element according to "C9.," where the cavity is formed to a circular shape in a plan view as viewed from a direction normal to a major surface of the heat insulating film, the metal line is embedded inside the heat insulating film, and the metal line is formed as an annular stripe that is concentric to the cavity.

Preferred embodiments of the second to fourth inventions shall now be described in detail with reference to FIG. 9 to FIG. 56. The symbols in FIG. 9 to FIG. 56 are unrelated to the symbols in FIG. 1A to FIG. 9 used for the above description of the first invention.

Figure 9:
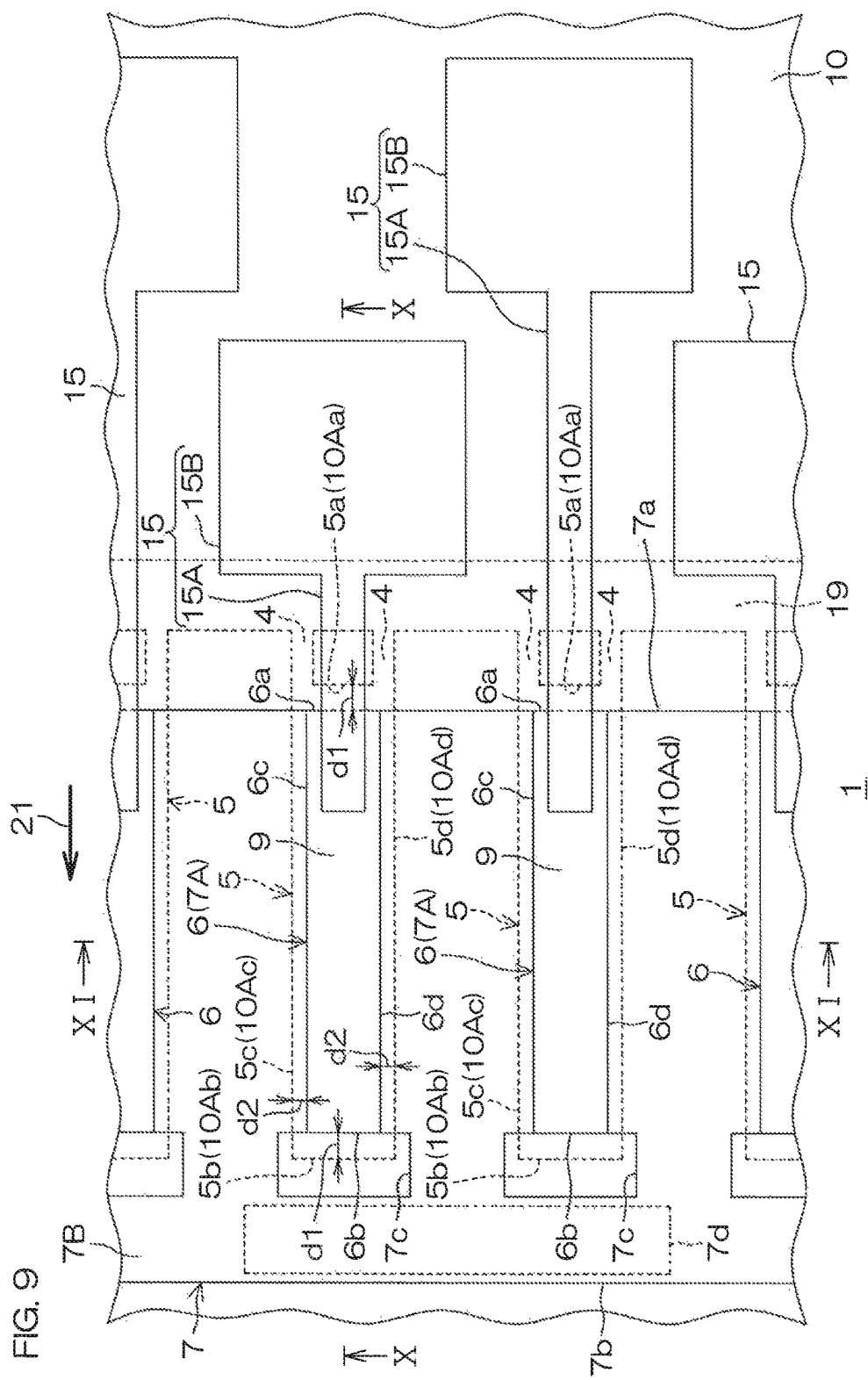
FIG. 9 is a schematic plan view of an inkjet printing head to which a second invention is applied.
Figure 10:
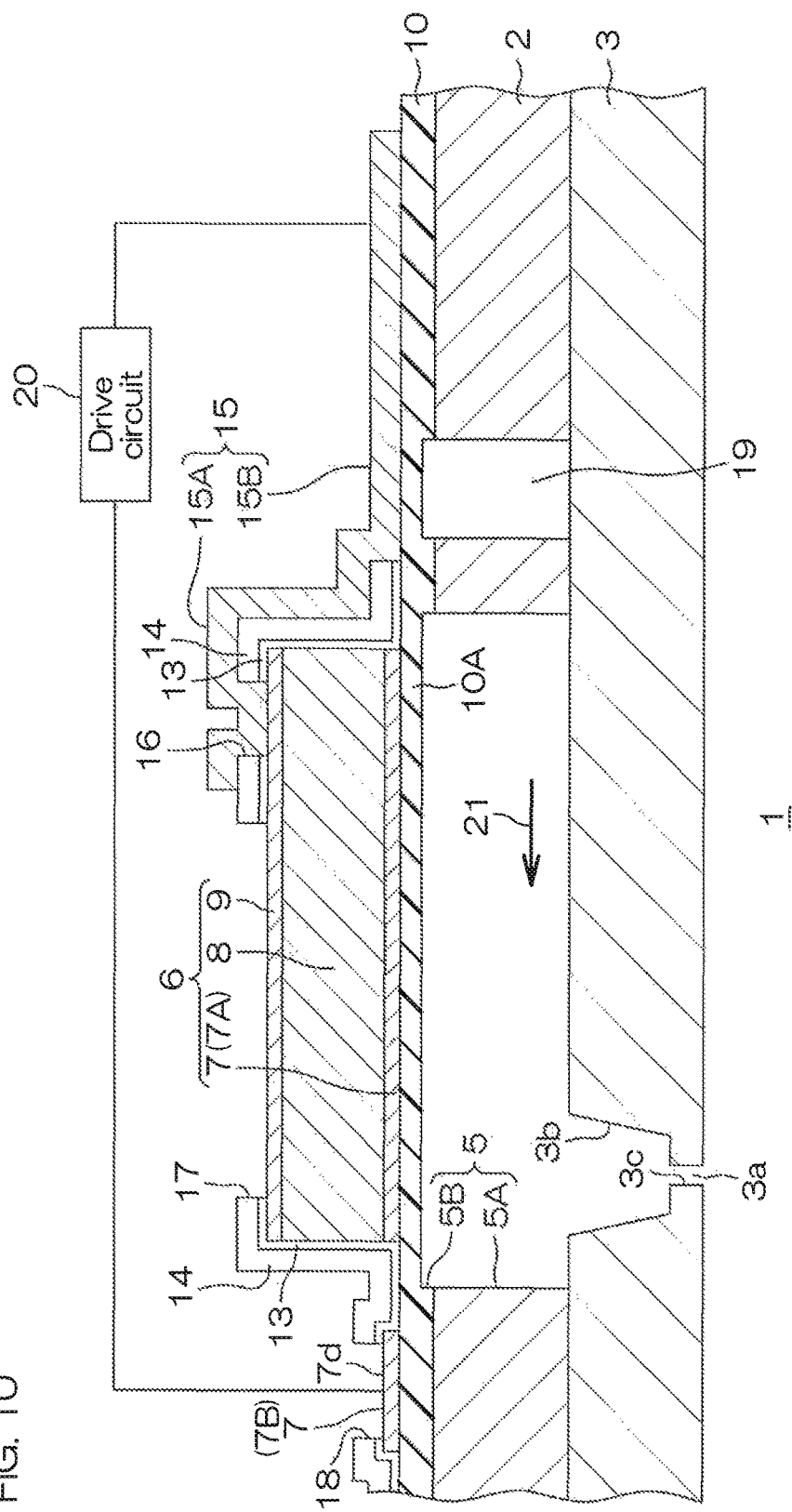
FIG. 10 is a schematic enlarged sectional view taken along line X-X in FIG. 9.
Figure 11:
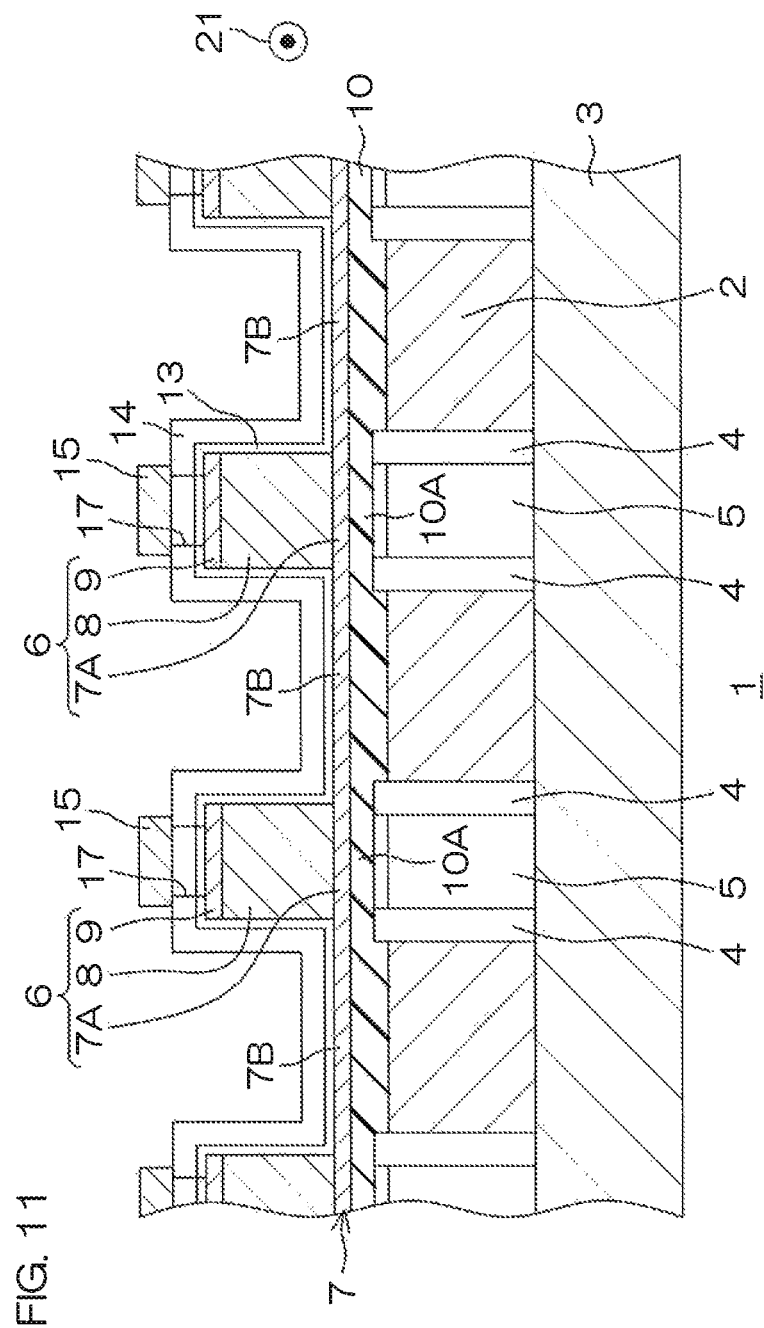
FIG. 11 is a schematic enlarged sectional view taken along line XI-XI in FIG. 9.
Figure 12:
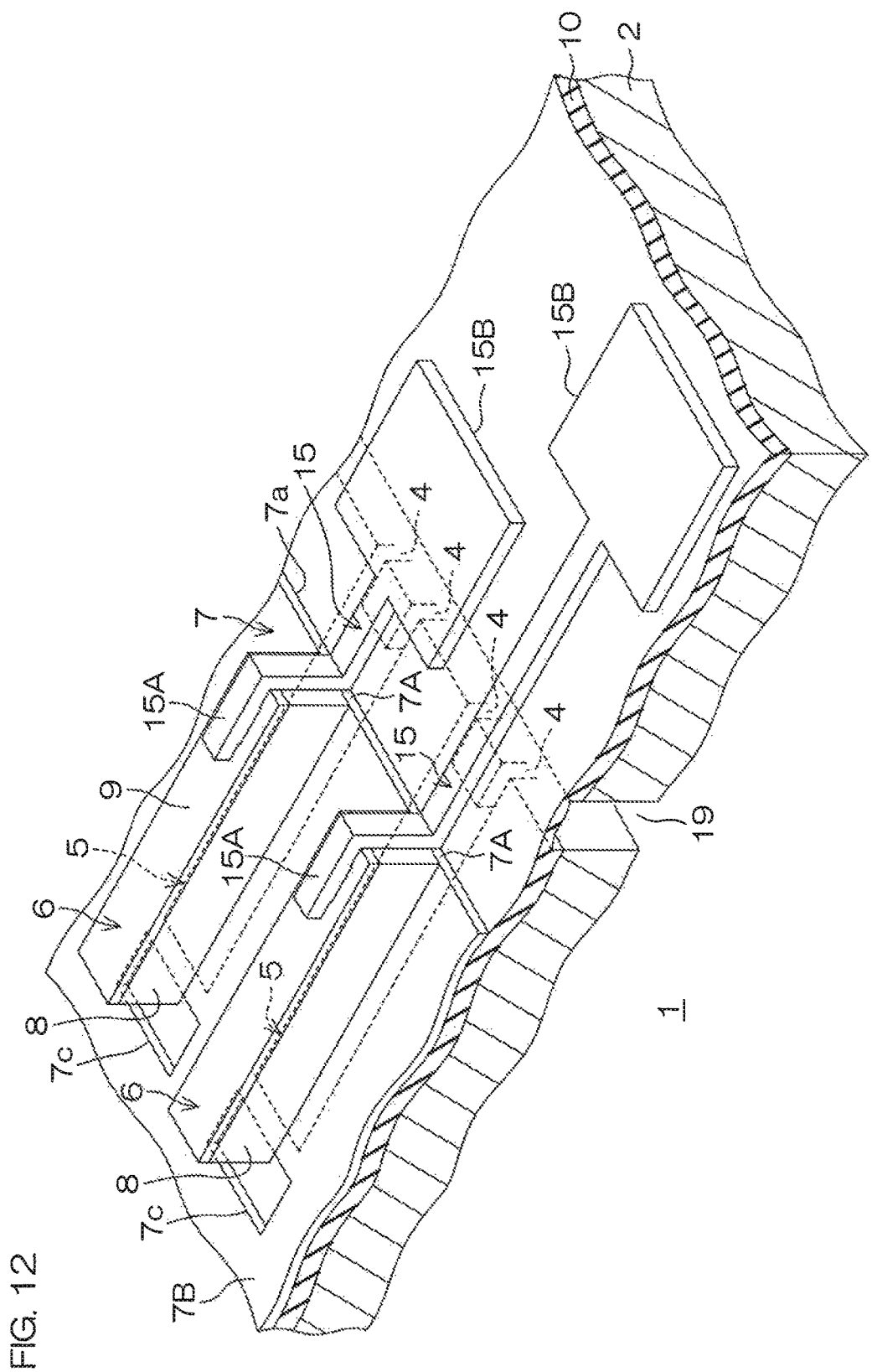
FIG. 12 is a schematic perspective view of the inkjet printing head.
Figure 13:
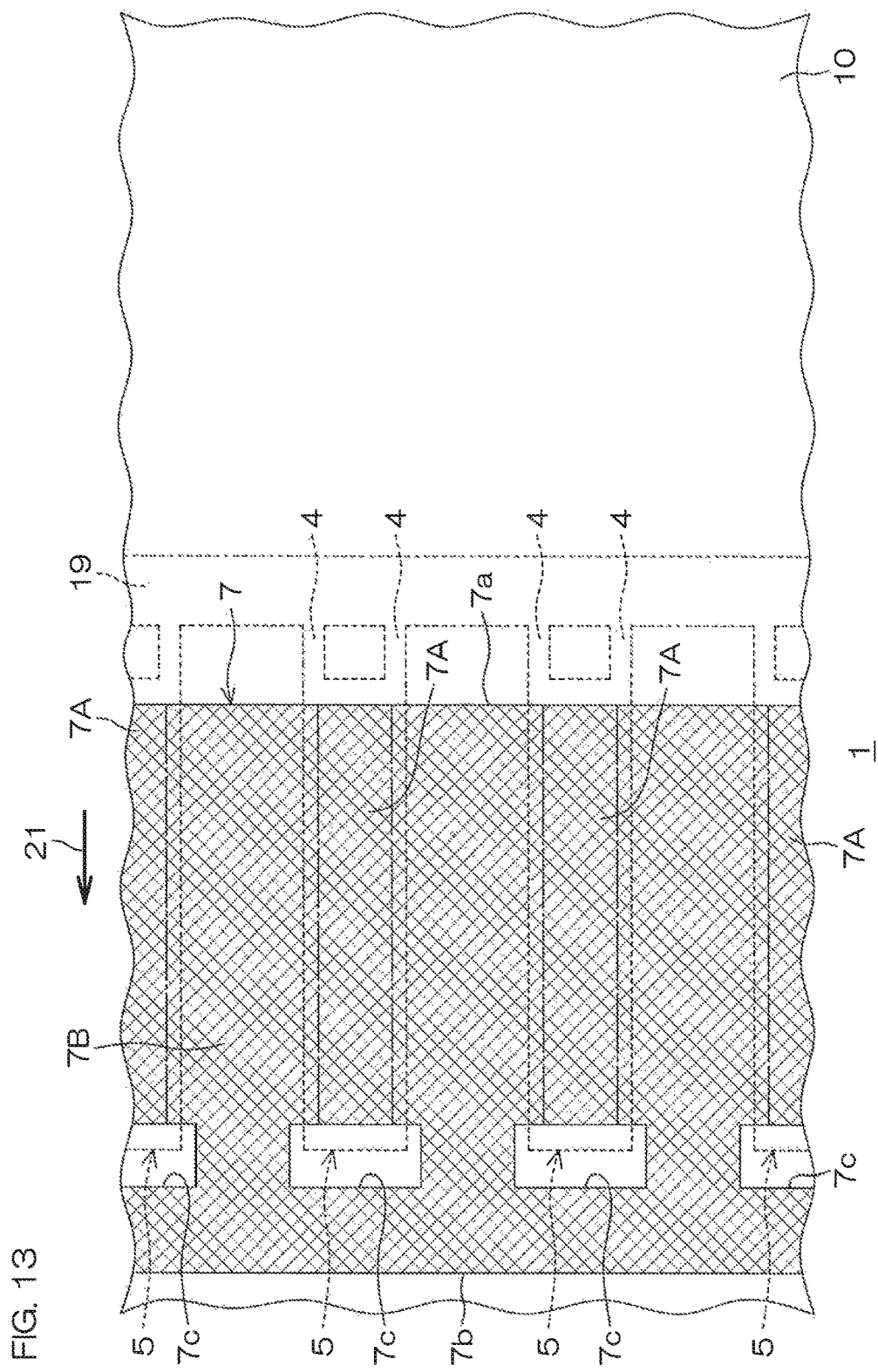
FIG. 13 is a plan view of a planar shape of a lower electrode formed above a movable film formation layer and is a plan view with which the arrangement besides the lower electrode formed above the movable film formation layer is removed.

FIG. 9 is a schematic plan view of an inkjet printing head to which the second invention is applied. FIG. 10 is a schematic enlarged sectional view taken along line X-X in FIG. 9. FIG. 11 is a schematic enlarged sectional view taken along line XI-XI in FIG. 9. FIG. 12 is a schematic perspective view of the inkjet printing head. In FIG. 9 and FIG. 12, a hydrogen barrier film indicated by symbol 13 and an insulating film indicated by symbol 14 in FIG. 10 and FIG. 11 are omitted. FIG. 13 is a plan view of a planar shape of a lower electrode formed above a movable film formation layer and is a plan view with which the arrangement besides the lower electrode formed above the movable film formation layer is removed.

Referring to FIG. 10, the inkjet printing head 1 includes a silicon substrate 2 and a nozzle substrate 3 having discharge ports 3a that discharge ink. A movable film formation layer 10 is laminated on the silicon substrate 2. In the laminate of the silicon substrate 2 and the movable film formation layer 10, pressure chambers (cavities) 5 are formed as ink flow passages (ink reservoirs). Each pressure chamber 5 is constituted of a space portion 5A, formed in the silicon substrate 2 and penetrating through the silicon substrate 2 in a thickness direction, and a recess 5B, formed in a rear surface (surface at the silicon substrate 2 side) of the movable film formation layer 10 and continuous to the space portion 5A.

The nozzle substrate 3 is constituted, for example, of a silicon plate, is adhered to a rear surface of the silicon substrate 2, and, together with the silicon substrate 2 and the movable film formation layer 10, defines the pressure chambers 5. The nozzle substrate 3 has recesses 3b facing the pressure chambers 5 and an ink discharge passage 3c is formed in a bottom surface of each recess 3b. Each ink discharge passage 3c penetrates through the nozzle substrate 3 and has a discharge port 3a at an opposite side from a pressure chamber 5. Therefore, when a volume change occurs in the pressure chamber 5, the ink retained in the pressure chamber 5 passes through the ink discharge passage 3c and is discharged from the discharge port 3a.

Each pressure chamber 5 is formed by digging into the silicon substrate 2 and the movable film formation layer 10 from the rear surface side of the silicon substrate 2. Ink supply passages 4 (see FIG. 9 and FIG. 11 together), in communication with the pressure chambers 5, are further formed in the silicon substrate 2 and the movable film formation layer 10. The ink supply passages 4 are in communication with the pressure chambers 5 and are formed to guide ink from an ink tank (for example, an ink cartridge) that is an ink supply source to the pressure chambers 5.

Each pressure chamber 5 is formed to be elongate along an ink flow direction 21, which is a right/left direction in FIG. 10. Each portion of the movable film formation layer 10 that is atop roof portion of a pressure chamber 5 constitutes a movable film (membrane) 10A. The movable film 10A (movable film formation layer 10) is constituted, for example, of a silicon oxide ($SiO_2$) film formed above the silicon substrate 2. The movable film 10A (movable film formation layer 10) may be constituted of a laminate, for example, of a silicon (Si) layer formed above the silicon substrate 2, a silicon oxide ($SiO_2$) layer formed above the silicon layer, and a silicon nitride (SiN) layer formed above the silicon oxide layer. In the present specification, the movable film 10A refers to each portion of the movable film formation layer 10 that is a top roof portion defining a pressure chamber 5. Therefore, portions of the movable film formation layer 10 besides the top roof portions of the pressure chambers 5 do not constitute the movable films 10A.

Each movable film 10A has a thickness of, for example, 0.4 μm to 2 μm. If the movable film 10A is constituted of a silicon oxide film, the thickness of the silicon oxide film may be approximately 1.2 μm. If the movable film 10A is constituted of a laminate of a silicon layer, a silicon oxide layer, and a silicon nitride layer, the thickness of each of the silicon layer, the silicon oxide layer, and the silicon nitride layer may be approximately 0.4 μm.

Each pressure chamber 5 is defined by the movable film 10A, the silicon substrate 2, and the nozzle substrate 3 and is formed to a substantially rectangular parallelepiped shape in the present preferred embodiment. The pressure chamber 5 may, for example, have a length of approximately 800 μm and a width of approximately 55 μm. Each ink supply passage 4 is formed to be in communication with one end portion (an end portion positioned at an opposite side from the discharge port 3a in the present preferred embodiment) in a long direction of a pressure chamber 5. In the present preferred embodiment, the discharge port 3a of the nozzle substrate 3 is disposed near another end portion related to the long direction of the pressure chamber 5.

A piezoelectric element 6 is disposed on a front surface of each movable film 10A. A piezoelectric actuator is arranged by the silicon substrate 2, the movable film 10A, and the piezoelectric element 6. The piezoelectric element 6 includes a lower electrode 7 formed above the movable film formation layer 10, a piezoelectric film 8 formed above the lower electrode 7, and an upper electrode 9 formed above the piezoelectric film 8. In other words, the piezoelectric element 6 is arranged by sandwiching the piezoelectric film 8 from above and below by the upper electrode 9 and the lower electrode 7.

The lower electrode 7 has, for example, a two-layer structure with a Ti (titanium) layer and a Pt (platinum) layer being laminated in that order from the movable film 10A side. Besides this, the lower electrode 7 may be formed of a single film that is an Au (gold) film, a Cr (chromium) layer, or an Ni (nickel) layer, etc. The lower electrode 7 has main electrode portions 7A in contact with lower surfaces of the piezoelectric films 8 and an extension portion 7B (see also FIG. 9 and FIG. 11 to FIG. 13) extending to a region outside the piezoelectric film 8.

As the piezoelectric film 8, for example, a PZT (PbZr$_x$Ti$_{1-x}$O$_3$: lead zirconate titanate) film formed by a sol-gel method or a sputtering method may be applied. Such a piezoelectric film 8 is constituted of a sintered body of metal oxide crystals. The piezoelectric film 8 preferably has a thickness of 1 μm to 5 μm. The overall thickness of the movable film 10A is preferably approximately the same as the thickness of the piezoelectric film 8 or approximately ⅔ the thickness of the piezoelectric film.

Each upper electrode 9 is formed to have substantially the same shape in plan view as the piezoelectric film 8. In the present preferred embodiment, the upper electrode 9 has a four-layer structure in which a conductive oxide film (for example, an IrO$_2$ (iridium oxide) film) and a metal film (for example, an IrO$_2$ (iridium oxide) film) are alternately laminated twice.

The front surface of the movable film formation layer 10, front surfaces of the piezoelectric elements 6, and a front surface of the extension portion 7B of the lower electrode 7 are covered with a hydrogen barrier film 13. The hydrogen barrier film 13 is constituted, for example, of Al$_2$O$_3$ (alumina). Degradation of characteristics of the piezoelectric films 8 due to hydrogen reduction can thereby be prevented. An insulating film 14 is laminated above the hydrogen barrier film 13. The insulating film 14 is constituted, for example, of SiO$_2$. Wirings 15 are formed above the insulating film 14. Each wiring 15 is constituted of a metal material that includes Al (aluminum).

One end portion of each wiring 15 is disposed above one end portion of an upper electrode 9. A penetrating hole (contact hole) 16, penetrating continuously through the hydrogen barrier film 13 and the insulating film 14, is formed between the wiring 15 and the upper electrode 9. The one end portion of the wiring 15 enters into the penetrating hole 16 and is connected to the upper electrode 9 inside the penetrating hole 16. Also, in the hydrogen barrier film 13 and the insulating film 14, an opening 17 of rectangular shape in plan view is formed in a region corresponding to a central portion of a front surface of each upper electrode 9 (portion surrounded by a peripheral edge portion of a front surface of each upper electrode 9).

Also, an opening 18, penetrating continuously through the hydrogen barrier film 13 and the insulating film 14, is formed at a position corresponding to a predetermined region above the extension portion 7B of the lower electrode 7 and a front surface of the lower electrode 7 is exposed via the opening 18. The exposed portion constitutes a pad portion 7d arranged to connect the lower electrode 7 to the exterior. At a portion of the front surface of the movable film formation layer 10 further upstream than upstream ends in the ink flow direction 21 of the piezoelectric elements 6, the hydrogen barrier film 13 and the insulating film 14 are formed just in regions close to the upstream ends of the piezoelectric elements 6 and the hydrogen barrier film 13 and the insulating film 14 are not formed further upstream.

Each piezoelectric element 6 is formed at a position facing a pressure chamber 5 across a movable film 10A. That is, the piezoelectric element 6 is formed to contact a surface of the movable film 10A at the opposite side from the pressure chamber 5. The pressure chamber 5 is filled with ink supplied from an unillustrated ink tank through the ink supply passages 4. The movable film 10A defines a top surface portion of the pressure chamber 5 and faces the pressure chamber 5. The movable film 10A is supported by portions of the laminate of the movable film formation layer 10 and the silicon substrate 2 at a periphery of the pressure chamber 5 and has flexibility enabling deformation in a direction facing the pressure chamber 5 (in other words, in the thickness direction of the movable film 10A).

The wirings 15 and the pad portion 7d of the lower electrode 7 are connected to a drive circuit 20. The drive circuit 20 may be formed in a region of the silicon substrate 2 separate from the pressure chambers 5 or may be formed outside the silicon substrate 2. When a drive voltage is applied from the drive circuit 20 to a piezoelectric element 6, the piezoelectric film 8 deforms due to an inverse piezoelectric effect. The movable film 10A is thereby made to deform together with the piezoelectric element 6 to bring about a volume change of the pressure chamber 5 and the ink inside the pressure chamber 5 is pressurized. The pressurized ink passes through the ink discharge passage 3c and is discharged as microdroplets from the discharge port 3a.

Referring to FIG. 9 to FIG. 13, a plurality of the pressure chambers 5 are formed as stripes extending parallel to each other in the laminate of the silicon substrate 2 and the movable film formation layer 10. The plurality of pressure chambers 5 are formed at equal intervals that are minute intervals (for example, of approximately 30 µm to 350 µm) in a width direction thereof. In plan view, each pressure chamber 5 has an oblong shape that is elongate along the ink flow direction 21 from ink supply passages 4 to a discharge passage 3c. That is, the top surface portion of the pressure chamber 5 has two side edges 5c and 5d along the ink flow direction 21 and two end edges 5a and 5b along a direction orthogonal to the ink flow direction 21. At the one end portion of each pressure chamber 5, the ink supply passages 4 are divided and formed as two passages and are in communication with a common ink passage 19. The common ink passage 19 is in communication with the ink supply passages 4 corresponding to the plurality of pressure chambers 5 and is formed to supply the ink from the ink tank to the ink supply passages 4.

Each piezoelectric element 6 has a rectangular shape in plan view with which a length in the ink flow direction 21 (same direction as a long direction of each movable film 10A) is defined to be shorter than a length of the movable film 10A in the long direction. As shown in FIG. 9, respective end edges 6a and 6b along a short direction of the piezoelectric element 6 are disposed at inner sides at predetermined intervals d1 (for example, of 5 µm) from respective corresponding end edges 10Aa and 10Ab of the movable film 10A. Also, a width of the piezoelectric element 6 in the short direction (direction parallel to a major surface of the silicon substrate 2) orthogonal to the long direction of the movable film 10A is defined to be narrower than a width of the movable film 10A (top surface portion of a pressure chamber 5) in the short direction. Respective side edges 6c and 6d along a long direction of the piezoelectric element 6 are disposed at inner sides at predetermined intervals d2 (for example, of 5 µm) from respective corresponding side edges 10Ac and 10Ad of the movable film 10A.

As shown in FIG. 9 and FIG. 13, the lower electrode 7 has, in plan view, a flat plate shape with a predetermined width in a direction along the ink flow direction 21 and extending across the plurality of pressure chambers 5 in the direction orthogonal to the ink flow direction 21, and is a common electrode used in common for the plurality of piezoelectric elements 6. A first side 7a of the lower electrode 7 along the direction orthogonal to the ink flow direction 21 is matched in plan view with a line joining the end edges 6a at one end of the plurality of piezoelectric elements 6. A second side 7b of the lower electrode 7 opposite the first side 7a is disposed further outside (downstream in the ink flow direction 21) than the end edges 10Ab of the movable films 10A corresponding to the other end edges 6b of the plurality of piezoelectric elements 6.

The lower electrode 7 includes the main electrode portions 7A of rectangular shapes in plan view that constitute the piezoelectric elements 6 and the extension portion 7B lead out from the main electrode portions 7A in a direction along the front surface of the movable film formation layer 10 to cross over peripheral edges of the top surface portions (movable films 10A) of the pressure chambers 5 and extend outside the peripheral edges of the top surface portions of the pressure chambers 5. Each main electrode portion 7A is formed to be shorter than a movable film 10A along the long direction of the movable film 10A and respective end edges thereof are disposed at inner sides at the predetermined intervals d1 from the respective corresponding end edges 10Aa and 10Ab of the movable film 10A. Also with the main electrode portion 7A, a width along the short direction of the movable film 10A is defined to be narrower than the width of the movable film 10A in the short direction and respective end edges thereof are disposed at inner sides at the intervals d2 from the respective corresponding side edges 10Ac and 10Ad of the movable film 10A.

In plan view, the extension portion 7B extends from the respective side edges of each main electrode portion 7A to the outside of the corresponding side edges 5c and 5d of the top surface portion of a pressure chamber 5 upon crossing over the side edges 5c and 5d of the top surface portion of the pressure chamber 5. Of all regions of the lower electrode 7, the extension portion 7B is the region excluding the main electrode portions 7A.

In the extension portion 7B, cutout portions 7c of rectangular shapes in plan view that penetrate through the lower electrode 7 are formed at downstream sides in the ink flow direction 21 of the respective piezoelectric elements 6. In plan view, each cutout portion 7c has two side edges (short sides) along the ink flow direction 21 and two end edges (long sides) along the direction orthogonal to the ink flow direction 21. One end edge of the cutout portion 7c is disposed at a position matching the end edge 6b of a piezoelectric element 6 (end edge at the downstream side of a main electrode portion 7A) in relation to the ink flow direction 21 and the other end edge is disposed further outside (downstream in the ink flow direction 21) than the end edge 10Ab of a movable film 10A. One side edge of the cutout portion 7c is disposed further outside than the one side edge 10Ac of the movable film 10A and the other side edge of the cutout portion 7c is disposed further outside than the other side edge 10Ad of the movable film 10A. Therefore in plan view, an end portion of the movable film 10A at the end edge 10Ab side is disposed at an inner side of the cutout portion 7c. The pad portion 7d of rectangular shape that is elongate in the direction orthogonal to the ink flow direction 21 is formed in a region between the second side 7b of the lower electrode 7 and the plurality of cutout portions 7c.

Referring to FIG. 9 to FIG. 12, each upper electrode 9 is formed to a rectangular shape of the same pattern as a main electrode portion 7A of the lower electrode 7 in plan view. That is, the upper electrode 9 is formed to be shorter than a movable film 10A along the long direction of the movable film 10A and respective end edges thereof are disposed at inner sides at the predetermined intervals d1 from the respective corresponding end edges 10Aa and 10Ab of the movable film 10A. Also with the upper electrode 9, a width along the short direction of the movable film 10A is defined to be narrower than the width of the movable film 10A in the short direction and respective end edges thereof are disposed at inner sides at the intervals d2 from the respective corresponding side edges 10Ac and 10Ad of the movable film 10A.

In plan view, each piezoelectric film 8 is formed to a rectangular shape of the same pattern as an upper electrode 9. That is, the piezoelectric film 8 is formed to be shorter than a movable film 10A along the long direction of the movable film 10A and respective end edges thereof are disposed at inner sides at the predetermined intervals d1 from the respective corresponding end edges 10Aa and 10Ab of the movable film 10A. Also with the piezoelectric film 8, a width along the short direction of the movable film 10A is defined to be narrower than the width of the movable film 10A in the short direction and respective end edges thereof are disposed at inner sides at the intervals d2 from the respective corresponding side edges 10Ac and 10Ad of the movable film 10A. A lower surface of the piezoelectric film 8 contacts an upper surface of a main electrode portion 7A of the lower electrode 7 and an upper surface of the piezoelectric film 8 contacts a lower surface of the upper electrode 9.

Each wiring 15 is constituted of a lead-out portion 15A, having one end portion connected to one end portion (an end portion at the one end edge 6a side of a piezoelectric element 6) of an upper electrode 9 and extending in a direction opposite to the ink flow direction 21 in plan view, and a pad portion 15B of rectangular shape in plan view that is made integral to the lead-out portion 15A and connected to a tip of the lead-out portion 15A. At a portion further upstream in the ink flow direction 21 than the one end edge 6a of the piezoelectric element 6, the pad portion 15B is formed above a front surface of the movable film formation layer 10 at which the hydrogen barrier film 13 and the insulating film 14 are not formed. The lead-out portion 15A includes a first portion, formed above the insulating film 14 and covering one end portion of the upper surface of the piezoelectric element 6 (an end portion at the one end edge 6a side of the piezoelectric element 6), an end surface of the piezoelectric element 6 continuous to the one end portion, and a front surface of the movable film formation layer 10 continuous to the end surface, and a second portion from the first portion to the pad portion 1B. The second portion is formed above the front surface of the movable film formation layer 10 at which the hydrogen barrier film 13 and the insulating film 14 are not formed.

Figure 14:
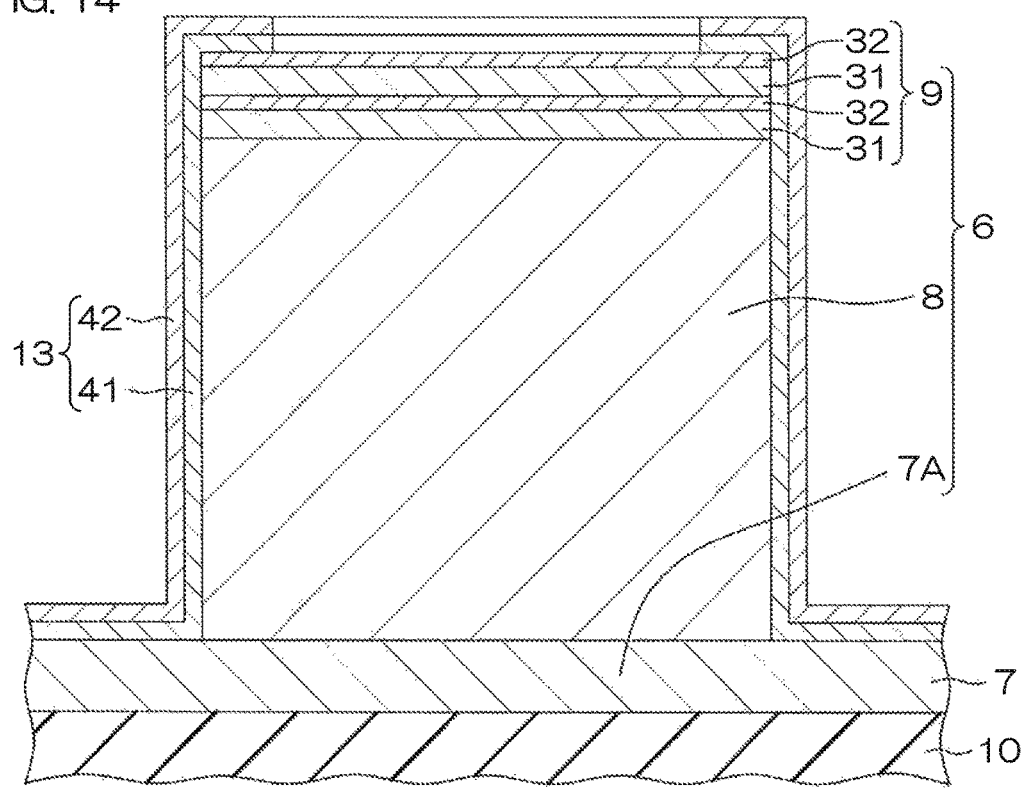
FIG. 14 is an enlarged sectional view of the structure of an upper electrode and the structure of a hydrogen barrier film.

FIG. 14 is an enlarged sectional view of the structure of the upper electrode 9 and the structure of the hydrogen barrier film 13 and corresponds to the section of FIG. 11.

The upper electrode 9 has the structure in which an $IrO_2$ (iridium oxide) film 31 that is the conductive oxide film and an Ir (iridium) film 32 that is the metal film are alternately laminated twice. Specifically, the upper electrode has the four-layer structure in which the $IrO_2$ film 31, the Ir film 32, the $IrO_2$ film 31, and the Ir film 32 are laminated in that order from the piezoelectric film 8 side. Each $IrO_2$ film 31 has a film thickness, for example, of 20 nm and each Ir film 32 has a film thickness, for example, of 10 nm.

The hydrogen barrier film 13 is constituted of two types of sputtered films 41 and 42 formed under different conditions. Specifically, the hydrogen barrier film 13 has a two-layer structure in which a first sputtered film 41 at a lower layer side and a second sputtered film 42 at an upper layer side are laminated. In the present preferred embodiment, the first sputtered film 41 and the second sputtered film 42 are both constituted of sputtered films of $Al_2O_3$ (alumina). The first sputtered film 41 and the second sputtered film 42 may be TiO films (titanium dioxide films) or may be SiN films (silicon nitride films).

The first sputtered film 41 is formed under a low pressure condition of, for example, not less than 0.01 Pa and less than 0.1 Pa and the second sputtered film 42 is formed under a high pressure condition of, for example, not less than 0.1 Pa and not more than 3.0 Pa. The first sputtered film 41 may have a film thickness of not less than 10 nm and not more than 100 nm and the second sputtered film 42 may have a film thickness of not less than 10 nm and not more than 100 nm. The total of the film thicknesses of the first sputtered film 41 and the second sputtered film 42 may be not more than 100 nm. For example, first sputtered film 41 may have a film thickness of 30 nm and the second sputtered film 42 may have a film thickness of 30 nm.

The hydrogen barrier film 13 may be constituted of three or more types of sputtered films formed under different conditions.

The insulating film 14 is formed after forming the piezoelectric elements 6 and in a process of forming the insulating film 14, hydrogen may enter the piezoelectric films 8 and the piezoelectric characteristics may become degraded.

With the inkjet printing head 1, each upper electrode 9 has the four-layer structure in which the $IrO_2$ film 31, the Ir film 32, the $IrO_2$ film 31, and the Ir film 32 are laminated in that order from the piezoelectric film 8 side, and therefore a high hydrogen barrier effect is obtained with a thinner overall film thickness than when the upper electrode is formed thickly with a metal single film of Ir, etc. Degradation of characteristics due to hydrogen reduction of the piezoelectric films 8 can thereby be prevented effectively. The reason for this shall now be explained. The $IrO_2$ film, which is a conductive oxide film, is sacrificed and changes to Ir when hydrogen enters it. It therefore has a function of trapping or blocking hydrogen. Although the Ir film, which is a metal film, is somewhat high in density and has barrier performance against oxygen and hydrogen, it is polycrystalline and therefore hydrogen may enter from a grain boundary. Therefore by alternately laminating the $IrO_2$ film, which is a conductive oxide film, and the Ir film, which is a metal film, repeatedly at least two or more times, an upper electrode of high hydrogen barrier property is obtained.

As the conductive oxide film, for example, an $SrRuO_3$ (strontium ruthenate) film may be used in place of the $IrO_2$ film. Also as the metal film, for example, Pt, Au, etc., may be used in place of the Ir film.

As shall be described below, in the process of forming the insulating film 14, the front surfaces and side surfaces of the piezoelectric elements 6 are covered by the hydrogen barrier film 13 and degradation of characteristics due to hydrogen reduction of the piezoelectric films 8 is suppressed by the hydrogen barrier film 13 as well. In particular, with the present inkjet printing head 1, the hydrogen barrier film 13 has the two-layer structure in which the first sputtered film 41 and the second sputtered film 42 formed under different conditions are laminated. The first sputtered film 41 and the second sputtered film 42 are formed under different conditions and are thus films that differ in characteristics. That is, the hydrogen barrier film 13 is constituted from a laminated film of the two types of sputtered films 41 and 42 that differ in characteristics and the hydrogen barrier film 13 can thus be made high in hydrogen barrier property. Degradation of characteristics due to hydrogen reduction of the piezoelectric films 8 can thereby be prevented more effectively.

FIG. 15A to 15M are sectional views of an example of a process for manufacturing the inkjet printing head 1 and show a section corresponding to FIG. 10.

First, as shown in FIG. 15A, the movable film formation layer 10 is formed on a front surface of the silicon substrate 2. However, as the silicon substrate 2, that which is thicker than the thickness of the silicon substrate 2 at the final stage is used. Specifically, a silicon oxide layer (for example, of 1.2 μm thickness) is formed on the front surface of the silicon substrate 2. If the movable film formation layer 10 is constituted of a laminate of a silicon layer, a silicon oxide layer, and a silicon nitride layer, the silicon layer (for example, of 0.4 μm thickness) is formed on the front surface of the silicon substrate 2, the silicon oxide layer (for example, of 0.4 μm thickness) is formed above the silicon layer, and the silicon nitride layer (for example, of 0.4 μm thickness) is formed above the silicon oxide layer. A base oxide film, for example, of $Al_2O_3$, MgO, or $ZrO_2$, etc., may be formed on the front surface of the movable film formation layer 10. Such base oxide films prevent metal atoms (for example, Pb) from escaping from the piezoelectric films 8 that are to be formed later. When metal atoms escape, the piezoelectric films 8 may degrade in piezoelectric characteristics. Also, when metal atoms that have escaped become mixed in the silicon layer constituting the movable film 10A, the movable film 10A may degrade in durability.

Figure 15B:
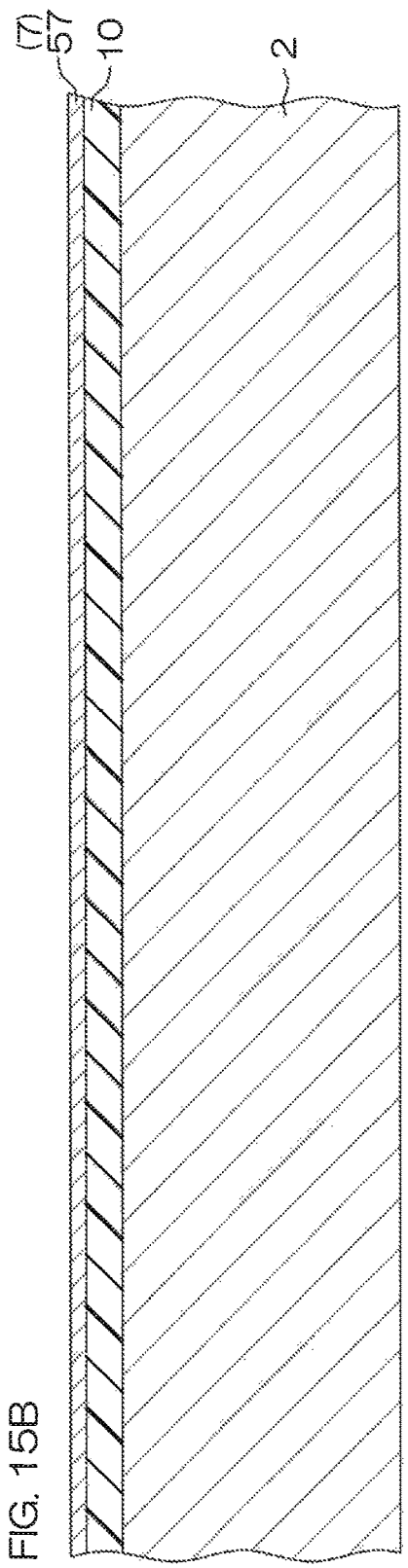
FIG. 15B is a sectional view of a step subsequent to that of FIG. 15A.

Next, a lower electrode film 57, which is a material layer of the lower electrode 7, is formed above the movable film formation layer 10 (above the base oxide film in the case where the base oxide film is formed) as shown in FIG. 15B. The lower electrode film 57 is constituted, for example, of a Pt/Ti laminated film having a Ti film (for example, of 10 nm to 40 nm thickness) as a lower layer and a Pt film (for example, of 10 nm to 400 nm thickness) as an upper layer. Such a lower electrode film 57 may be formed by the sputtering method.

Figure 15C:
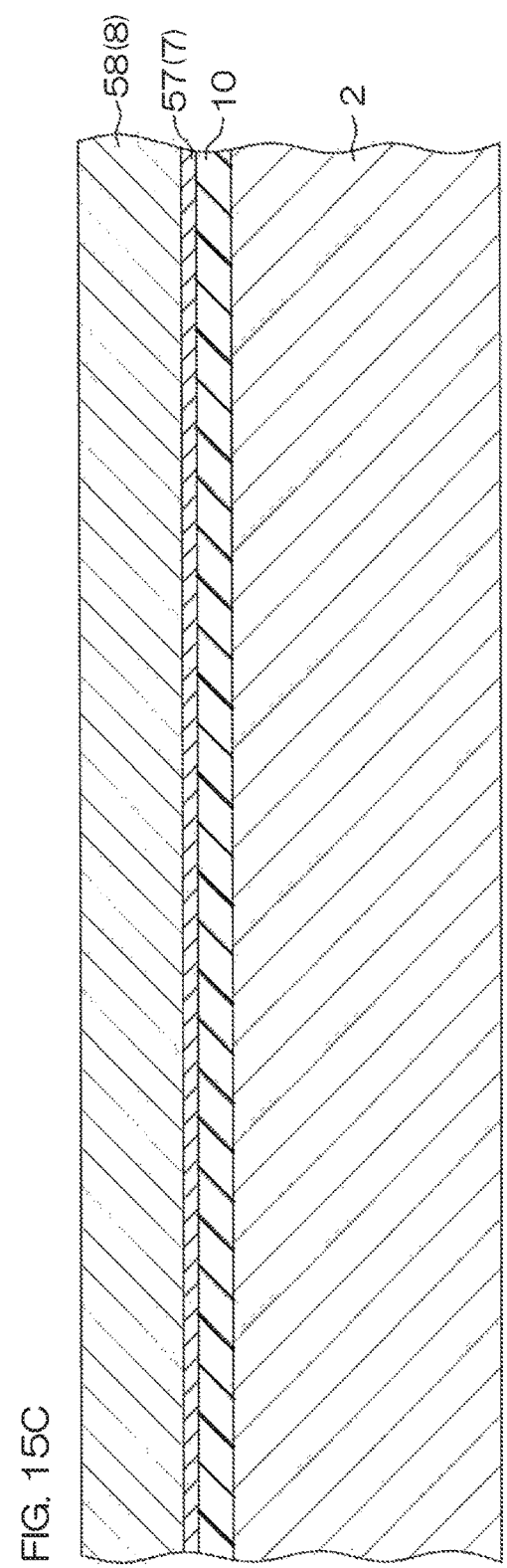
FIG. 15C is a sectional view of a step subsequent to that of FIG. 15B.

Next, as shown in FIG. 15C, a material film (piezoelectric material film) 58 of the piezoelectric films 8 is formed on an entire surface above the lower electrode film 57. Specifically, for example, a PZT film of 1 μm to 5 μm thickness is formed by a sol-gel method. Such a PZT film is constituted of a sintered body of metal oxide crystal grains.

Figure 15D:
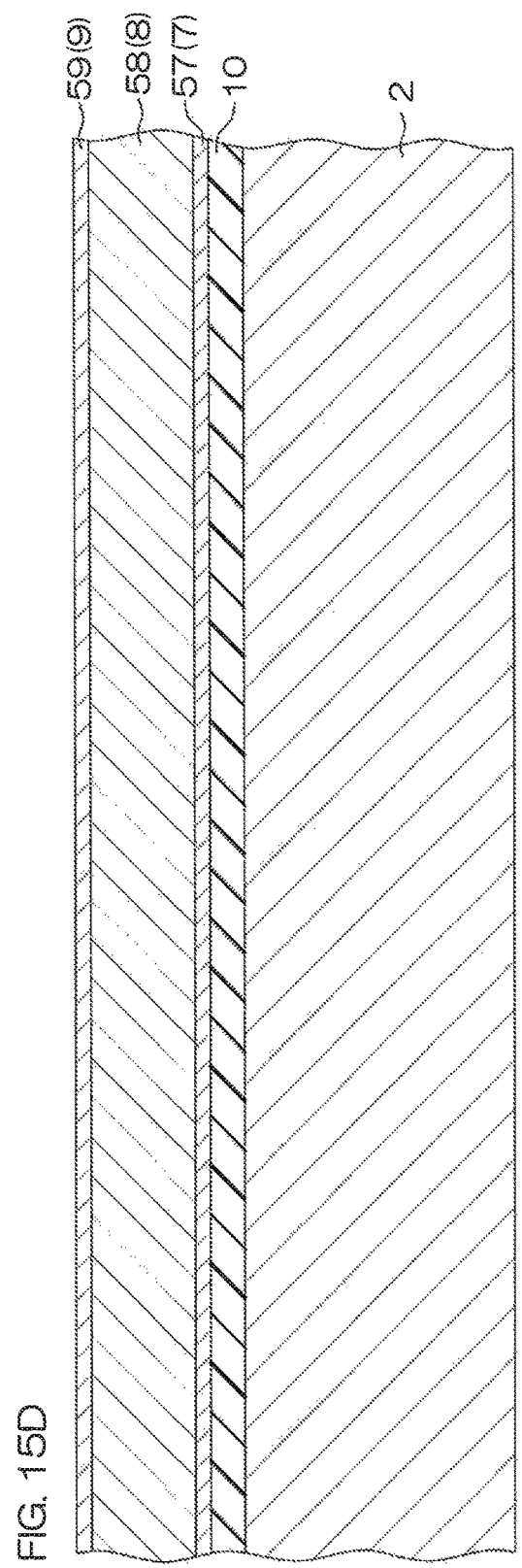
FIG. 15D is a sectional view of a step subsequent to that of FIG. 15C.

Next, as shown in FIG. 15D, an upper electrode film 59, which is a material of the upper electrode 9, is formed on the entire surface of the piezoelectric material film 58. As shown in FIG. 14, the upper electrode film 59 is constituted of an $IrO_2/Ir/IrO_2/Ir$ laminated film with which an $IrO_2$ film (for example, of 20 nm thickness), an Ir film (for example, of 10 nm thickness), an $IrO_2$ film (for example, of 20 nm thickness), and an Ir film (for example, of 10 nm thickness) are laminated in that order from the piezoelectric material film 58 side. Such an upper electrode film 59 may be formed by the sputtering method.

Figure 15F:
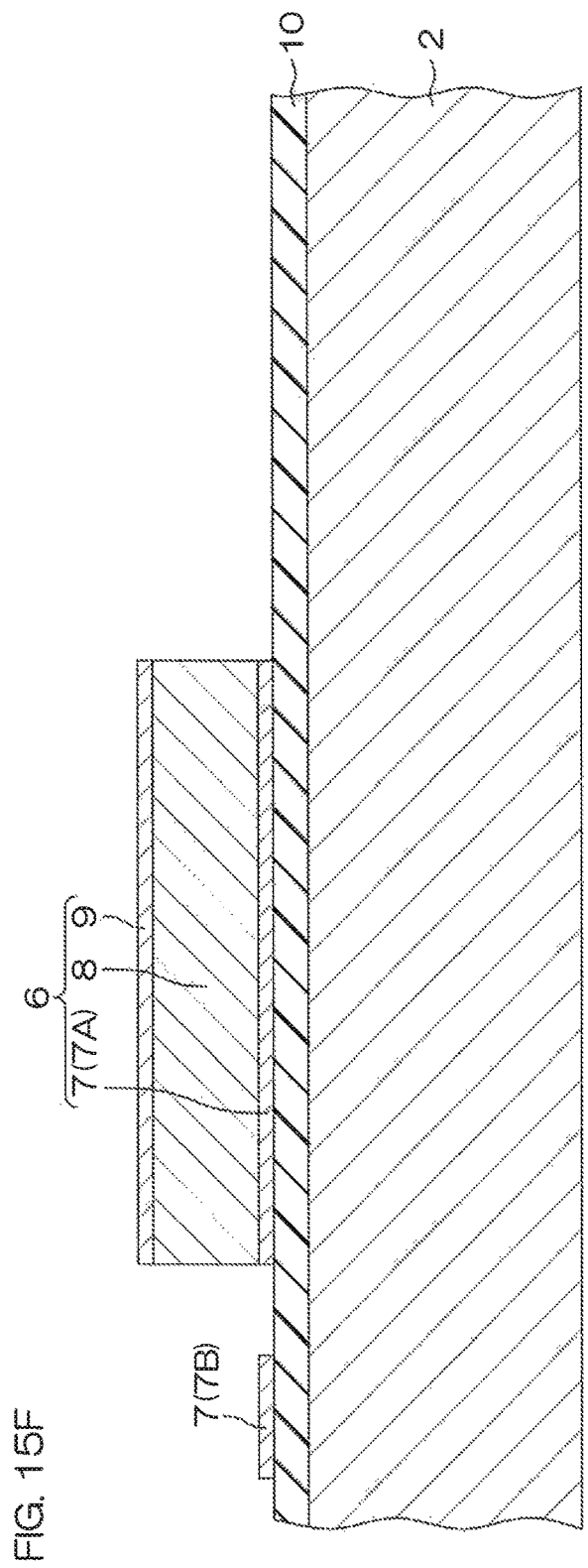
FIG. 15F is a sectional view of a step subsequent to that of FIG. 15E.

Next, as shown in FIG. 15E and FIG. 15F, patterning of the upper electrode film 59, the piezoelectric material film 58, and the lower electrode film 57 is performed. First, as shown in FIG. 15E, a resist mask with a pattern of the lower electrode 7 is formed by photolithography and using the resist mask as a mask, the upper electrode film 59, the piezoelectric material film 58, and the lower electrode film 57 are etched in the same pattern to thereby form the lower electrode film 57 of a predetermined pattern. More specifically, the upper electrode film 59 is patterned by dry etching, the piezoelectric material film 58 is patterned by wet etching, and the lower electrode film 57 is patterned by dry etching. The lower electrode 7 is thereby formed. An etchant used in the wet etching of the piezoelectric material film 58 may be an acid having hydrochloric acid as a main component.

Then, after peeling off the resist mask, a resist mask with a pattern of the piezoelectric films 8 is formed by photolithography and using the resist pattern, the upper electrode film 59 and the piezoelectric material film 58 are etched in the same pattern. More specifically, the upper electrode film 59 is patterned by dry etching and the piezoelectric material film 58 is patterned by wet etching. The piezoelectric films 8 and the upper electrodes 9 are thereby formed as shown in FIG. 15F. The piezoelectric elements 6, each constituted of the main electrode portion 7A of the lower electrode, the piezoelectric film 8, and the upper electrode 9, are thereby formed as shown in FIG. 15F.

Figure 15G:
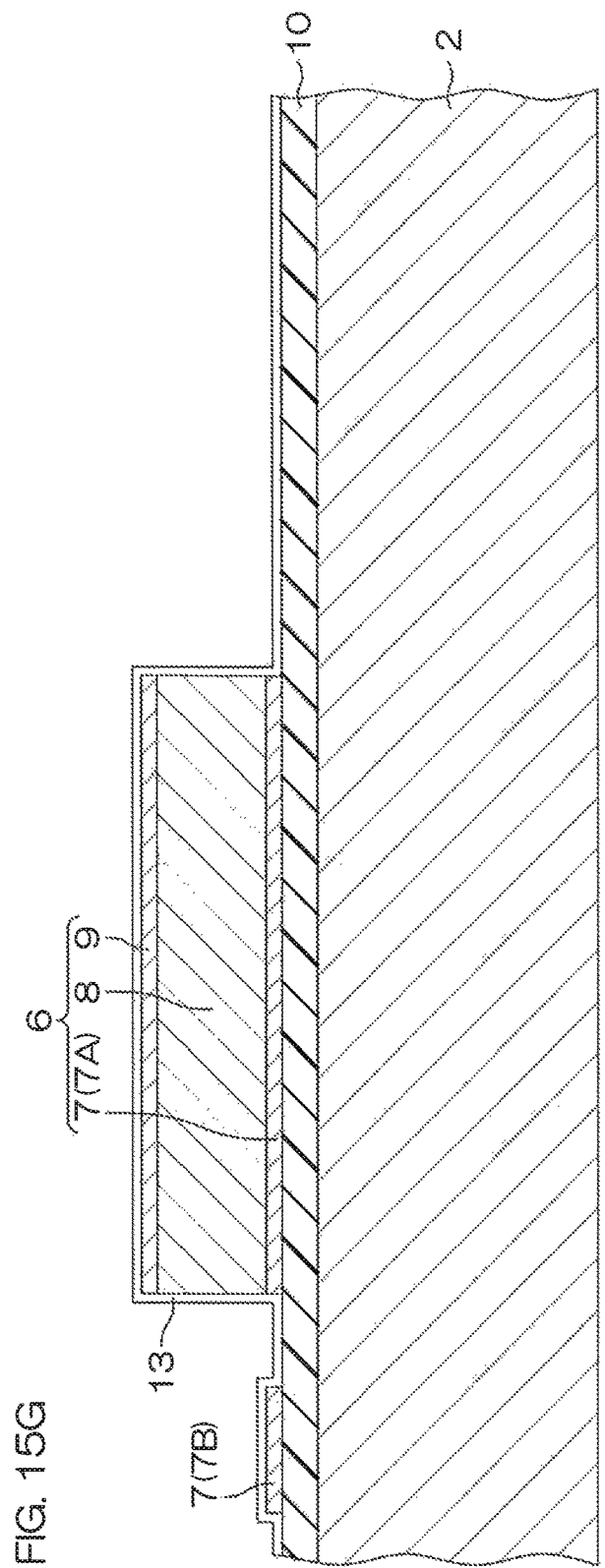
FIG. 15G is a sectional view of a step subsequent to that of FIG. 15F.

Then, after peeling off the resist mask, the hydrogen barrier film 13 covering the entire surface is formed as shown in FIG. 15G. As shown in FIG. 14, the hydrogen barrier film 13 is constituted of a laminated film having the first sputtered film 41 as a lower layer and the second sputtered film 42 as an upper layer. The first sputtered film 41 is formed under a low pressure condition of, for example, not less than 0.01 Pa and less than 0.1 Pa and the second sputtered film 42 is formed under a high pressure condition of, for example, not less than 0.1 Pa and not more than 3.0 Pa. The first sputtered film 41 may, for example, be an $Al_2O_3$ film having a film thickness of not less than 10 nm and not more than 100 nm. The second sputtered film 42 may, for example, be an $Al_2O_3$ film having a film thickness of not less than 10 nm and not more than 100 nm.

Next, as shown in FIG. 15H, the insulating film 14 is formed on the entire surface above the hydrogen barrier film 13. The insulating film 14 may be an $SiO_2$ film and may have a film thickness of 250 nm to 1000 nm.

Next, as shown in FIG. 15I, of portions of the insulating film 14 and the hydrogen barrier film 13 further upstream than the upstream end edges in the ink flow direction 21 of the piezoelectric elements 6 (see FIG. 10), portions besides portions in the vicinities of the piezoelectric elements 6 are removed. At the same time, the penetrating holes 16 and the opening 18 are formed in both the insulating film 14 and the hydrogen barrier film 13.

Figure 15J:
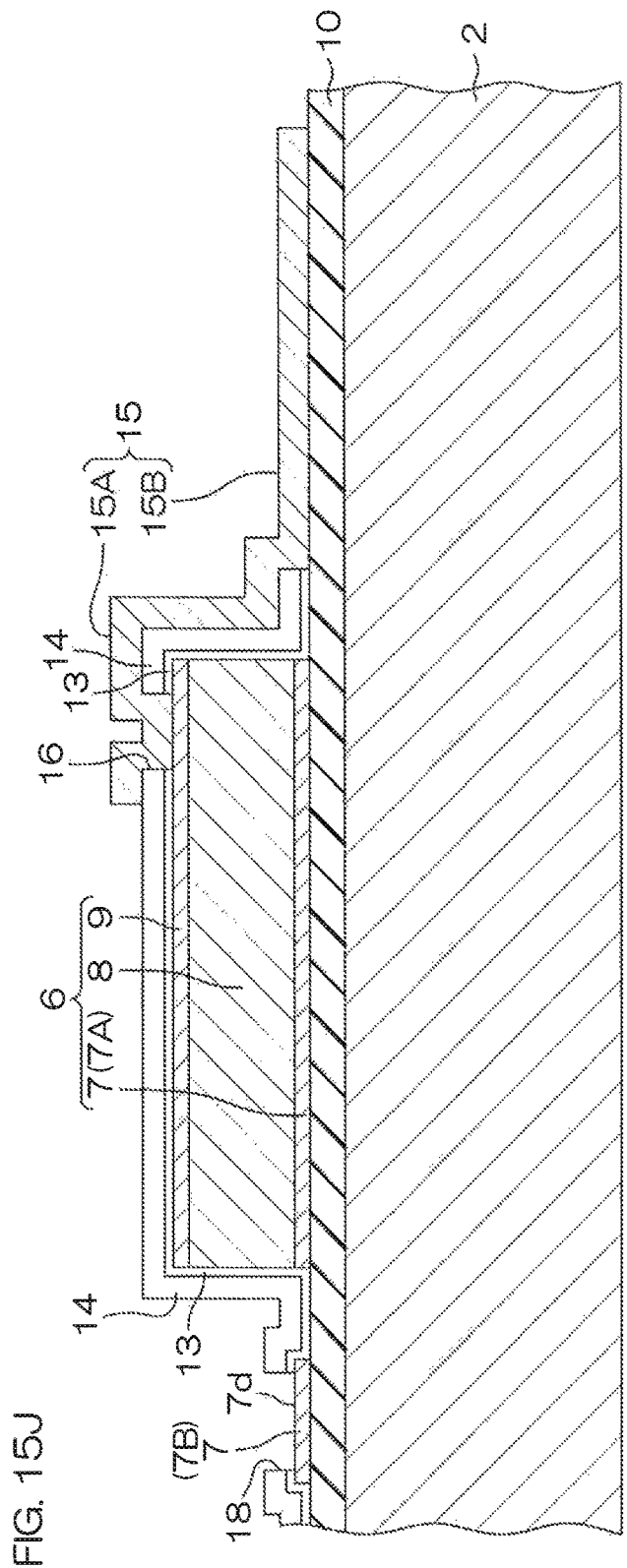
FIG. 15J is a sectional view of a step subsequent to that of FIG. 15I.

Next, a wiring film that constitutes the wirings 15 is formed above the insulating film 14, including the interiors of the penetrating holes 16. Thereafter, the wiring film is patterned by photolithography and etching to form the wirings 15 connected to the upper electrodes 9 as shown in FIG. 15J.

Figure 15K:
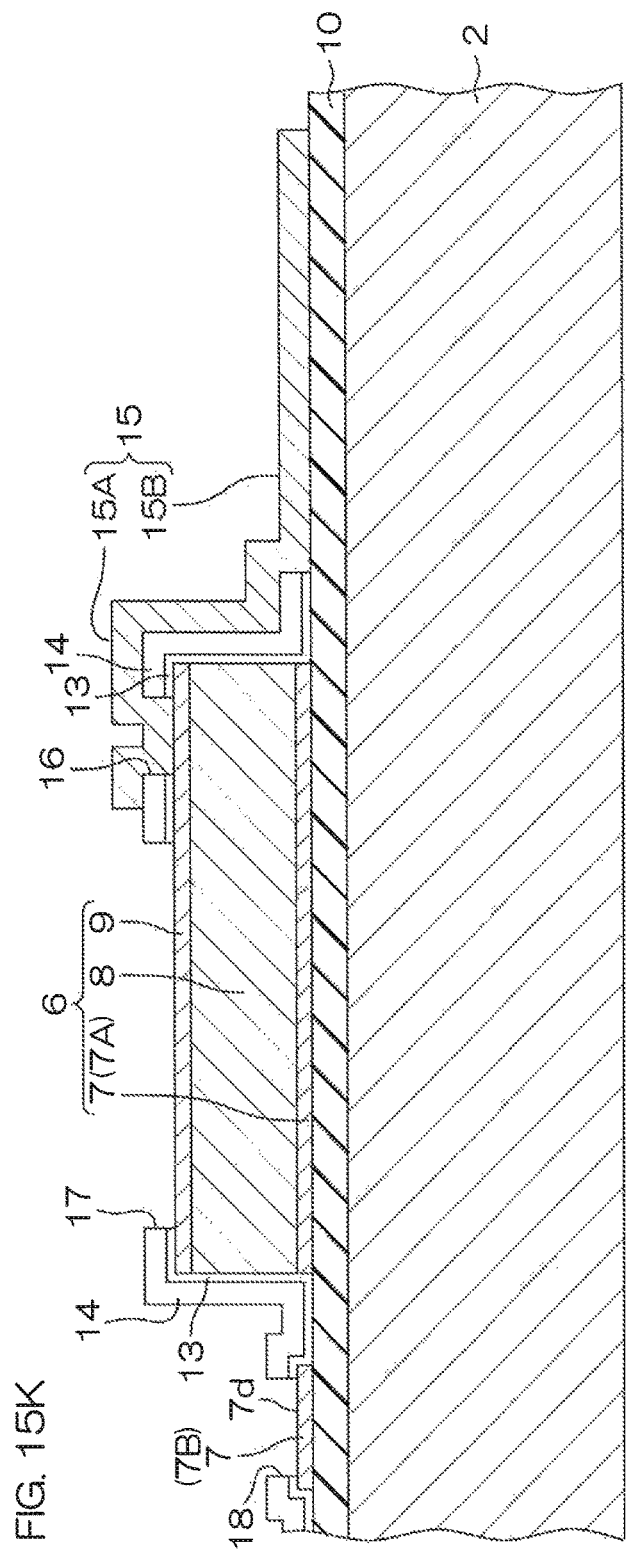
FIG. 15K is a sectional view of a step subsequent to that of FIG. 15J.

Next, as shown in FIG. 15K, the openings 17 are formed in the insulating film 14 and the hydrogen barrier film 13 at upper surface central regions of the upper electrodes 9.

Figure 15L:
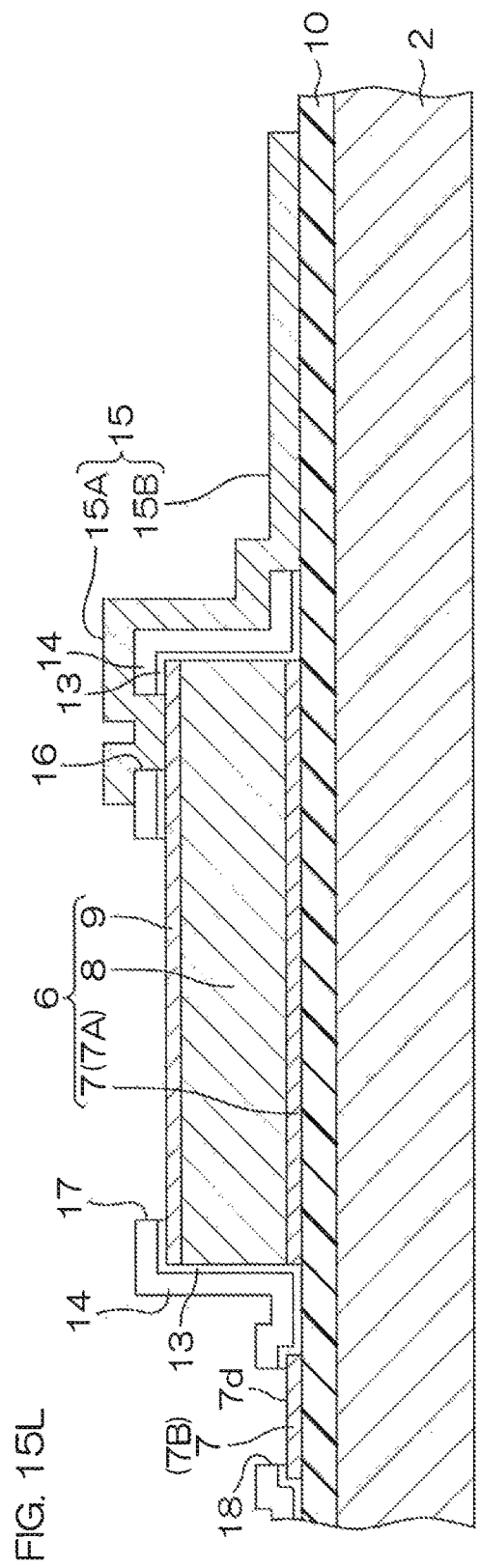
FIG. 15L is a sectional view of a step subsequent to that of FIG. 15K.

Next, as shown in FIG. 15L, rear surface grinding for thinning the silicon substrate 2 is performed. The silicon substrate 2 is made thin by the silicon substrate 2 being ground from the rear surface. For example, the silicon substrate 2 with a thickness of approximately 670 μm in the initial state may be thinned to a thickness of approximately 300 lam.

Figure 15M:
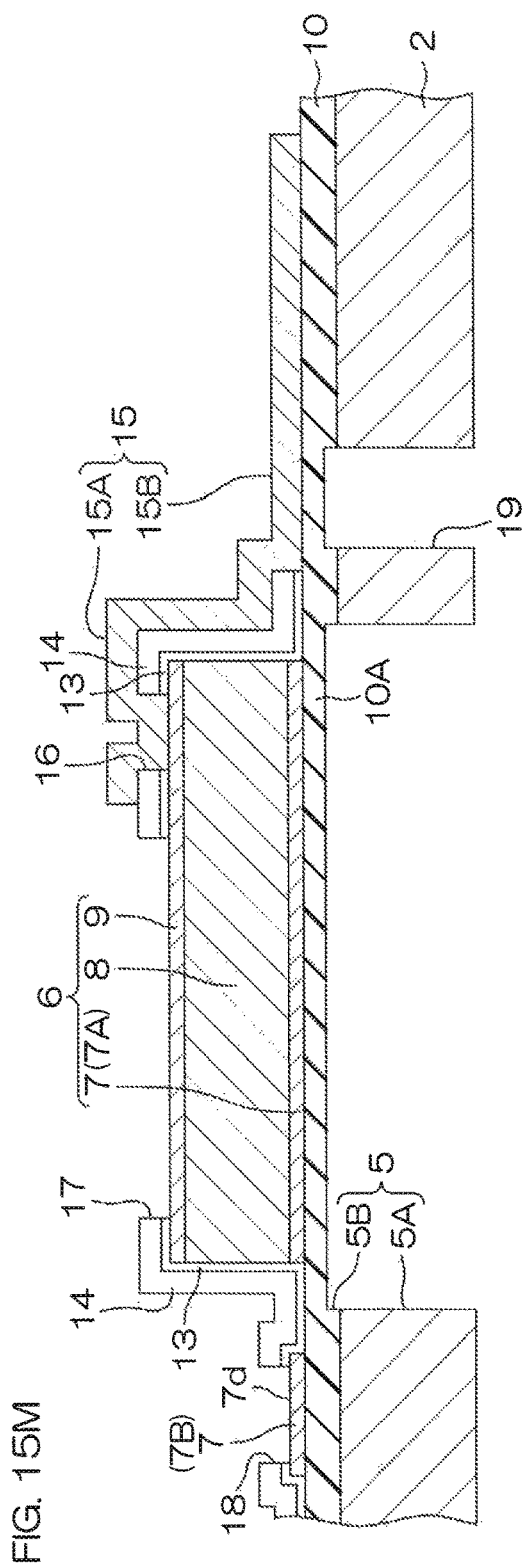
FIG. 15M is a sectional view of a step subsequent to that of FIG. 19L.

Next, as shown in FIG. 15M, etching (dry etching or wet etching) from the rear surface of the silicon substrate 2 is performed on the laminate of the silicon substrate 2 and the movable film formation layer 10 to form the pressure chambers 5, the ink supply passages 4, and the common ink passage 19 and form the movable films 10A at the same time. In the etching process, the base oxide film formed on the front surfaces of the hydrogen barrier film 13 and the movable film formation layer 10 prevents the escaping of metal elements (Pb, Zr, and Ti in the case of PZT) from the piezoelectric films and keeps the piezoelectric characteristics of the piezoelectric films 8 in a satisfactory state. Also as mentioned above, the base oxide film formed on the front surface of the movable film formation layer 10 contributes to maintaining the durability of silicon layer that forms the movable films 10A.

Thereafter, although not shown in FIG. 15, the nozzle substrate 3 is adhered onto the rear surface of the silicon substrate 2 and the inkjet printing head 1 shown in FIG. 9 to FIG. 12 is thereby obtained.

FIG. 16 is an enlarged sectional view of a modification example of the hydrogen barrier film 13. FIG. 16 shows a section corresponding to that of FIG. 14. In FIG. 16, portions corresponding to respective portions in FIG. 14 described above are provided with the same symbols as in FIG. 14.

The hydrogen barrier film 13 here is constituted of a laminated film in which a sputtered film 43 at a lower layer side formed by the sputtering method and a plasma CVD film 44 at an upper layer side formed by a plasma CVD (chemical vapor deposition) method are laminated. The sputtered film 43 is constituted of an $Al_2O_3$ film formed by the sputtering method. The plasma CVD film 44 is constituted of an SiN film (silicon nitride film) formed by the plasma CVD method.

Although the sputtered film 43 has a good hydrogen barrier property, it does not have a very good covering property with respect to the side surfaces of the piezoelectric elements 6 (side surfaces of the piezoelectric films 8). Also with the sputtered film 43, pinholes form readily when there is unevenness on the surface of the piezoelectric films 8. On the other hand, although being poor in hydrogen barrier property in comparison to the sputtered film 43, the plasma CVD film 44 can readily wrap around the side surface of the piezoelectric element 6 and is also high in the ability to fill pinholes. Therefore, with an arrangement where a sputtered film and a plasma CVD film are laminated, the hydrogen barrier effect can be improved in comparison to an arrangement where the hydrogen barrier film is formed with just a sputtered film if the hydrogen barrier film thickness is the same in both arrangements.

In other words, in comparison to a case where a hydrogen barrier film is formed of just a sputtered film, the hydrogen barrier property can be maintained even when the hydrogen barrier film is thinned if the hydrogen barrier film is formed of a laminated film of a sputtered film and a plasma CVD film. The hydrogen barrier film can thus be made thin and therefore the movable films 10A can be made large in displacement.

The sputtered film 43 may have a film thickness of not less than 10 nm and not more than 100 nm. The plasma CVD film 44 may have a film thickness of not less than 10 nm and not more than 100 nm. The total of the film thicknesses of the sputtered film 43 and the plasma CVD film 44 may be not more than 100 nm. For example, the sputtered film 43 may have a film thickness of 30 nm and the plasma CVD film 44 may have a film thickness of 30 nm. To make the thickness of the hydrogen barrier film 13 thin, the film thickness of the sputtered film 43 may be made thinner than the film thickness of the plasma CVD film 44.

Figure 17:
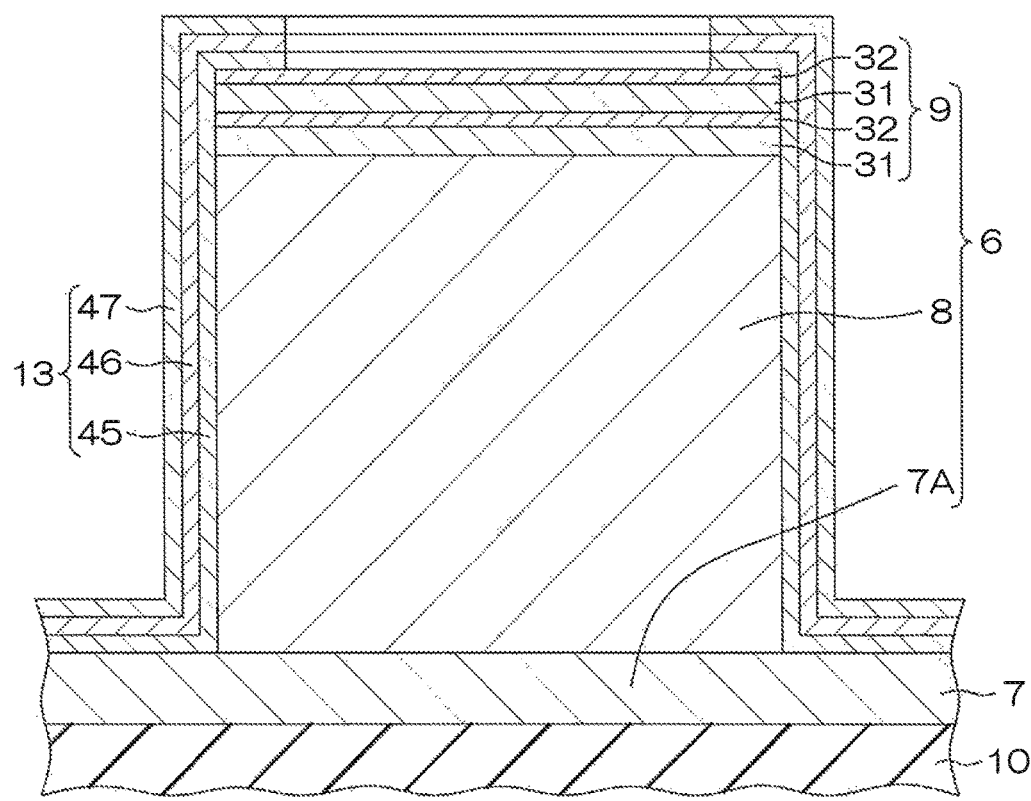
FIG. 17 is an enlarged sectional view of another modification example of the hydrogen barrier film.

FIG. 17 is an enlarged sectional view of another modification example of the hydrogen barrier film 13. FIG. 17 shows a section corresponding to that of FIG. 14. In FIG. 17, portions corresponding to respective portions in FIG. 14 described above are provided with the same symbols as in FIG. 14.

The hydrogen barrier film 13 here is constituted of a laminated film in which a first sputtered film 45 of a lowermost layer, a second sputtered film 46 of an intermediate layer formed under conditions different from the first sputtered film 45, and a plasma CVD film 47 of an uppermost layer are laminated. The first sputtered film 45 may be an $Al_2O_3$ film formed under the same conditions as the first sputtered film 41 of FIG. 14. The second sputtered film 46 may be an $Al_2O_3$ film formed under the same conditions as the second sputtered film 42 of FIG. 14. As with the plasma CVD film 44 of FIG. 16, the plasma CVD film 47 is constituted of an SiN film formed by the plasma CVD method.

Each of the first sputtered film 45 and the second sputtered film 46 may have a film thickness of not less than 10 nm and not more than 100 nm. The plasma CVD film 47 may have a film thickness of not less than 10 nm and not more than 100 nm. The total of the film thicknesses of the first sputtered film 45, the second sputtered film 46, and the plasma CVD film 47 may be not more than 100 nm. For example, each of the first sputtered film 45, the second sputtered film 46, and the plasma CVD film 47 may have a film thickness of 20 nm.

Figure 18:
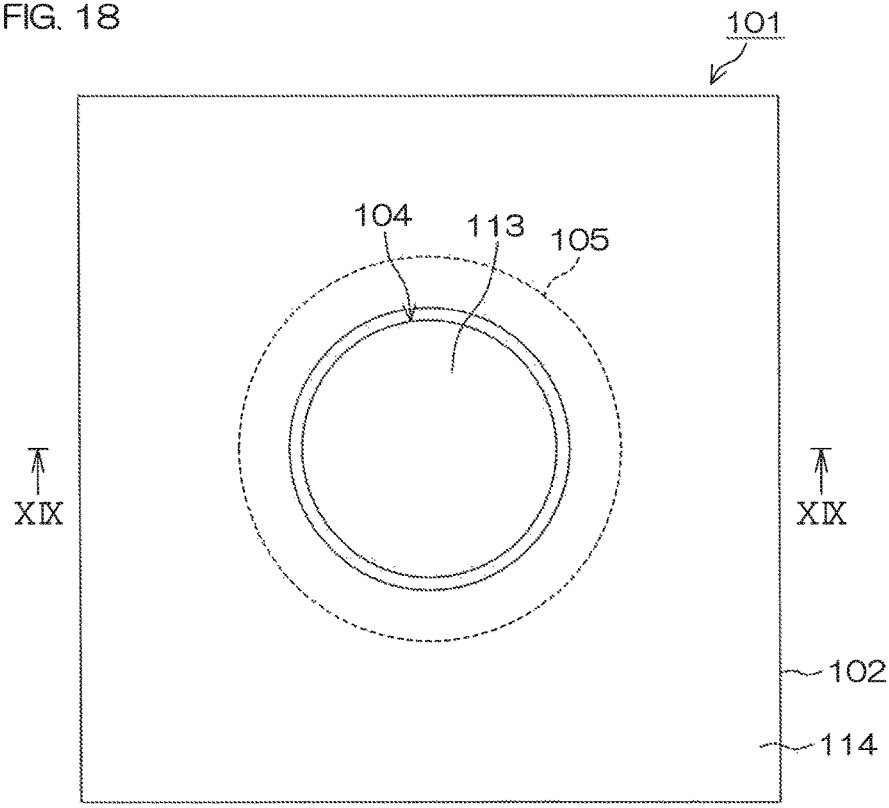
FIG. 18 is a schematic plan view of a pyroelectric infrared image sensor.
Figure 19:
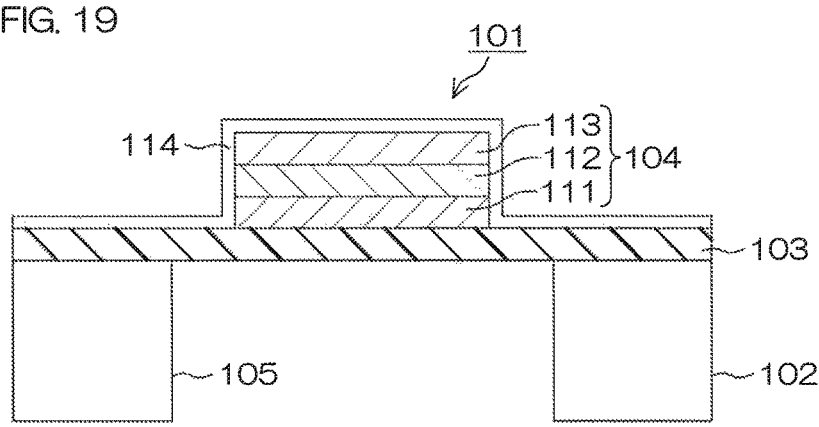
FIG. 19 is a sectional view taken along line XIX-XIX in FIG. 18.

FIG. 18 is a schematic plan view of a pyroelectric infrared image sensor. FIG. 19 is a sectional view taken along line XIX-XIX in FIG. 18.

The pyroelectric infrared image sensor 101 makes use of a change in surface charge of a pyroelectric material due to a temperature change due to infrared rays to detect the amount of infrared rays. The pyroelectric infrared image sensor 101 includes a silicon substrate 102, a heat insulating film (membrane) 103 formed above the silicon substrate 102, and a pyroelectric element 104 formed above the insulating film 103.

A cavity 105 that prevents heat transfer from the pyroelectric element 104 to the silicon substrate 102 is formed in the silicon substrate 102. The cavity 105 is formed by digging into the silicon substrate 102 from a rear surface side of the silicon substrate 102. The cavity 105 has a circular shape in plan view. A top surface of the cavity 105 is defined by the heat insulating film 103. The heat insulating film 103 is formed to cover an entirety of a top surface portion of the cavity 105 and further extend to a periphery thereof. The heat insulating film 103 is constituted of a silicon oxide ($SiO_2$) film.

The pyroelectric element 104 includes a lower electrode 111 formed to be in contact with a surface of the heat insulating film 103 at an opposite side from the cavity 105, a pyroelectric film 112 formed above the lower electrode 111, and an upper electrode 113 formed above the pyroelectric film 112.

The lower electrode 111 is constituted, for example, of a Pt film. The pyroelectric film 112 is constituted, for example, of a PZT ($PbZr_xTi_{1-x}O_3$: lead zirconate titanate) film. The upper electrode 113 is constituted, for example, of a Pt film.

The lower electrode 111 is formed, in plan view, to a circle that is concentric with a center of the cavity 105 and having a diameter smaller than the diameter of the cavity 105. The pyroelectric film 112 is formed in the same pattern as the lower electrode 111. The upper electrode 113 is formed in the same pattern as the pyroelectric film 112.

Front surfaces of the heat insulating film 103 and the pyroelectric element 104 are covered by a hydrogen barrier film 114. Although not illustrated, an insulating film is formed on a front surface of the hydrogen barrier film 114. In a process of forming the insulating film, hydrogen may enter into the pyroelectric film 112 and the pyroelectric characteristics may degrade. The hydrogen barrier film 114 is thus formed on the front surfaces of the heat insulating film 103 and the pyroelectric element 104.

When infrared rays are irradiated onto the pyroelectric element 104, the heat thereof causes the temperature of the pyroelectric film 112 to change and thereby causes a change in the surface charge of the pyroelectric film 112. The change in surface charge of the pyroelectric film 112 is taken out via the lower electrode 111 and the upper electrode 113. The light amount of the infrared rays can thereby be detected. For the sake of convenience, wirings for taking out the change in surface charge of the pyroelectric film 112 from the lower electrode 111 and the upper electrode 113 are omitted in FIG. 18 and FIG. 19.

Figure 20A:
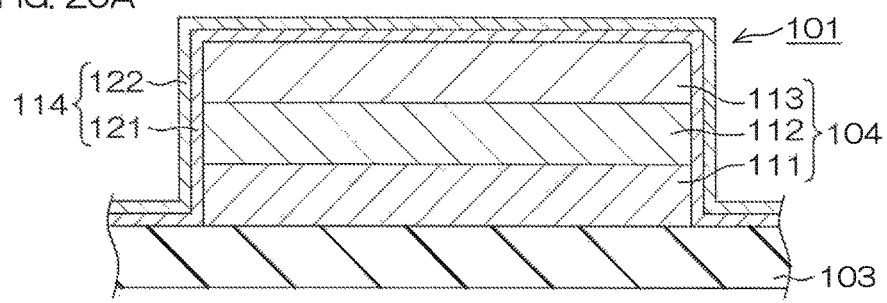
FIG. 20A is an enlarged sectional view of the structure of the hydrogen barrier film.

FIG. 20A is an enlarged sectional view of the structure of the hydrogen barrier film 114.

The hydrogen barrier film 114 is constituted of two types of two types of sputtered films 121 and 122 formed under different conditions. Specifically, the hydrogen barrier film 114 has a two-layer structure in which a first sputtered film 121 at a lower layer side and a second sputtered film 122 at an upper layer side are laminated. The first sputtered film 121 and the second sputtered film 122 are both constituted of sputtered films of $Al_2O_3$ (alumina). The first sputtered film 121 and the second sputtered film 122 may be TiO films (titanium dioxide films) or may be SiN films (silicon nitride films).

The first sputtered film 121 is formed under a low pressure condition of, for example, not less than 0.01 Pa and less than 0.1 Pa and the second sputtered film 122 is formed under a high pressure condition of, for example, not less than 0.1 Pa and not more than 3.0 Pa. The first sputtered film 121 may have a film thickness of not less than 10 nm and not more than 100 nm and the second sputtered film 122 may have a film thickness of not less than 10 nm and not more than 100 nm. The total of the film thicknesses of the first sputtered film 121 and the second sputtered film 122 may be not more than 100 nm. For example, first sputtered film 121 may have a film thickness of 30 nm and the second sputtered film 122 may have a film thickness of 30 nm. The hydrogen barrier film 114 is thus arranged by laminating the two types of sputtered films 121 and 122 that differ in characteristics and therefore the hydrogen barrier film 114 can be made high in hydrogen barrier property. Degradation of characteristics due to hydrogen reduction of the pyroelectric films 112 can thereby be prevented more effectively.

Figure 20B:
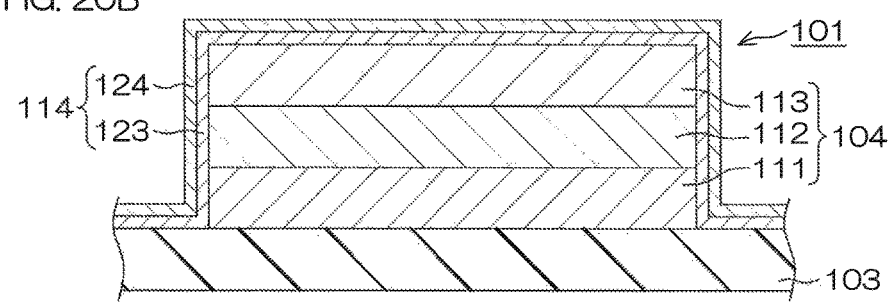
FIG. 20B is an enlarged sectional view of a modification example of the hydrogen barrier film.

FIG. 20B is an enlarged sectional view of a modification example of the hydrogen barrier film 114.

The hydrogen barrier film 114 here is constituted of a laminated film in which a sputtered film 123 at a lower layer side formed by the sputtering method and a plasma CVD film 124 at an upper layer side formed by the plasma CVD method are laminated. The sputtered film 123 is constituted of an $Al_2O_3$ film formed by the sputtering method. The plasma CVD film 124 is constituted of an SiN film (silicon nitride film) formed by the plasma CVD method.

Although the sputtered film 123 has a good hydrogen barrier property, it does not have a very good covering property with respect to a side surface of the pyroelectric element 104 (an outer peripheral surface of the pyroelectric film 112). Also with the sputtered film 123, pinholes form readily when there is unevenness on the surface of the pyroelectric film 112. On the other hand, although being poor in hydrogen barrier property in comparison to the sputtered film 123, the plasma CVD film 124 can readily wrap around the outer peripheral surface of the pyroelectric element 104 and is also high in the ability to fill pinholes. Therefore, with an arrangement where a sputtered film and a plasma CVD film are laminated, the hydrogen barrier effect can be improved in comparison to an arrangement where the hydrogen barrier film is formed with just a sputtered film if the hydrogen barrier film thickness is the same in both arrangements.

The sputtered film 123 may have a film thickness of not less than 10 nm and not more than 100 nm. The plasma CVD film 124 may have a film thickness of not less than 10 nm and not more than 100 nm. The total of the film thicknesses of the sputtered film 123 and the plasma CVD film 124 may be not more than 100 nm. For example, the sputtered film 123 may have a film thickness of 30 nm and the plasma CVD film 124 may have a film thickness of 30 nm.

Figure 20C:
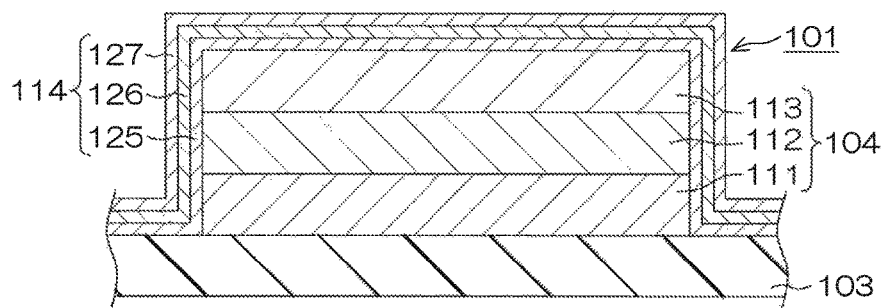
FIG. 20C is an enlarged sectional view of another modification example of the hydrogen barrier film.

FIG. 20C is an enlarged sectional view of another modification example of the hydrogen barrier film 114.

The hydrogen barrier film 114 here is constituted of a laminated film in which a first sputtered film 125 of a lowermost layer, a second sputtered film 126 of an intermediate layer formed under conditions different from the first sputtered film 125, and a plasma CVD film 127 of an uppermost layer are laminated. The first sputtered film 125 may be an $Al_2O_3$ film formed under the same conditions as the first sputtered film 121 of FIG. 20A. The second sputtered film 126 may be an $Al_2O_3$ film formed under the same conditions as the second sputtered film 122 of FIG. 20A. As with the plasma CVD film 124 of FIG. 20B, the plasma CVD film 127 is constituted of an SiN film formed by the plasma CVD method.

Each of the first sputtered film 125 and the second sputtered film 126 may have a film thickness of not less than 10 nm and not more than 100 nm. The plasma CVD film 127 may have a film thickness of not less than 10 nm and not more than 100 nm. The total of the film thicknesses of the first sputtered film 125, the second sputtered film 126, and the plasma CVD film 127 may be not more than 100 nm. For example, each of the first sputtered film 125, the second sputtered film 126, and the plasma CVD film 127 may have a film thickness of 20 nm.

Figure 21:
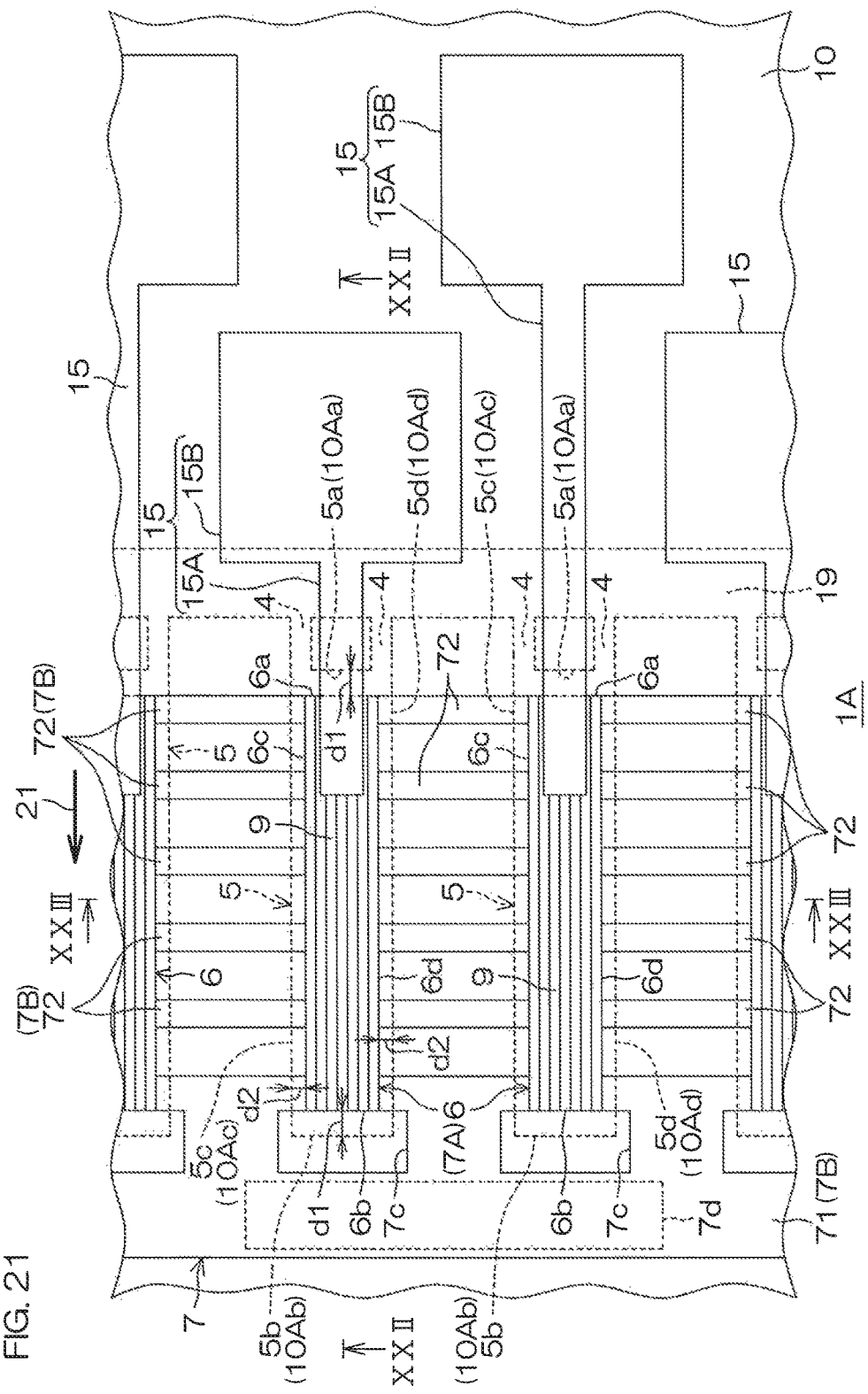
FIG. 21 is a schematic plan view of an inkjet printing head to which a third and fourth inventions are applied.
Figure 22:
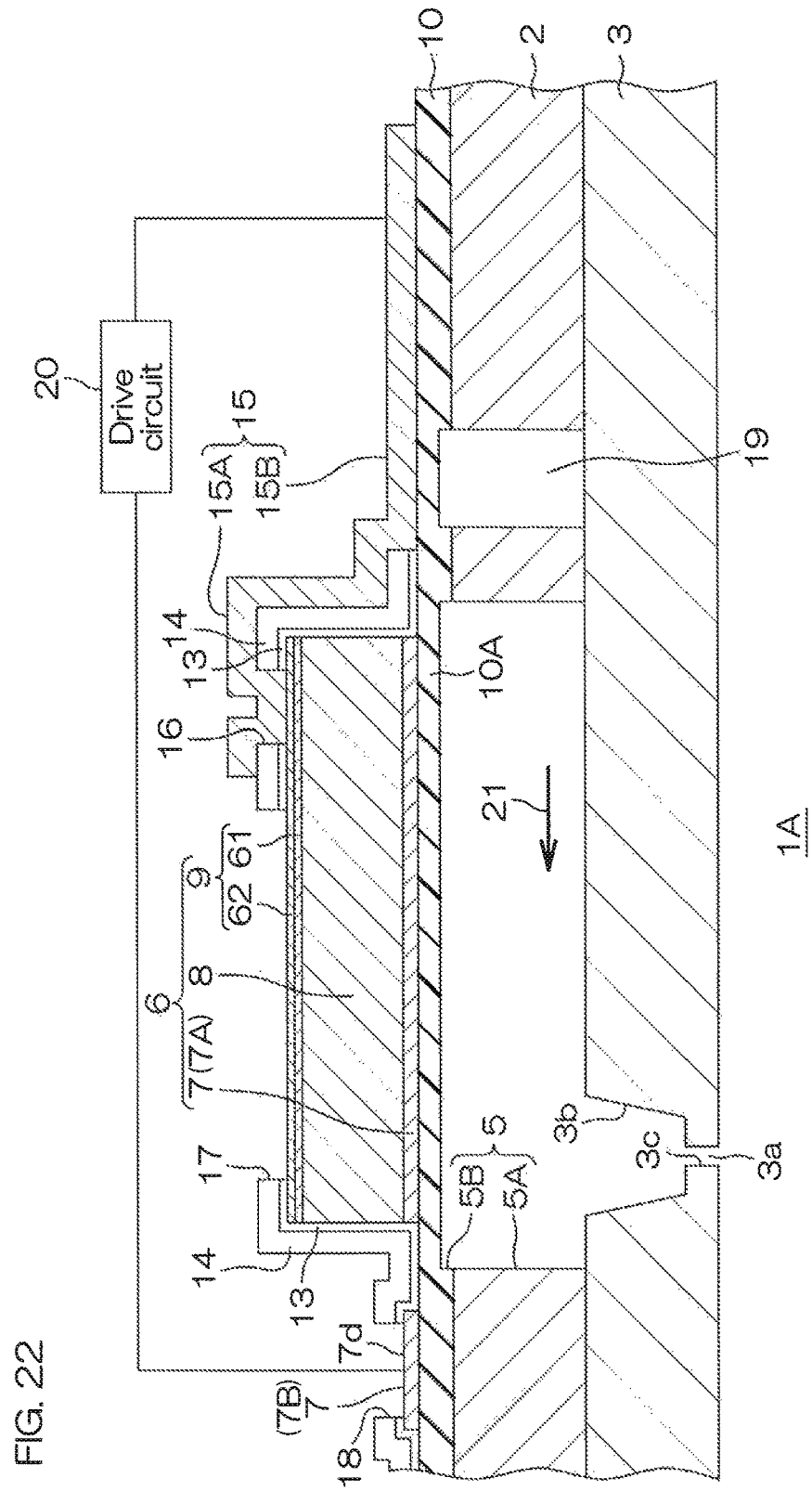
FIG. 22 is a schematic enlarged sectional view taken along line XXII-XXII in FIG. 21.
Figure 23:
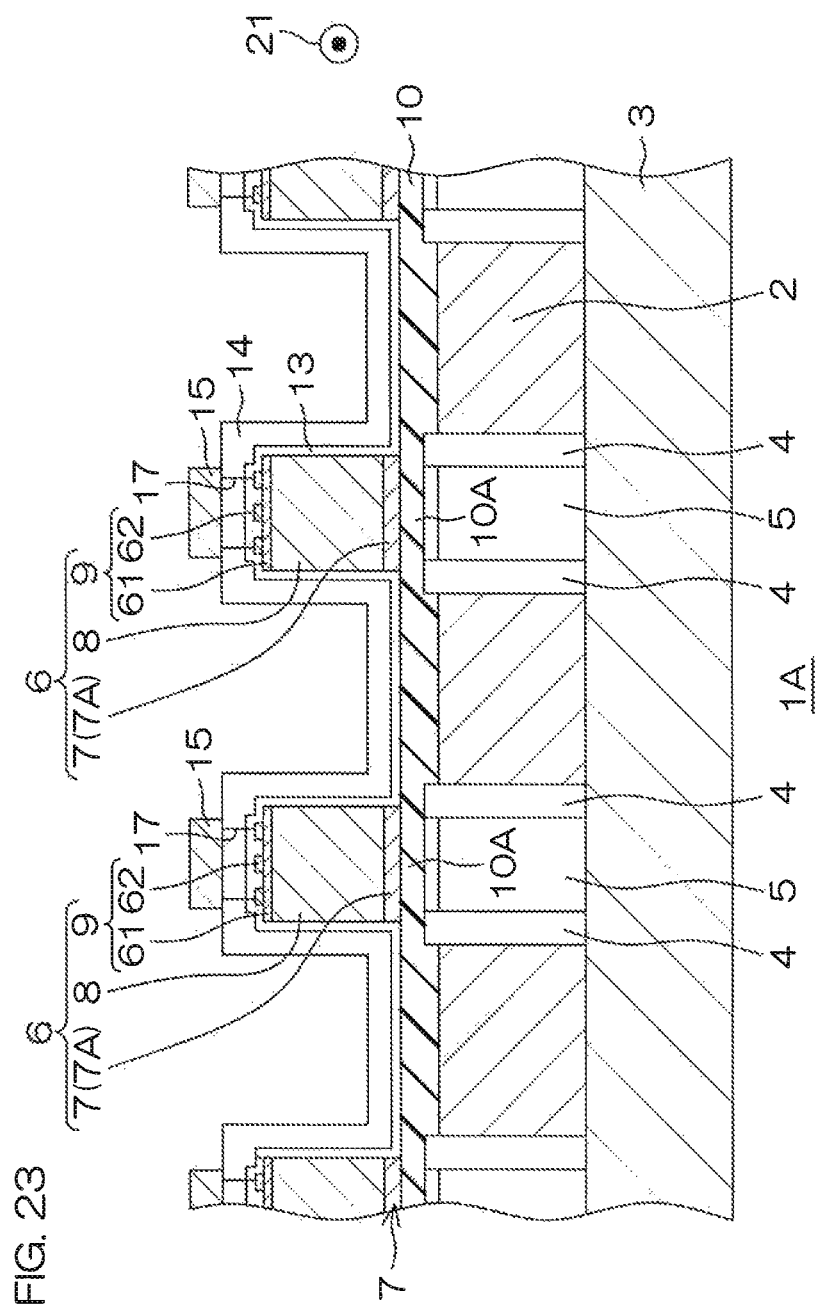
FIG. 23 is a schematic enlarged sectional view taken along line XXIII-XXIII in FIG. 21.
Figure 24:
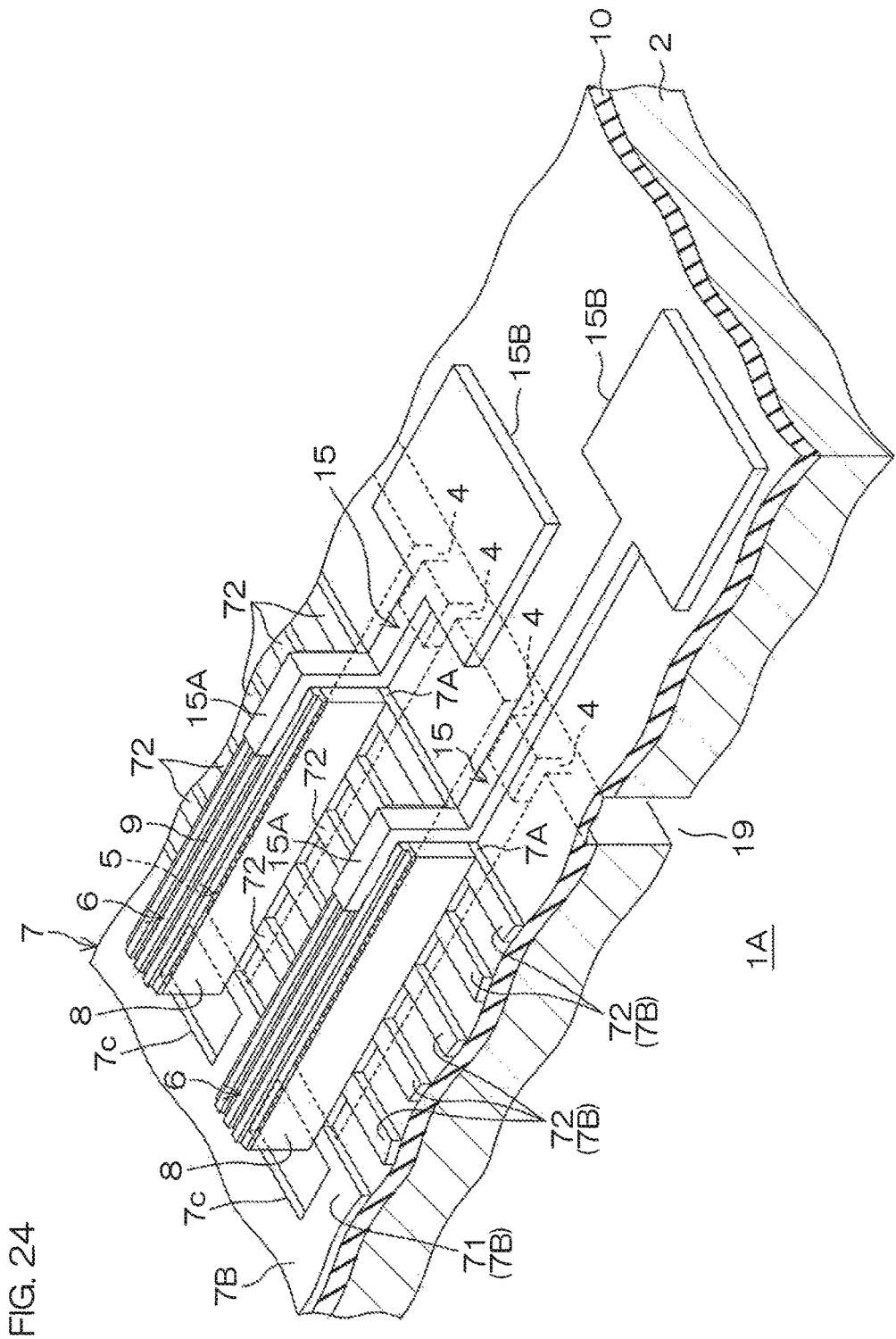
FIG. 24 is a schematic perspective view of the inkjet printing head.
Figure 25:
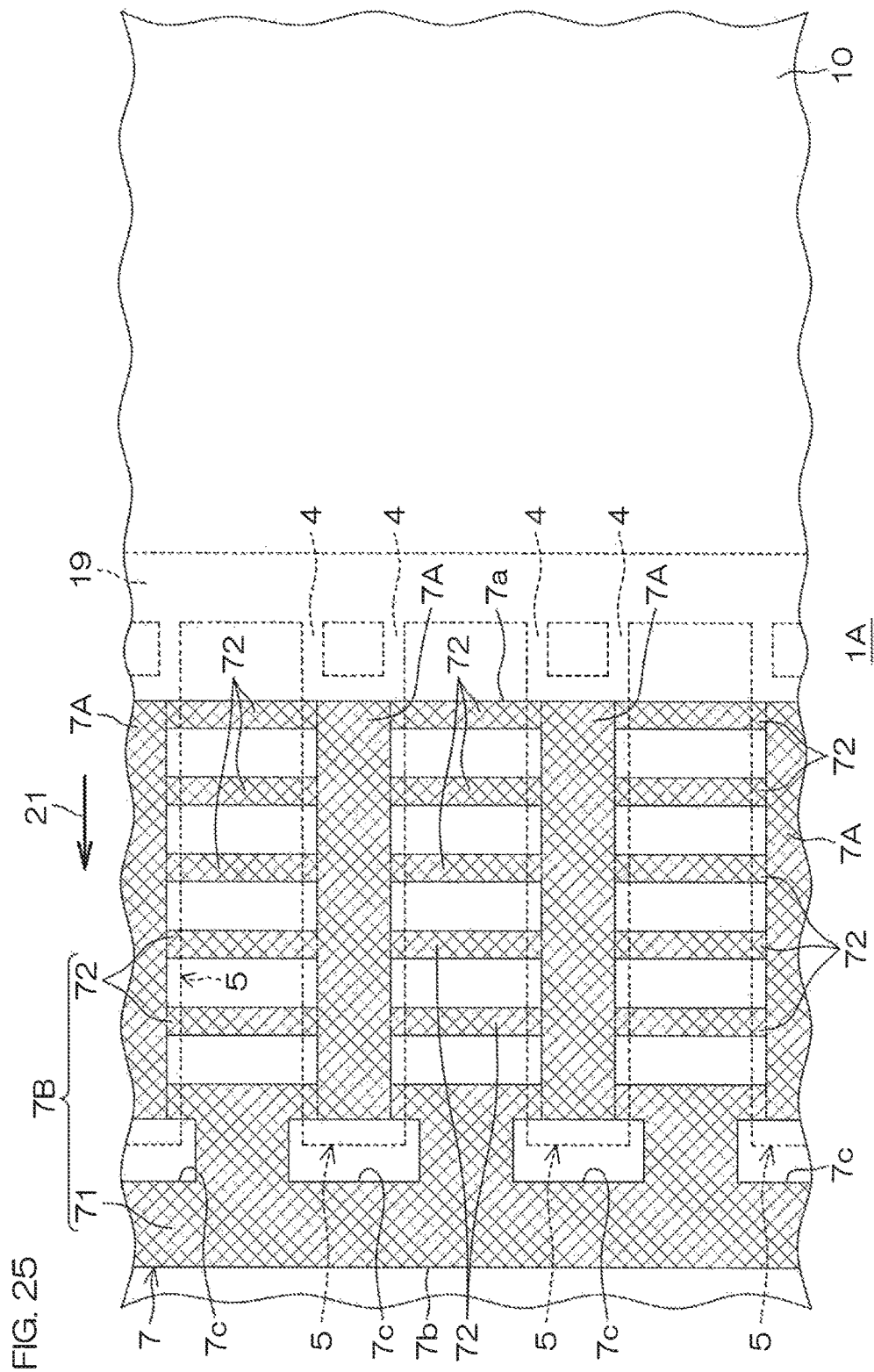
FIG. 25 is a plan view of a planar shape of a lower electrode formed above the movable film formation layer and is a plan view with which the arrangement besides the lower electrode formed above the movable film formation layer is removed.
Figure 26:
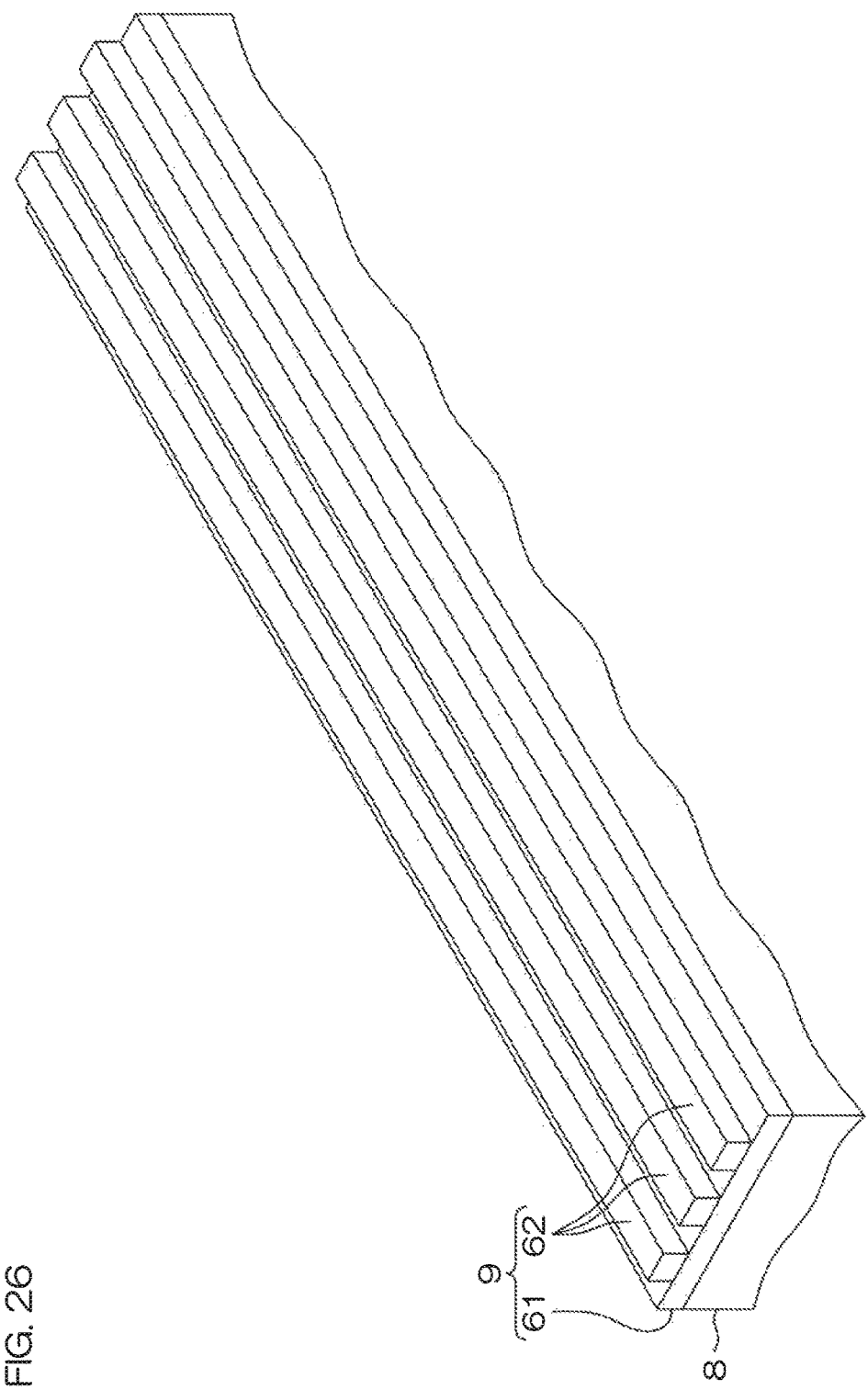
FIG. 26 is an enlarged perspective view of the structure of the upper electrode.

FIG. 21 is a schematic plan view of an inkjet printing head to which the third and fourth inventions are applied. FIG. 22 is a schematic enlarged sectional view taken along line XXII-XXII in FIG. 21. FIG. 23 is a schematic enlarged sectional view taken along line XXIII-XXIII in FIG. 21. FIG. 24 is a schematic perspective view of the inkjet printing head. In FIG. 21 and FIG. 24, a hydrogen barrier film indicated by symbol 13 and an insulating film indicated by symbol 14 in FIG. 22 and FIG. 23 are omitted. FIG. 25 is a plan view of a planar shape of a lower electrode formed above a movable film formation layer and is a plan view with which the arrangement besides the lower electrode formed above the movable film formation layer is removed. FIG. 26 is an enlarged perspective view of the structure of the upper electrode.

Referring to FIG. 22, the inkjet printing head 1A includes a silicon substrate 2 and a nozzle substrate 3 having discharge ports 3a that discharge ink. A movable film formation layer 10 is laminated on the silicon substrate 2. In the laminate of the silicon substrate 2 and the movable film formation layer 10, pressure chambers (cavities) 5 are formed as ink flow passages (ink reservoirs). Each pressure chamber 5 is constituted of a space portion 5A, formed in the silicon substrate 2 and penetrating through the silicon substrate 2 in a thickness direction, and a recess 5B, formed in a rear surface (surface at the silicon substrate 2 side) of the movable film formation layer 10 and continuous to the space portion 5A.

The nozzle substrate 3 is constituted, for example, of a silicon plate, is adhered to a rear surface of the silicon substrate 2, and, together with the silicon substrate 2 and the movable film formation layer 10, defines the pressure chambers 5. The nozzle substrate 3 has recesses 3b facing the pressure chambers 5 and an ink discharge passage 3c is formed in a bottom surface of each recess 3b. Each ink discharge passage 3c penetrates through the nozzle substrate 3 and has a discharge port 3a at an opposite side from a pressure chamber 5. Therefore, when a volume change occurs in the pressure chamber 5, the ink retained in the pressure chamber 5 passes through the ink discharge passage 3c and is discharged from the discharge port 3a.

Each pressure chamber 5 is formed by digging into the silicon substrate 2 and the movable film formation layer 10 from the rear surface side of the silicon substrate 2. Ink supply passages 4 (see FIG. 21 and FIG. 23 together), in communication with the pressure chambers 5, are further formed in the silicon substrate 2 and the movable film formation layer 10. The ink supply passages 4 are in communication with the pressure chambers 5 and are formed to guide ink from an ink tank (for example, an ink cartridge) that is an ink supply source to the pressure chambers 5.

Each pressure chamber 5 is formed to be elongate along an ink flow direction 21, which is a right/left direction in FIG. 22. Each portion of the movable film formation layer 10 that is atop roof portion of a pressure chamber 5 constitutes a movable film (membrane) 10A. The movable film 10A (movable film formation layer 10) is constituted, for example, of a silicon oxide ($SiO_2$) film formed above the silicon substrate 2. The movable film 10A (movable film formation layer 10) may be constituted of a laminate, for example, of a silicon (Si) layer formed above the silicon substrate 2, a silicon oxide ($SiO_2$) layer formed above the silicon layer, and a silicon nitride (SiN) layer formed above the silicon oxide layer. In the present specification, the movable film 10A refers to each portion of the movable film formation layer 10 that is a top roof portion defining a pressure chamber 5. Therefore, portions of the movable film formation layer 10 besides the top roof portions of the pressure chambers 5 do not constitute the movable films 10A.

Each movable film 10A has a thickness of, for example, 0.4 μm to 2 μm. If the movable film 10A is constituted of a silicon oxide film, the thickness of the silicon oxide film may be approximately 1.2 μm. If the movable film 10A is constituted of a laminate of a silicon layer, a silicon oxide layer, and a silicon nitride layer, the thickness of each of the silicon layer, the silicon oxide layer, and the silicon nitride layer may be approximately 0.4 μm.

Each pressure chamber 5 is defined by the movable film 10A, the silicon substrate 2, and the nozzle substrate 3 and is formed to a substantially rectangular parallelepiped shape in the present preferred embodiment. The pressure chamber 5 may, for example, have a length of approximately 800 μm and a width of approximately 55 μm. Each ink supply passage 4 is formed to be in communication with one end portion (an end portion positioned at an opposite side from the discharge port 3a in the present preferred embodiment) in a long direction of a pressure chamber 5. In the present preferred embodiment, the discharge port 3a of the nozzle substrate 3 is disposed near another end portion related to the long direction of the pressure chamber 5.

A piezoelectric element 6 is disposed on a front surface of each movable film 10A. A piezoelectric actuator is arranged by the silicon substrate 2, the movable film 10A, and the piezoelectric element 6. The piezoelectric element 6 includes a lower electrode 7 formed above the movable film formation layer 10, a piezoelectric film 8 formed above the lower electrode 7, and an upper electrode 9 formed above the piezoelectric film 8. In other words, the piezoelectric element 6 is arranged by sandwiching the piezoelectric film 8 from above and below by the upper electrode 9 and the lower electrode 7.

The lower electrode 7 has, for example, a two-layer structure with a Ti (titanium) layer and a Pt (platinum) layer being laminated in that order from the movable film 10A side. The lower electrode 7 has main electrode portions 7A in contact with lower surfaces of the piezoelectric films 8 and an extension portion 7B (see also FIG. 21, FIG. 24, FIG. 25) extending to a region outside the piezoelectric film 8.

As the piezoelectric film 8, for example, a PZT ($PbZr_xTi_{1-x}O_3$: lead zirconate titanate) film formed by a sol-gel method or a sputtering method may be applied. Such a piezoelectric film 8 is constituted of a sintered body of metal oxide crystals. The piezoelectric film 8 preferably has a thickness of 1 μm to 5 μm. The overall thickness of the movable film 10A is preferably approximately the same as the thickness of the piezoelectric film 8 or approximately ⅔ the thickness of the piezoelectric film.

Each upper electrode 9 is formed to have substantially the same shape in plan view as the piezoelectric film 8. In the present preferred embodiment, the upper electrode 9 has a two-layer structure in which an $IrO_2$ (iridium oxide) film 61 and an Ir (iridium) film 62 are laminated in that order from the piezoelectric film 8 side.

The front surface of the movable film formation layer 10, front surfaces of the piezoelectric elements 6, and a front surface of the extension portion 7B of the lower electrode 7 are covered with a hydrogen barrier film 13. The hydrogen barrier film 13 is constituted, for example, of $Al_2O_3$ (alumina). Degradation of characteristics of the piezoelectric films 8 due to hydrogen reduction can thereby be prevented. An insulating film 14 is laminated above the hydrogen barrier film 13. The insulating film 14 is constituted, for example, of $SiO_2$. Wirings 15 are formed above the insulating film 14. Each wiring 15 is constituted of a metal material that includes Al (aluminum).

One end portion of each wiring 15 is disposed above one end portion of an upper electrode 9. A penetrating hole (contact hole) 16, penetrating continuously through the hydrogen barrier film 13 and the insulating film 14, is formed between the wiring 15 and the upper electrode 9. The one end portion of the wiring 15 enters into the penetrating hole 16 and is connected to the upper electrode 9 inside the penetrating hole 16. Also, in the hydrogen barrier film 13 and the insulating film 14, an opening 17 of rectangular shape in plan view is formed in a region corresponding to a central portion of a front surface of each upper electrode 9 (portion surrounded by a peripheral edge portion of a front surface of each upper electrode 9).

Also, an opening 18, penetrating continuously through the hydrogen barrier film 13 and the insulating film 14, is formed at a position corresponding to a predetermined region above the extension portion 7B of the lower electrode 7 and a front surface of the lower electrode 7 is exposed via the opening 18. The exposed portion constitutes a pad portion 7d arranged to connect the lower electrode 7 to the exterior. At a portion of the front surface of the movable film formation layer 10 further upstream than upstream ends in the ink flow direction 21 of the piezoelectric elements 6, the hydrogen barrier film 13 and the insulating film 14 are formed just in regions close to the upstream ends of the piezoelectric elements 6 and the hydrogen barrier film 13 and the insulating film 14 are not formed further upstream.

Each piezoelectric element 6 is formed at a position facing a pressure chamber 5 across a movable film 10A. That is, the piezoelectric element 6 is formed to contact a surface of the movable film 10A at the opposite side from the pressure chamber 5. The pressure chamber 5 is filled with ink supplied from an unillustrated ink tank through the ink supply passages 4. The movable film 10A defines a top surface portion of the pressure chamber 5 and faces the pressure chamber 5. The movable film 10A is supported by portions of the laminate of the movable film formation layer 10 and the silicon substrate 2 at a periphery of the pressure chamber 5 and has flexibility enabling deformation in a direction facing the pressure chamber 5 (in other words, in a thickness direction of the movable film 10A).

The wirings 15 and the pad portion 7d of the lower electrode 7 are connected to a drive circuit 20. The drive circuit 20 may be formed in a region of the silicon substrate 2 separate from the pressure chambers 5 or may be formed outside the silicon substrate 2. When a drive voltage is applied from the drive circuit 20 to a piezoelectric element 6, the piezoelectric film 8 deforms due to an inverse piezoelectric effect. The movable film 10A is thereby made to deform together with the piezoelectric element 6 to bring about a volume change of the pressure chamber 5 and the ink inside the pressure chamber 5 is pressurized. The pressurized ink passes through the ink discharge passage 3*c* and is discharged as microdroplets from the discharge port 3*a*.

Referring to FIG. 21 to FIG. 25, a plurality of the pressure chambers 5 are formed as stripes extending parallel to each other in the laminate of the silicon substrate 2 and the movable film formation layer 10. The plurality of pressure chambers 5 are formed at equal intervals that are minute intervals (for example, of approximately 30 μm to 350 μm) in a width direction thereof. In plan view, each pressure chamber 5 has an oblong shape that is elongate along the ink flow direction 21 from ink supply passages 4 to a discharge passage 3*c*. That is, the top surface portion of the pressure chamber 5 has two side edges 5*c* and 5*d* along the ink flow direction 21 and two end edges 5*a* and 5*b* along a direction orthogonal to the ink flow direction 21. At the one end portion of each pressure chamber 5, the ink supply passages 4 are divided and formed as two passages and are in communication with a common ink passage 19. The common ink passage 19 is in communication with the ink supply passages 4 corresponding to the plurality of pressure chambers 5 and is formed to supply the ink from the ink tank to the ink supply passages 4.

Each piezoelectric element 6 has a rectangular shape in plan view with which a length in the ink flow direction 21 (same direction as a long direction of each movable film 10A) is defined to be shorter than a length of the movable film 10A in the long direction. As shown in FIG. 21, respective end edges 6*a* and 6*b* along a short direction of the piezoelectric element 6 are disposed at inner sides at predetermined intervals d1 (for example, of 5 μm) from respective corresponding end edges 10Aa and 10Ab of the movable film 10A. Also, a width of the piezoelectric element 6 in the short direction (direction parallel to a major surface of the silicon substrate 2) orthogonal to the long direction of the movable film 10A is defined to be narrower than a width of the movable film 10A (top surface portion of a pressure chamber 5) in the short direction. Respective side edges 6*c* and 6*d* along a long direction of the piezoelectric element 6 are disposed at inner sides at predetermined intervals d2 (for example, of 5 μm) from respective corresponding side edges 10Ac and 10Ad of the movable film 10A.

The lower electrode 7 includes the main electrode portions 7A of rectangular shapes in plan view that constitute the piezoelectric elements 6 and the extension portion 7B lead out from the main electrode portions 7A in a direction along the front surface of the movable film formation layer 10. Each main electrode portion 7A is formed to be shorter than a movable film 10A along the long direction of the movable film 10A and respective end edges thereof are disposed at inner sides at the predetermined intervals d1 from the respective corresponding end edges 10Aa and 10Ab of the movable film 10A. Also with the main electrode portion 7A, a width along the short direction of the movable film 10A is defined to be narrower than the width of the movable film 10A in the short direction and respective end edges thereof are disposed at inner sides at the intervals d2 from the respective corresponding side edges 10Ac and 10Ad of the movable film 10A.

The extension portion 7B has a common electrode portion 71 that is lead out in a direction orthogonal to the ink flow direction 21 from side edges of end portions of the plurality of main electrode portions 7A at the downstream side in the ink flow direction 21 and also extends in the ink flow direction 21. The extension portion 7B also has a plurality of rectilinear electrode portions (metal lines) 72 that are lead out in the direction orthogonal to the ink flow direction 21 from both side edges of the respective main electrode portions 7A at portions further upstream in the ink flow direction 21 than the common electrode portion 71 and cross the side edges 10Ac and 10Ad of the top surface portions (movable films 10A) of the pressure chambers 5 to extend to outer sides of the side edges 10Ac and 10Ad of the top surface portions of the pressure chambers 5.

In plan view, the common electrode portion 71 has a rectangular shape that is long in the direction orthogonal to the ink flow direction 21. In the common electrode portion 71, cutout portions 7*c* of rectangular shapes in plan view that penetrate through the lower electrode 7 are formed at downstream sides in the ink flow direction 21 of the respective main electrode portions 7A. In plan view, each cutout portion 7*c* has two side edges (short sides) along the ink flow direction 21 and two end edges (long sides) along the direction orthogonal to the ink flow direction 21. One end edge of the cutout portion 7*c* is disposed at a position matching the end edge 6*b* of a piezoelectric element 6 (end edge at the downstream side of a main electrode portion 7A) in relation to the ink flow direction 21 and the other end edge is disposed further outside (downstream in the ink flow direction 21) than the end edge 10Ab of a movable film 10A. One side edge of the cutout portion 7*c* is disposed further outside than the one side edge 10Ac of the movable film 10A and the other side edge of the cutout portion 7*c* is disposed further outside than the other side edge 10Ad of the movable film 10A. Therefore in plan view, an end portion of the movable film 10A at the end edge 10Ab side is disposed at an inner side of the cutout portion 7*c*. The pad portion 7*d* of rectangular shape that is elongate in the direction orthogonal to the ink flow direction 21 is formed in a region between a side edge of the common electrode portion 71 at the downstream side in the ink flow direction 21 and the plurality of cutout portions 7*c*.

The plurality of rectilinear electrode portions 72*b* lead out from the respective side edges of the main electrode portions 7A are formed at intervals in the ink flow direction 21. A plurality of rectilinear electrode portions 72 lead out from one side edge of a main electrode portion 7A and a plurality of rectilinear electrode portions 72 connected to a plurality of rectilinear electrode portions 72 lead out from the other side edge of the main electrode portion 7A are matched in position in regard to the direction orthogonal to the ink flow direction 21. A plurality of rectilinear electrode portions 72 lead out from facing side edges of adjacent main electrode portions 7A are connected to each other. In other words, between adjacent main electrode portions 7A, a plurality of rectilinear electrode portions 72 are formed so as to join the facing side edges of the main electrode portions 7A to each other. That is, the lower electrode 7 has the plurality of rectilinear electrode portions 72 that are formed in a stripe pattern in regions outside the piezoelectric elements 6.

Referring to FIG. 21 to FIG. 24 and FIG. 26, each upper electrode 9 is arranged from a flat $IrO_2$ film 61 formed above a piezoelectric film 8 and a plurality of rectilinear Ir films 62 formed above the $IrO_2$ film 61 to constitute a stripe pattern. In plan view, the $IrO_2$ film 61 is formed to a rectangular shape of the same pattern as a main electrode portion 7A of the lower electrode 7. That is, the $IrO_2$ film 61 is formed to be shorter than a movable film 10A along the long direction of the movable film 10A and respective end edges thereof are disposed at inner sides at the predetermined intervals d1 from the respective corresponding end edges 10Aa and 10Ab of the movable film 10A. Also with the $IrO_2$ film 61, a width along the short direction of the movable film 10A is defined to be narrower than the width of the movable film 10A in the short direction and respective end edges thereof are disposed at inner sides at the intervals d2 from the respective corresponding side edges 10Ac and 10Ad of the movable film 10A.

The plurality of rectilinear Ir films 62 extend in a long direction of the $IrO_2$ film 61 and are formed across the entire length of the $IrO_2$ film 61. Each Ir film 62 is rectangular in cross section. Thicknesses of portions (groove portions) of the upper electrode 9 at which the rectilinear Ir films 62 are not formed are thinner than thicknesses of the portions at which the rectilinear Ir films 62 are formed. The upper electrode 9 thus has a plurality of thin film portions (groove portions) extending in its long direction.

In plan view, each piezoelectric film 8 is formed to a rectangular shape of the same pattern as an upper electrode 9. That is, the piezoelectric film 8 is formed to be shorter than a movable film 10A along the long direction of the movable film 10A and respective end edges thereof are disposed at inner sides at the predetermined intervals d1 from the respective corresponding end edges 10Aa and 10Ab of the movable film 10A. Also with the piezoelectric film 8, a width along the short direction of the movable film 10A is defined to be narrower than the width of the movable film 10A in the short direction and respective end edges thereof are disposed at inner sides at the intervals d2 from the respective corresponding side edges 10Ac and 10Ad of the movable film 10A. A lower surface of the piezoelectric film 8 contacts an upper surface of a main electrode portion 7A of the lower electrode 7 and an upper surface of the piezoelectric film 8 contacts a lower surface of the upper electrode 9.

Each wiring 15 is constituted of a lead-out portion 15A, having one end portion connected to one end portion (an end portion at the one end edge 6a side of a piezoelectric element 6) of an upper electrode 9 and extending in a direction opposite to the ink flow direction 21 in plan view, and a pad portion 15B of rectangular shape in plan view that is made integral to the lead-out portion 15A and connected to a tip of the lead-out portion 15A. At a portion further upstream in the ink flow direction 21 than the one end edge 6a of the piezoelectric element 6, the pad portion 15B is formed above a front surface of the movable film formation layer 10 at which the hydrogen barrier film 13 and the insulating film 14 are not formed. The lead-out portion 15A includes a first portion, formed above the insulating film 14 and covering one end portion of the upper surface of the piezoelectric element 6 (an end portion at the one end edge 6a side of the piezoelectric element 6), an end surface of the piezoelectric element 6 continuous to the one end portion, and a front surface of the movable film formation layer 10 continuous to the end surface, and a second portion from the first portion to the pad portion 15B. The second portion is formed above the front surface of the movable film formation layer 10 at which the hydrogen barrier film 13 and the insulating film 14 are not formed.

A process of manufacturing the inkjet printing head 1A of FIG. 21 is the same as the process of manufacturing the above-described inkjet printing head 1 of FIG. 9 (FIG. 15A to FIG. 15M) and description thereof shall thus be omitted.

An annular region (in the present preferred embodiment, a rectangular annular region that is long in the ink flow direction 21) in each movable film 10A between the peripheral edges 10Aa to 10Ad of the movable film 10A and the peripheral edges 6a to 6d of a piezoelectric element 6 is a region that is not constrained by peripheral walls of the piezoelectric element 6 or the pressure chamber 5 and is a main deformation region at which a large deformation occurs. That is, a peripheral edge portion of the movable film 10A is the main deformation region at which a large deformation occurs. Therefore, when the piezoelectric element 6 is driven, the peripheral edge portion of the movable film 10A bends so that inner peripheral edge sides of the peripheral edge portion of the movable film 10A are displaced in a thickness direction (downward in the present preferred embodiment) of the pressure chamber 5 and an entire central portion of the movable film 10A that is surrounded by the peripheral edge portion is thereby displaced in the thickness direction (downward in the present preferred embodiment) of the pressure chamber 5. In this process, the movable film 10A undergoes warping deformation in the short direction so that its width central portion is displaced in the thickness direction (downward in the present preferred embodiment) of the pressure chamber 5.

If the main deformation region of the movable film 10A is arranged from just the movable film 10A, the displacement of the movable film 10A can be made large. However, the movable film 10A is constituted of a hard, brittle material, such as silicon oxide, and therefore cracks readily. Although the movable film 10A can be reinforced by forming the lower electrode 7 across the entirety of the main deformation region of the movable film 10A as in the above-described inkjet printing head 1 of FIG. 9, the displacement of the movable film 10A will be lessened.

With the inkjet printing head 1A of FIG. 21, the lower electrode 7 has the plurality of rectilinear electrode portions (metal lines) 72 that are formed in a stripe pattern in regions outside the piezoelectric element 6. The rectilinear electrode portions 72, which are constituted of a metal, are formed at a high temperature and shrink thereafter upon being cooled to ordinary temperature and the rectilinear electrode portions 72 are thus made to have tensile stress. That is, the rectilinear electrode portions 72 apply a force in a shrinking direction to the movable film 10A and the movable film 10A is thus made unlikely to crack. Also, the rectilinear electrode portions 72 are formed not in the entirety of the main deformation region of the movable film 10A but in a partial region and therefore the displacement of the movable film 10A is not decreased in comparison to a case where the lower electrode is formed across the entirety of the main deformation region of the movable film 10A.

It suffices that the plurality of rectilinear electrode portions 72 are formed to constitute a stripe pattern or a mesh pattern between the piezoelectric element 6 and the edges of the pressure chamber 5 (peripheral edges of the movable film 10A).

Also with the inkjet printing head 1A of FIG. 21, each of the upper electrodes 9 has the plurality of thin film portions (groove portions) extending in the long direction. The movable films 10A are thereby made to undergo warping deformation readily in the short direction when the piezoelectric elements 6 are driven and the movable films 10A can thus be made large in displacement. Also with each upper electrode 9, portions (thick film portions) at which the rectilinear Ir films 62 are formed contribute to making the upper electrode 9 low in resistance. The upper electrodes 9 can thus be made soft while lowering the DC resistance of the upper electrodes 9 and the movable films 10A can thereby be made large in displacement and improved in operation speed (responsiveness).

Figure 27:
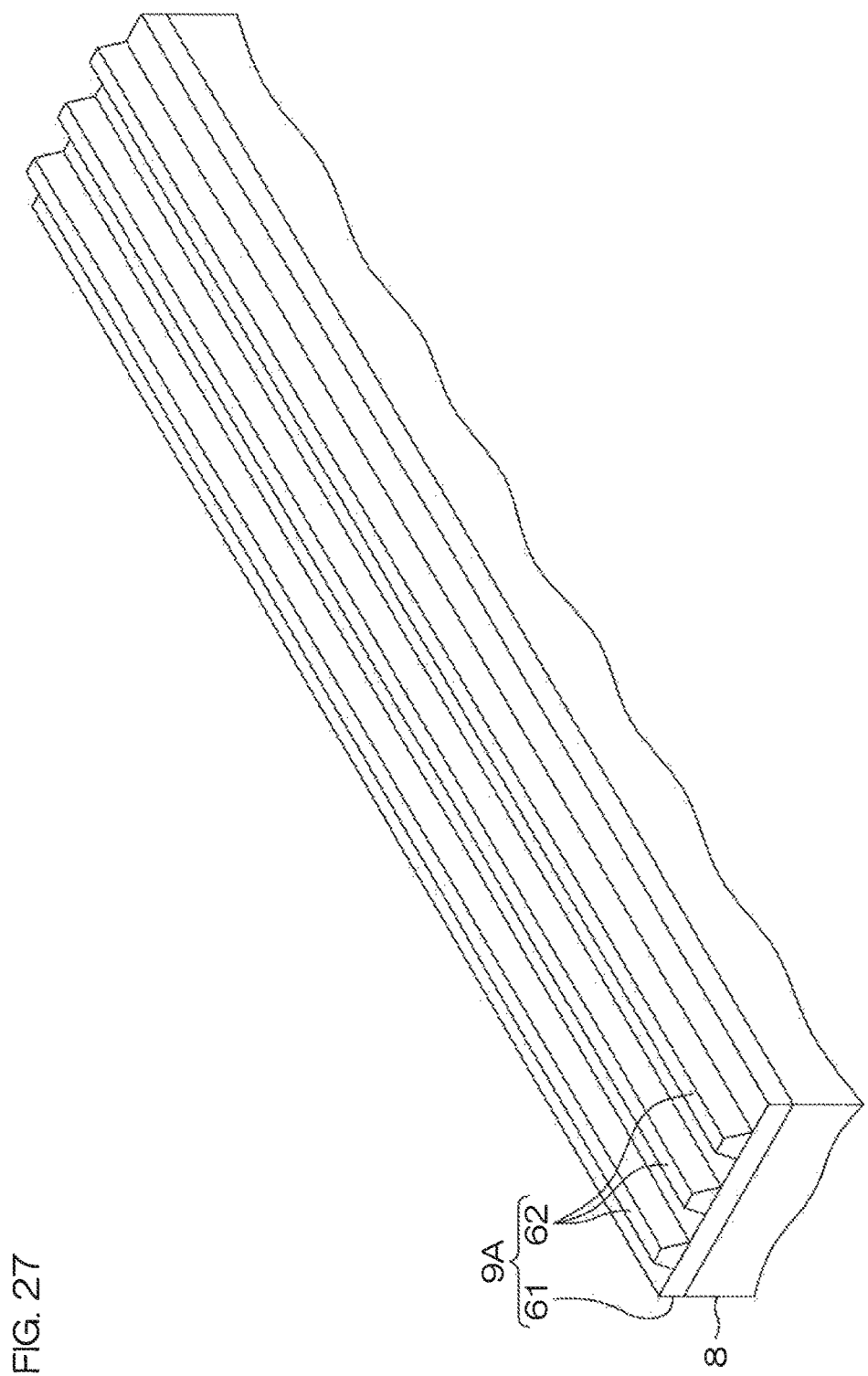
FIG. 27 is an enlarged perspective view of a first modification example of an upper electrode.

FIG. 27 is an enlarged perspective view of a first modification example of an upper electrode 9.

As with the upper electrode 9 shown in FIG. 26, the upper electrode 9 here is arranged from a flat IrO$_2$ film 61 formed above a piezoelectric film 8 and a plurality of rectilinear Ir films 62 formed as stripes above the IrO$_2$ film 61. This arrangement differs from the upper electrode 9 shown in FIG. 26 in that a cross section of each projecting portion constituted of an IrO$_2$ film 61 is trapezoidal.

Figure 28:
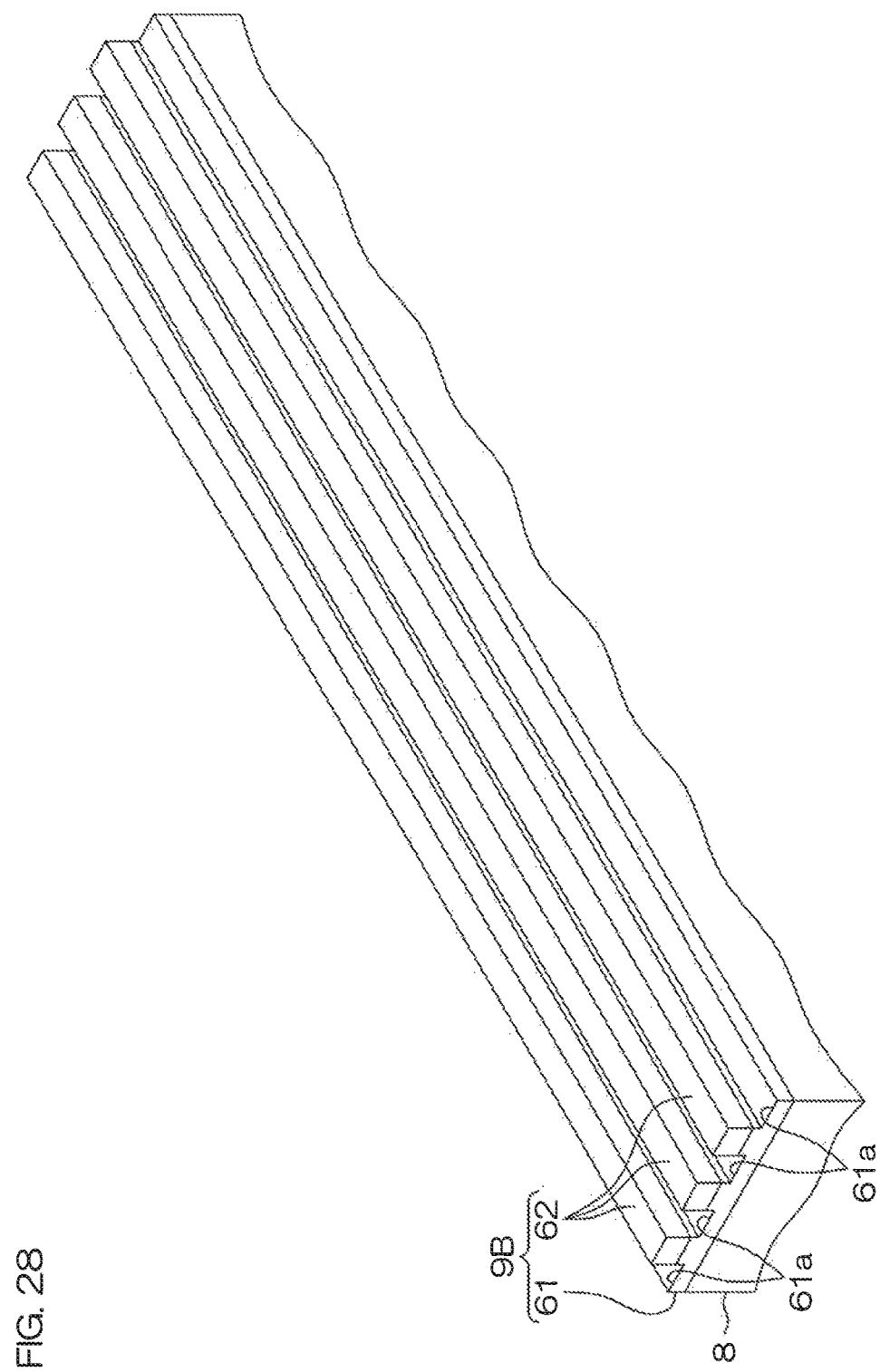
FIG. 28 is an enlarged perspective view of a second modification example of an upper electrode.

FIG. 28 is an enlarged perspective view of a second modification example of an upper electrode 9.

As with the upper electrode 9 shown in FIG. 26, the upper electrode 9B here is arranged from an IrO$_2$ film 61 formed above a piezoelectric film 8 and a plurality of rectilinear Ir films 62 formed as stripes above the IrO$_2$ film 61. The IrO$_2$ film 61 has, on its front surface, a plurality of rectilinear grooves (rectilinear recesses) 61a matched with grooves between mutually adjacent rectilinear Ir films 62 and grooves outside the rectilinear Ir films 62 at the respective sides.

Figure 29:
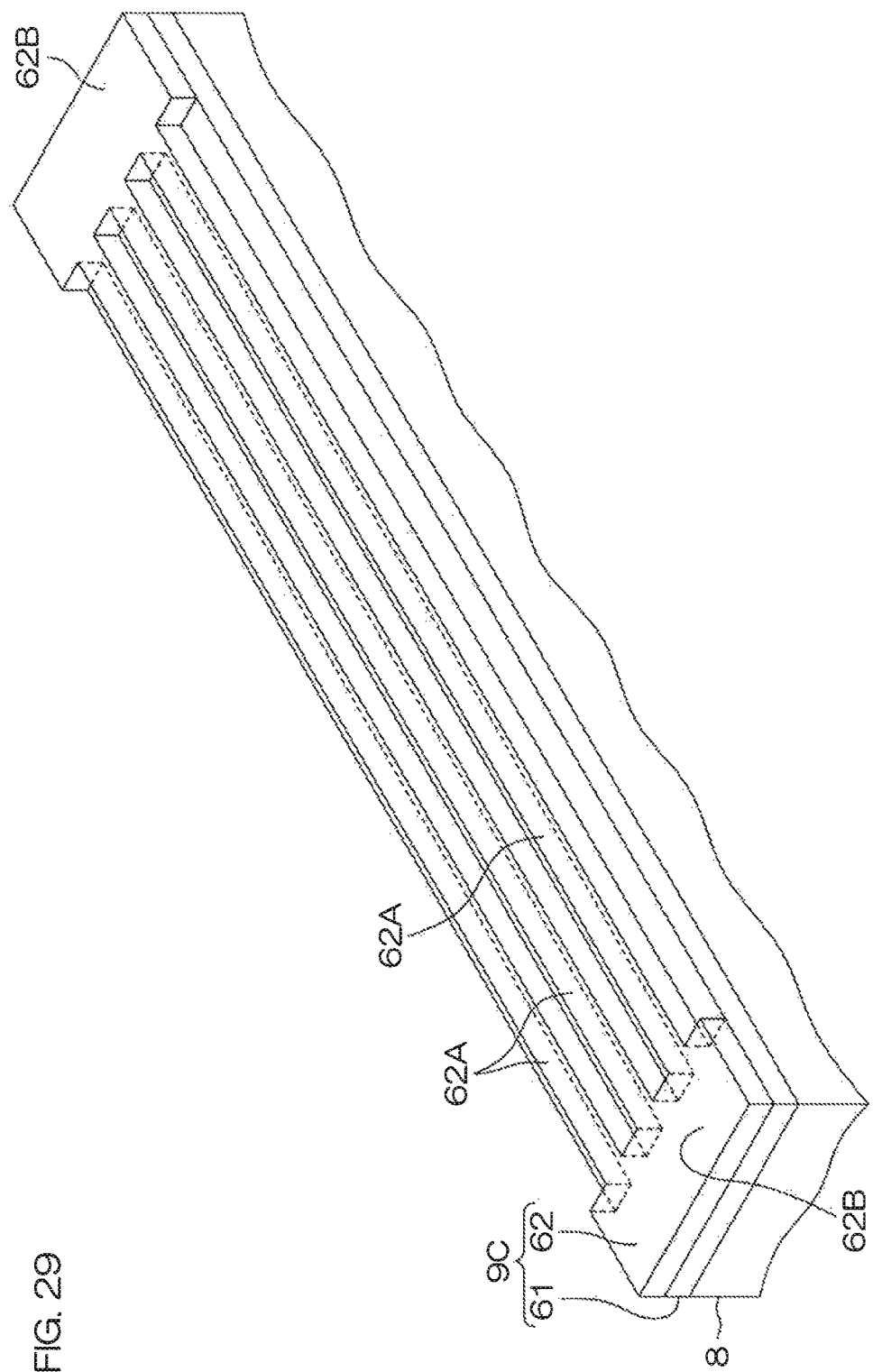
FIG. 29 is an enlarged perspective view of a third modification example of an upper electrode.

FIG. 29 is an enlarged perspective view of a third modification example of an upper electrode 9.

The upper electrode 9C here is arranged from a flat IrO$_2$ film 61 formed above a piezoelectric film 8 and an Ir film 62 formed above the IrO$_2$ film 61. The Ir film 62 has a plurality of linear portions 62A formed at intermediate portions in a long direction of a front surface of the IrO$_2$ film 61 and solid pattern portions 62B formed at respective end portions of the linear portions 62A. The plurality of linear portions 62A are formed parallel to the long direction of the IrO$_2$ film 61. That is, the plurality of linear portions 62A are formed as stripes. Each solid pattern portion 62B is a portion at which the Ir film 62 is formed across an entire front surface of a corresponding end portion of the IrO$_2$ film 61. Each solid pattern portion 62B is connected to corresponding end portions of the plurality of linear portions 62A.

Figure 30:
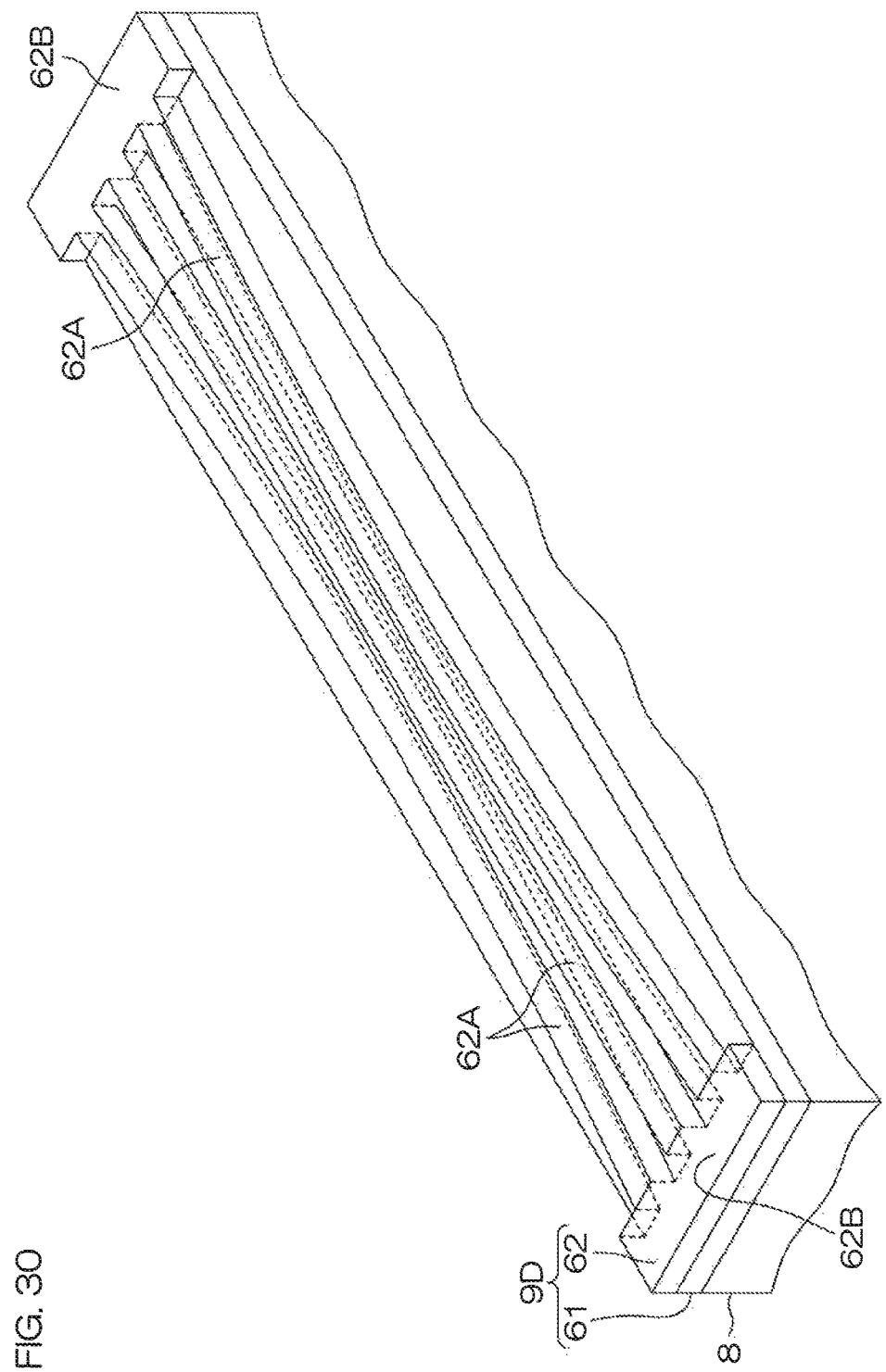
FIG. 30 is an enlarged perspective view of a fourth modification example of an upper electrode.

FIG. 30 is an enlarged perspective view of a fourth modification example of an upper electrode 9.

As with the upper electrode 9C shown in FIG. 29, with the upper electrode 9D here, an Ir film 62 has a plurality of linear portions 62A formed at intermediate portions in a long direction of a front surface of an IrO$_2$ film 61 and solid pattern portions 62B formed at respective end portions of the linear portions 62A. The present arrangement differs from the upper electrode 9C of FIG. 29 in that the plurality of linear portions 62A include linear portions 62A that are formed curvingly in plan view.

Figure 31:
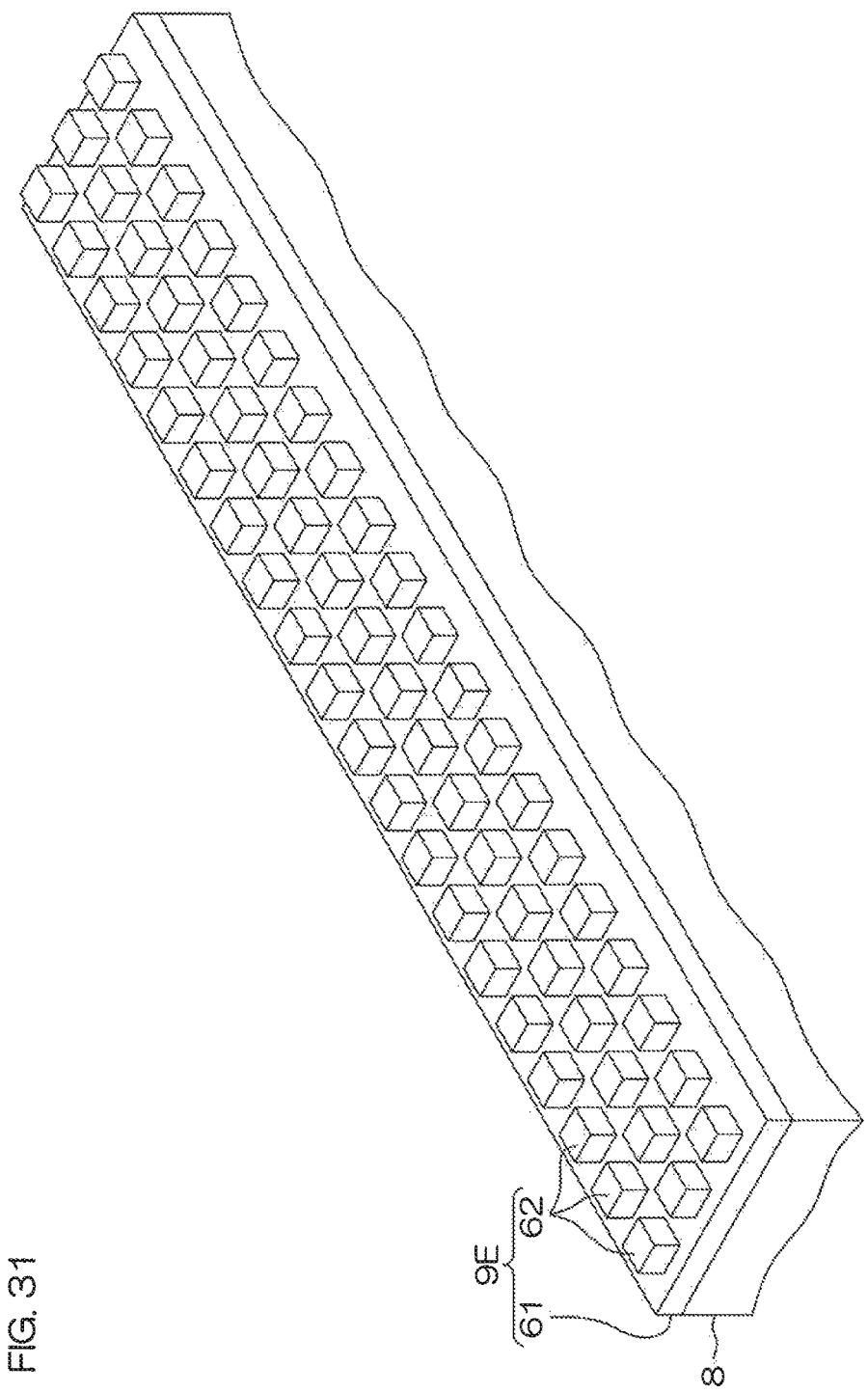
FIG. 31 is an enlarged perspective view of a fifth modification example of an upper electrode.

FIG. 31 is an enlarged perspective view of a fifth modification example of an upper electrode 9.

The upper electrode 9E here is arranged from a flat IrO$_2$ film 61 formed above a piezoelectric film 8 and a plurality of dot-shaped Ir films 62 formed above the IrO$_2$ film 61. The plurality of dot-shaped Ir films 62 are positioned in alignment with a plurality of columns aligned in a short direction and extending in a long direction of the IrO$_2$ film 61.

Figure 32:
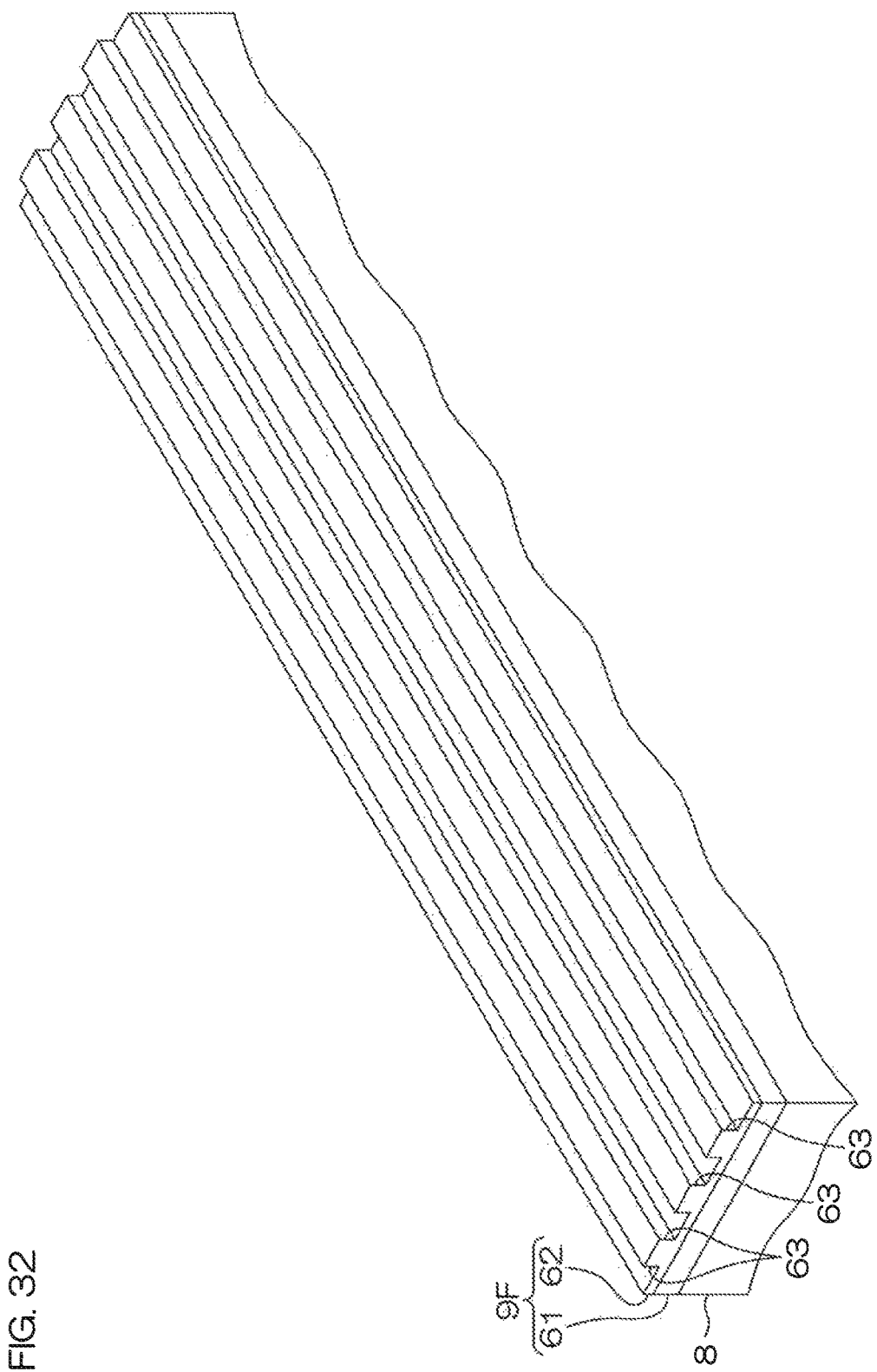
FIG. 32 is an enlarged perspective view of a sixth modification example of an upper electrode.

FIG. 32 is an enlarged perspective view of a sixth modification example of an upper electrode 9.

The upper electrode 9F here is arranged from a flat IrO$_2$ film 61 formed above a piezoelectric film 8 and an Ir film 62 covering a front surface of the IrO$_2$ film 61. A plurality of rectilinear grooves 63, extending parallel to a long direction of the Ir film 62, are formed in a front surface of the Ir film 62. That is, the plurality of rectilinear grooves 63 are formed as stripes. The grooves 63 do not penetrate through the Ir film 62 and bottom portions of the grooves 63 are also defined by the Ir film 62. The grooves 63 have rectangular cross sections. However, the two grooves 63 at the respective sides are opened upward and also open to outer sides.

Figure 33:
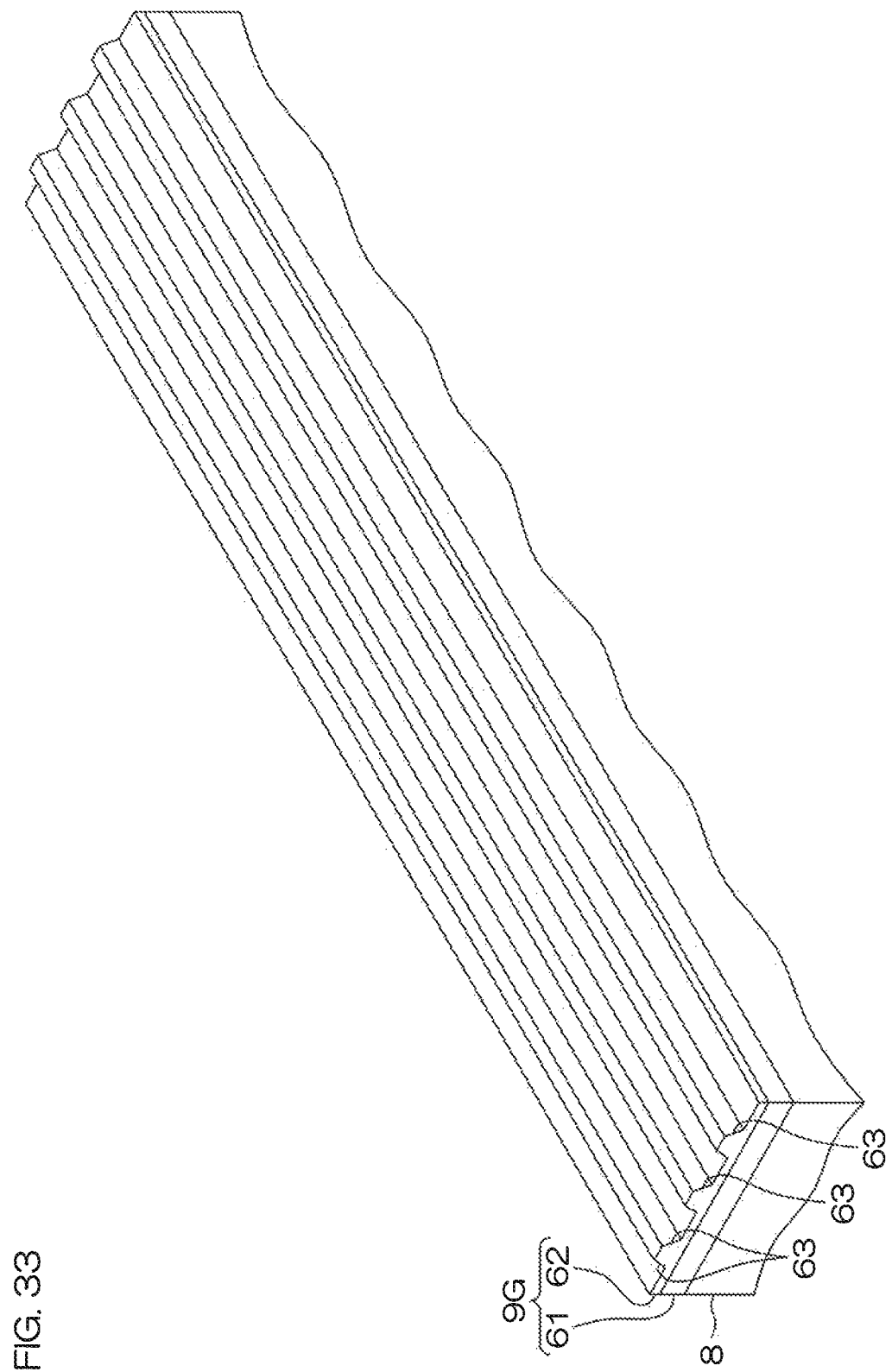
FIG. 33 is an enlarged perspective view of a seventh modification example of an upper electrode.

FIG. 33 is an enlarged perspective view of a seventh modification example of an upper electrode 9.

As with the upper electrode 9F shown in FIG. 32, the upper electrode 9G here is arranged from a flat IrO$_2$ film 61 formed above a piezoelectric film 8 and an Ir film 62 covering a front surface of the IrO$_2$ film 61. A plurality of rectilinear grooves 63, extending parallel to a long direction of the Ir film 62, are formed in a front surface of the Ir film 62. The present arrangement differs from the upper electrode 9F shown in FIG. 32 in that a cross section of each groove 63 is trapezoidal.

Figure 34:
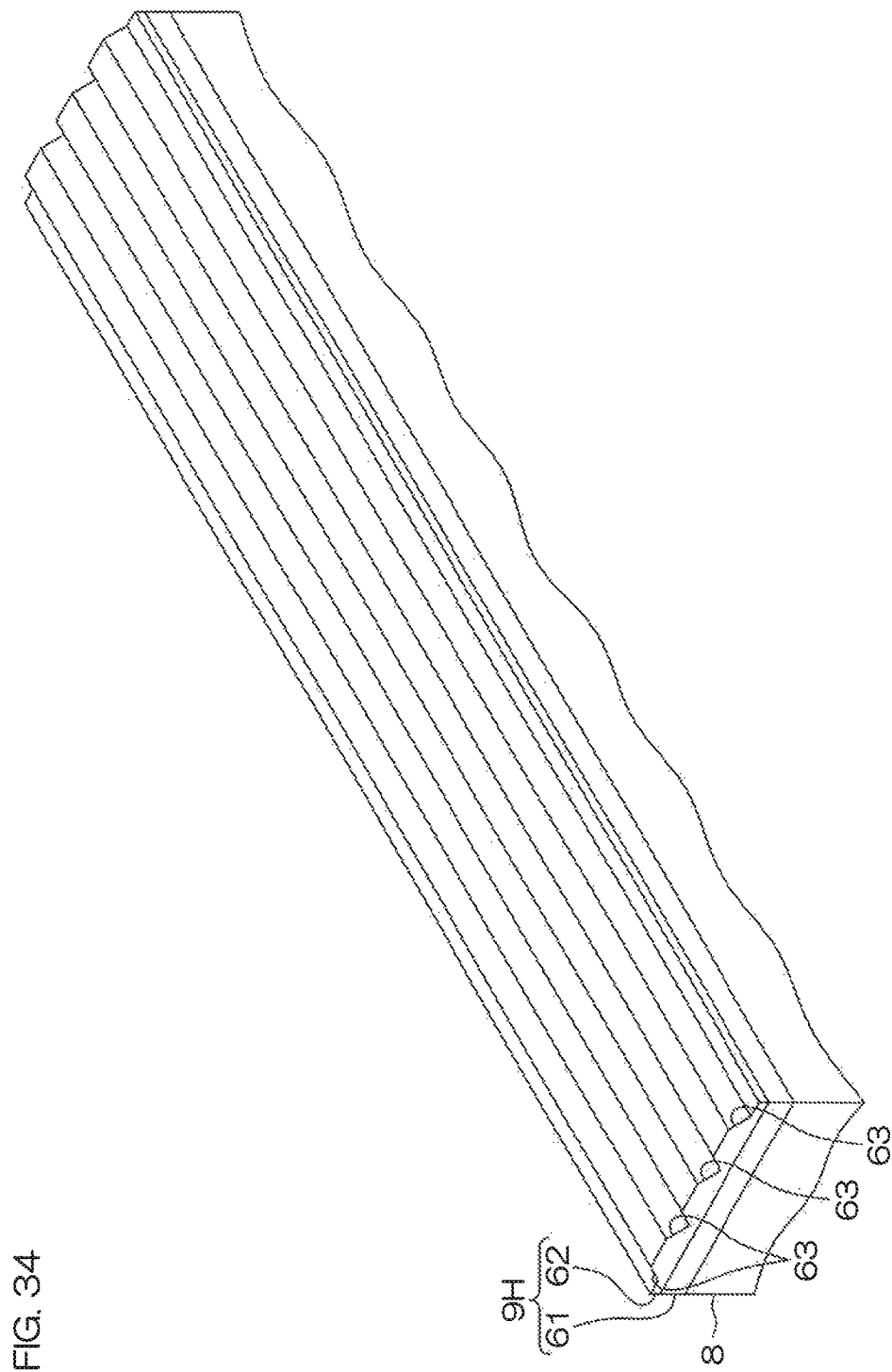
FIG. 34 is an enlarged perspective view of an eighth modification example of an upper electrode.

FIG. 34 is an enlarged perspective view of an eighth modification example of an upper electrode 9.

As with the upper electrode 9F shown in FIG. 32, the upper electrode 9H here is arranged from a flat IrO$_2$ film 61 formed above a piezoelectric film 8 and an Ir film 62 covering a front surface of the IrO$_2$ film 61. A plurality of rectilinear grooves 63, extending parallel to a long direction of the Ir film 62, are formed in a front surface of the Ir film 62. The present arrangement differs from the upper electrode 9F shown in FIG. 32 in that a cross section of each groove 63 is V-shaped.

Figure 35:
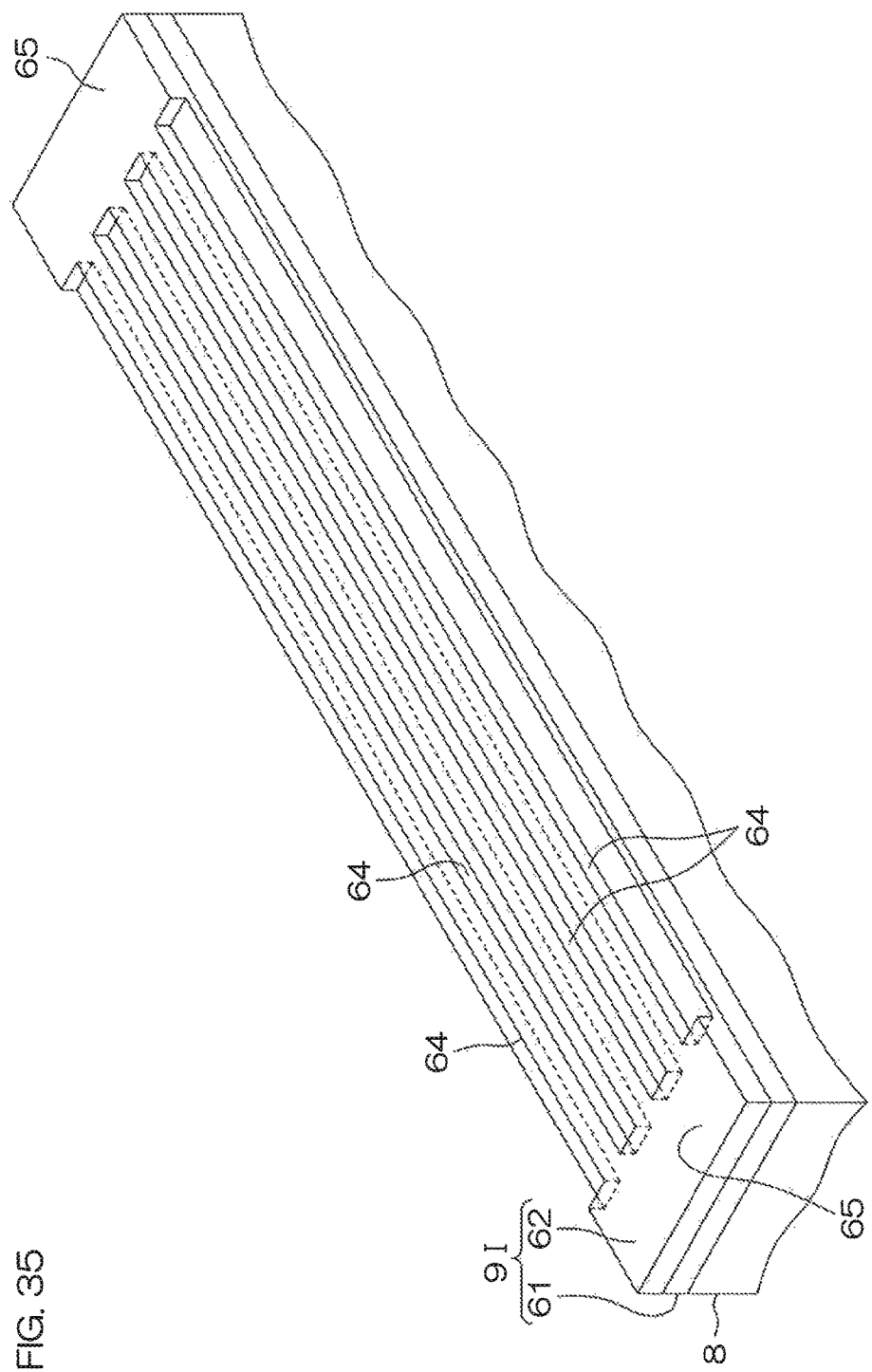
FIG. 35 is an enlarged perspective view of a ninth modification example of an upper electrode.

FIG. 35 is an enlarged perspective view of a ninth modification example of an upper electrode 9.

As with the upper electrode 9F shown in FIG. 32, the upper electrode 9I here is arranged from a flat IrO$_2$ film 61 formed above a piezoelectric film 8 and an Ir film 62 covering a front surface of the IrO$_2$ film 61. A plurality of rectilinear grooves 64, extending parallel to a long direction of the Ir film 62, are formed at intermediate portions in a long direction of a front surface of the Ir film 62. That is, the plurality of rectilinear grooves 64 are formed as stripes. Bottom portions of the grooves 64 are also defined by the Ir film 62. The grooves 64 have rectangular cross sections. However, the two grooves 64 at the respective sides are opened upward and also open to outer sides. Both end portions of the Ir film 62 are formed to solid pattern portions 65 in which the grooves 64 are not formed.

Figure 36:
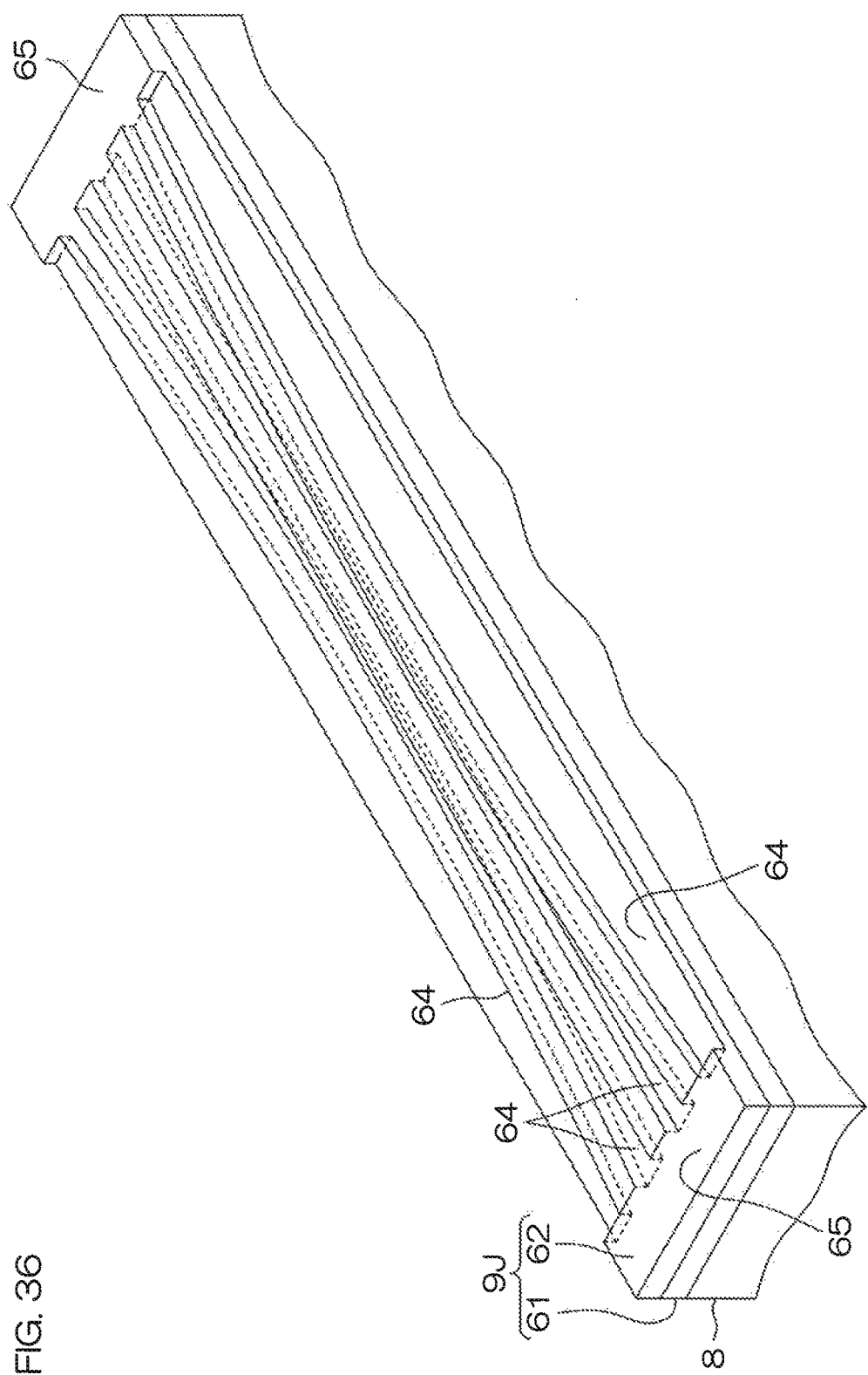
FIG. 36 is an enlarged perspective view of a tenth modification example of an upper electrode.

FIG. 36 is an enlarged perspective view of a tenth modification example of an upper electrode 9.

As with the upper electrode 9H of FIG. 35, with the upper electrode 9J here, a plurality of linear grooves 64, extending in a long direction of an Ir film 62, are formed at intermediate portions in a long direction of a front surface of the Ir film 62. Both end portions of the Ir film 62 are formed to solid pattern portions 65 in which the grooves 64 are not formed. The present arrangement differs from the upper electrode 9I of FIG. 35 in that the plurality of grooves 64 include grooves having curved portions in plan view.

Figure 37:
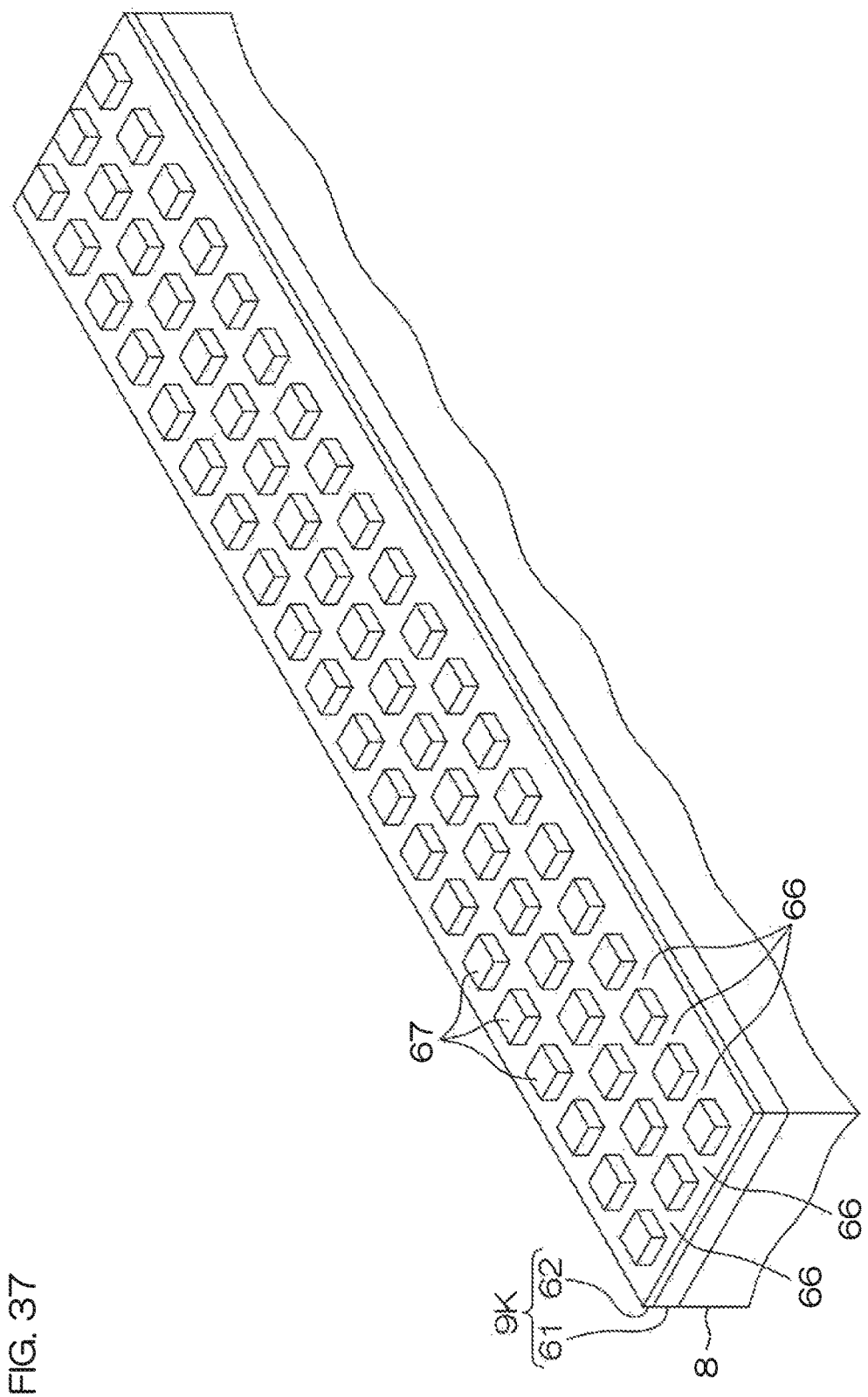
FIG. 37 is an enlarged perspective view of an eleventh modification example of an upper electrode.

FIG. 37 is an enlarged perspective view of an eleventh modification example of an upper electrode 9.

The upper electrode 9K here is arranged from a flat IrO$_2$ film 61 formed above a piezoelectric film 8 and an Ir film 62 covering a front surface of the IrO$_2$ film 61. A groove 66 is formed as a lattice in a front surface of the Ir film 62 and a plurality of dot-shaped projections 67 are defined by the groove 66. In plan view, the plurality of dot-shaped projections 67 are positioned in alignment with a plurality of columns aligned in a short direction and extending in a long direction of the IrO$_2$ film 61.

Figure 38:
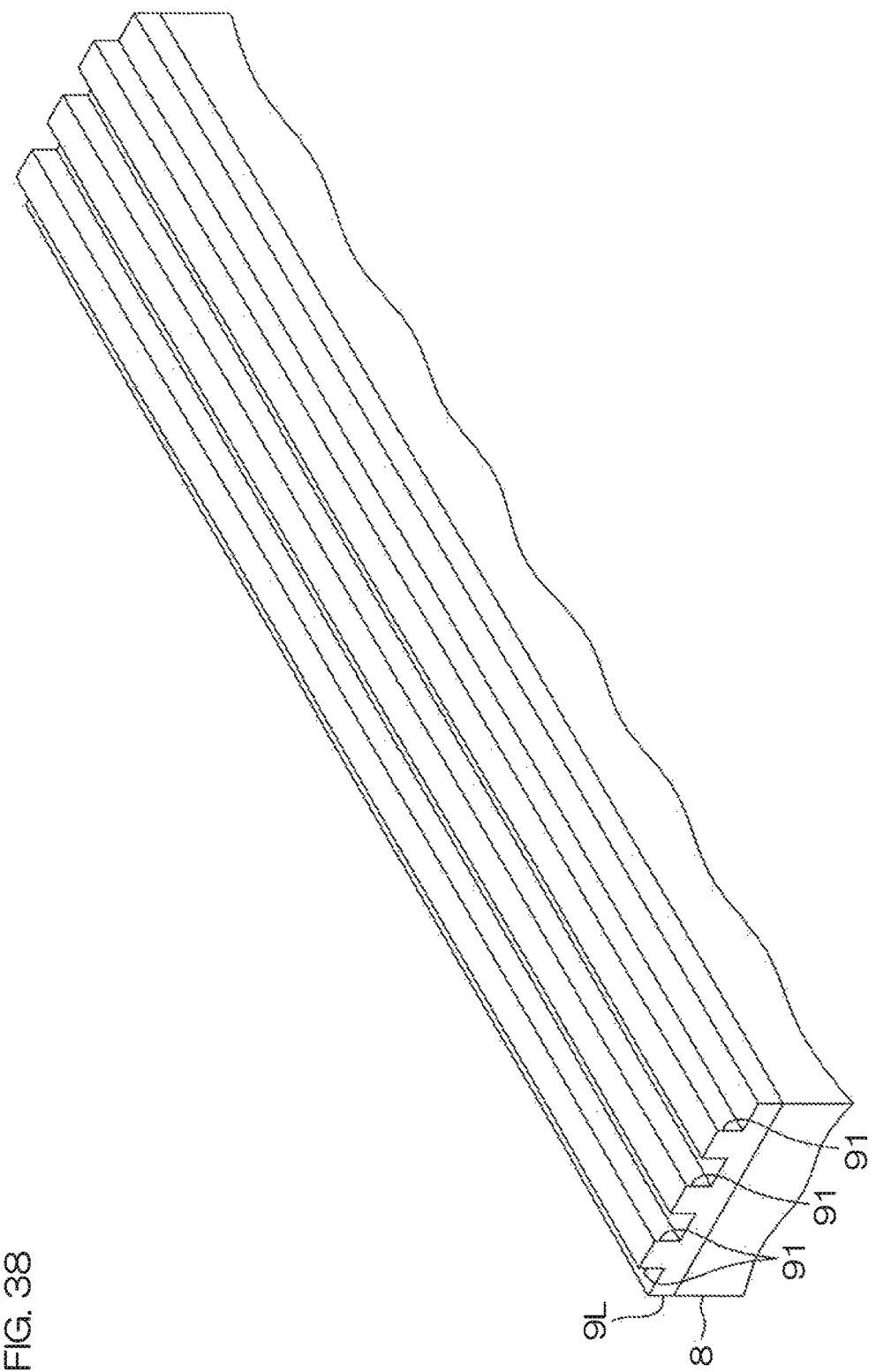
FIG. 38 is an enlarged perspective view of a twelfth modification example of an upper electrode.

FIG. 38 is an enlarged perspective view of a twelfth modification example of an upper electrode 9.

The upper electrode 9L here is arranged from a metal single film constituted, for example, of an Ir film. A plurality of rectilinear grooves 91, extending parallel to a long direction of the upper electrode 9L, are formed in a front surface of the upper electrode 9L. That is, the plurality of rectilinear grooves 91 are formed as stripes. The grooves 91 have rectangular cross sections. However, the two grooves 91 at the respective sides are opened upward and also open to outer sides.

Figure 39:
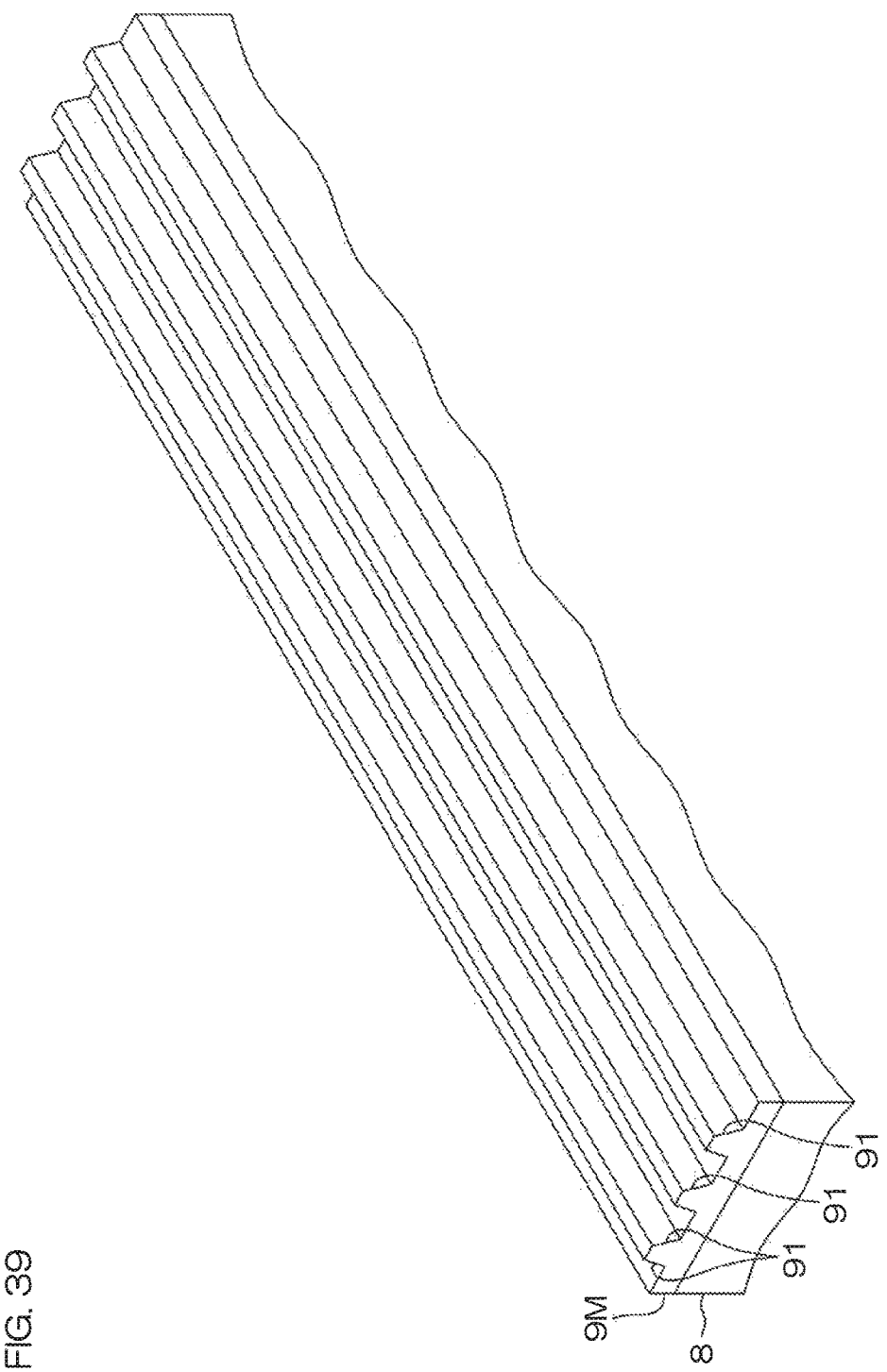
FIG. 39 is an enlarged perspective view of a thirteenth modification example of an upper electrode.

FIG. 39 is an enlarged perspective view of a thirteenth modification example of an upper electrode 9.

As with the upper electrode 9L shown in FIG. 38, the upper electrode 9M here is arranged from a metal single film constituted, for example, of an Ir film. A plurality of rectilinear grooves 91, extending parallel to a long direction of the upper electrode 9M, are formed in a front surface of the upper electrode 9M. The present arrangement differs from the upper electrode 9L shown in FIG. 38 in that a cross section of each groove 91 is trapezoidal.

Figure 40:
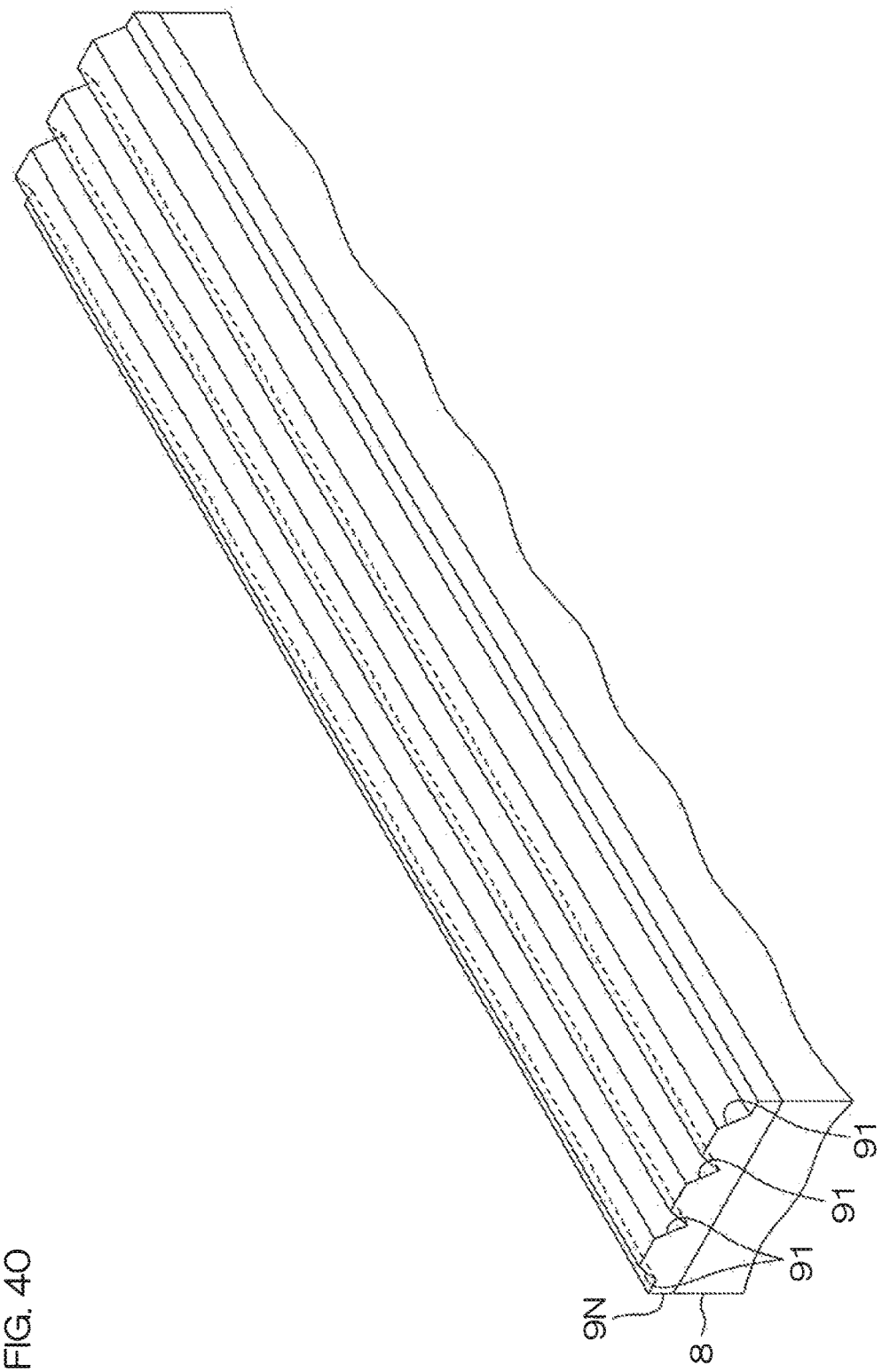
FIG. 40 is an enlarged perspective view of a fourteenth modification example of an upper electrode.

FIG. 40 is an enlarged perspective view of a fourteenth modification example of an upper electrode 9.

As with the upper electrode 9L shown in FIG. 38, the upper electrode 9N here is arranged from a metal single film constituted, for example, of an Ir film. A plurality of rectilinear grooves 91, extending parallel to a long direction of the upper electrode 9N, are formed in a front surface of the upper electrode 9N. The present arrangement differs from the upper electrode 9L shown in FIG. 38 in that a cross section of each groove 91 is V-shaped.

Figure 41:
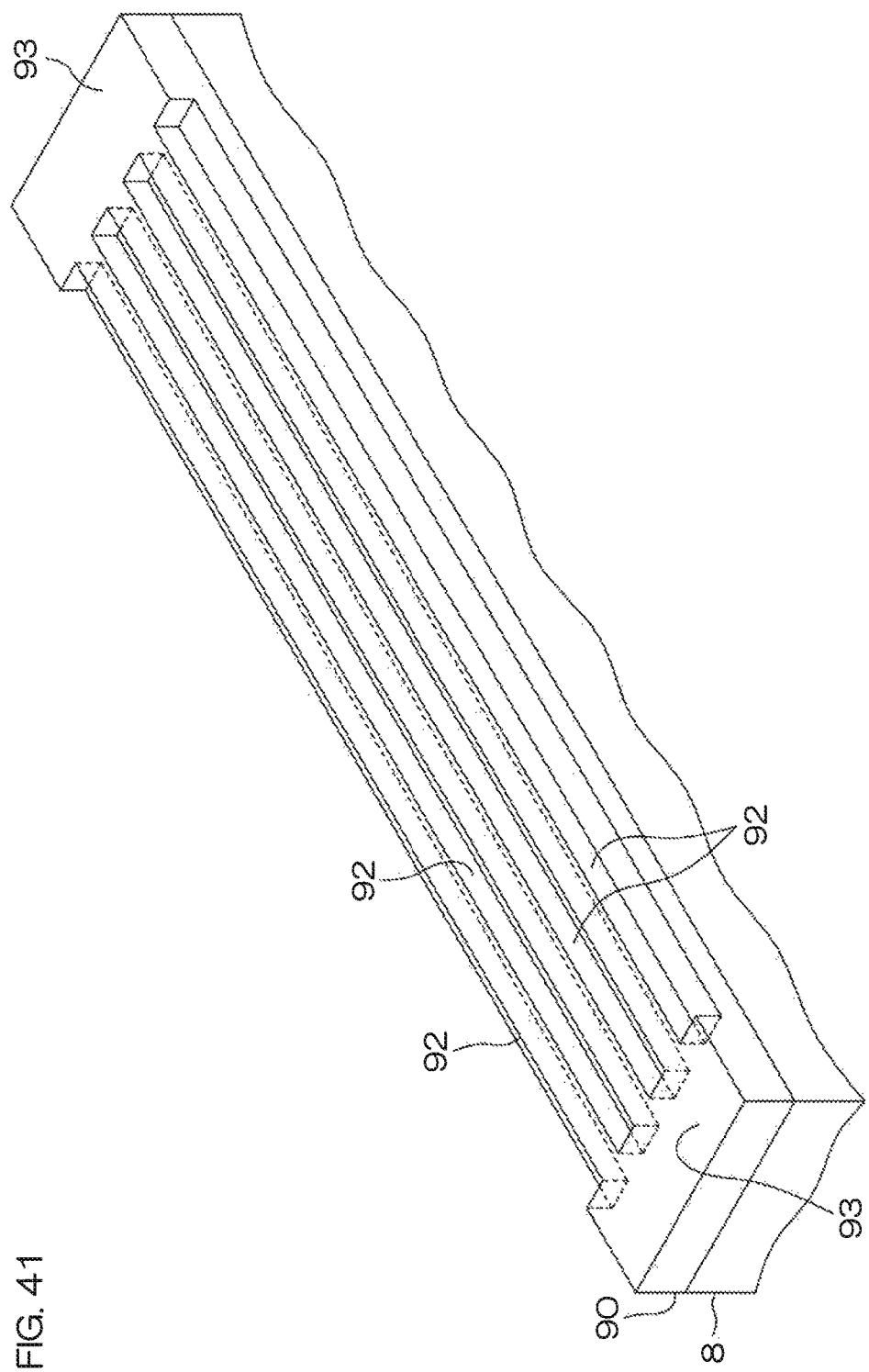
FIG. 41 is an enlarged perspective view of a fifteenth modification example of an upper electrode.

FIG. 41 is an enlarged perspective view of a fifteenth modification example of an upper electrode 9.

As with the upper electrode 9L shown in FIG. 38, the upper electrode 9O here is arranged from a metal single film constituted, for example, of an Ir film. A plurality of rectilinear grooves 92, extending parallel to a long direction of the upper electrode 9O, are formed at intermediate portions in a long direction of a front surface of the upper electrode 9O. Both end portions of the upper electrode 9O are formed to solid pattern portions 93 in which the grooves 92 are not formed. However, the two grooves 92 at the respective sides are opened upward and also open to outer sides.

Figure 42:
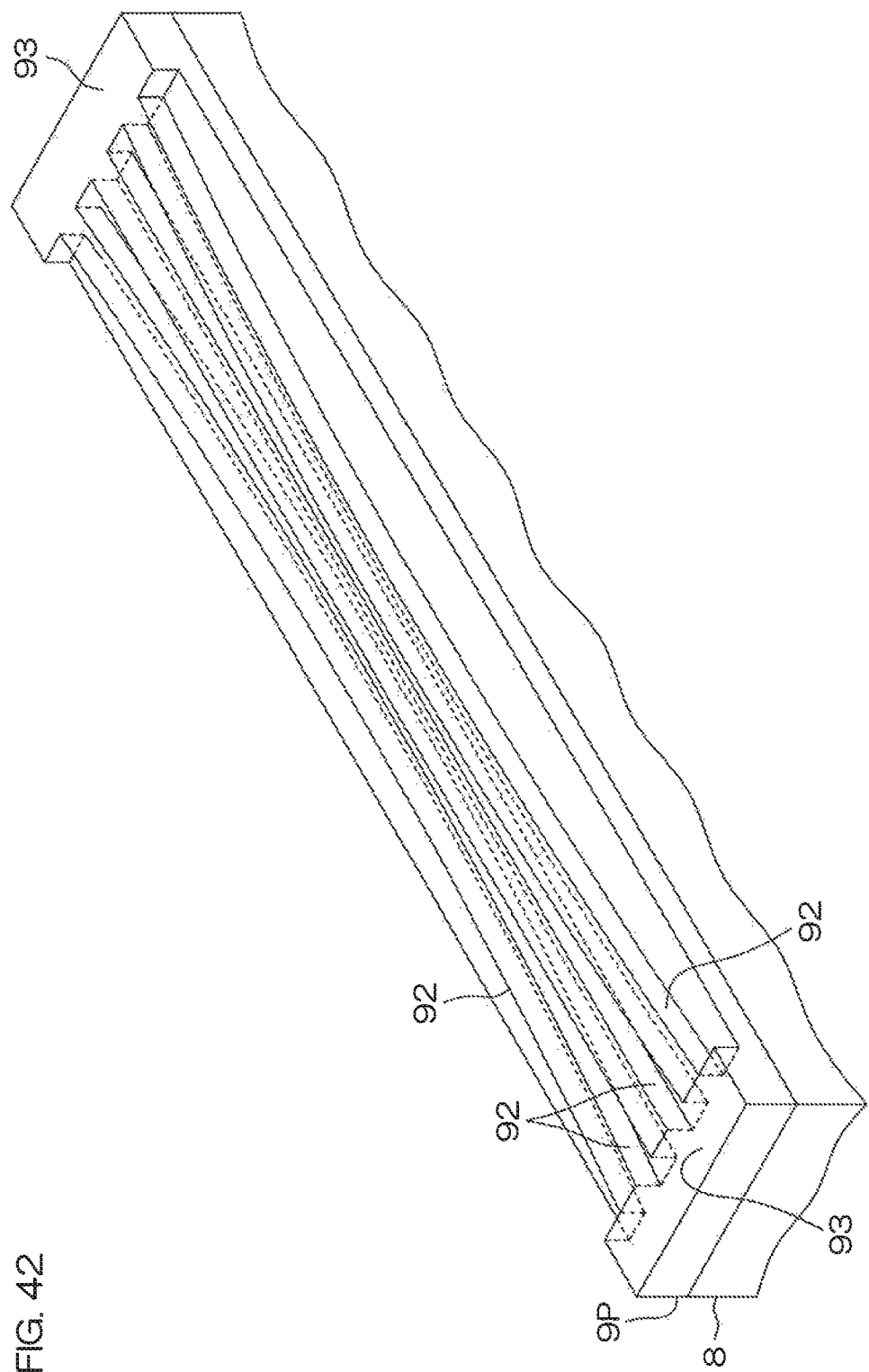
FIG. 42 is an enlarged perspective view of a sixteenth modification example of an upper electrode.

FIG. 42 is an enlarged perspective view of a sixteenth modification example of an upper electrode 9.

As with the upper electrode 9O of FIG. 41, with the upper electrode 9P here, a plurality of linear grooves 92, extending in a long direction of the upper electrode 9P, are formed at intermediate portions in along direction of a front surface of the upper electrode 9P. Both end portions of the upper electrode 9P are formed to solid pattern portions 93 in which the grooves 92 are not formed. The present arrangement differs from the upper electrode 9O of FIG. 41 in that the plurality of grooves 92 include grooves having curved portions in plan view.

Figure 43:
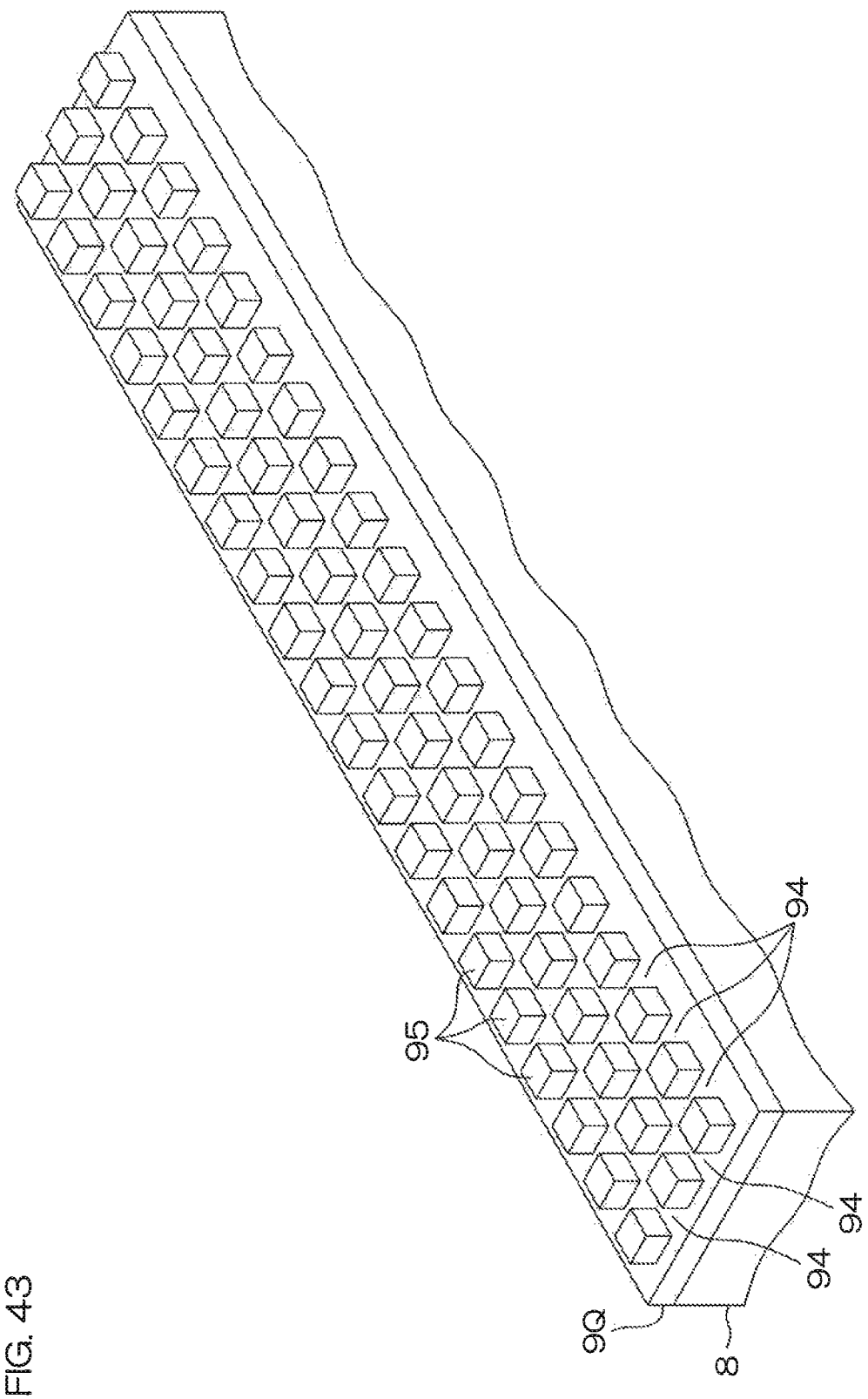
FIG. 43 is an enlarged perspective view of a seventeenth modification example of an upper electrode.

FIG. 43 is an enlarged perspective view of a seventeenth modification example of an upper electrode 9.

The upper electrode 9Q here is arranged from a metal single film constituted, for example, of an Ir film. A groove 94 is formed as a lattice in a front surface of the upper electrode 9Q and a plurality of dot-shaped projections 95 are defined by the groove 94. In plan view, the plurality of dot-shaped projections 95 are positioned in alignment with a plurality of columns aligned in a short direction and extending in a long direction of the upper electrode 9Q.

Figure 44:
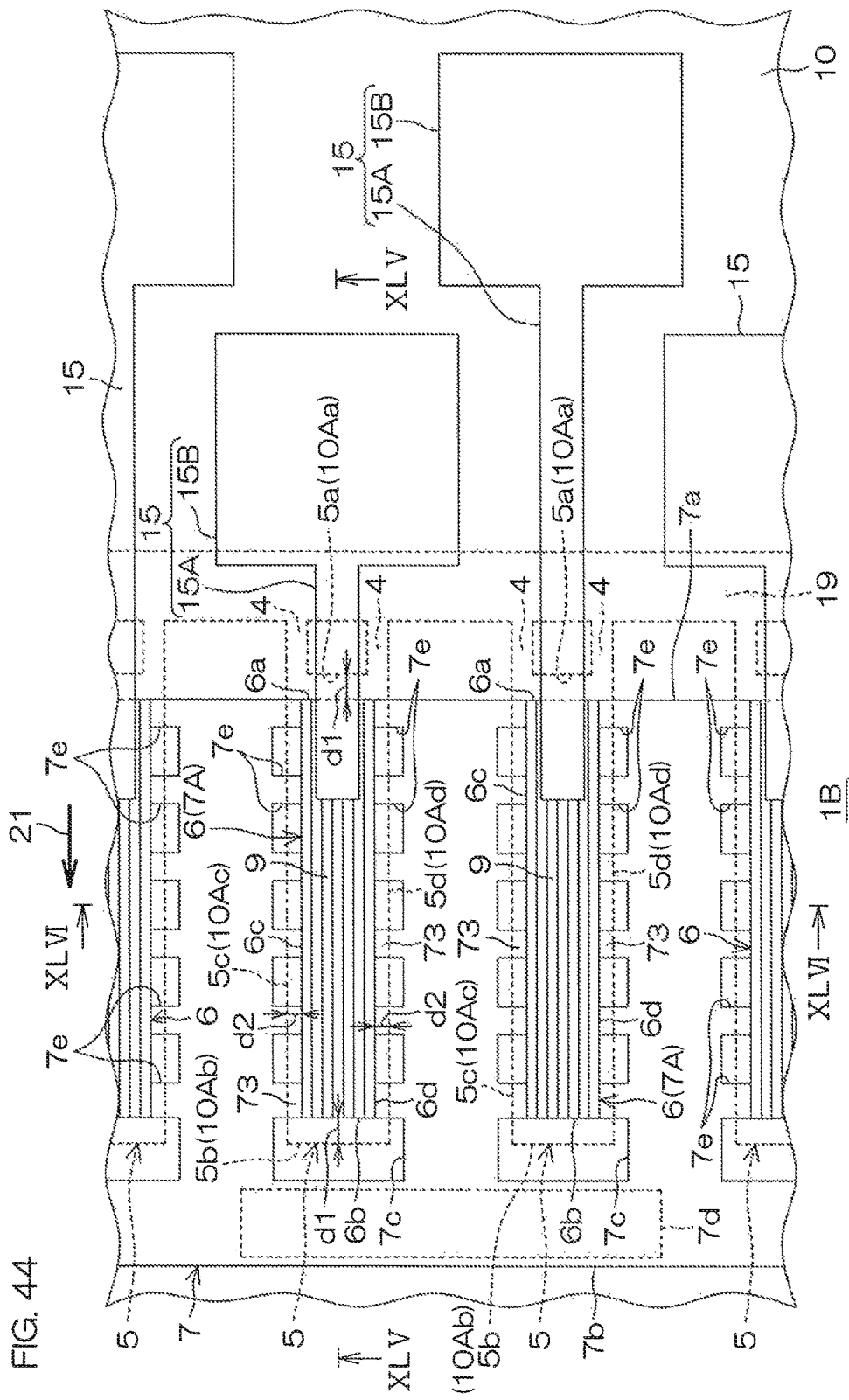
FIG. 44 is a schematic plan view of another example of the inkjet printing head to which the third and fourth inventions are applied.
Figure 45:
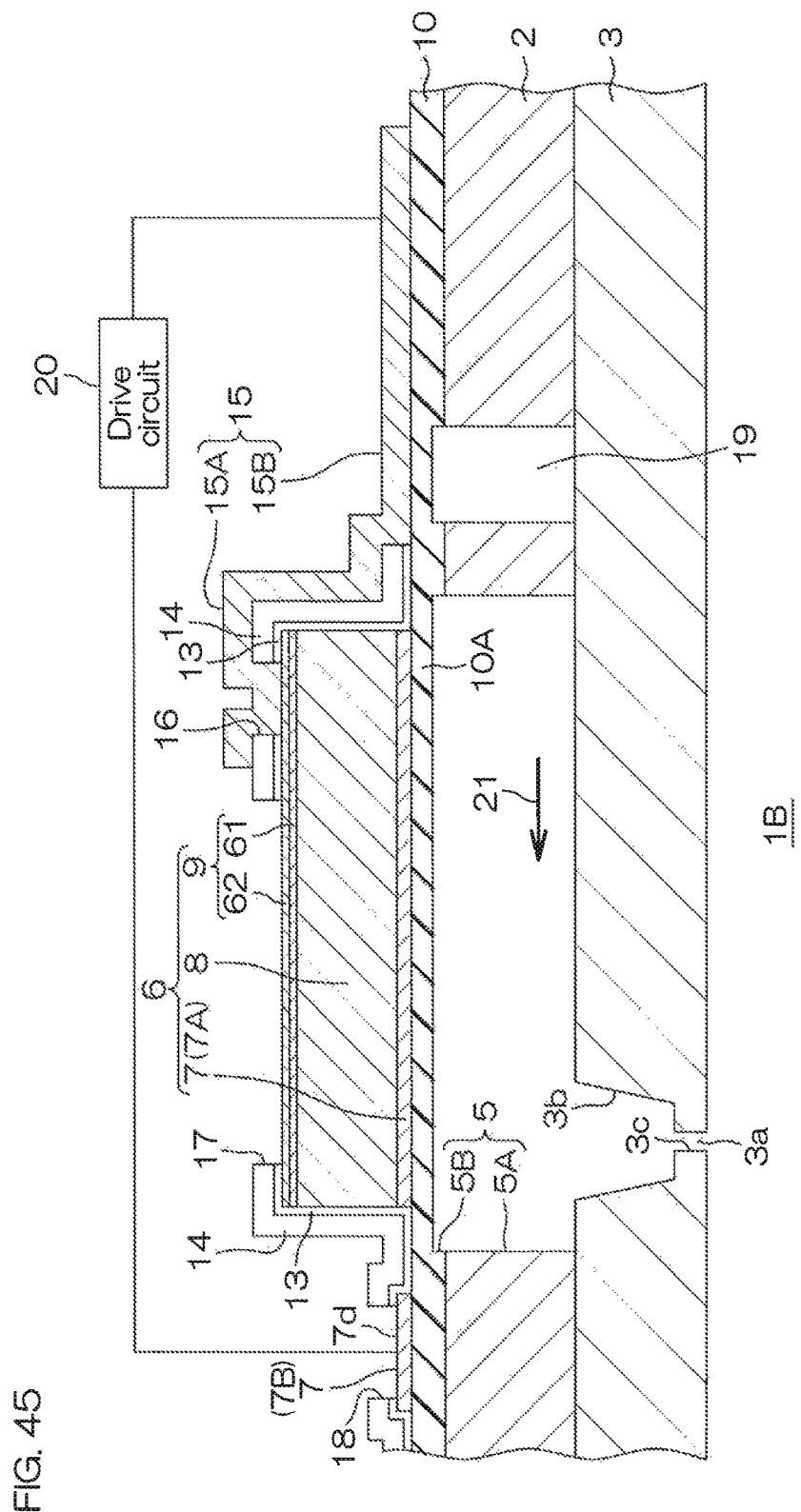
FIG. 45 is a schematic enlarged sectional view taken along line LXV-LXV in FIG. 44.
Figure 46:
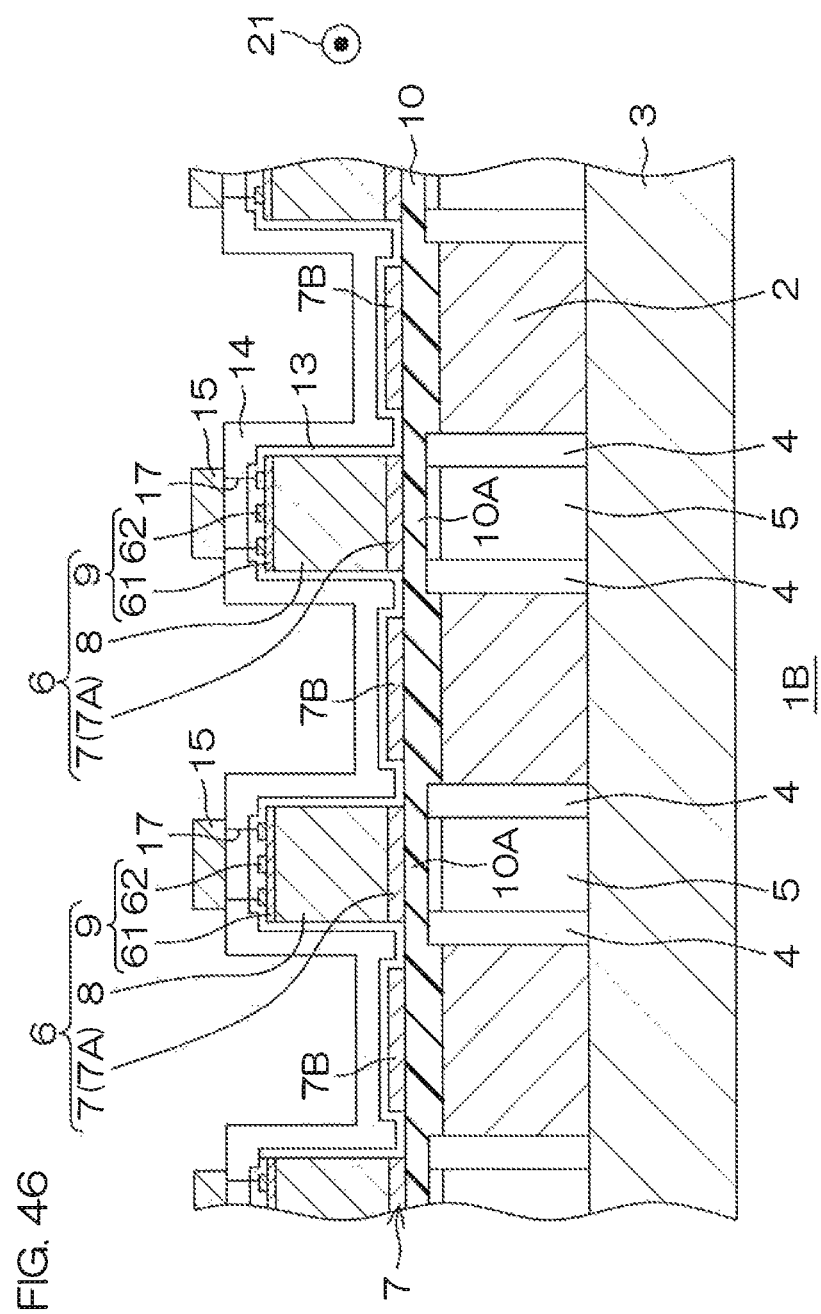
FIG. 46 is a schematic enlarged sectional view taken along line LXVI-LXVI in FIG. 44.
Figure 47:
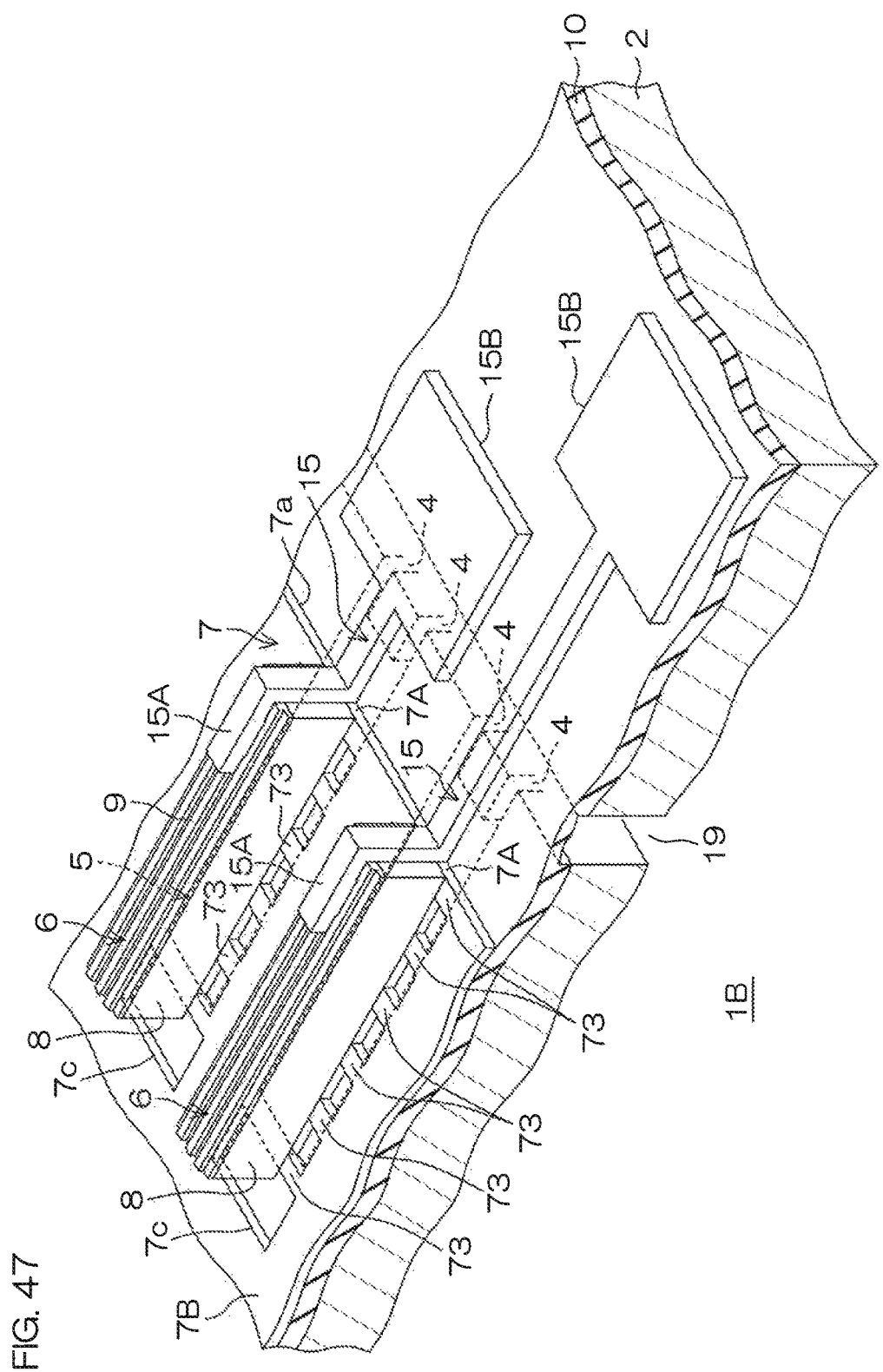
FIG. 47 is a schematic perspective view of the inkjet printing head.
Figure 48:
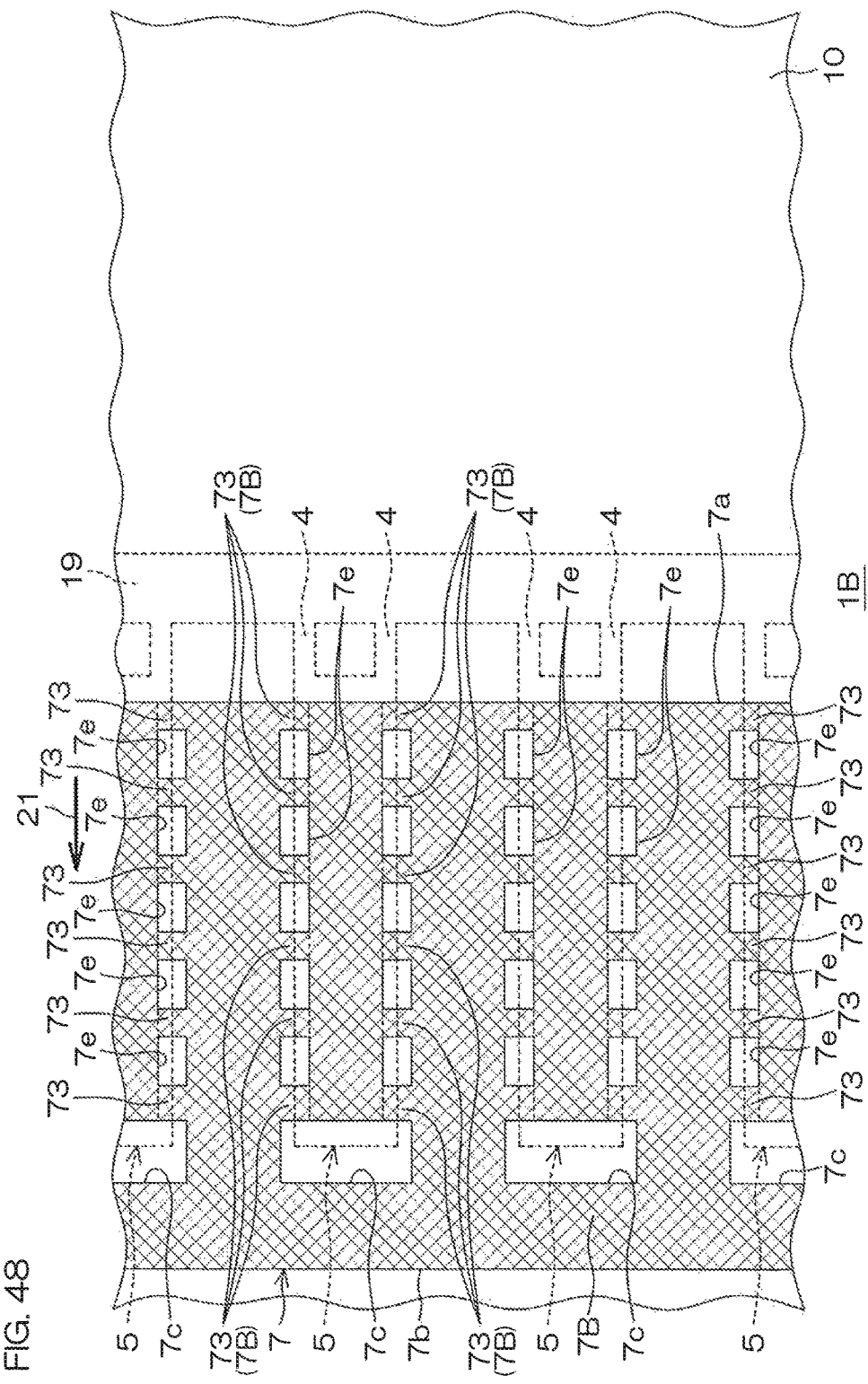
FIG. 48 is a plan view of a planar shape of the lower electrode formed above the movable film formation layer and is a plan view with which the arrangement besides the lower electrode formed above the movable film formation layer is removed.

FIG. 44 is a schematic plan view of another example of the inkjet printing head to which the third and fourth inventions are applied. FIG. 45 is a schematic enlarged sectional view taken along line LXV-LXV in FIG. 44. FIG. 46 is a schematic enlarged sectional view taken along line LXVI-LXVI in FIG. 44. FIG. 47 is a schematic perspective view of the inkjet printing head. In FIG. 44 and FIG. 47, the hydrogen barrier film indicated by symbol 13 and the insulating film indicated by symbol 14 in FIG. 45 and FIG. 46 are omitted. FIG. 48 is a plan view of a planar shape of the lower electrode formed above the movable film formation layer and is a plan view with which the arrangement besides the lower electrode formed above the movable film formation layer is removed. In FIG. 44 to FIG. 48, portions corresponding to respective portions in FIG. 21 to FIG. 25 of the description above are provided with the same reference symbols as in FIG. 21 to FIG. 25.

In comparison to the inkjet printing head 1A of FIG. 21, the inkjet printing head 1B differs in the pattern of the lower electrode 7. Other points besides this are the same as in the inkjet printing head 1A of FIG. 21.

The lower electrode 7 has, in plan view, a flat plate shape with a predetermined width in a direction along the ink flow direction 21 and extending across the plurality of pressure chambers 5 in the direction orthogonal to the ink flow direction 21, and is a common electrode used in common for the plurality of piezoelectric elements 6. The first side 7a of the lower electrode 7 along the direction orthogonal to the ink flow direction 21 is matched in plan view with a line joining the end edges 6a at one end of the plurality of piezoelectric elements 6. The second side 7b of the lower electrode 7 opposite the first side 7a is disposed further outside (downstream in the ink flow direction 21) than the end edges 10Ab of the movable films 10A corresponding to the other end edges 6b of the plurality of piezoelectric elements 6.

The lower electrode 7 includes the main electrode portions 7A of rectangular shapes in plan view that constitute the piezoelectric elements 6 and the extension portion 7B lead out from the main electrode portions 7A in a direction along the front surface of the movable film formation layer 10. Each main electrode portion 7A is formed to be shorter than a movable film 10A along the long direction of the movable film 10A and the respective end edges thereof are disposed at inner sides at the predetermined intervals d1 from the respective corresponding end edges 10Aa and 10Ab of the movable film 10A. Also with the main electrode portion 7A, the width along the short direction of the movable film 10A is defined to be narrower than the width of the movable film 10A in the short direction and the respective end edges thereof are disposed at inner sides at the intervals d2 from the respective corresponding side edges 10Ac and 10Ad of the movable film 10A. Of all regions of the lower electrode 7, the extension portion 7B is the region excluding the main electrode portions 7A.

In the extension portion 7B, cutout portions 7c of rectangular shapes in plan view that penetrate through the lower electrode 7 are formed at downstream sides in the ink flow direction 21 of the respective piezoelectric elements 6. In plan view, each cutout portion 7c has two side edges (short sides) along the ink flow direction 21 and two end edges (long sides) along the direction orthogonal to the ink flow direction 21. One end edge of the cutout portion 7c is disposed at a position matching the end edge 6b of a piezoelectric element 6 (end edge at the downstream side of a main electrode portion 7A) in relation to the ink flow direction 21 and the other end edge is disposed further outside (downstream in the ink flow direction 21) than the end edge 10Ab of a movable film 10A. One side edge of the cutout portion 7c is disposed further outside than the one side edge 10Ac of the movable film 10A and the other side edge of the cutout portion 7c is disposed further outside than the other side edge 10Ad of the movable film 10A. Therefore in plan view, an end portion of the movable film 10A at the end edge 10Ab side is disposed at an inner side of the cutout portion 7c. The pad portion 7d of rectangular shape that is elongate in the direction orthogonal to the ink flow direction 21 is formed in a region between the second side 7b of the lower electrode 7 and the plurality of cutout portions 7c.

Also in the extension portion 7B, a plurality of cutout portions 7e are formed along each side edge of each main electrode portion 7A (each of the side edges 6c and 6d of each piezoelectric element 6) at a region close to and at an outer side of each side edge of each main electrode portion 7A. The plurality of cutout portions 7e are formed at intervals in the long direction of the main electrode portion 7A. Each cutout portion 7A is rectangular in plan view and has two side edges (long sides) along the ink flow directions 21 and two end edges (short sides) along the direction orthogonal to the ink flow direction 21.

One side edge of each cutout portion 7c formed in a region close to and at an outer side of one side edge 6c of a piezoelectric element 6 is disposed at a position matching the one side edge 6c of the piezoelectric element 6 and the other side edge is disposed further outside than the side edge 1 OAc of a movable film 10A. One side edge of each cutout portion 7e formed in a region close to and at an outer side of the other side edge 6d of the piezoelectric element 6 is disposed at a position matching the other side edge 6d of the piezoelectric element 6 and the other side edge is disposed further outside than the side edge 10Ad of the movable film 10A.

By the forming of such a plurality of cutout portions 7e in the extension portion 7B, the extension portion 7B is formed to be of a mesh pattern (lattice pattern) in plan view in regions outside the respective side edges 6c and 6d of the piezoelectric elements 6. More specifically, in regions close to and at outer sides of the respective side edges of each main electrode portion 7A, the extension portion 7B has a plurality of rectilinear electrode portions 73 lead out in the direction orthogonal to the ink flow direction 21 from both side edges of the main electrode portion 7A and crossing over peripheral edges of the top surface portion (movable film 10A) of a pressure chamber 5 to extend outside the top surface portion of the pressure chamber 5. The rectilinear electrode portions 73 are disposed in parallel at intervals in the ink flow direction 21. The plurality of rectilinear electrode portions 73 are thus formed as stripes.

That is, with the inkjet printing head 1B of FIG. 44, the lower electrode 7 has a plurality of rectilinear electrode portions (metal lines) 73 formed in a stripe pattern in regions close to and at outer sides of each piezoelectric element 6. The rectilinear electrode portions 73, which are constituted of a metal, are formed at a high temperature and shrink thereafter upon being cooled to ordinary temperature and the rectilinear electrode portions 73 are thus made to have tensile stress. That is, the rectilinear electrode portions 73 apply a force in a shrinking direction to a movable film 10A and the movable film 10A is thus made unlikely to crack. Also, the rectilinear electrode portions 73 are formed not in the entirety of the main deformation region of the movable film 10A but in a partial region and therefore the displacement of the movable film 10A is not decreased in comparison to a case where the lower electrode is formed across the entirety of the main deformation region of the movable film 10A.

It suffices that the plurality of rectilinear electrode portions 73 are formed to constitute a stripe pattern or a mesh pattern between the piezoelectric element 6 and the edges of the pressure chamber 5 (peripheral edges of the movable film 10A).

In the inkjet printing head 1B of FIG. 44, the upper electrodes 9 may have any one of the structures of the upper electrodes 9A to 9Q shown in FIG. 27 to FIG. 43.

Figure 49:
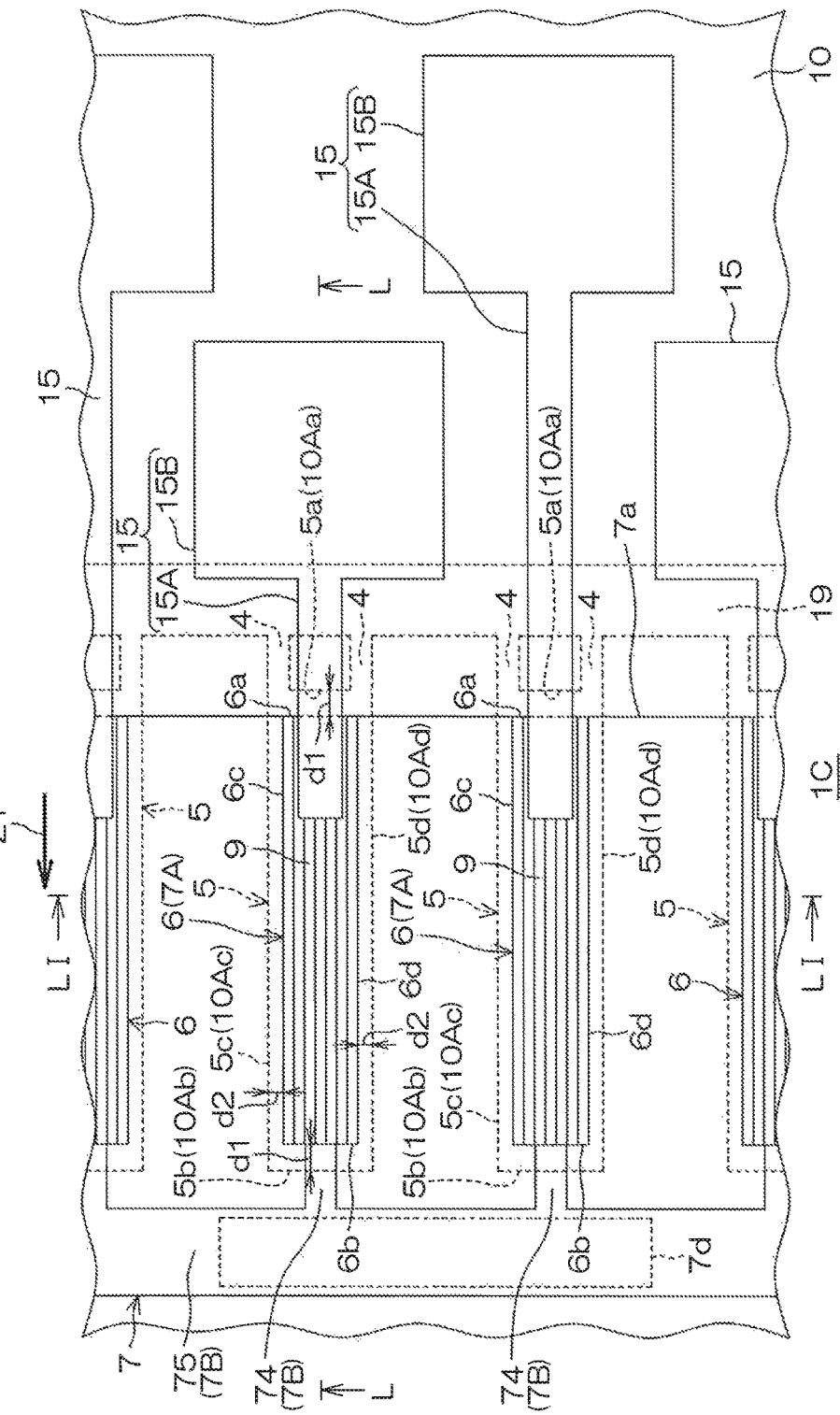
FIG. 49 is a schematic plan view of yet another example of the inkjet printing head to which the third and fourth inventions are applied.
Figure 50:
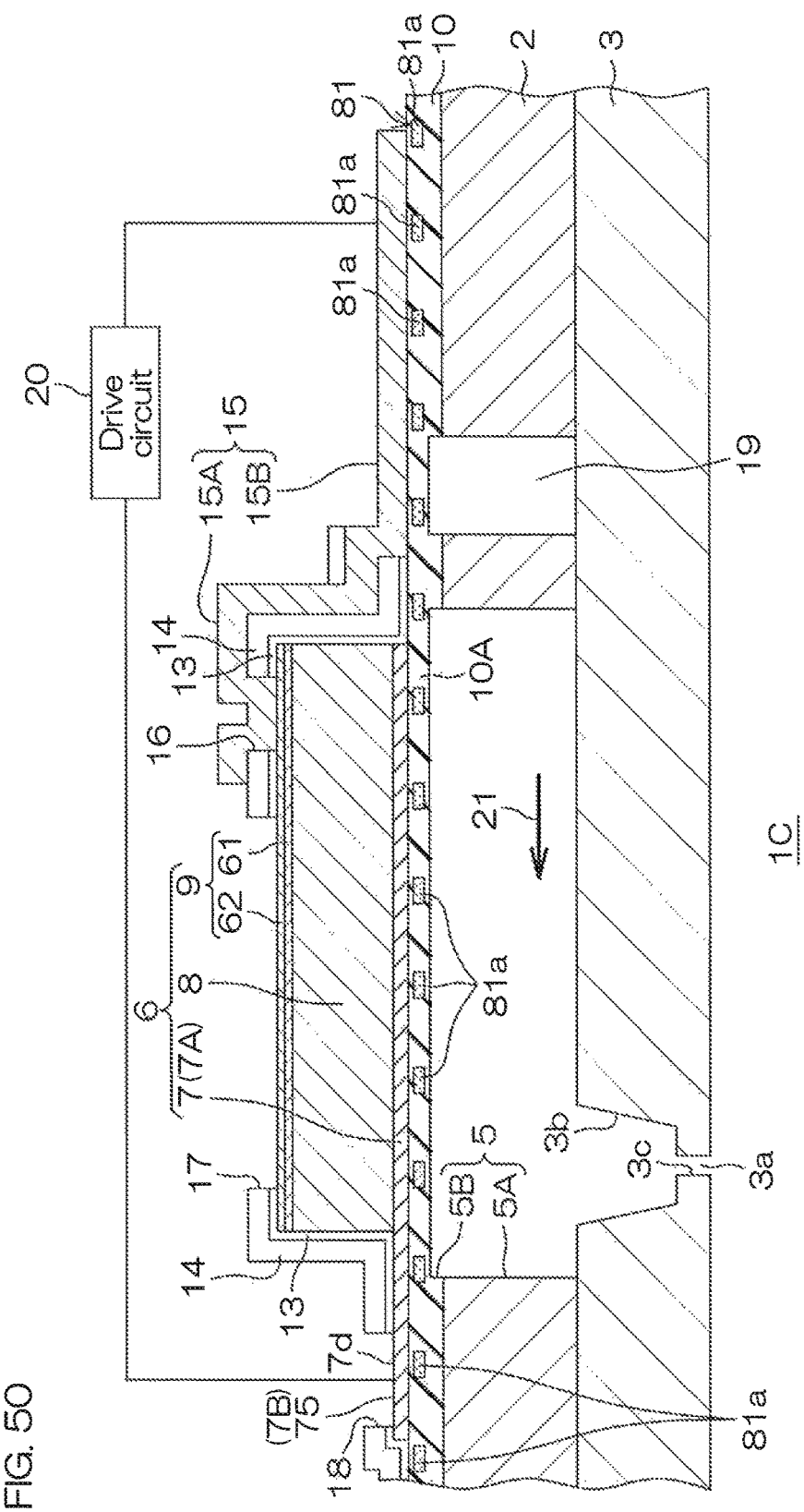
FIG. 50 is a schematic enlarged sectional view taken along line L-L in FIG. 49.
Figure 51:
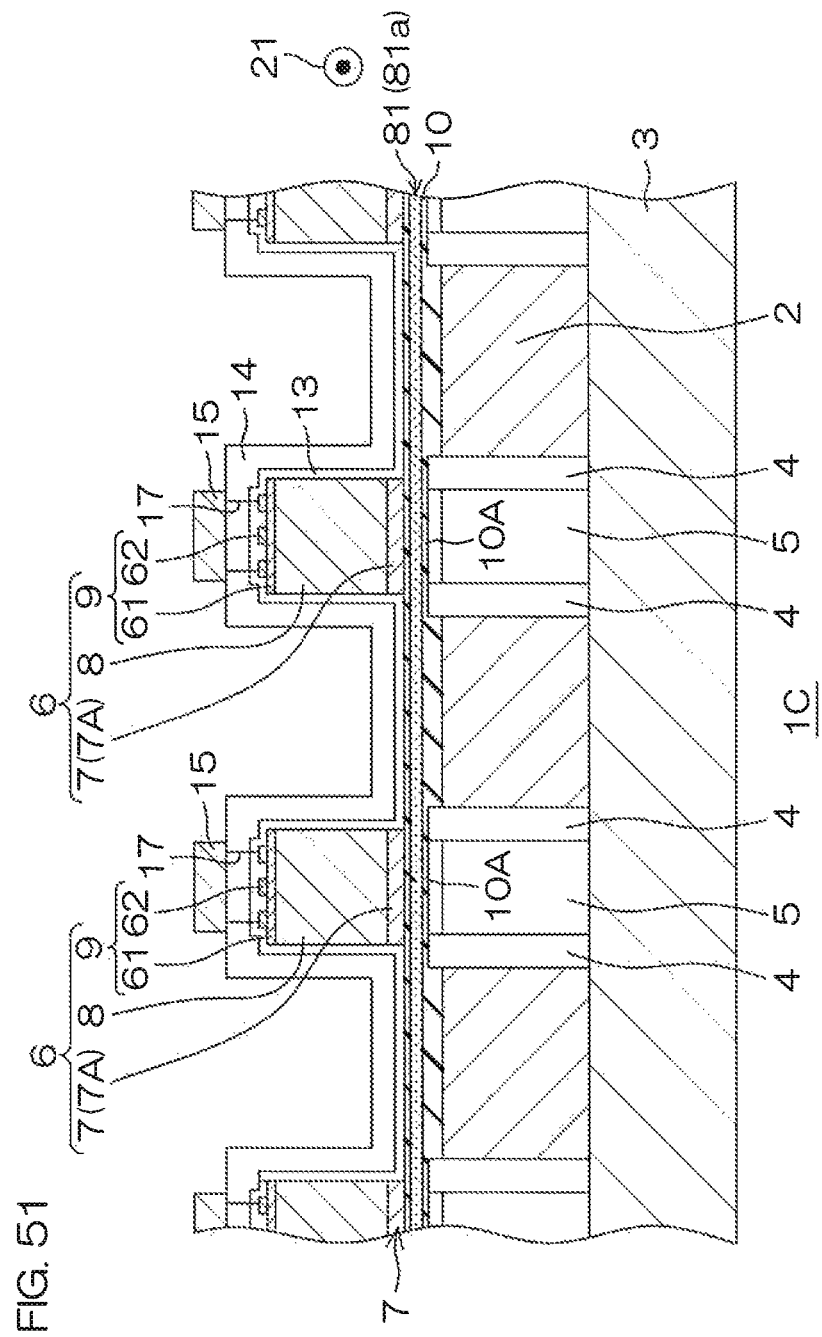
FIG. 51 is a schematic enlarged sectional view taken along line LI-LI in FIG. 49.
Figure 52:
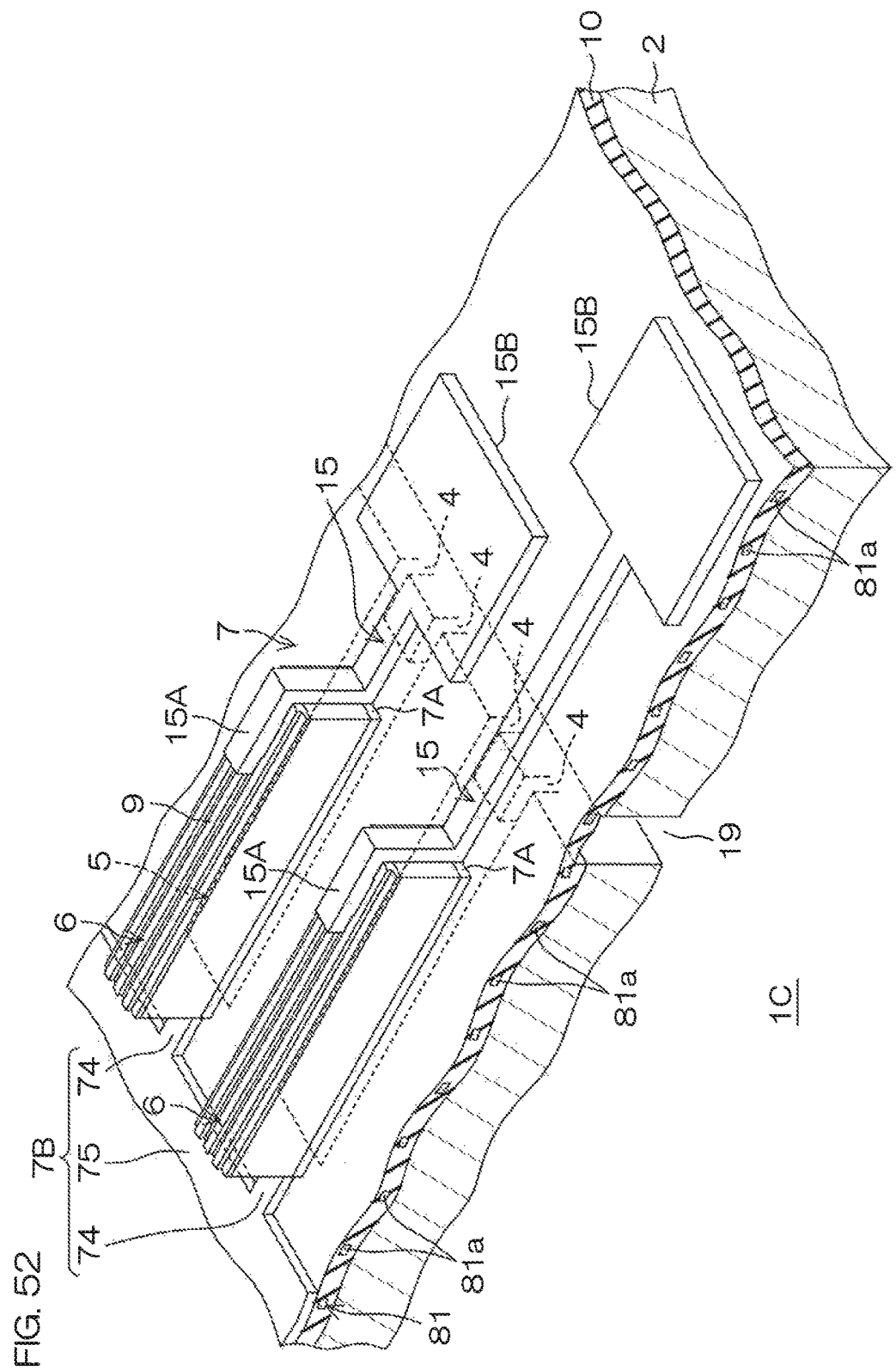
FIG. 52 is a schematic perspective view of the inkjet printing head.
Figure 53:
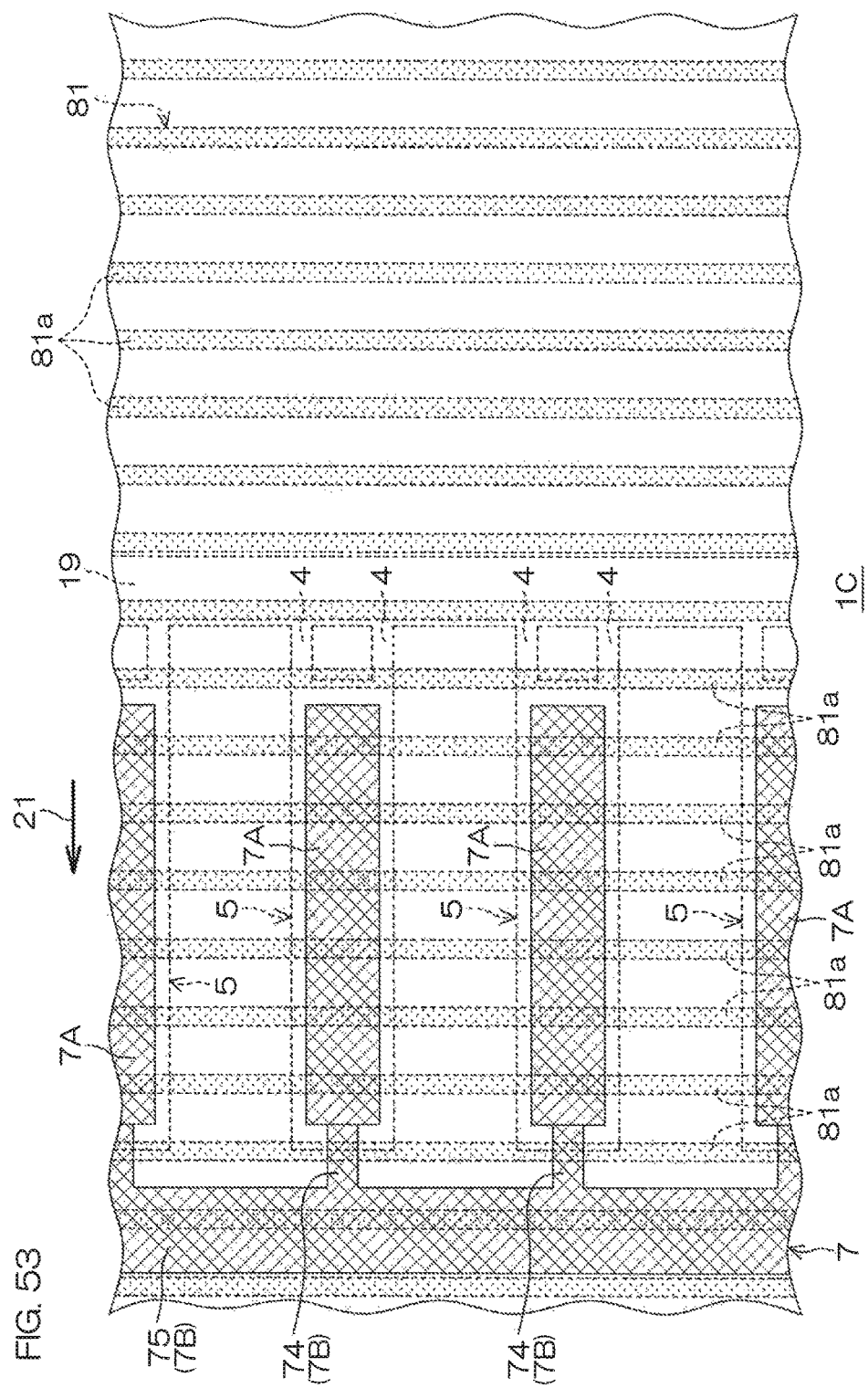
FIG. 53 is a plan view of a planar shape of the lower electrode formed above the movable film formation layer and is a plan view with which the arrangement besides the lower electrode formed above the movable film formation layer is removed.

FIG. 49 is a schematic plan view of yet another example of the inkjet printing head to which the third and fourth inventions are applied. FIG. 50 is a schematic enlarged sectional view taken along line L-L in FIG. 49. FIG. 51 is a schematic enlarged sectional view taken along line LI-LI in FIG. 49. FIG. 52 is a schematic perspective view of the inkjet printing head. In FIG. 49 and FIG. 52, the hydrogen barrier film indicated by symbol 13 and the insulating film indicated by symbol 14 in FIG. 50 and FIG. 51 are omitted. FIG. 53 is a plan view of a planar shape of the lower electrode formed above the movable film formation layer and is a plan view with which the arrangement besides the lower electrode formed above the movable film formation layer is removed. In FIG. 49 to FIG. 53, portions corresponding to respective portions in FIG. 21 to FIG. 25 of the description above are provided with the same reference symbols as in FIG. 21 to FIG. 25.

In comparison to the inkjet printing head 1A of FIG. 21, the present inkjet printing head 1C differs in the structure of the movable films 10A (movable film formation layer 10) and the pattern of the lower electrode 7. Other points besides this are the same as in the inkjet printing head 1A of FIG. 21.

A metal film 81 of a stripe pattern is embedded inside the movable film formation layer 10. The metal film 81 of the stripe pattern is arranged from a plurality of rectilinear metal films (metal lines) 81a parallel to the direction (the width direction of each piezoelectric element 6) orthogonal to the ink flow direction 21. The metal film 81 may, for example, be a Ti film.

The movable film formation layer 10 having the metal film 81 of the stripe pattern embedded therein may be prepared, for example, as follows. A first silicon oxide film that is to be the material of the movable film formation layer 10 is formed above the substrate 2. Next, a metal material film, made of the material of the metal film 81, is formed on a front surface of the first silicon oxide film, for example, by the sputtering method. Next, a resist mask of a stripe pattern is formed above the metal material film by photolithography. By the metal material film being etched using the resist mask as a mask, the metal film 81 of the stripe pattern is formed. Next, a second silicon oxide film is formed on the front surface of the first silicon oxide film and a front surface of the metal film 81. The movable film formation layer 10 having the metal film 81 embedded therein is thereby obtained.

The lower electrode 7 has the main electrode portions 7A of rectangular shapes in plan view that contact the lower surfaces of the piezoelectric films 8 and the extension portion 7B extending to regions outside the piezoelectric films 8. Each main electrode portion 7A is formed to be shorter than a movable film 10A along the long direction of the movable film 10A and the respective end edges thereof are disposed at inner sides at the predetermined intervals d1 from the respective corresponding end edges 10Aa and 10Ab of the movable film 10A. Also with the main electrode portion 7A, the width along the short direction of the movable film 10A is defined to be narrower than the width of the movable film 10A in the short direction and the respective end edges thereof are disposed at inner sides at the intervals d2 from the respective corresponding side edges 10Ac and 10Ad of the movable film 10A.

The extension portion 7B includes lead-out electrode portions 74 lead out from the main electrode portions 7A and a common connection portion 75 connecting the main electrode portions 7A of the plurality of piezoelectric elements 6 in common. The common connection portion 75 extends in a direction orthogonal to the ink flow direction 21 at a position further downstream in the ink flow direction 21 than the plurality of piezoelectric elements 6. Each lead-out electrode portion 74 is lead out along a long direction of a piezoelectric element 6 from a vicinity of a central portion of the end edge 6b at the downstream side in the ink flow direction 21 of the piezoelectric element 6 and is connected to the common connection portion 75. The pad portion 7d of rectangular shape that is elongate in the direction orthogonal to the ink flow direction 21 is formed in the common connection portion 75. That is, with the inkjet printing head 1C, the lower electrode 7 is not formed in regions at outer sides of the side edges 6c and 6d of the piezoelectric elements 6.

With the inkjet printing head 1C, although the lower electrode 7 is not formed in regions at outer sides of the side edges 6c and 6d of the piezoelectric elements 6, the metal film 81 of the stripe pattern is embedded in the movable film formation layer 10. That is, the plurality of mutually parallel rectilinear metal films 81a are embedded in the movable film formation layer 10. The rectilinear metal films 81a are formed at a high temperature and shrink thereafter upon being cooled to ordinary temperature and the rectilinear metal films 81a are thus made to have tensile stress. That is, the rectilinear metal films 81a apply a force in a shrinking direction to a movable film 10A and the movable film 10A is thus made unlikely to crack.

Figure 54:
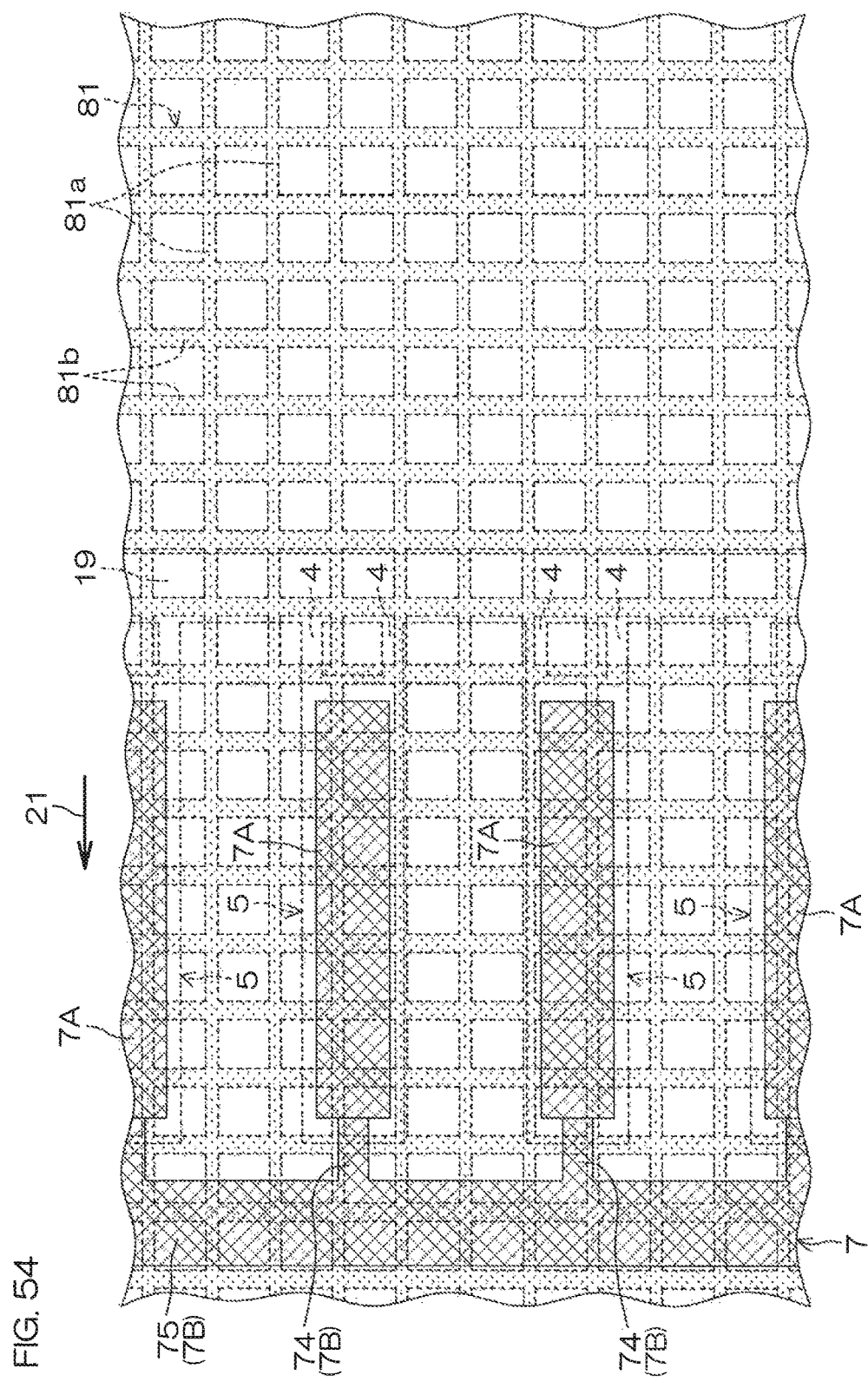
FIG. 54 is a plan view of another example of a metal film embedded inside the movable film formation layer.

The metal film 81 embedded inside the movable film formation layer 10 is not restricted to be of a stripe pattern and may be of a mesh pattern (lattice pattern). FIG. 54 shows an example of a case where the metal film 81 of a mesh pattern is embedded inside the movable film formation layer 10. The metal film 81 of the mesh pattern has a plurality of first rectilinear metal films 81a, which are parallel to the direction (the width direction of each piezoelectric element 6) orthogonal to the ink flow direction 21, and a plurality of second rectilinear metal films 81b, which are formed integral to the first rectilinear metal films 81a and are orthogonal to the first rectilinear metal films 81a.

In the inkjet printing head 1C of FIG. 49, the upper electrodes 9 may have any one of the structures of the upper electrodes 9A to 9Q shown in FIG. 27 to FIG. 43.

Figure 55:
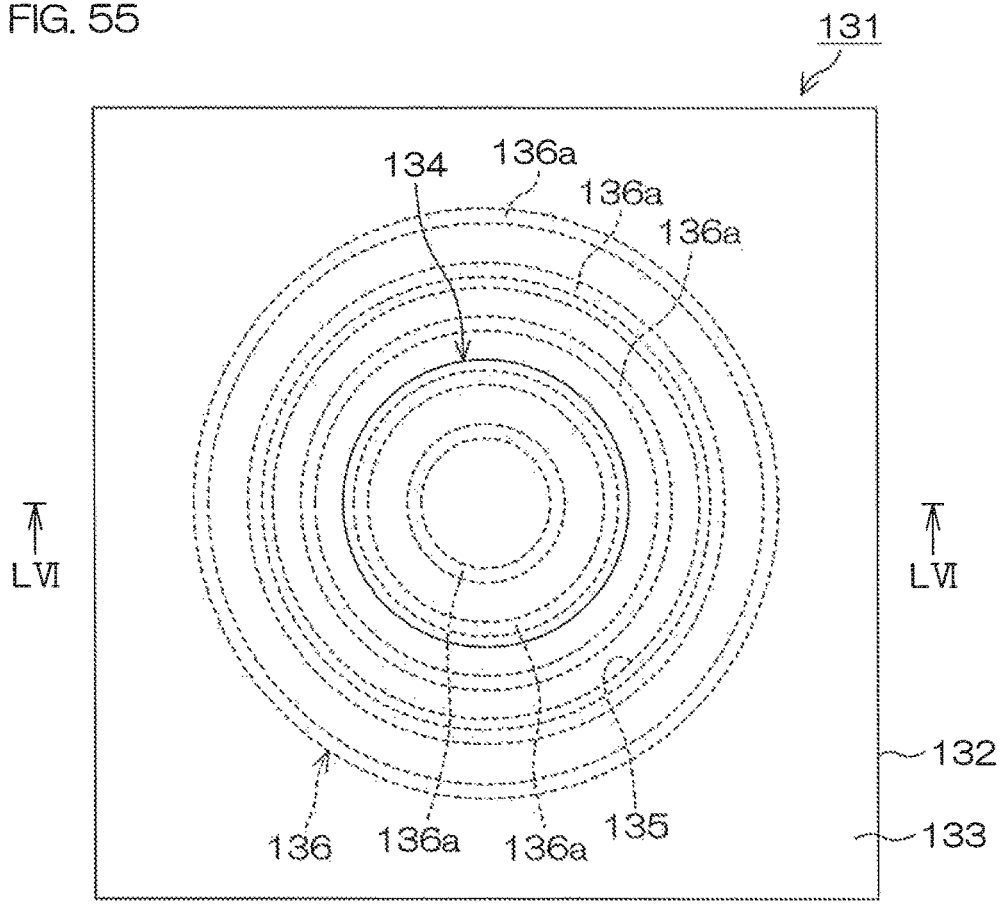
FIG. 55 is a schematic plan view of another example of a pyroelectric infrared image sensor to which the fourth invention is applied.
Figure 56:
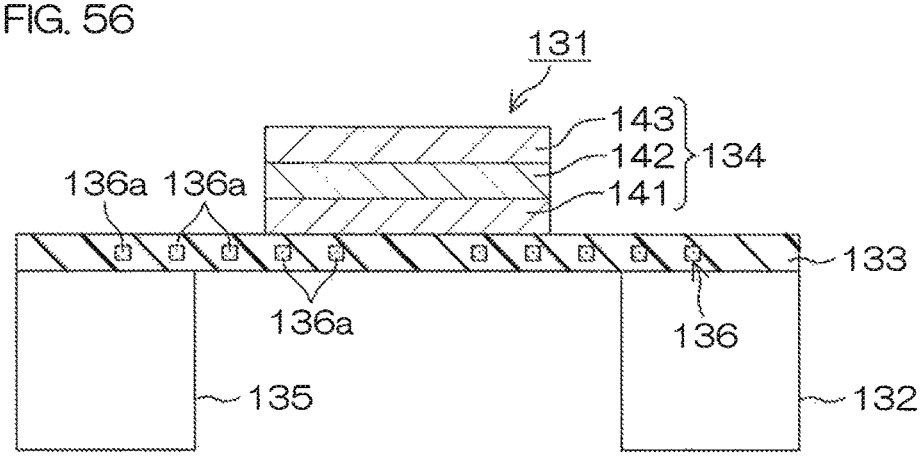
FIG. 56 is a sectional view taken along line LVI-LVI in FIG. 55.

FIG. 55 is a schematic plan view of another example of a pyroelectric infrared image sensor to which the fourth invention is applied. FIG. 56 is a sectional view taken along line LVI-LVI in FIG. 55.

The pyroelectric infrared image sensor 131 makes use of a change in surface charge of a pyroelectric material due to a temperature change due to infrared rays to detect the amount of infrared rays. The pyroelectric infrared image sensor 131 includes a silicon substrate 132, a heat insulating film (membrane) 133 formed above the silicon substrate 132, and a pyroelectric element 134 formed above the insulating film 133.

A cavity 135 that prevents heat transfer from the pyroelectric element 134 to the silicon substrate 132 is formed in the silicon substrate 132. The cavity 135 is formed by digging into the silicon substrate 132 from a rear surface side of the silicon substrate 132. The cavity 135 has a circular shape in plan view. A top surface of the cavity 135 is defined by the heat insulating film 133. The heat insulating film 133 is formed to cover an entirety of a top surface portion of the cavity 135 and further extend to a periphery thereof. The heat insulating film 133 is constituted of a silicon oxide ($SiO_2$) film.

A metal film 136 of an annular stripe pattern is embedded inside the heat insulating film 133. The metal film 136 of the annular stripe pattern has a plurality of annular metal films (metal lines) 136a of different diameters that are concentric to the cavity 135 in plan view. The metal film 136 may, for example, be a Ti film. Each annular metal film 136a is formed at a high temperature and shrinks thereafter upon being cooled to ordinary temperature and each annular metal film 136a is thus made to have tensile stress. That is, each annular metal film 136a applies a force in a shrinking direction to the heat insulating film 133 and the heat insulating film 133 is thus made unlikely to crack.

The pyroelectric element 134 includes a lower electrode 141 formed to be in contact with a surface of the heat insulating film 133 at an opposite side from the cavity 135, a pyroelectric film 142 formed above the lower electrode 141, and an upper electrode 143 formed above the pyroelectric film 142.

The lower electrode 141 is constituted, for example, of a Pt film. The pyroelectric film 142 is constituted, for example, of a PZT ($PbZr_xTi_{1-x}O_3$: lead zirconate titanate) film. The upper electrode 143 is constituted, for example, of a Pt film. The lower electrode 141 is formed, in plan view, to a circle that is concentric to a center of the cavity 135 and having a diameter smaller than the diameter of the cavity 135. The pyroelectric film 142 is formed in the same pattern as the lower electrode 141. The upper electrode 143 is formed in the same pattern as the pyroelectric film 142.

When infrared rays are irradiated onto the pyroelectric element 144, the heat thereof causes the temperature of the pyroelectric film 142 to change and thereby causes a change in the surface charge of the pyroelectric film 142. The change in surface charge of the pyroelectric film 142 is taken out via the lower electrode 141 and the upper electrode 143. The light amount of the infrared rays can thereby be detected. For the sake of convenience, wirings for taking out the change in surface charge of the pyroelectric film 142 from the lower electrode 141 and the upper electrode 143 are omitted in FIG. 55 and FIG. 56.

Although preferred embodiments of the second to fourth inventions have been described above, the second to fourth inventions may be implemented in yet other preferred embodiments. Although with the inkjet printing heads 1 to 1C of FIG. 9, FIG. 21, FIG. 44, and FIG. 49, PZT was cited as an example of the material of the piezoelectric film, a piezoelectric material besides this that is constituted of a metal oxide as represented by lead titanate ($PbPO_3$), potassium niobate ($KNbO_3$), lithium niobate ($LiNbO_3$), lithium tantalate ($LiTaO_3$), etc., may be applied instead.

Although with the inkjet printing heads 1 to 1C of FIG. 9, FIG. 21, FIG. 44, and FIG. 49, recesses 5B, each defining a portion of a pressure chamber 5, are formed in the rear surface of the movable film formation layer 10, the recesses 5B do not have to be formed. In this case, each pressure chamber 5 is constituted of just a space portion 5A formed in the silicon substrate 2.

The present application corresponds to Japanese Patent Application No. 2014-159807 filed on Aug. 5, 2014 in the Japan Patent Office, Japanese Patent Application No. 2014-180573 filed on Sep. 4, 2014 in the Japan Patent Office, Japanese Patent Application No. 2014-180571 filed on Sep. 4, 2014 in the Japan Patent Office, Japanese Patent Application No. 2014-180572 filed on Sep. 4, 2014 in the Japan Patent Office and Japanese Patent Application No. 2015-151164 filed on Jul. 30, 2015 in the Japan Patent Office, and the entire disclosure of these applications are incorporated herein by reference.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A device using a piezoelectric element, comprising:
a substrate having a cavity;
a movable film held on the substrate so as to face the cavity;
a piezoelectric element disposed above the movable film, and having a lower electrode, a piezoelectric film formed above the lower electrode, and an upper electrode formed above the piezoelectric film;
a hydrogen barrier film covering an entirety of a side surface of the upper electrode and the piezoelectric film;
an interlayer insulating film having an opening at an upper surface center of the upper electrode, being laminated on the hydrogen barrier film, and facing the entirety of the side surface of the upper electrode and the piezoelectric film across the hydrogen barrier film; and
a metal barrier film is interposed between the movable film and the piezoelectric element.

2. The device using the piezoelectric element according to claim 1, wherein the metal barrier film is an $Al_2O_3$ film.

3. A device using a piezoelectric element, comprising:
a substrate having a cavity;
a movable film held on the substrate so as to face the cavity;
a piezoelectric element disposed above the movable film, and having a lower electrode, a piezoelectric film formed above the lower electrode, and an upper electrode formed above the piezoelectric film;
a hydrogen barrier film covering an entirety of a side surface of the upper electrode and the piezoelectric film;
an interlayer insulating film having an opening at an upper surface center of the upper electrode, being laminated on the hydrogen barrier film, and facing the entirety of the side surface of the upper electrode and the piezoelectric film across the hydrogen barrier film;
wherein above the piezoelectric element, a contact hole, exposing a portion of the upper electrode, is formed in the interlayer insulating film, and
wherein above the interlayer insulating film, there is formed a wiring having one end portion connected to the upper electrode via the contact hole and another end portion lead out to an outer side of the piezoelectric element; and
a passivation film formed just in a region in which the wiring above the interlayer insulating film is present and covering the wiring.

4. The device using the piezoelectric element according to claim 1, wherein the hydrogen barrier film is an $Al_2O_3$ film.

5. The device using the piezoelectric element according to claim 1, wherein the interlayer insulating film is an SiO film.

6. The device using the piezoelectric element according to claim 3, wherein the passivation film is an SiN film.

7. The device using the piezoelectric element according to claim 1, wherein the upper electrode is constituted of a laminated film of an $IrO_2$ film formed above the piezoelectric film and an Ir film formed above the $IrO_2$ film.

8. The device using the piezoelectric element according to claim 1, wherein above the piezoelectric element, a contact hole, exposing a portion of the upper electrode, is formed in the interlayer insulating film, and
above the interlayer insulating film, there is formed a wiring having one end portion connected to the upper electrode via the contact hole and another end portion lead out to an outer side of the piezoelectric element.

9. The device using the piezoelectric element according to claim 2, wherein above the piezoelectric element, a contact hole, exposing a portion of the upper electrode, is formed in the interlayer insulating film, and
above the interlayer insulating film, there is formed a wiring having one end portion connected to the upper electrode via the contact hole and another end portion lead out to an outer side of the piezoelectric element.

10. The device using the piezoelectric element according to claim 1, wherein the cavity is formed to a rectangular shape in a plan view as viewed from a direction normal to a major surface of the movable film,
the movable film is formed to a rectangular shape matching a cavity edge in the plan view,
the piezoelectric film, in the plan view, is a rectangle having a width shorter than a width in a short direction of the movable film and a length shorter than a length in a long direction of the movable film, with both end edges and both side edges thereof being receded further toward an interior of the movable film than both end edges and both side edges, respectively, of the movable film, and
the upper electrode, in the plan view, is a rectangle having a width shorter than the width in a short direction of the movable film and a length shorter than the length in a long direction of the movable film, with both end edges and both side edges thereof being receded further toward the interior of the movable film than both end edges and both side edges, respectively, of the movable film.

11. The device using the piezoelectric element according to claim 2, wherein the cavity is formed to a rectangular shape in a plan view as viewed from a direction normal to a major surface of the movable film,
the movable film is formed to a rectangular shape matching a cavity edge in the plan view,
the piezoelectric film, in the plan view, is a rectangle having a width shorter than a width in a short direction of the movable film and a length shorter than a length in a long direction of the movable film, with both end edges and both side edges thereof being receded further toward an interior of the movable film than both end edges and both side edges, respectively, of the movable film, and
the upper electrode, in the plan view, is a rectangle having a width shorter than the width in a short direction of the movable film and a length shorter than the length in a long direction of the movable film, with both end edges and both side edges thereof being receded further toward the interior of the movable film than both end edges and both side edges, respectively, of the movable film.

12. The device using the piezoelectric element according to claim 8, wherein the cavity is formed to a rectangular shape in a plan view as viewed from a direction normal to a major surface of the movable film,
the movable film is formed to a rectangular shape matching a cavity edge in the plan view,
the piezoelectric film, in the plan view, is a rectangle having a width shorter than a width in a short direction of the movable film and a length shorter than a length in a long direction of the movable film, with both end edges and both side edges thereof being receded further toward an interior of the movable film than both end edges and both side edges, respectively, of the movable film, and the upper electrode, in the plan view, is a rectangle having a width shorter than the width in a short direction of the movable film and a length shorter than the length in a long direction of the movable film, with both end edges and both side edges thereof being receded further toward the interior of the movable film than both end edges and both side edges, respectively, of the movable film.

13. A method for manufacturing a device using a piezoelectric element comprising:
 a first step of forming, above a movable film, a piezoelectric element including a lower electrode, a piezoelectric film formed above the lower electrode, and an upper electrode formed above the piezoelectric film;
 a second step of forming a hydrogen barrier film covering front surfaces of the movable film and the piezoelectric element;
 a third step of forming an interlayer insulating film above the hydrogen barrier film;
 a fourth step of forming, above the piezoelectric element, a contact hole, exposing a portion of the upper electrode, in the hydrogen barrier film and the interlayer insulating film;
 a fifth step of forming, above the interlayer insulating film, a wiring having one end portion contacting the upper electrode via the contact hole and another end portion lead out to an outer side of the piezoelectric element;
 a sixth step of forming a passivation film, covering the wiring, in a region above the interlayer insulating film in which the wiring is present; and
 a seventh step of forming an opening at an upper surface central portion of the piezoelectric element in the hydrogen barrier film and the interlayer insulating film.

14. The method for manufacturing the device using the piezoelectric element according to claim 13, wherein the fifth step includes
 a step of forming a wiring film above the interlayer insulating film, including an interior of the contact hole, and
 a step of patterning the wiring film to form the wiring having the one end portion contacting the upper electrode via the contact hole and the other end portion lead out to the outer side of the piezoelectric element.

15. The method for manufacturing the device using the piezoelectric element according to claim 14, wherein the sixth step includes a step of forming, above the interlayer insulating film, the passivation film covering a front surface of the interlayer insulating film and a front surface of the wiring, and
 a step of patterning the passivation film to a pattern constituted of just a portion covering the wiring.

* * * * *